(12) United States Patent
Murakami et al.

(10) Patent No.: US 11,063,609 B2
(45) Date of Patent: Jul. 13, 2021

(54) TRANSMITTER, RECEIVER, TRANSMISSION METHOD, AND RECEPTION METHOD

(71) Applicant: Panasonic Intellectual Property Management Co., Ltd., Osaka (JP)

(72) Inventors: Yutaka Murakami, Kanagawa (JP); Tomohiro Kimura, Osaka (JP); Mikihiro Ouchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/801,234

(22) Filed: Feb. 26, 2020

(65) Prior Publication Data

US 2020/0195277 A1 Jun. 18, 2020

Related U.S. Application Data

(63) Continuation of application No. 16/254,950, filed on Jan. 23, 2019, now Pat. No. 10,637,505, which is a (Continued)

(30) Foreign Application Priority Data

May 11, 2015 (JP) ................. 2015-096313

(51) Int. Cl.
*H03M 13/25* (2006.01)
*H03M 13/00* (2006.01)
(Continued)

(52) U.S. Cl.
CPC ..... *H03M 13/255* (2013.01); *H03M 13/1102* (2013.01); *H03M 13/1111* (2013.01);
(Continued)

(58) Field of Classification Search
None
See application file for complete search history.

(56) References Cited

U.S. PATENT DOCUMENTS 8,356,137 B2   1/2013  Post
8,495,477 B2   7/2013  Song
(Continued)

OTHER PUBLICATIONS

International Search Report of PCT application No. PCT/JP2015/002613 dated Jul. 21, 2015.
(Continued)

*Primary Examiner* — Phung M Chung
(74) *Attorney, Agent, or Firm* — Wenderoth, Lind & Ponack, L.L.P.

(57) ABSTRACT

One coding scheme is selected from a plurality of coding schemes, an information sequence is encoded by using the selected coding scheme, and an obtained encoded sequence is modulated to obtain a modulated signal. The obtained modulated signal is subjected to a phase change and is transmitted. The plurality of coding schemes include at least a first coding scheme and a second coding scheme. The first coding scheme is a coding scheme with a first coding rate for forming a generated first codeword as a first encoded sequence by using a first parity check matrix. The second coding scheme is a coding scheme with a second coding rate obtained after puncturing processing, for generating a second encoded sequence by performing the puncturing processing on a generated second codeword by using a second parity check matrix different from the first parity check matrix. The number of bits of the first encoded sequence is equal to the number of bits of the second encoded sequence.

4 Claims, 52 Drawing Sheets

Related U.S. Application Data continuation of application No. 15/297,447, filed on Oct. 19, 2016, now Pat. No. 10,236,914, which is a continuation of application No. PCT/JP2015/002613, filed on May 25, 2015.

(60) Provisional application No. 62/021,811, filed on Jul. 8, 2014, provisional application No. 62/009,387, filed on Jun. 9, 2014, provisional application No. 62/004,994, filed on May 30, 2014.

(51) Int. Cl.
*H03M 13/35* (2006.01)
*H03M 13/11* (2006.01)
*H03M 13/13* (2006.01)
*H04L 1/00* (2006.01)
*H03M 13/19* (2006.01)

(52) U.S. Cl.
CPC ........... *H03M 13/19* (2013.01); *H03M 13/35* (2013.01); *H03M 13/6362* (2013.01); *H04L 1/00* (2013.01)

(56) References Cited

U.S. PATENT DOCUMENTS

| | | | |
|---|---|---|---|
| 9,281,883 B2 | 3/2016 | Murakami | |
| 9,294,165 B2 | 3/2016 | Murakami | |
| 9,461,725 B2 | 10/2016 | Murakami | |
| 9,571,131 B2 | 2/2017 | Murakami | |
| 9,882,618 B2 | 1/2018 | Murakami | |
| 10,236,914 B2 | 3/2019 | Murakami | |
| 10,237,015 B2 | 3/2019 | Murakami | |
| 10,411,835 B2 * | 9/2019 | Murakami | H03M 13/2906 |
| 10,666,386 B2 * | 5/2020 | Murakami | H04L 1/0041 |
| 2002/0157058 A1 | 10/2002 | Ariel | |
| 2006/0120481 A1 * | 6/2006 | Hong | H04L 1/0071 375/298 |
| 2010/0211854 A1 | 8/2010 | Wu | |
| 2010/0325511 A1 | 12/2010 | Oh et al. | |
| 2013/0136208 A1 | 5/2013 | Murakami et al. | |

OTHER PUBLICATIONS

DVB Document A122, "Frame structure channel coding and modulation for a second generation digital terrestrial television broadcasting system (DVB-T2)", Jun. 2008.

Qiuju Diao et al., "LDPC codes on partial geometries: Construction, trapping set structure, and puncturing", Transaction on Information Theory, vol. 59, No. 12, pp. 7898-7914, Dec. 2013.
ETSI EN 302 307 V1.1.1, Digital Video Broadcast (DVB); "Second generation framing structure, channel coding and modulation systems for broadcasting, interactive services, news gathering and other broadband satellite applications", Mar. 2005.
R. G. Gallager, "Low-density parity-check codes", IRE Transactions on information theory, pp. 21-28, 1962.
David J. C. MacKay, "Good error-correcting codes based on very sparse matrices", IEEE Trans. Inform. theory, vol. 45, No. 2, pp. 399-431, Mar. 1999.
Marc P. C. Fossorier, "Quasi-cyclic low-density parity-check codes from circulant permutation matrices", IEEE Trans. Inform. Theory, vol. 50, No. 8, pp. 1788-1793, Aug. 2004.
D. Divsalar et al., "Coding theorems for "turbo-like" codes", pp. 1-10.
Seho Myung et al., "Quasi-cyclic LDPC codes for fast encoding", IEEE Trans. Inform. Theory, vol. 51, No. 8, pp. 2894-2901, Aug. 2005.
Frank R. Kschischang et al., "Factor graphs and the sum-product algorithm", IEEE Trans. Inform. Theory, vol. 47, No. 2, pp. 498-519, Feb. 2001.
Mark P. C. Fossorier et al., "Reduced complexity iterative decoding of low density parity check codes based on belief propagation", IEEE Trans. Commun, vol. 47, No. 5, pp. 673-680, May 1999.
Jinghu Chen et al., "Reduced-complexity decoding of LDPC codes", IEEE Trans. Commun., vol. 53, No. 8, pp. 1288-1299, Aug. 2005.
Juntan Zhang and M. P. C. Fossorier, "Shuffled iterative decoding", IEEE Trans. Commun., vol. 53, No. 2, pp. 209-213, Feb. 2005.
Mohammad M. Mansour et al., "High-throughput LDPC decoders", IEEE Trans. VLSI syst, vol. 11, No. 6, pp. 976-996, Dec. 2003.
Nenad Miladinovic et al., "Improved bit-flipping decoding of low-density parity-check codes", IEEE Trans. Inform. Theory, vol. 51, No. 4, pp. 1594-1606, Apr. 2005.
Yang Zhang et al., "High dynamic range video compression by intensity dependent spatial quantization in HEVC", Proc. of Picture Coding Symposium 2013, pp. 353-356.
Masaru Takeuchi et al., "Considerations on bit depth scalable video coding using gradation interpolation", Instituion of Electronics, Information and Communication Engineering Magazine D, vol. J95-D, No. 9, pp. 1669-1671, Sep. 2012 (with English translation).
Extended European Search Report dated May 4, 2017 in corresponding European Application No. 15800000.0.
Xiaonan Shi et al., "Evaluation and Implementation of Quasi-Cyclic LDPC Codes for IEEE802.11n Based MIMO-OFDM System", IEEE Conference on Soft Computing in Industrial Applications (SMCia/08), 2008, pp. 277-280, XP031468421.

* cited by examiner

FIG. 5

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #A | METHOD #A | METHOD #A | METHOD #A | METHOD #A | METHOD #A | METHOD #A | METHOD #A | METHOD #A |
| z = 64800 BITS | METHOD #B | METHOD #B | METHOD #B | METHOD #B | METHOD #B | METHOD #B | METHOD #B | METHOD #B | METHOD #B |

FIG. 6

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #B | METHOD #B | METHOD #B | METHOD #B | METHOD #B | METHOD #B | METHOD #B | METHOD #B | METHOD #B |
| z = 64800 BITS | METHOD #B | METHOD #B | METHOD #B | METHOD #B | METHOD #B | METHOD #B | METHOD #B | METHOD #B | METHOD #B |

FIG. 7

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS 1000 BITS OR MORE AND 9000 BITS OR LESS | METHOD #A | METHOD #A | METHOD #A | METHOD #A | METHOD #A | METHOD #A | METHOD #A | METHOD #A | METHOD #A |
| z IS 10000 BITS OR MORE AND 20000 BITS OR LESS | METHOD #A | METHOD #A | METHOD #A | METHOD #A | METHOD #A | METHOD #A | METHOD #A | METHOD #A | METHOD #A |
| z IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

FIG. 8

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS 1000 BITS OR MORE AND 9000 BITS OR LESS | METHOD #A | METHOD #A | METHOD #A | METHOD #A | METHOD #A | METHOD #A | METHOD #A | METHOD #A | METHOD #A |
| z IS 10000 BITS OR MORE AND 20000 BITS OR LESS | METHOD #B | METHOD #B | METHOD #B | METHOD #B | METHOD #B | METHOD #B | METHOD #B | METHOD #B | METHOD #B |
| z IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

FIG. 9

| z IS LESS THAN 20000 BITS | METHOD #A |
|---|---|
| z IS 20000 BITS OR MORE | METHOD #B |

FIG. 10

| z IS LESS THAN 10000 BITS | METHOD #A |
|---|---|
| z IS 10000 BITS OR MORE | METHOD #B |

FIG. 12

| CODING RATE OF LESS THAN f | METHOD #B |
|---|---|
| CODING RATE OF e OR MORE AND f OR LESS | METHOD #A |
| CODING RATE OF LARGER THAN f | METHOD #B |

FIG. 13

| CODING RATE OF LESS THAN g | METHOD #B |
|---|---|
| CODING RATE OF g OR MORE | METHOD #A |

FIG. 14

| CODING RATE OF LESS THAN h | METHOD #A |
|---|---|
| CODING RATE OF h OR MORE | METHOD #B |

FIG. 15

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 16200 BITS | METHOD #A | METHOD #A | METHOD #A | METHOD #A | METHOD #B | METHOD #B | METHOD #B | METHOD #B | METHOD #B |
| z = 64800 BITS | METHOD #B | METHOD #B | METHOD #B | METHOD #B | METHOD #B | METHOD #B | METHOD #B | METHOD #B | METHOD #B |

FIG. 16

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS 10000 BITS OR MORE AND 20000 BITS OR LESS | METHOD #A | METHOD #A | METHOD #A | METHOD #B | METHOD #B | METHOD #B | METHOD #B | METHOD #B | METHOD #B |
| z IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

FIG. 44

| |
|---|
| VIDEO STREAM (PID=0x1011 MAIN VIDEO IMAGE) |
| AUDIO STREAM (PID=0x1100) |
| AUDIO STREAM (PID=0x1101) |
| PRESENTATION GRAPHICS STREAM (PID=0x1200) |
| PRESENTATION GRAPHICS STREAM (PID=0x1201) |
| INTERACTIVE GRAPHICS STREAM (PID=0x1400) |
| VIDEO STREAM (PID=0x1B00 SUB VIDEO IMAGE) |
| VIDEO STREAM (PID=0x1B01 SUB VIDEO IMAGE) |

TRANSMITTER, RECEIVER, TRANSMISSION METHOD, AND RECEPTION METHOD

BACKGROUND

1. Technical Field

The present disclosure relates to a broadcast and communication system which uses an error correction code.

2. Description of the Related Art

A broadcast and communication system which uses radio waves and cables uses an error correction code in order to improve data reception quality in a receiver. In this case, in consideration of an arithmetic operation scale, it is desirable to use as an error correction code an error correction code of high correction performance among error correction codes. In such a situation, use of an LDPC (Low-Density Parity-Check) code in a broadcast and communication system which uses radio waves and cables has been studied. In consideration of a variable amount of data transmitted by a transmitter, use environment (reception in mobile environment or reception in semi-fixed environment) and the like, a configuration of a system with a variable block length (code length) of an LDPC code and with a variable coding rate has been studied.

Meanwhile, an LDPC code generating method has variously been studied. For example, NPL 1 describes using an LDPC code defined by parity check matrix H1 (where a number of columns is $N_1$.) to encode an information sequence, and generating and transmitting a codeword of $N_1$ bits.

Moreover, in NPL 2, an information sequence is encoded by using an LDPC code defined by parity check matrix H2 (where a number of columns is L and a relationship of $N_2 < L$ holds.), and a codeword of L bits is generated. Then, NPL 2 describes determining bits not to be transmitted of $L-N_2$ bits among the codeword of the L bits, and transmitting a sequence of remaining $N_2$ bits (puncturing method).

CITATION LIST

Non-Patent Literatures

NPL 1: DVB Document A122, Framing structure channel coding and modulation for a second generation digital terrestrial television broadcasting system (DVB-T2), June 2008.

NPL 2: Q. Dia, Y. Y. Tai, S. Lin, and K. Abdel-Ghaffar, "LDPC codes on partial geometries: Construction, trapping set structure, and puncturing," IEEE Transaction on Information Theory, vol. 59, no. 12, pp. 7898-7914, December 2013.

NPL 3: Digital Video Broadcast (DVB); Second generation framing structure, channel coding and modulation systems for broadcasting, interactive services, news gathering and other broadband satellite application, ETSI EN 302 307 v1.1.1, March 2005.

NPL 4: R. G. Gallager, "Low-density parity check codes," IRE Trans. Inform. Theory, IT-8, pp. 21-28, 1962.

NPL 5: D. J. C. Mackay, "Good error-correcting codes based on very sparse matrices," IEEE Trans. Inform. Theory, vol. 45, no. 2, pp. 399-431, March 1999.

NPL 6: M. P. C. Fossorier, "Quasi-cyclic low-density parity-check codes from circulant permutation matrices," IEEE Trans. Inform. Theory, vol. 50, no. 8, pp. 1788-1793, August 2004.

NPL 7: D. Divsalar, H. Jin, and R. J. McElience, "Coding theorems for 'turbo-like' codes," pp. 1-10.

NPL 8: S. Myung, K. Yang, and J. Kim, "Quasi-cyclic LDPC codes for fast encoding," IEEE Trans. Inform. Theory, vol. 51, no. 8, pp. 2894-2901, August 2005.

NPL 9: F. R. Kschischang, B. J. Frey, and H. Loeliger, "Factor graphs and the sum-product algorithm," IEEE Trans. Inform. Theory, vol. 47, no. 2, pp. 498-519, February 2001.

NPL 10: M. P. C. Fossorier, M. Mihaljevic, and H. Imai, "Reduced complexity iterative decoding for low density parity check codes based on belief propagation," IEEE Trans. Commun., vol. 47, no. 5, pp. 673-680, May 1999.

NPL 11: J. Chen, A. Dholakis, E. Eleftheriou, M. P. C. Fossorier, and X.-Yu Hu, "Reduced-complexity decoding for LDPC codes," IEEE Trans. Commun., vol. 53, no. 8, pp. 1288-1299, August 2005.

NPL 12: J. Zhang, and M. P. C. Fossorier, "Shuffled iterative decoding," IEEE Trans. Commun., vol. 53, no. 2, pp. 209-213, February 2005.

NPL 13: M. Mansour, and N. Shanbhag, "High-throughput LDPC decoders," IEEE Trans. VLSI syst., vol. 11, no. 6, pp. 976-996, December 2003.

NPL 14: N. Miladinovic, and M. P. C. Fossorier, "Improved bit-flipping decoding of low-density parity-check codes," IEEE Trans. Inform. Theory, vol. 51, no. 4, pp. 1594-1606, April 2005.

NPL 15: Z. Yang, M. Naccari, D. Agrafiotis, M. Mrak, and D. R. Bull, "High dynamic range video compression by intensity dependent spatial quantization in HEVC," Proc. of Picture Coding Symposium 2013, pp. 353-356.

NPL 16: Masaru TAKEUCHI, Yuta YAMAMURA, Yasutaka MATSUO, Jiro KATTO, Kazuhisa IGUCHI, "A Study on Bit-depth Scalable Video Coding scheme Using Gradation Restoration," Journal D of The Institute of Electronics, Information and Communication Engineers, vol. J95-D, no. 9, pp. 1669-1671, September, 2012.

SUMMARY

In one general aspect, the techniques disclosed here feature a transmission method using a plurality of coding schemes. The transmission method includes selecting one coding scheme from the plurality of coding schemes, encoding an information sequence by using the selected coding scheme, to obtain an encoded sequence, modulating the encoded sequence to obtain a first modulated signal and a second modulated signal, and applying at least one of the first modulated signal and the second modulated signal to a phase change while regularly changing a degree the phase change, and transmitting the at least one of the first modulated signal and the second modulated. The plurality of coding schemes include at least a first coding scheme and a second coding scheme. The first coding scheme is a coding scheme with a first coding rate for forming a generated first codeword as a first encoded sequence by using a first parity check matrix. The second coding scheme is a coding scheme with a second coding rate different from the first coding rate and obtained after puncturing processing, for generating a second encoded sequence by performing the puncturing processing on a generated second codeword by using a second parity check matrix different from the first parity check matrix. Then, a number of bits of the first encoded sequence is equal to a number of bits of the second encoded sequence.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 5 is a view illustrating an example of a coding scheme selected for a code length and a coding rate;

FIG. 6 is a view illustrating an example of a coding scheme selected for a code length and a coding rate;

FIG. 7 is a view illustrating an example of a coding scheme selected for a code length and a coding rate;

FIG. 8 is a view illustrating an example of a coding scheme selected for a code length and a coding rate;

FIG. 9 is a view illustrating an example of a coding scheme selected for a code length;

FIG. 10 is a view illustrating an example of a coding scheme selected for a code length;

FIG. 12 is a view illustrating an example of a coding scheme selected for a coding rate;

FIG. 13 is a view illustrating an example of a coding scheme selected for a coding rate;

FIG. 14 is a view illustrating an example of a coding scheme selected for a coding rate;

FIG. 15 is a view illustrating an example of a coding scheme selected for a code length and a coding rate;

FIG. 16 is a view illustrating an example of a coding scheme selected for a code length and a coding rate;

FIG. 44 is a view illustrating an example of a configuration of multiplexed data;

DETAILED DESCRIPTION

Figure 1:
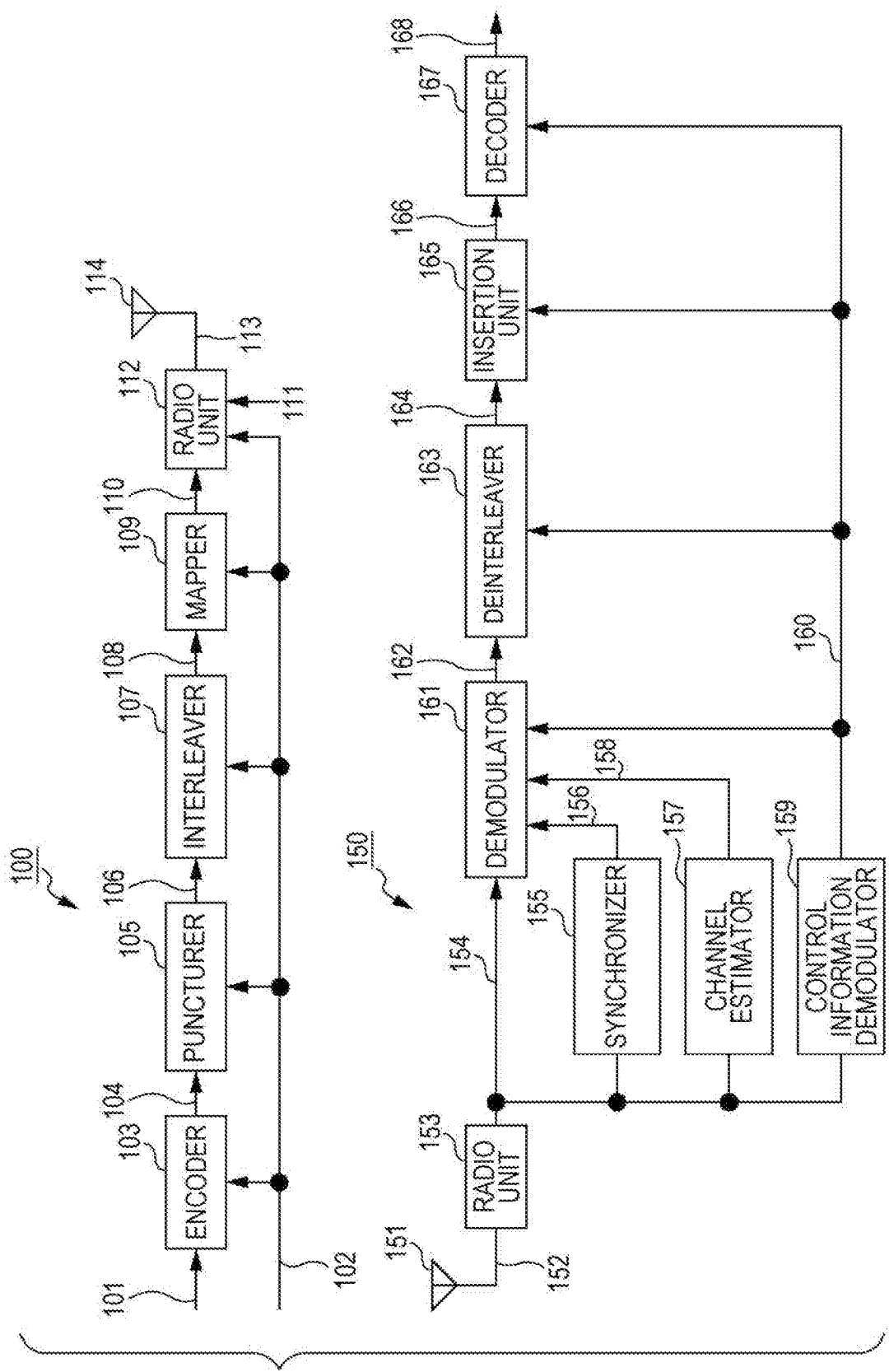
FIG. 1 is a view illustrating an example of configurations of a receiver and a transmitter which use radio waves.

The present disclosure relates to a setting of an LDPC code, which is for a receiver to obtain high data reception quality in a broadcast and communication system having a variable block length (code length) and a variable coding rate and using radio waves and cables, and which is used by the system.

One aspect of the present disclosure is a transmission method using a plurality of coding schemes. The transmission method includes selecting one coding scheme from the plurality of coding schemes, encoding an information sequence by using the selected coding scheme, to obtain an encoded sequence; modulating the encoded sequence to obtain a first modulated signal and a second modulated signal, and applying a phase change to at least one of the first modulated signal and the second modulated signal while regularly changing a degree of the phase change, and transmitting the at least one of the first modulated signal and the second modulated. The plurality of coding schemes include at least a first coding scheme and a second coding scheme. The first coding scheme is a coding scheme with a first coding rate for forming a generated first codeword as a first encoded sequence by using a first parity check matrix. The second coding scheme is a coding scheme with a second coding rate different from the first coding rate and obtained after puncturing processing, for generating a second encoded sequence by performing the puncturing processing on a generated second codeword by using a second parity check matrix different from the first parity check matrix. Then, a number of bits of the first encoded sequence is equal to a number of bits of the second encoded sequence.

One aspect of the present disclosure is a reception method using a plurality of decoding schemes. The reception method includes acquiring information indicating a phase changing method to which a received signal is subjected, demodulating the received signal based on the information indicating the phase changing method, and performing error correction decoding by using a plurality of reception values generated by the demodulation. When the plurality of reception values are values encoded by a first coding scheme, a first decoding scheme corresponding to the first coding scheme is applied to the plurality of reception values. When the plurality of reception values are values encoded by a second coding scheme, depuncturing processing is applied to the plurality of reception values, and a second decoding scheme corresponding to the second coding scheme is applied to a plurality of values obtained after the depuncturing processing. The first coding scheme is a coding scheme with a first coding rate for forming a generated first codeword as a first encoded sequence by using a first parity check matrix. The second coding scheme is a coding scheme with a second coding rate different from the first coding rate and obtained after puncturing processing, for generating a second encoded sequence by performing the puncturing processing on a generated second codeword by using a second parity check matrix different from the first parity check matrix. Then, a number of bits of the first encoded sequence is equal to a number of bits of the second encoded sequence.

One aspect of the present disclosure is a transmitter using a plurality of coding schemes. The transmitter includes an encoder that selects one coding scheme from the plurality of coding schemes, and that encodes an information sequence by using the selected coding scheme to obtain an encoded sequence, a modulator that modulates the encoded sequence to obtain a first modulated signal and a second modulated signal, and a transmitter that applies a phase change to at least one of the first modulated signal and the second modulated signal while regularly changing a degree of the phase change, and transmits the at least one of the first modulated signal and the second modulated. The plurality of coding schemes include at least a first coding scheme and a second coding scheme. The first coding scheme is a coding scheme with a first coding rate for forming a generated first codeword as a first encoded sequence by using a first parity check matrix. The second coding scheme is a coding scheme with a second coding rate different from the first coding rate and obtained after puncturing processing, for generating a second encoded sequence by performing the puncturing processing on a generated second codeword by using a second parity check matrix different from the first parity check matrix. Then, a number of bits of the first encoded sequence is equal to a number of bits of the second encoded sequence.

One aspect of the present disclosure is a receiver using a plurality of decoding schemes. The receiver includes an acquiring circuitry that acquires information indicating a phase changing method to which a received signal is subjected, a demodulator that demodulates the received signal based on the information indicating the phase changing method, and a decoder that performs error correction decoding on a plurality of reception values generated by the demodulator. When the plurality of reception values is values encoded by a first coding scheme, the decoder applies a first decoding scheme corresponding to the first coding scheme, to the plurality of reception values. When the plurality of reception values is values encoded by a second coding scheme, the decoder applies depuncturing processing to the plurality of reception values, and applies a second decoding scheme corresponding to the second coding scheme, to a plurality of values obtained after the depuncturing processing. The first coding scheme is a coding scheme performed at a first coding rate for forming a generated first codeword into a first encoded sequence by using a first parity check matrix. The second coding scheme is a coding scheme performed at a second coding rate different from the first coding rate and obtained after puncturing processing, for generating a second encoded sequence by performing the puncturing processing on a generated second codeword by using a second parity check matrix different from the first parity check matrix. Then, a number of bits of the first encoded sequence is equal to a number of bits of the second encoded sequence.

FIG. 1 illustrates an example of a configuration of a system which includes transmitter 100 and receiver 150, and which uses radio waves. Note that FIG. 1 illustrates the system which uses radio waves, but the system is not limited thereto and may be a system which uses cables (coaxial cables, cables, light or the like).

Encoder 103 receives an input of information 101 and control information 102, performs error correction coding based on information of a code contained in control information 102 and used for the error correction coding by a transmitter, such as information of a coding rate and a code length (block length), and outputs data 104 obtained after the error correction coding.

Puncturer 105 receives an input of control information 102 and data 104 obtained after the error correction coding, determines whether or not to puncture data 104 obtained after the error correction coding (whether or not to delete part of a bit sequence) based on the information of the code contained in control information 102 and used for the error correction coding by the transmitter, such as information of a coding rate and a code length (block length), and outputs data 106.

Interleaver 107 receives an input of control information 102 and data 106, rearranges data based on information contained in control information 102 and related to an interleaving method, and outputs rearranged data 108.

Mapper 109 receives an input of control information 102 and rearranged data 108, performs mapping based on information contained in control information 102 and related to a modulating method, and outputs baseband signal 110.

Radio unit 112 receives an input of control information 102, baseband signal 110 and pilot signal 111, and generates a frame by performing processing such as inserting a control information symbol used by a receiver to modulate from control information 102 (including information related to a modulating method, an error correction code method or the like), a pilot symbol and the like into a data symbol. Moreover, radio unit 112 performs signal processing based on control information 102 (for example, when OFDM (Orthogonal Frequency Division Multiplexing) is used, signal processing based on the OFDM is performed, and when a space-time code or an MIMO (Multiple Input-Multiple-Output) method is used, signal processing based on the space-time code or the MIMO method, or processing such as frequency conversion, band limitation and amplification is performed), and outputs transmission signal 113. Transmission signal 113 is output as a radio wave from antenna 114 (note that a number of antennas described is 2, but is not limited thereto).

FIG. 1 illustrates an example of a configuration of receiver 150 which receives a modulated signal transmitted by transmitter 100.

Radio unit 153 performs processing such as frequency conversion on received signal 152 received at antenna 151, and outputs baseband signal 154.

Synchronizer 155 receives an input of baseband signal 154, performs processing for frequency synchronization and time synchronization by using a pilot symbol, a preamble or the like contained in a baseband signal, and outputs synchronization signal 156.

Channel estimator 157 receives an input of baseband signal 154, performs channel estimation by using a pilot symbol, a preamble or the like contained in a baseband signal, and outputs channel estimation signal 15.

Control information demodulator 159 receives an input of baseband signal 154, demodulates a control information symbol contained in the baseband signal, and outputs control information signal 160.

Demodulator 161 receives an input of baseband signal 154, synchronization signal 156, channel estimation signal 158 and control information signal 160, determines, for example, a log likelihood ratio of each bit of a data symbol contained in baseband signal 154 by using synchronization signal 156 and channel estimation signal 158 based on information contained in control information signal 160 and related to a transmission method such as a modulating method, and outputs log likelihood ratio signal 162.

Deinterleaver 163 receives an input of control information signal 160 and log likelihood ratio signal 162, rearranges order of log likelihood ratios based on information contained in control information signal 160 and related to an interleaving method, and outputs rearranged log likelihood ratio signal 164.

Insertion unit 165 receives an input of control information signal 160, and determines whether or not the transmitter has performed puncturing (whether or not the transmitter has deleted part of a bit sequence) based on information of a block length (code length) and a coding rate of an error correction code in control information signal 160.

When it is determined that the "transmitter has performed puncturing," insertion unit 165 inserts into rearranged log likelihood ratio signal 164 a log likelihood ratio (for example, a value of "0") corresponding to a bit punctured (deleted) by the transmitter.

When it is determined that the "transmitter has not performed puncturing," insertion unit 165 does not perform the above-described insertion of the log likelihood ratio.

Then, insertion unit 165 outputs second log likelihood ratio signal 166.

Decoder 167 receives an input of control information signal 160 and second log likelihood ratio signal 166, performs error correction decoding based on information contained in the control information signal and related to an error correction code, and outputs received data 168. Note that according to the present disclosure, since an LDPC code is used, belief propagation (BP) decoding (for example, sum-product decoding, min-sum decoding and Laired BP decoding) is performed based on a parity check matrix.

Figure 2:
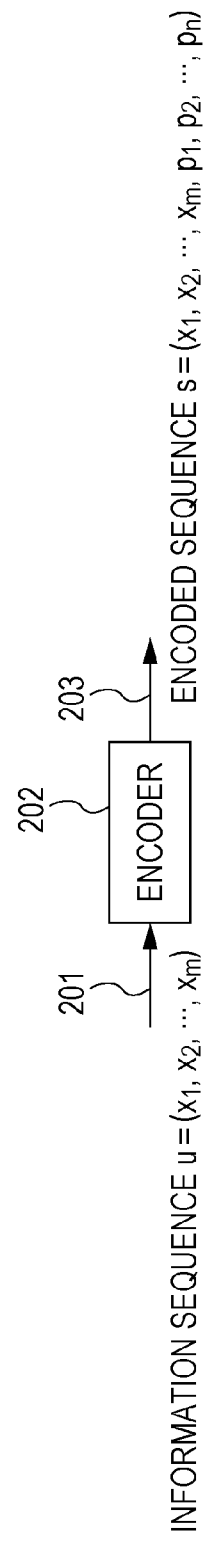
FIG. 2 is a view illustrating an example of a configuration of an encoder.

The LDPC code will be described. FIG. 2 illustrates a configuration of the encoder. When an information sequence is $u=(x_1, x_2, \ldots, x_m)$ (201), an encoded sequence is $s=(x_1, x_2, \ldots x_m, p_1, p_2, \ldots, p_n)$ (203) and a parity check matrix is H, the following equation holds (m is a natural number, and n is a natural number).

$$Hs^T = 0$$

Encoder 202 uses a relationship of the above-described equation to receive an input of information sequence $u=(x_1, x_2, \ldots, x_m)$, and generates and outputs encoded sequence $s=(x_1, x_2, \ldots, x_m, p_1, p_2, \ldots, p_n)$. Note that coding rate $R=m/(m+n)$ holds. Note that $(p_1, p_2, \ldots, p_n)$ will be referred to as a parity sequence.

Hence, the transmitter transmits a total of m+n bits $(x_1, x_2, \ldots, x_m, p_1, p_2, \ldots, p_n)$ as one encoded block.

In this case, a number of rows of parity check matrix H is n, and a number of columns is m+n.

Note that a case where encoding is performed as in FIG. 2 will be referred to as an "LDPC coding scheme which does not perform puncturing."

Figure 3:
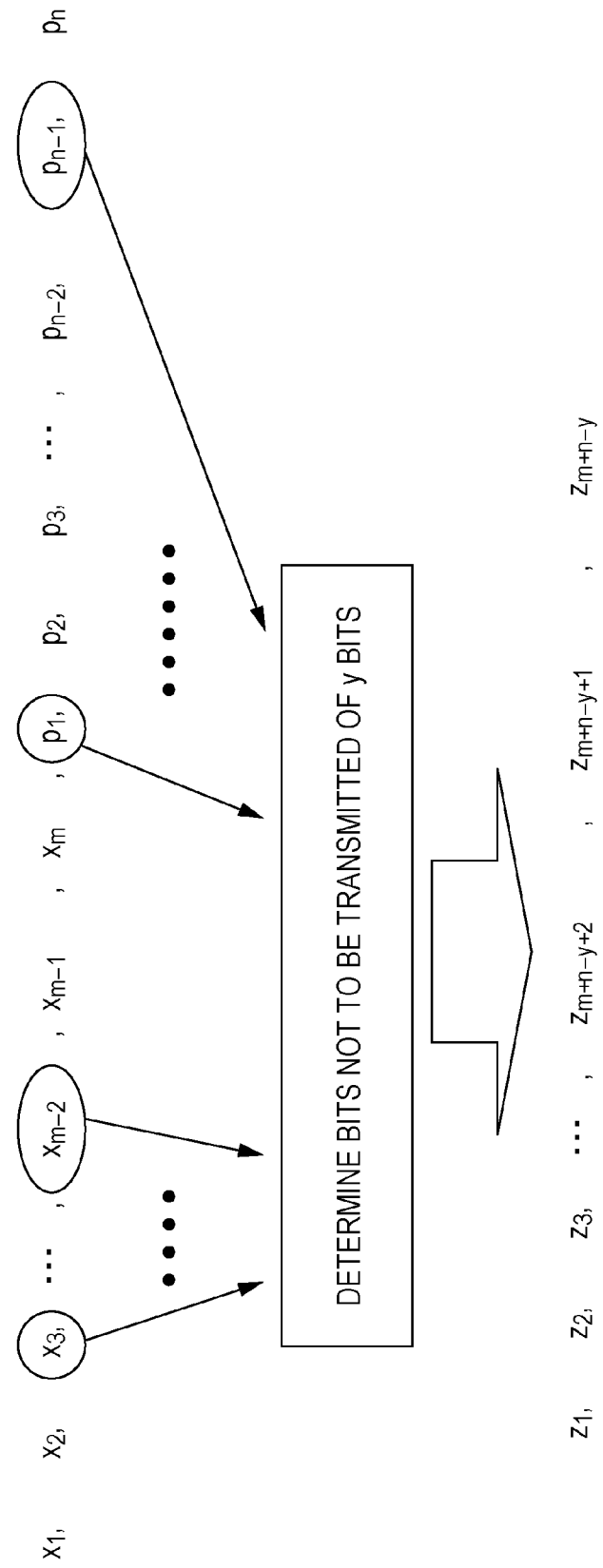
FIG. 3 is a view illustrating an example of an operation of the transmitter performed when puncturing is used.

Next, an LDPC code using puncturing will be described. The transmitter determines bits not to be transmitted of y bits in encoded sequence $s=(x_1, x_2, \ldots, x_m, p_1, p_2, \ldots, p_n)$ in the above-described LDPC code, and the transmitter transmits a sequence of m+n−y bits other than the determined bits. FIG. 3 illustrates a specific example of the LDPC code using puncturing.

In FIG. 3, for example, the transmitter selects a total of y bits of "$x_3, \ldots, x_{m-2}, p_1, \ldots, p_{n-1}$," determines not to transmit these y bits, and transmits sequence of the total of m+n−y bits, $z_1, z_2, z_3, \ldots, z_{m+n-y+2}, z_{m+n-y+1}, z_{m+n-y}$, other than the bits determined not to be transmitted.

Note that in an example in FIG. 3, the y bits not to be transmitted are selected from both of an information sequence and a parity sequence, but are not limited thereto and may be selected only from an information sequence or may be selected only from a parity sequence. That is, the y bits not to be transmitted may be selected from an encoded sequence in any way.

Hence, the transmitter transmits the total of m+n−y bits of $(z_1, z_2, z_3, \ldots, z_{m+n-y+2}, z_{m+n-y+1}, z_{m+n-y})$ as one encoded block.

Note that here, the above-described method will be referred to as an "LDPC coding scheme using puncturing."

Figure 4:
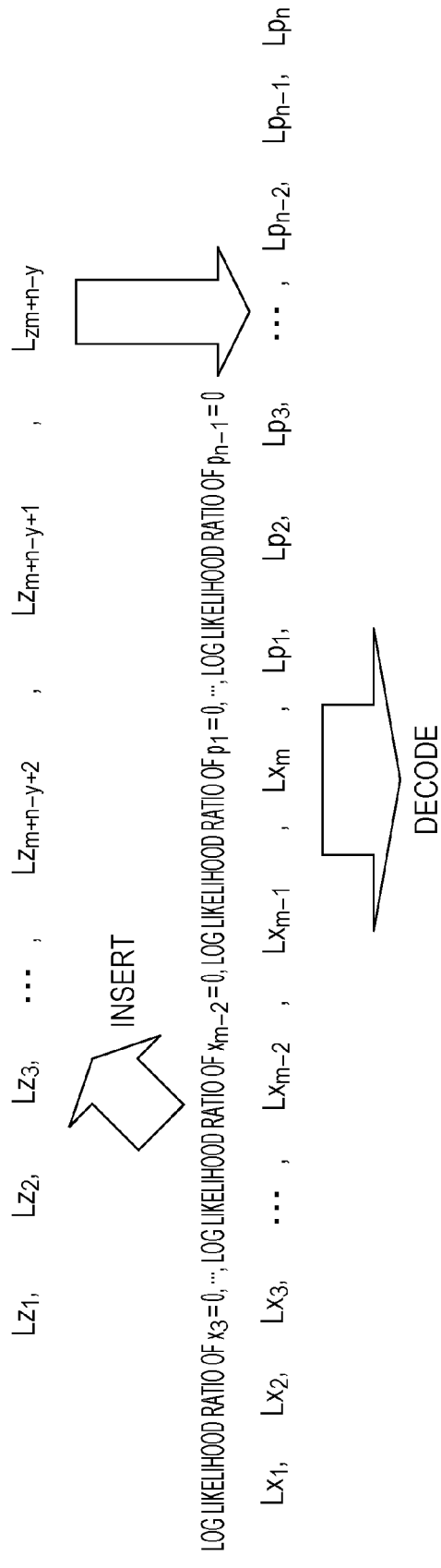
FIG. 4 is a view illustrating an example of an operation of the receiver performed when puncturing is used.

FIG. 4 illustrates an example of an operation example of the receiver performed when the transmitter transmits data as illustrated in FIG. 3.

The receiver receives sequence $z_1, z_2, z_3, \ldots, z_{m+n-y+2}, z_{m+n-y+1}, z_{m+n-y}$, and determines log likelihood ratios of these bits as $Lz_1, Lz_2, Lz_3, \ldots, Lz_{m+n-y+2}, Lz_{m+n-y+1}, Lz_{m+n-y}$.

As illustrated in FIG. 4, the receiver sets to "0 (zero)" the log likelihood ratio of each bit of the total of y bits of the bits that the transmitter has not transmitted "$x_3, \ldots, x_{m-2}, p_1, \ldots, p_{n-1}$." Therefore, the receiver inserts a "log likelihood ratio of $x_3 =, \ldots$, a log likelihood ratio of $x_{m-2} = 0$, a log likelihood ratio of $p_1 = 0, \ldots$, a log likelihood ratio of $p_{n-1} = 0$." Hence, log likelihood ratios $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$ of respective bits of $x_1, x_2, x_3, \ldots, x_{m-2}, x_{m-1}, x_m, p_1, p_2, p_3, \ldots, p_{n-2}, p_{n-1}, p_n$ are obtained. Then, the receiver performs BP decoding by using $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$, and obtains received data.

Next, a case where the transmitter supports α bits and β bits as a number of bits of one encoded block for coding rate R=γ. Note that α and β are natural numbers, and α<β holds.

In a case of the "LDPC coding scheme using puncturing," an LDPC code of a code length (block length) of α+v bits (where v is a natural number) and coding rate q (where q<γ) is used for coding rate R=γ and the α bits of one encoded block, and subsequently puncturing is performed. Note that this method will be referred to as "method #1."

Similarly, in a case of the "LDPC coding scheme using puncturing," an LDPC code of a code length (block length) of β+u bits (where u is a natural number) and coding rate q (where q<γ) is used for coding rate R=γ and the β bits of one encoded block, and subsequently puncturing is performed. Note that this method will be referred to as "method #2."

By contrast with this, in a case of the "LDPC coding scheme which does not perform puncturing," an LDPC code of a code length (block length) of the α bits and coding rate γ is used for coding rate R=γ and the α bits of one encoded block. Note that this method will be referred to as "method #3."

Similarly, in a case of the "LDPC coding scheme which does not perform puncturing," an LDPC code of a code length (block length) of the β bits and coding rate γ is used for coding rate R=γ and the β bits of one encoded block. Note that this method will be referred to as "method #4."

Under a condition that a relationship of α<β holds, discussion will be made.

In this case, when the number of bits of one encoded block is the α bits, there is a case where "method #1" provides higher data reception quality than data reception quality of "method #3."

On the other hand, when the number of bits of one encoded block is β, there is a case where "method #4" provides higher data reception quality than data reception quality of "method #2."

A reason for this will be described below.

In a case of "method #1," an LDPC code having a code length (block length) of a+v bits that are larger than α is used in order to realize the number of bits of one encoded block of the α bits. Here, in a case of α<β and small a, a degree of contribution made by an added value of v in the code length (block length) of the α+v bits is large. For this reason, there is a case where use of "method #1" can provide high data reception quality as compared to use of the LDPC code of the code length (block length) of the α bits.

On the other hand, in a case of "method #2," an LDPC code having a code length (block length) of β+u bits that are larger than β is used in order to realize the number of bits of one encoded block of the β bits. Here, in a case of α<β and large β, a degree of contribution made by an added value of u in the code length (block length) of the β+u bits is small, and puncturing causes large deterioration. Therefore, there is a case where use of an LDPC code having the code length (block length) of the β bits, that is, "method #4" provides higher data reception quality than data reception quality of "method #2."

However, data reception quality depends on specific values of α and β. (Moreover, the values of α and β are likely to change depending on a coding rate.) A specific example will be described below.

FIG. 5 is an example illustrating which one of "method #A" and "method #B" is used for number of bits z and a coding rate of one encoded block. Note that in a case of "method #A," a coding rate means a coding rate obtained after puncturing (obtained after bits not to be transmitted are deleted) instead of a coding rate of the LDPC code.

In the example in FIG. 5, in a case of one encoded block z=8100 bits, "method #A" realizes all coding rates 5/15, 6/15, 7/15, 8/15, 9/15, 10/15, 11/15, 12/15 and 13/15.

Then, in a case of one encoded block z=16200 bits, "method #A" realizes all coding rates 5/15, 6/15, 7/15, 8/15, 9/15, 10/15, 11/15, 12/15 and 13/15.

In a case of one encoded block z=64800 bits, "method #B" realizes all coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).) In this case, there are a and b satisfying one of the following conditions.

Condition 5-1: An LDPC code that is a base of "method #A in a case of coding rate a" and an LDPC code that is a base of "method #A in a case of coding rate b" are different codes.

Condition 5-2: A parity check matrix of an LDPC code that is a base of "method #A in a case of coding rate a" and a parity check matrix of an LDPC code that is a base of "method #A in a case of coding rate b" are different.

Condition 5-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 5-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver set a coding rate from coding rates illustrated in FIG. 6, and select one encoded block from the number of bits of one encoded block illustrated in FIG. 6.

FIG. 6 is an example illustrating which one of "method #A" and "method #B" is used for number of bits z and a coding rate of one encoded block. Note that in a case of "method #A," a coding rate means a coding rate obtained after puncturing (obtained after bits not to be transmitted are deleted) instead of a coding rate of the LDPC code.

In the example in FIG. 6, in a case of one encoded block z=8100 bits, "method #A" realizes all coding rates 5/15, 6/15, 7/15, 8/15, 9/15, 10/15, 11/15, 12/15 and 13/15.

Then, in a case of one encoded block z=16200 bits, "method #B" realizes all coding rates 5/15, 6/15, 7/15, 8/15, 9/15, 10/15, 11/15, 12/15 and 13/15.

In a case of one encoded block z=64800 bits, "method #B" realizes all coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).) In this case, there are a and b satisfying one of the following conditions.

Condition 6-1: An LDPC code that is a base of "method #A in a case of coding rate a" and an LDPC code that is a base of "method #A in a case of coding rate b" are different codes.

Condition 6-2: A parity check matrix of an LDPC code that is a base of "method #A in a case of coding rate a" and a parity check matrix of an LDPC code that is a base of "method #A in a case of coding rate b" are different.

Condition 6-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 6-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver set a coding rate from coding rates illustrated in FIG. 7, and select one encoded block from the number of bits of one encoded block illustrated in FIG. 7.

FIG. 7 is an example illustrating which one of "method #A" and "method #B" is used for number of bits z and a coding rate of one encoded block. Note that in a case of "method #A," a coding rate means a coding rate obtained after puncturing (obtained after bits not to be transmitted are deleted) instead of a coding rate of the LDPC code.

In the example in FIG. 7, when one encoded block z is 1000 bits or more and 9000 bits or less, "method #A" realizes all coding rates 5/15, 6/15, 7/15, 8/15, 9/15, 10/15, 11/15, 12/15 and 13/15.

Then, when one encoded block z is 10000 bits or more and 20000 bits or less, "method #A" realizes all coding rates 5/15, 6/15, 7/15, 8/15, 9/15, 10/15, 11/15, 12/15 and 13/15.

When one encoded block z is 50000 bits or more and 70000 bits or less, "method #B" realizes all coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).) In this case, there are a and b satisfying one of the following conditions.

Condition 7-1: An LDPC code that is a base of "method #A in a case of coding rate a" and an LDPC code that is a base of "method #A in a case of coding rate b" are different codes.

Condition 7-2: A parity check matrix of an LDPC code that is a base of "method #A in a case of coding rate a" and a parity check matrix of an LDPC code that is a base of "method #A in a case of coding rate b" are different.

Condition 7-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 7-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver set a coding rate from coding rates illustrated in FIG. 8, and select one encoded block from the number of bits of one encoded block illustrated in FIG. 8.

FIG. 8 is an example illustrating which one of "method #A" and "method #B" is used for number of bits z and a coding rate of one encoded block. Note that in a case of "method #A," a coding rate means a coding rate obtained after puncturing (obtained after bits not to be transmitted are deleted) instead of a coding rate of the LDPC code.

In the example in FIG. 8, when number of bits z of one encoded block is 1000 bits or more and 9000 bits or less, "method #A" realizes all coding rates 5/15, 6/15, 7/15, 8/15, 9/15, 10/15, 11/15, 12/15 and 13/15.

Then, when number of bits z of one encoded block is 10000 bits or more and 20000 bits or less, "method #B" realizes all coding rates 5/15, 6/15, 7/15, 8/15, 9/15, 10/15, 11/15, 12/15 and 13/15.

When one encoded block z is 50000 bits or more and 70000 bits or less, "method #B" realizes all coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).) In this case, there are a and b satisfying one of the following conditions.

Condition 8-1: An LDPC code that is a base of "method #A in a case of coding rate a" and an LDPC code that is a base of "method #A in a case of coding rate b" are different codes.

Condition 8-2: A parity check matrix of an LDPC code that is a base of "method #A in a case of coding rate a" and a parity check matrix of an LDPC code that is a base of "method #A in a case of coding rate b" are different.

Condition 8-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 8-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver select one encoded block from the number of bits of one encoded block illustrated in FIG. 9. Note that a coding rate can also be set.

FIG. 9 is an example illustrating which one of "method #A" and "method #B" is used for number of bits z of one encoded block. Note that in a case of "method #A," a coding rate means a coding rate obtained after puncturing (obtained after bits not to be transmitted are deleted) instead of a coding rate of the LDPC code.

In the example in FIG. 9, when one encoded block z is less than 20000 bits, "method #A" is used.

Then, when one encoded block z is 20000 bits or more, "method #B" is used.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).)

In this case, there are a and b satisfying one of the following conditions.

Condition 9-1: An LDPC code that is a base of "method #A in a case of coding rate a" and an LDPC code that is a base of "method #A in a case of coding rate b" are different codes.

Condition 9-2: A parity check matrix of an LDPC code that is a base of "method #A in a case of coding rate a" and a parity check matrix of an LDPC code that is a base of "method #A in a case of coding rate b" are different.

Condition 9-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 9-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver select one encoded block from the number of bits of one encoded block illustrated in FIG. 10. Note that a coding rate can also be set.

FIG. 10 is an example illustrating which one of "method #A" and "method #B" is used for number of bits z of one encoded block. Note that in a case of "method #A," a coding rate means a coding rate obtained after puncturing (obtained after bits not to be transmitted are deleted) instead of a coding rate of the LDPC code.

In the example in FIG. 10, when one encoded block z is less than 10000 bits, "method #A" is used.

Then, when one encoded block z is 10000 bits or more, "method #B" is used.

In this case, when a number of bits of one encoded block is a certain value, "method #A in a case of coding rate a" and "method #A in a case of coding rate b" (where a≠b) will be discussed. (Here, coding rate a and coding rate b are both coding rates obtained after puncturing (obtained after bits not to be transmitted are deleted).) In this case, there are a and b satisfying one of the following conditions.

Condition 10-1: An LDPC code that is a base of "method #A in a case of coding rate a" and an LDPC code that is a base of "method #A in a case of coding rate b" are different codes.

Condition 10-2: A parity check matrix of an LDPC code that is a base of "method #A in a case of coding rate a" and a parity check matrix of an LDPC code that is a base of "method #A in a case of coding rate b" are different.

Condition 10-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 10-4: A number of columns of a parity check matrix of an LDPC code that is a base of "method #A in a case of coding rate a" and a number of columns of a parity check matrix of an LDPC code that is a base of "method #A in a case of coding rate b" are different.

Figure 11:
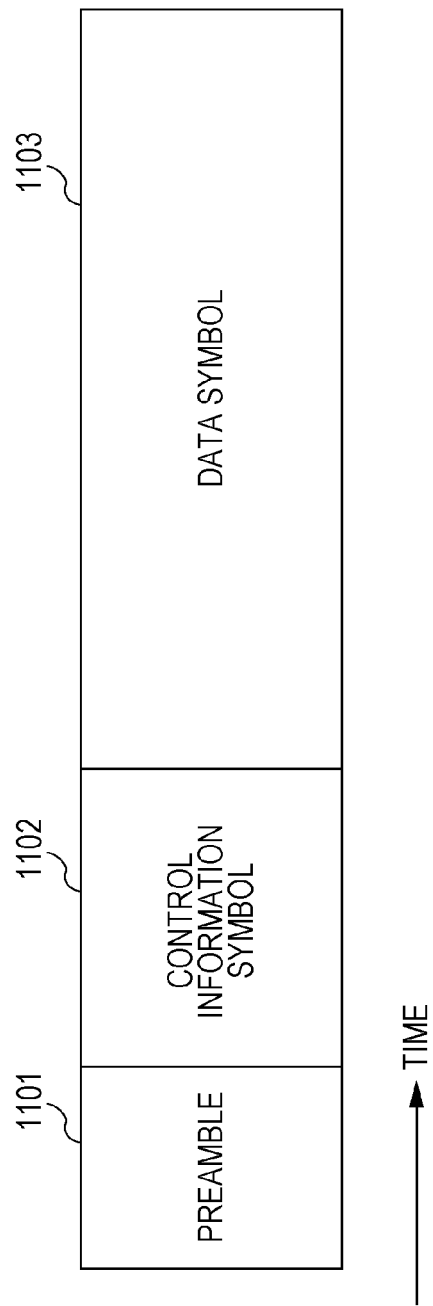
FIG. 11 is a view illustrating an example of a configuration of a frame transmitted by the transmitter.

FIG. 11 is a view illustrating an example of a configuration of a frame transmitted by the transmitter, and a horizontal axis indicates time. FIG. 11 illustrates an example where a transmission method which uses, for example, a single carrier is used. However, when a multi-carrier method such as OFDM (Orthogonal Frequency Division Multiplexing) is used, there is a plurality of carriers in a frequency direction, and there are symbols in a carrier direction. Moreover, when a space-time code or an MIMO (Multiple Input-Multiple-Output) method is used, there is a frame per stream.

FIG. 11 illustrates preamble 1101, and for example, a PSK (Phase Shift Keying) modulated symbol known in the transmitter and the receiver is used. The receiver performs frequency offset estimation, frequency synchronization, time synchronization, frame synchronization, channel estimation, signal detection and the like by using this symbol.

Control information symbol 1102 includes, for example, information of an error correction code method (a code length, and a block length and a coding rate of one encoded block) used for generating a data symbol, information of a modulating method used for generating a data symbol, and information related to the transmission method. The receiver obtains the control information by demodulating this symbol, and, consequently, can perform demodulation and error correction decoding of the data symbol.

Moreover, whether or not to insert a log likelihood ratio described with reference to FIG. 1 is controlled based on the information obtained by control information symbol 1102.

Data symbol 1103 is generated based on an error correction code method (a code length, and a block length and a coding rate of one encoded block), a modulating method and a transmission method selected by the transmitter. Note that although not illustrated in FIG. 11, a symbol such as a pilot symbol may be inserted in symbols described as control information symbol 1102 and data symbol 1103.

Hence, a frame configuration is not limited to the configuration in FIG. 11.

The transmitter can select a value of one encoded block of data to be transmitted from a plurality of values and establishes a threshold. When one encoded block of data to be transmitted by the transmitter is the threshold or more, the transmitter selects the "LDPC coding scheme which does not perform puncturing," and when the one encoded block is less than the threshold, the transmitter selects the "LDPC coding scheme using puncturing" to transmit data. Consequently, the receiver can obtain an effect of obtaining high data reception quality at any value of one encoded block.

Next, a case where the transmitter supports coding rates $\alpha$, $\beta$ and $\gamma$ for number of bits $\delta$ of one encoded block will be discussed. Note that $\alpha$, $\beta$ and $\gamma$ are values larger than 0 and smaller than 1, and $\alpha<\beta<\gamma$ holds. Note that a coding rate in a case of the "LDPC coding scheme using puncturing" means a coding rate obtained after puncturing (obtained after bits not to be transmitted are deleted).

In a case of the "LDPC coding scheme using puncturing," an LDPC code of a code length (block length) of $\delta+u$ bits (where u is a natural number) and coding rate a (where $a<\alpha$) is used for coding rate $R=\alpha$ and the $\delta$ bits of one encoded block, and subsequently puncturing is performed. Note that this method will be referred to as "method $1."

Similarly, in a case of the "LDPC coding scheme using puncturing," an LDPC code of a code length (block length) of $\delta+v$ bits (where v is a natural number) and coding rate b (where $b<\beta$) is used for coding rate $R=\beta$ and the $\delta$ bits of one encoded block, and subsequently puncturing is performed. Note that this method will be referred to as "method $2."

In a case of the "LDPC coding scheme using puncturing," an LDPC code of a code length (block length) of $\delta+w$ bits (where w is a natural number) and coding rate c (where $c<\gamma$) is used for coding rate $R=\gamma$ and the $\delta$ bits of one encoded block, and subsequently puncturing is performed. Note that this method will be referred to as "method $3."

By contrast with this, in a case of the "LDPC coding scheme which does not perform puncturing," an LDPC code of a code length (block length) of $\delta$ bits and coding rate a is used for coding rate $R=\alpha$ and the $\delta$ bits of one encoded block. Note that this method will be referred to as "method $4."

Similarly, in a case of the "LDPC coding scheme which does not perform puncturing," an LDPC code of a code length (block length) of the $\delta$ bits and coding rate $\beta$ is used for coding rate $R=\beta$ and the $\delta$ bits of one encoded block. Note that this method will be referred to as "method $5."

In a case of the "LDPC coding scheme which does not perform puncturing," an LDPC code of a code length (block length) of the $\delta$ bits and coding rate $\gamma$ is used for coding rate $R=\gamma$ and the $\delta$ bits of one encoded block. Note that this method will be referred to as "method $6."

Under a condition that a relationship of $\alpha<\beta<\gamma$ holds, discussion will be made.

In this case, when the coding rate is as small as $\alpha$, there is a case where "method $4" provides higher data reception quality than data reception quality of "method $1."

When the coding rate is an intermediate value like $\beta$, there is a case where "method $2" provides higher data reception quality than data reception quality of "method $5."

When the coding rate is as large as $\gamma$, there is a case where "method $6" provides higher data reception quality than data reception quality "of method $3."

A reason for this will be described below.

Performance of an LDPC code of a low coding rate tends to have an expanding difference from Shannon limits. Hence, in a case of a small (low) coding rate such as coding rate a and in a case of "method $1," a coding rate of a base LDPC code is smaller than a. For this reason, a difference from Shannon limits is large and, when puncturing is performed, it is difficult to obtain good data reception quality.

In a case of an intermediate coding rate such as coding rate $\beta$ and in a case of "method $2," there is a large difference between a Shannon limit of the coding rate of the base LDPC code and a Shannon limit of the punctured coding rate. For this reason, performance of the base LDPC code makes contribution, and "method $2" is highly likely to provide high data reception quality.

In a case of a high coding rate such as coding rate $\gamma$ and in a case of "method $3," there is a small difference between a Shannon limit of the coding rate of the base LDPC code and the Shannon limit of the punctured coding rate. For this reason, "method $3" is likely to have difficulty in obtaining high data reception quality. However, as compared to "method $6," "method $3" has an advantage of being capable of using a sparse parity check matrix. Consequently, "method $3" is likely to provide good reception quality.

However, data reception quality depends on specific values of $\alpha$, $\beta$ and $\gamma$. (Moreover, the values of $\alpha$, $\beta$ and $\gamma$ are likely to change depending on a value of one encoded block.) A specific example will be described below.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver select a coding rate from coding rates illustrated in FIG. 12. Note that the number of bits of one encoded block can also be set.

FIG. 12 is an example illustrating which one of "method #A" and "method #B" is used when number of bits z of one encoded block is set to a certain value. Note that in a case of "method #A," a coding rate means a coding rate obtained after puncturing (obtained after bits not to be transmitted are deleted) instead of a coding rate of the LDPC code.

In FIG. 12, e and f are larger than 0 and smaller than 1, and e<f holds.

In the example in FIG. 12, when the coding rate is less than f in a case of one encoded block z (z is a natural number), "method #B" is used.

Then, when the coding rate is e or more and f or less in a case of one encoded block z (z is a natural number), "method #A" is used.

Then, when the coding rate is larger than f in a case of one encoded block z (z is a natural number), "method #B" is used.

There are a and b satisfying the coding rates of e or more and f or less, and the transmitter can select "method #A in a case of coding rate a" and "method #A in a case of coding rate b." (Here, coding rate a and coding rate b are both coding rates obtained after puncturing (obtained after bits not to be transmitted are deleted).) (Here, a≠b holds).

In this case, there are a and b satisfying one of the following conditions.

Condition 12-1: An LDPC code that is a base of "method #A in a case of coding rate a" and an LDPC code that is a base of "method #A in a case of coding rate b" are different codes.

Condition 12-2: A parity check matrix of an LDPC code that is a base of "method #A in a case of coding rate a" and a parity check matrix of an LDPC code that is a base of "method #A in a case of coding rate b" are different.

Condition 12-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 12-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be one or more types of coding rates which are less than f, there may be two or more types of coding rates which are e or more and f or less and there may be one or more types of coding rates which are larger than f.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver select a coding rate from coding rates illustrated in FIG. 13. Note that the number of bits of one encoded block can also be set.

FIG. 13 is an example illustrating which one of "method #A" and "method #B" is used for number of bits z of one encoded block. Note that in a case of "method #A," a coding rate means a coding rate obtained after puncturing (obtained after bits not to be transmitted are deleted) instead of a coding rate of the LDPC code.

In FIG. 13, g is larger than 0 and is smaller than 1.

In the example in FIG. 13, when the coding rate is less than g in a case of one encoded block z (z is a natural number), "method #B" is used.

Then, when the coding rate is g or more in a case of one encoded block z (z is a natural number), "method #A" is used.

There are a and b satisfying a coding rate of g or more, and the transmitter can select "method #A in a case of coding rate a" and "method #A in a case of coding rate b." (Here, coding rate a and coding rate b are both coding rates obtained after puncturing (obtained after bits not to be transmitted are deleted).) (Here, a b holds.) In this case, there are a and b satisfying one of the following conditions.

Condition 13-1: An LDPC code that is a base of "method #A in a case of coding rate a" and an LDPC code that is a base of "method #A in a case of coding rate b" are different codes.

Condition 13-2: A parity check matrix of an LDPC code that is a base of "method #A in a case of coding rate a" and a parity check matrix of an LDPC code that is a base of "method #A in a case of coding rate b" are different.

Condition 13-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 13-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be one or more types of coding rates which are less than g, and two or more types of coding rates which are g or more.

A number of bits of one encoded block is z bits. Note that z is a natural number.

The z bits of one encoded block are realized by using the "LDPC coding scheme using puncturing." Note that this method will be referred to as "method #A."

The z bits of one encoded block are realized by using the "LDPC coding scheme which does not perform puncturing." Note that this method will be referred to as "method #B."

The transmitter and the receiver select a coding rate from coding rates illustrated in FIG. 14. Note that the number of bits of one encoded block can also be set.

FIG. 14 is an example illustrating which one of "method #A" and "method #B" is used for number of bits z of one encoded block. Note that in a case of "method #A," a coding rate means a coding rate obtained after puncturing (obtained after bits not to be transmitted are deleted) instead of a coding rate of the LDPC code.

In FIG. 14, his larger than 0 and is smaller than 1.

In the example in FIG. 14, when the coding rate is less than h in a case of one encoded block z (z is a natural number), "method #A" is used.

Then, when the coding rate is h or more in a case of one encoded block z (z is a natural number), "method #B" is used.

There are a and b satisfying a coding rate of less than h, and the transmitter can select "method #A in a case of coding rate a" and "method #A in a case of coding rate b."(Here, coding rate a and coding rate b are both coding rates obtained after puncturing (obtained after bits not to be transmitted are deleted).) (Here, a b holds.) In this case, there are a and b satisfying one of the following conditions.

Condition 14-1: An LDPC code that is a base of "method #A in a case of coding rate a" and an LDPC code that is a base of "method #A in a case of coding rate b" are different codes.

Condition 14-2: A parity check matrix of an LDPC code that is a base of "method #A in a case of coding rate a" and a parity check matrix of an LDPC code that is a base of "method #A in a case of coding rate b" are different.

Condition 14-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 14-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be two or more types of coding rates which are less than h, and one or more types of coding rates which are h or more.

Operations of the transmitter and the receiver are as described above with reference to FIGS. 1, 11 and the like.

The transmitter sets to a predetermined value a value of one encoded block of data to be transmitted, and establishes a threshold.

When the coding rate is the threshold or more, the transmitter selects the "LDPC coding scheme which does not perform puncturing," and when the coding rate is less than the threshold, the transmitter selects the "LDPC coding scheme using puncturing."

Alternatively, when the coding rate is the threshold or more, the transmitter selects the "LDPC coding scheme using puncturing," and when the coding rate is less than the threshold, the transmitter selects the "LDPC coding scheme which does not perform puncturing".

Consequently, the receiver can obtain an effect of obtaining high data reception quality at any coding rate.

Exemplary Embodiment A

The present exemplary embodiment will describe examples of configurations of the control information transmission method and transmitter according to the above-described exemplary embodiment, and configurations of the control information reception method and receiver according to the above-described exemplary embodiment.

FIG. 15 illustrates an example of parameters of an error correction code according to the present exemplary embodiment. A number of bits of one encoded block is z bits. Note that z is a natural number.

The z bits of one encoded block are realized by using an "LDPC coding scheme using puncturing." This method will be referred to as "method #A."

The z bits of one encoded block are realized by using an "LDPC coding scheme which does not perform puncturing." This method will be referred to as "method #B."

The z bits of one encoded block will be described supplementarily.

In a case of the "LDPC coding scheme using puncturing," coding of an LDPC code (LDPC block code) having a code length (block length) of z+γ bits (γ is a natural number) is performed, and data of the z+γ bits is obtained. Then, the γ bits are punctured (the γ bits not to be transmitted are determined), and data of the z bits to be transmitted is obtained. In a case of the "LDPC coding scheme using puncturing," the "z bits of one encoded block" means that "this data to be transmitted is of the z bits."

In a case of the "LDPC coding scheme which does not perform puncturing," coding of an LDPC code (LDPC block code) having a code length of z bits is performed, data of the z bits is obtained, and this data of the z bits is transmitted. The "z bits of one encoded block" means that "this data to be transmitted is of the z bits."

FIG. 15 is an example illustrating which one of "method #A" and "method #B" is used for number of bits z and a coding rate of one encoded block. Note that in a case of "method #A," a coding rate means a coding rate obtained after puncturing (obtained after bits not to be transmitted are deleted) instead of a coding rate of the LDPC code (instead of a coding rate obtained before puncturing).

In the example in FIG. 15, in a case of one encoded block z=16200 bits, "method #A" realizes coding rates 5/15, 6/15, 7/15 and 8/15, and "method #B" realizes 9/15, 10/15, 11/15, 12/15 and 13/15.

Then, in a case of one encoded block z=64800 bits, "method #B" realizes coding rates 5/15, 6/15, 7/15, 8/15, 9/15, 10/15, 11/15, 12/15 and 13/15.

Features in FIG. 15 are such that "when the transmitter and the receiver support number of bits x (x is a natural number) of one encoded block and number of bits y (y is a natural number) of one encoded block and when x>y holds, "method #B" is used at all coding rates in a case of number of bits x (x is a natural number) of one encoded block, and there are coding rates which adopt "method #A" in a case of number of bits y of one encoded block". Therefore, in FIG. 15, in a case of z=16200 bits, "method #A" is used at coding rates 5/15, 6/15, 7/15 and 8/15 (however, FIG. 15 is only an example, and, in a case of z=16200 bits, there only needs to be coding rates which adopt "method #A").

Moreover, as described above, FIG. 15 may be interpreted such that "when number of bits x (x is a natural number) of one encoded block and number of bits y (y is a natural number) of one encoded block are supported at a certain coding rate and when x>y holds, "method #B" is used in a case of number of bits x of one encoded block, and "method #A" is used in a case of number of bits y of one encoded block" (however, at another coding rate, "method #B" may be used in both the cases of number of bits x of one encoded block and number of bits y of one encoded block).

FIG. 16 is an example that illustrates which one of "method #A" and "method #B" is used for number of bits z and a coding rate of one encoded block, and that is different from FIG. 15. Note that in a case of "method #A," a coding rate means a coding rate obtained after puncturing (obtained after bits not to be transmitted are deleted) instead of a coding rate of the LDPC code (instead of a coding rate obtained before puncturing).

In the example in FIG. 16, when one encoded block z is 10000 bits or more and 20000 bits or less, "method #A" realizes coding rates 5/15, 6/15 and 7/15, and "method #B" realizes 8/15, 9/15, 10/15, 11/15, 12/15 and 13/15.

Then, when number of bits z of one encoded block is 50000 bits or more and 70000 bits or less, "method #B" realizes coding rates 5/15, 6/15, 7/15, 8/15, 9/15, 10/15, 11/15, 12/15 and 13/15.

As described above, features of FIG. 16 are such that "when number of bits x (x is a natural number) of one encoded block and number of bits y (y is a natural number) of one encoded block are supported at a certain coding rate and when x>y holds, "method #B" is used in a case of number of bits x of one encoded block, and "method #A" is used in a case of number of bits y of one encoded block" (however, at another coding rate, "method #B" may be used in both the cases of number of bits x of one encoded block and number of bits y of one encoded block).

Figure 17:
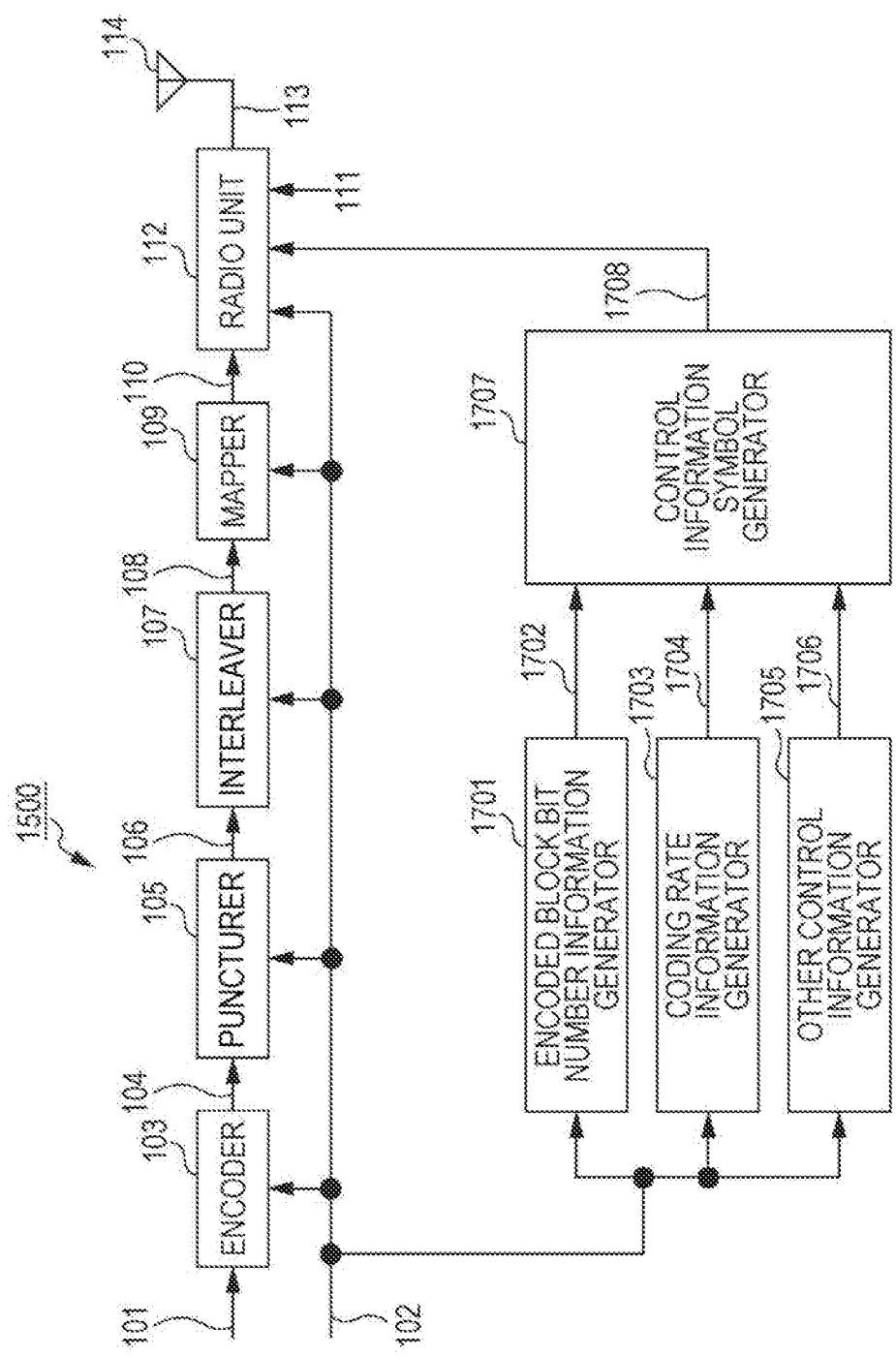
FIG. 17 is a view illustrating an example of a configuration of a transmitter.

FIG. 17 illustrates an example of a configuration of the transmitter, and elements which operate in the same way as those in FIG. 1 are assigned the same reference numerals in FIG. 17 and will not be described. Encoder 103 in FIG. 17 receives an input of information 101 and control information 102, and performs error correction coding processing based on FIG. 15 or 16.

For example, a case where the error correction coding processing is performed based on FIG. 15 will be described.

Control information 102 includes information of number of bits z of one encoded block of an error correction code (LDPC code), and information of a coding in error correction coding (a coding rate obtained after puncturing when puncturing is performed).

However, in a case of "method #A," a coding rate in error correction coding means a coding rate obtained after puncturing (obtained after bits not to be transmitted are deleted) instead of a coding rate of the LDPC code (instead of a coding rate obtained before puncturing). Then, in a case of "method #B," the coding rate in error correction coding means a coding rate of an LDPC code.

Therefore, for example, based on FIG. 15, encoder 103 receives an input of information 101 and control information 102. Encoder 103 performs error correction coding (including puncturing processing) on information 101 based on the information of number of bits z of one encoded block of the error correction code (LDPC code) contained in control information 102, and based on the information of the coding rate in error correction coding contained in control information 102. Encoder 103 outputs data 104 obtained after the error correction coding.

When the information of number of bits z of one encoded block of the error correction code (LDPC code) contained in control information 102 indicates z=16200 bits, and when the information of the coding rate in error correction coding indicates a coding rate 5/15, encoder 101 performs encoding according to "method #A" corresponding to the coding rate 5/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates z=16200 bits, and when the information of the coding rate in error correction coding indicates a coding rate 6/15, encoder 101 performs encoding according to "method #A" corresponding to the coding rate 6/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates z=16200 bits, and when the information of the coding rate in error correction coding indicates a coding rate 7/15, encoder 101 performs encoding according to "method #A" corresponding to the coding rate 7/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates z=16200 bits, and when the information of the coding rate in error correction coding indicates a coding rate 8/15, encoder 101 performs encoding according to "method #A" corresponding to the coding rate 8/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates z=16200 bits, and when the information of the coding rate in error correction coding indicates a coding rate 9/15, encoder 101 performs encoding according to "method #B" corresponding to the coding rate 9/15 (encoder 101 does not perform puncturing as described above).

When the information of number of bits z of one encoded block of the error correction code (LDPC code) contained in control information 102 indicates z=16200 bits, and when the information of the coding rate in error correction coding indicates a coding rate 10/15, encoder 101 performs encoding according to "method #B" corresponding to the coding rate 10/15 (encoder 101 does not perform puncturing as described above).

When the information of number of bits z of one encoded block of the error correction code (LDPC code) contained in control information 102 indicates z=16200 bits, and when the information of the coding rate in error correction coding indicates a coding rate 11/15, encoder 101 performs encoding according to "method #B" corresponding to the coding rate 11/15 (encoder 101 does not perform puncturing as described above).

When the information of number of bits z of one encoded block of the error correction code (LDPC code) contained in control information 102 indicates z=16200 bits, and when the information of the coding rate in error correction coding indicates a coding rate 12/15, encoder 101 performs encoding according to "method #B" corresponding to the coding rate 12/15 (encoder 101 does not perform puncturing as described above).

When the information of number of bits z of one encoded block of the error correction code (LDPC code) contained in control information 102 indicates z=16200 bits, and when the information of the coding rate in error correction coding indicates a coding rate 13/15, encoder 101 performs encoding according to "method #B" corresponding to the coding rate 13/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 5/15, encoder 101 performs encoding according to "method #B" corresponding to the coding rate 5/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 6/15, encoder 101 performs encoding according to "method #B" corresponding to the coding rate 6/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 7/15, encoder 101 performs encoding according to "method #B" corresponding to the coding rate 7/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 8/15, encoder 101 performs encoding according to "method #B" corresponding to the coding rate 8/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 9/15, encoder 101 performs encoding according to "method #B" corresponding to the coding rate 9/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 10/15, encoder 101 performs encoding according to "method #B" corresponding to the coding rate 10/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 11/15, encoder 101 performs encoding according to "method #B" corresponding to the coding rate 11/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 12/15, encoder 101 performs encoding according to "method #B" corresponding to the coding rate 12/15 (encoder 101 does not perform puncturing as described above).

When the information of number of bits z of one encoded block of the error correction code (LDPC code) contained in control information 102 indicates z=64800 bits, and when the information of the coding rate in error correction coding indicates a coding rate 13/15, encoder 101 performs encoding according to "method #B" corresponding to the coding rate 13/15 (encoder 101 does not perform puncturing as described above).

For example, based on FIG. 16, encoder 103 receives an input of information 101 and control information 102. Encoder 103 performs error correction coding (including puncturing processing) on information 101 based on the information of number of bits z of one encoded block of the error correction code (LDPC code) contained in control information 102, and based on the information of the coding rate in error correction coding contained in control information 102. Encoder 103 outputs data 104 obtained after the error correction coding.

When the information of number of bits z of one encoded block of the error correction code (LDPC code) contained in control information 102 indicates that "z is 10000 bits or more and 20000 bits or less," and when the information of the coding rate in error correction coding indicates a coding rate 5/15, encoder 101 performs encoding according to "method #A" corresponding to the coding rate 5/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates that "z is 10000 bits or more and 20000 bits or less," and when the information of the coding rate in error correction coding indicates a coding rate 6/15, encoder 101 performs encoding according to "method #A" corresponding to the coding rate 6/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates that "z is 10000 bits or more and 20000 bits or less," and when the information of the coding rate in error correction coding indicates a coding rate 7/15, encoder 101 performs encoding according to "method #A" corresponding to the coding rate 7/15 (as described above, encoder 101 performs encoding of an LDPC code, and performs puncturing (encoder 101 selects bits not to be transmitted and determines data to be transmitted)).

When the information of number of bits z of one encoded block of the error correction code (LDPC code) contained in control information 102 indicates that "z is 10000 bits or more and 20000 bits or less," and when the information of the coding rate in error correction coding indicates a coding rate 8/15, encoder 101 performs encoding according to "method #B" corresponding to the coding rate 8/15 (encoder 101 does not perform puncturing as described above).

When the information of number of bits z of one encoded block of the error correction code (LDPC code) contained in control information 102 indicates that "z is 10000 bits or more and 20000 bits or less," and when the information of the coding rate in error correction coding indicates a coding rate 9/15, encoder 101 performs encoding according to "method #B" corresponding to the coding rate 9/15 (encoder 101 does not perform puncturing as described above).

When the information of number of bits z of one encoded block of the error correction code (LDPC code) contained in control information 102 indicates that "z is 10000 bits or more and 20000 bits or less," and when the information of the coding rate in error correction coding indicates a coding rate 10/15, encoder 101 performs encoding according to "method #B" corresponding to the coding rate 10/15 (encoder 101 does not perform puncturing as described above).

When the information of number of bits z of one encoded block of the error correction code (LDPC code) contained in control information 102 indicates that "z is 10000 bits or more and 20000 bits or less," and when the information of the coding rate in error correction coding indicates a coding rate 11/15, encoder 101 performs encoding according to "method #B" corresponding to the coding rate 11/15 (encoder 101 does not perform puncturing as described above).

When the information of number of bits z of one encoded block of the error correction code (LDPC code) contained in control information 102 indicates that "z is 10000 bits or more and 20000 bits or less," and when the information of the coding rate in error correction coding indicates a coding rate 12/15, encoder 101 performs encoding according to "method #B" corresponding to the coding rate 12/15 (encoder 101 does not perform puncturing as described above).

When the information of number of bits z of one encoded block of the error correction code (LDPC code) contained in control information 102 indicates that "z is 10000 bits or more and 20000 bits or less," and when the information of the coding rate in error correction coding indicates a coding rate 13/15, encoder 101 performs encoding according to "method #B" corresponding to the coding rate 13/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 5/15, encoder 101 performs encoding according to "method #B" corresponding to the coding rate 5/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 6/15, encoder 101 performs encoding according to "method #B" corresponding to the coding rate 6/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 7/15, encoder 101 performs encoding according to "method #B" corresponding to the coding rate 7/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 8/15, encoder 101 performs encoding according to "method #B" corresponding to the coding rate 8/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 9/15, encoder 101 performs encoding according to "method #B" corresponding to the coding rate 9/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 10/15, encoder 101 performs encoding according to "method #B" corresponding to the coding rate 10/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 11/15, encoder 101 performs encoding according to "method #B" corresponding to the coding rate 11/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 12/15, encoder 101 performs encoding according to "method #B" corresponding to the coding rate 12/15 (encoder 101 does not perform puncturing as described above).

When the information of number of bits z of one encoded block of the error correction code (LDPC code) contained in control information 102 indicates that "z is 50000 bits or more and 70000 bits or less," and when the information of the coding rate in error correction coding indicates a coding rate 13/15, encoder 101 performs encoding according to "method #B" corresponding to the coding rate 13/15 (encoder 101 does not perform puncturing as described above).

Encoded block bit number information generator 1701 receives an input of control information 102. Encoded block bit number information generator 1701 extracts information of number of bits z of one encoded block of an error correction code (LDPC code) contained in control information 102. Encoded block bit number information generator 1701 outputs information 1702 of the number of bits of one encoded block for forming a control information symbol.

Coding rate information generator 1703 receives an input of control information 102. Coding rate information generator 1703 extracts information of a coding rate in error correction coding contained in control information 102 (a coding rate obtained after puncturing when puncturing is performed). Coding rate information generator 1703 outputs information 1704 of the coding rate in error correction coding for forming the control information symbol.

Other control information generator 1705 receives an input of control information 102. Other control information generator 1705 outputs control information 1706 for forming a control information symbol other than information of the number of bits of one encoded block for forming a control information symbol and information of a coding rate in error correction coding for forming a control information symbol.

Control information symbol generator 1707 receives an input of information 1702 of the number of bits of one encoded block, information 1704 of a coding rate in error correction coding, and control information 1706. Control information symbol generator 1707 performs processing such as error correction coding and mapping, and outputs control information symbol baseband signal 1708.

Radio unit 112 receives an input of control information 102, baseband signal 110, pilot signal 111 and control information symbol baseband signal 1708. Based on information related to a frame configuration and contained in control information 102, radio unit 112 generates and outputs transmission signal 113 which is based on a frame configuration (for example, when OFDM (Orthogonal Frequency Division Multiplexing) is used, processing such as inverse Fourier transform and frequency conversion is performed).

Figure 18:
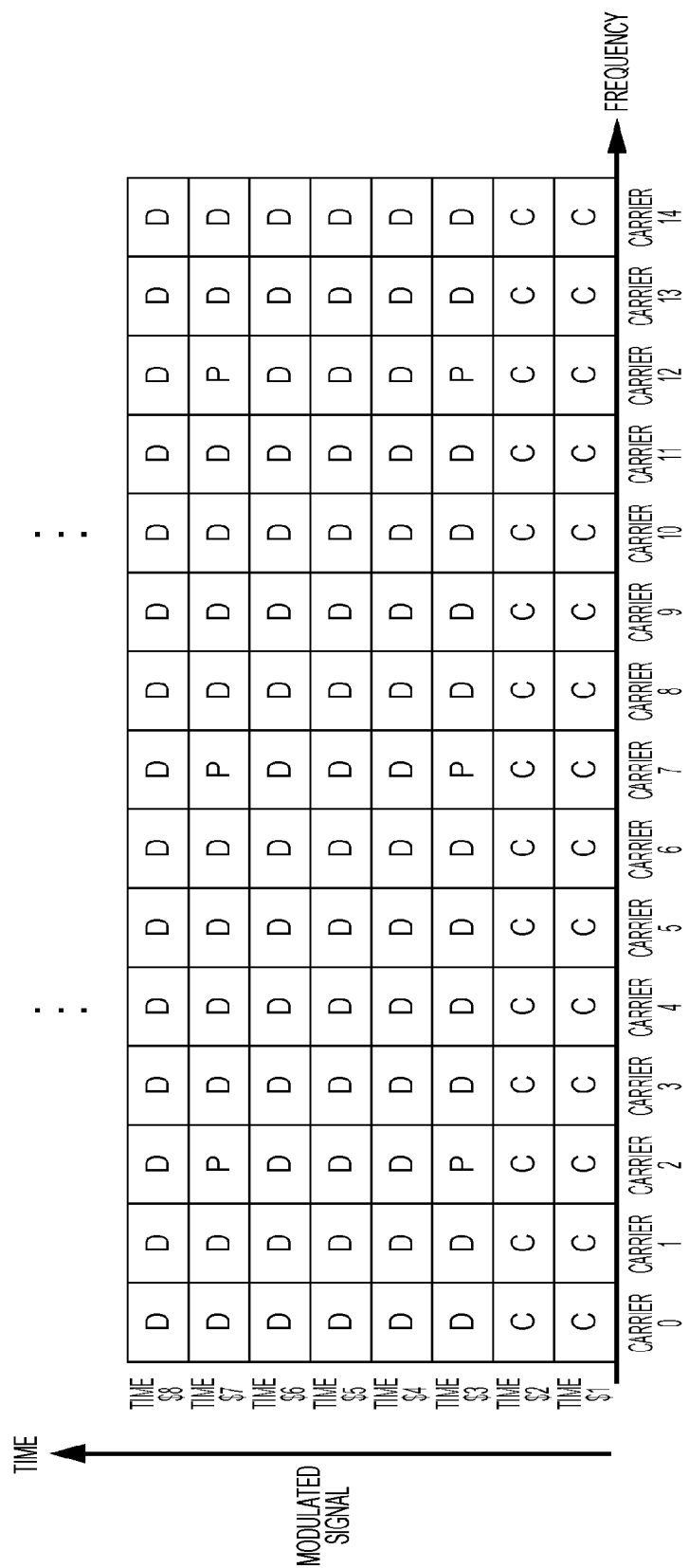
FIG. 18 is a view illustrating an example of a frame configuration of a modulated signal transmitted by the transmitter.

FIG. 18 illustrates an example of a frame configuration of a modulated signal transmitted by the transmitter in FIG. 17 (an example of a frame configuration in transmission of one modulated signal). In FIG. 18, a vertical axis indicates time, and a horizontal axis indicates a frequency. For example, in a case of a multi-carrier method such as OFDM (Orthogonal Frequency Division Multiplexing), since there is a plurality of carriers, it is assumed that there are symbols in carrier 0 to carrier 14. Then, in FIG. 18, time $1 to time $8 are indicated.

In FIG. 18, "C" indicates a control information symbol, "P" indicates a pilot symbol and "D" indicates a data symbol. As described above with reference to FIG. 17, the control information symbol includes information of the number of bits of one encoded block and information of a coding rate in error correction coding.

The pilot symbol is a symbol used by the receiver which receives a modulated signal transmitted by the transmitter to perform channel estimation (propagation channel fluctuation estimation), frequency synchronization, time synchronization, signal detection, frequency offset estimation and the like. For example, the pilot symbol only needs to be a known symbol modulated by using PSK (Phase Shift Keying) modulation in the transmitter and the receiver (or the receiver may be capable of learning a symbol transmitted by the transmitter by establishing synchronization.).

The data symbol is a symbol for transmitting data obtained after error correction coding and generated based on, for example, FIG. 15 or 16 (note that the number of bits of one encoded block of data obtained after error correction coding, and the coding rate in error correction coding are a number of bits of one encoded block and a coding rate in error correction coding specified by information of the number of bits of one encoded block contained in a control information symbol and by information of a coding rate in error correction coding contained in a control information symbol).

Next, an operation of the receiver which receives a modulated signal transmitted by the transmitter in FIG. 17 will be described.

A configuration of the receiver which receives a modulated signal transmitted by the transmitter in FIG. 17 is as indicated by 150 in FIG. 1. Particularly, operations of control information demodulator 159 and decoder 167 in receiver 150 in FIG. 1 will be described in detail below.

Figure 19:
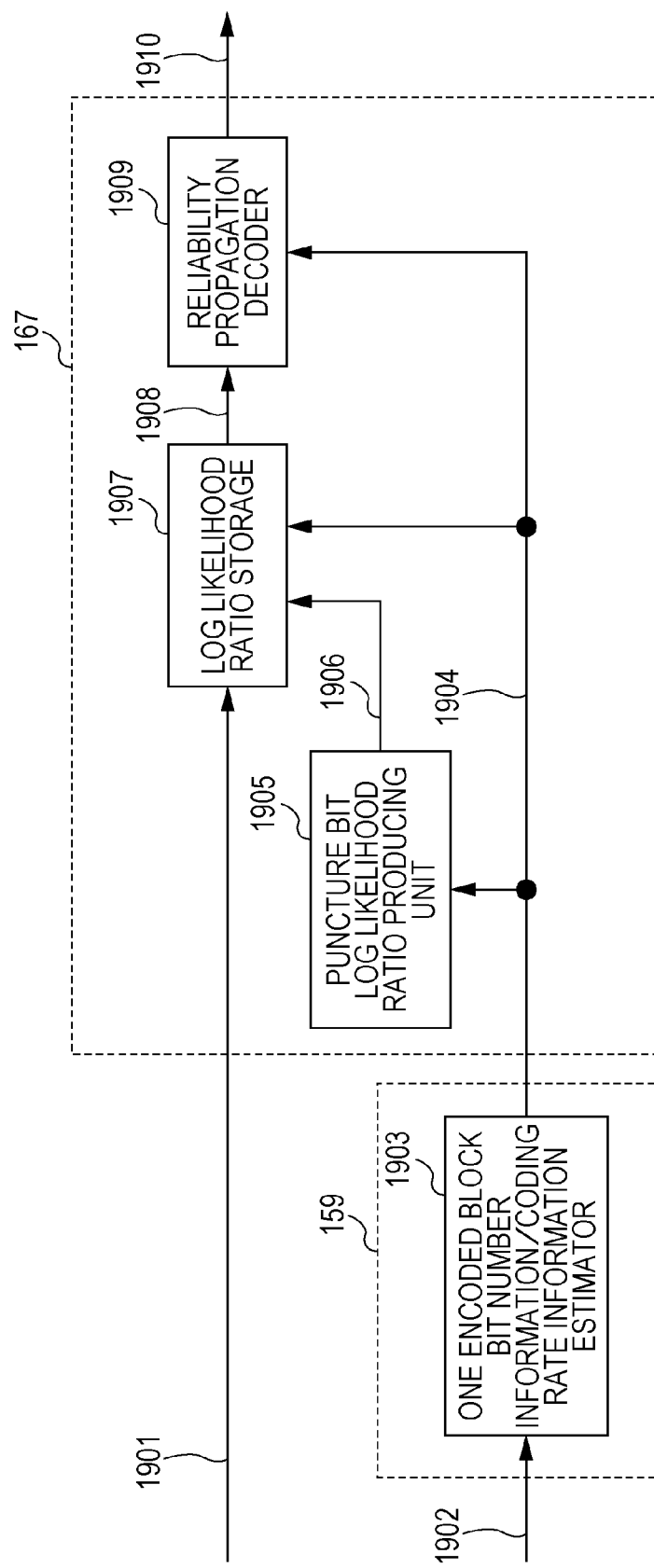
FIG. 19 is a view illustrating an example of a configuration of a portion related to a control information demodulator and a decoder.

FIG. 19 is a view illustrating a configuration of a portion related to control information demodulator 159 and decoder 167 in receiver 150 in FIG. 1.

Control information demodulator 159 includes one encoded block bit number information/coding rate information estimator 1903. One encoded block bit number information/coding rate information estimator 1903 receives an input of baseband signal 1902, and extracts the control information symbol illustrated in FIG. 18. Further, one encoded block bit number information/coding rate information estimator 1903 obtains information of the number of bits of one encoded block and information of a coding rate in error correction coding, from the control information symbol. One encoded block bit number information/coding rate information estimator 1903 outputs estimation signal 1904 of the information of the number of bits of one encoded block and the information of the coding rate in error correction coding.

Puncture bit log likelihood ratio producing unit 1905 receives an input of estimation signal 1904 of the information of the number of bits of one encoded block and the information of the coding rate in error correction coding. Puncture bit log likelihood ratio producing unit 1905 determines whether a method used by the transmitter to generate data of a data symbol is "method #A" or "method #B" described with reference to FIGS. 15 and 16, from the information of the number of bits of one encoded block and the information of the coding rate in error correction coding based on FIG. 15 or 16. When it is determined that the method used by the transmitter to generate data of a data symbol is "method #B," puncture bit log likelihood ratio producing unit 1905 generates and outputs log likelihood ratio 106 of bits corresponding to bits punctured by the transmitter (bits which are not transmitted by the transmitter).

For example, when the transmitter in FIG. 17 performs encoding based on FIG. 15 and transmits a modulated signal, puncture bit log likelihood ratio producing unit 1905 determines as follows.

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 5/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 6/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 7/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 8/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 9/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 10/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 11/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 12/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=16200 bits, and that the information of the coding rate in error correction coding indicates a coding rate 13/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 5/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 6/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 7/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 8/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 9/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 10/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 11/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 12/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates z=64800 bits, and that the information of the coding rate in error correction coding indicates a coding rate 13/15, puncture bit log likelihood ratio producing unit 1905 determines that the method used by the transmitter to generate data of a data symbol is "method #B."

For example, when the transmitter in FIG. 17 performs encoding based on FIG. 16 and transmits a modulated signal, puncture bit log likelihood ratio producing unit 1905 determines as follows.

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 5/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 6/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 7/15, puncture bit log likelihood ratio producing unit 1905 determines that the method used by the transmitter to generate data of a data symbol is "method #A."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 8/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 9/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 10/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 11/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 12/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 10000 bits or more and 20000 bits or less," and that the information of the coding rate in error correction coding indicates a coding rate 13/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 5/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 6/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 7/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 8/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 9/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 10/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 11/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 12/15, puncture bit log likelihood ratio producing unit 1905 determines that the method used by the transmitter to generate data of a data symbol is "method #B."

When estimation signal 1904 of the information of the number of bits of one encoded block and the information of the coding rate in error correction coding indicates that the information of number of bits z of one encoded block of an error correction code (LDPC code) indicates "z being 50000 bits or more and 70000 bits or less," and that the information of the coding rate in error correction coding indicates a coding rate 13/15, puncture bit log likelihood ratio producing unit 1905 determines that the method used by the transmitter to generate data of a data symbol is "method #B."

Exemplary Embodiment B

A modification of exemplary embodiment A will be described.

An example illustrating which one of "method #A" and "method #B" is used for number of one encoded blocks z and a coding rate is as described with reference to FIGS. 15 and 16 in exemplary embodiment A, and will not be described.

A configuration of a transmitter is as described with reference to FIG. 17 in exemplary embodiment A, and will partially be described.

Figure 20:
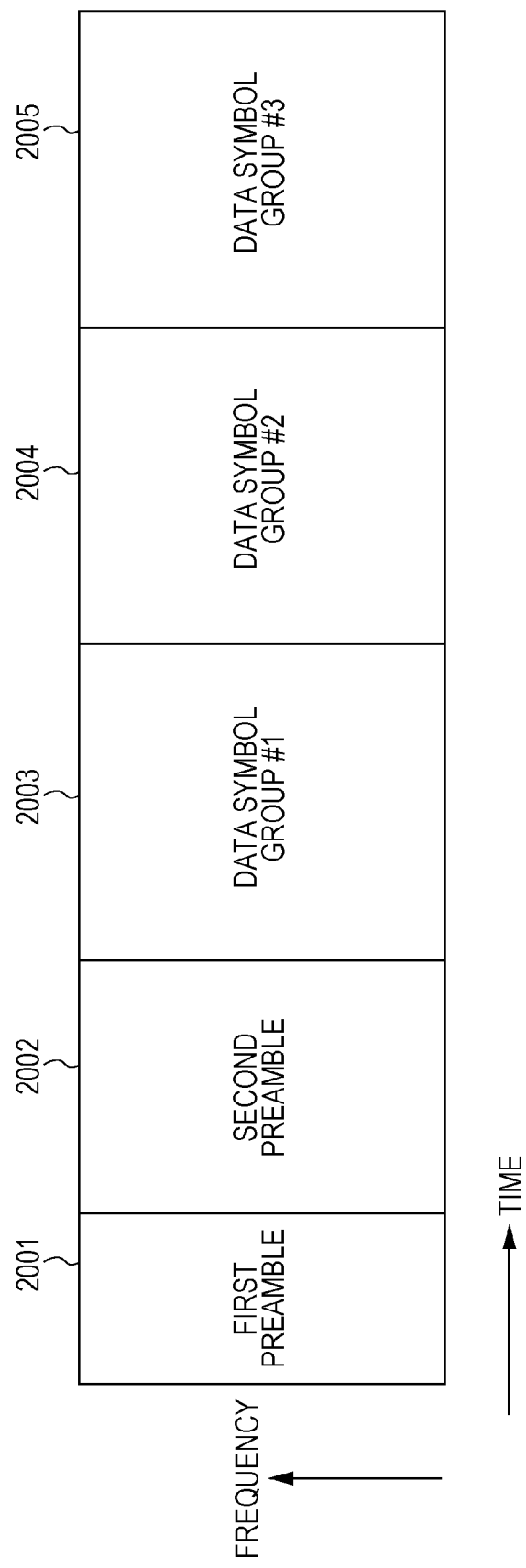
FIG. 20 is a view illustrating an example of a frame configuration of a modulated signal transmitted by the transmitter.

FIG. 20 illustrates an example of a frame configuration of a modulated signal transmitted by the transmitter in FIG. 17. In FIG. 20, a vertical axis indicates a frequency, and a horizontal axis indicates time. Then, since a transmission method using a multi-carrier such as an OFDM method is used, there is a plurality of carriers on the vertical axis of frequency.

FIG. 20 illustrates first preamble 2001, second preamble 2002, data symbol group #1 2003, data symbol group #2 2004, and data symbol group #3 2005.

The data symbol groups will be described. In a case of a broadcast system, a data symbol group may be allocated per video/audio. For example, a symbol for transmitting a first video/audio stream is data symbol group #1 (2003), a symbol for transmitting a second video/audio stream is data symbol group #2 (2004), and a symbol for transmitting a third video/audio stream is data symbol group #3 (note that a PLP (Physical Layer Pipe) may be referred to as a data symbol group. In this case, data symbol group #1 may be referred to as PLP #1, data symbol group #2 may be referred to as PLP #2, and data symbol group #3 may be referred to as PLP #3).

First preamble 2001 and second preamble 2002 include, for example, a symbol for performing frequency synchronization and time synchronization (for example, a PSK (Phase Shift Keying) symbol having signal constellation in an in-phase I-quadrature plane known in a transmitter and a receiver), a symbol for transmitting transmission method information of each data symbol group (information for identifying an SISO (Single-Input Single-Output) method, an MISO (Multiple-Input Single-Output) method and an MIMO method), a symbol for transmitting information related to an error correction code of each data symbol group (for example, a code length (the number of bits of one encoded block) and a coding rate), a symbol for transmitting information related to a modulating method of each data symbol group (in a case of the MISO method or the MIMO method, since there is a plurality of streams, a plurality of modulating methods is specified), a symbol for transmitting transmission method information of the first and second preambles, a symbol for transmitting information related to a modulating method of the first and second preambles, a symbol for transmitting information related to a method for inserting a pilot symbol, and a symbol for transmitting information related to a method for suppressing PAPR (Peak-to-Average Power Ratio).

As with exemplary embodiment A, in the present exemplary embodiment, particularly it is assumed that information of the number of bits of one encoded block of each data symbol group and information of a coding rate in error correction coding of each data symbol group are contained in first preamble (2001) and/or second preamble (2002). Therefore, in a case of the frame configuration in FIG. 20, information of the number of bits of one encoded block of data symbol group #1 and information of a coding rate in error correction coding of data symbol group #1, information of the number of bits of one encoded block of data symbol group #2 and information of a coding rate in error correction coding of data symbol group #2, and information of the number of bits of one encoded block of data symbol group #3 and information of a coding rate in error correction coding of data symbol group #3 are contained in first preamble (2001) and/or second preamble (2002).

Therefore, for example, based on FIG. 15, encoder 103 receives an input of information 101 and control information 102. Encoder 103 performs error correction coding (including puncturing processing) on information 101 based on the information of number of bits z of one encoded block of the error correction code (LDPC code) contained in control information 102, and based on the information of the coding rate in error correction coding contained in control information 102. Encoder 103 outputs data 104 obtained after the error correction coding.

In this case, the following is performed for each data symbol group. Note that in a case of the frame configuration in FIG. 20, the following is carried out, assuming that X is 1, 2 and 3.

When information of number of bits z of one encoded block of the error correction code (LDPC code) of data symbol group #X contained in control information 102 indicates z=16200 bits, and when information of a coding rate in error correction coding of data symbol group #X indicates a coding rate 5/15, encoder 101 performs encoding according to "method #A" corresponding to the coding rate 5/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 6/15, encoder 101 performs encoding according to "method #A" corresponding to the coding rate 6/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 7/15, encoder 101 performs encoding according to "method #A" corresponding to the coding rate 7/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 8/15, encoder 101 performs encoding according to "method #A" corresponding to the coding rate 8/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 9/15, encoder 101 performs encoding according to "method #B" corresponding to the coding rate 9/15 in order to generate data for forming data symbol group #X (encoder 101 does not perform puncturing as described above).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 10/15, encoder 101 performs encoding according to "method #B" corresponding to the coding rate 10/15 in order to generate data for forming data symbol group #X (encoder 101 does not perform puncturing as described above).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 11/15, encoder 101 performs encoding according to "method #B" corresponding to the coding rate 11/15 in order to generate data for forming data symbol group #X (encoder 101 does not perform puncturing as described above).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 12/15, encoder 101 performs encoding according to "method #B" corresponding to the coding rate 12/15 in order to generate data for forming data symbol group #X (encoder 101 does not perform puncturing as described above).

When the information of number of bits z of one encoded block of the error correction code (LDPC code) of data symbol group #X contained in control information 102 indicates z=16200 bits, and when the information of a coding rate in error correction coding of data symbol group #X indicates a coding rate 13/15, encoder 101 performs encoding according to "method #B" corresponding to the coding rate 13/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 5/15, encoder 101 performs encoding according to "method #B" corresponding to the coding rate 5/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 6/15, encoder 101 performs encoding according to "method #B" corresponding to the coding rate 6/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 7/15, encoder 101 performs encoding according to "method #B" corresponding to the coding rate 7/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 8/15, encoder 101 performs encoding according to "method #B" corresponding to the coding rate 8/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 9/15, encoder 101 performs encoding according to "method #B" corresponding to the coding rate 9/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 10/15, encoder 101 performs encoding according to "method #B" corresponding to the coding rate 10/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 11/15, encoder 101 performs encoding according to "method #B" corresponding to the coding rate 11/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 12/15, encoder 101 performs encoding according to "method #B" corresponding to the coding rate 12/15 in order to generate data for forming data symbol group #X (encoder 101 does not perform puncturing as described above).

When the information of number of bits z of one encoded block of the error correction code (LDPC code) of data symbol group #X contained in control information 102 indicates z=64800 bits, and when the information of a coding rate in error correction coding of data symbol group #X indicates a coding rate 13/15, encoder 101 performs encoding according to "method #B" corresponding to the coding rate 13/15 in order to generate data for forming data symbol group #X (encoder 101 does not perform puncturing as described above).

For example, based on FIG. 16, encoder 103 receives an input of information 101 and control information 102. Encoder 103 performs error correction coding (including puncturing processing) on information 101 based on the information of number of bits z of one encoded block of the error correction code (LDPC code) contained in control information 102, and based on the information of the coding rate in error correction coding contained in control information 102. Encoder 103 outputs data 104 obtained after the error correction coding.

In this case, the following is performed for each data symbol group. Note that in a case of the frame configuration in FIG. 20, the following is carried out, assuming that X is 1, 2 and 3.

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 5/15, encoder 101 performs encoding according to "method #A" corresponding to the coding rate 5/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 6/15, encoder 101 performs encoding according to "method #A" corresponding to the coding rate 6/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 7/15, encoder 101 performs encoding according to "method #A" corresponding to the coding rate 7/15 in order to generate data for forming data symbol group #X (as described above, encoder 101 performs encoding of an LDPC code and performs puncturing (encoder 101 selects bits not to be transmitted, and determines data to be transmitted)).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 8/15, encoder 101 performs encoding according to "method #B" corresponding to the coding rate 8/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 9/15, encoder 101 performs encoding according to "method #B" corresponding to the coding rate 9/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 10/15, encoder 101 performs encoding according to "method #B" corresponding to the coding rate 10/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 11/15, encoder 101 performs encoding according to "method #B" corresponding to the coding rate 11/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 12/15, encoder 101 performs encoding according to "method #B" corresponding to the coding rate 12/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 10000 bits or more and 20000 bits or less," and when the information of a coding rate in error correction coding of data symbol group #X indicates a coding rate 13/15, encoder 101 performs encoding according to "method #B" corresponding to the coding rate 13/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 5/15, encoder 101 performs encoding according to "method #B" corresponding to the coding rate 5/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 6/15, encoder 101 performs encoding according to "method #B" corresponding to the coding rate 6/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 7/15, encoder 101 performs encoding according to "method #B" corresponding to the coding rate 7/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 8/15, encoder 101 performs encoding according to "method #B" corresponding to the coding rate 8/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 9/15, encoder 101 performs encoding according to "method #B" corresponding to the coding rate 9/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 10/15, encoder 101 performs encoding according to "method #B" corresponding to the coding rate 10/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 11/15, encoder 101 performs encoding according to "method #B" corresponding to the coding rate 11/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 12/15, encoder 101 performs encoding according to "method #B" corresponding to the coding rate 12/15 in order to generate data for forming data symbol group #X (encoder 101 does not perform puncturing as described above).

When the information of number of bits z of one encoded block of the error correction code (LDPC code) of data symbol group #X contained in control information 102 indicates that "z is 50000 bits or more and 70000 bits or less," and when the information of a coding rate in error correction coding of data symbol group #X indicates a coding rate 13/15, encoder 101 performs encoding according to "method #B" corresponding to the coding rate 13/15 in order to generate data for forming data symbol group #X (encoder 101 does not perform puncturing as described above).

Next, an operation of the receiver which receives a modulated signal transmitted by the transmitter in FIG. 17 will be described.

A configuration of the receiver which receives a modulated signal transmitted by the transmitter in FIG. 17 is as indicated by 150 in FIG. 1. Particularly, operations of control information demodulator 159 and decoder 167 in receiver 150 in FIG. 1 will be described in detail below.

FIG. 19 is a view illustrating a configuration of a portion related to control information demodulator 159 and decoder 167 in receiver 150 in FIG. 1.

Control information demodulator 159 includes one encoded block bit number information/coding rate information estimator 1903. One encoded block bit number information/coding rate information estimator 1903 receives an input of baseband signal 1902, and extracts the first preamble and (or) the second preamble illustrated in FIG. 20. Further, one encoded block bit number information/coding rate information estimator 1903 obtains information of the number of bits of one encoded block and information of a coding rate in error correction coding from the first preamble and (or) the second preamble. One encoded block bit number information/coding rate information estimator 1903 outputs estimation signal 1904 of the information of the number of bits of one encoded block and the information of the coding rate in error correction coding.

In a case of the present exemplary embodiment, the transmitter in FIG. 17 transmits a modulated signal of the frame configuration based on FIG. 20, and receiver 150 in FIG. 1 receives this modulated signal. In this case, receiver 150 in FIG. 1 performs a demodulating and decoding operation for obtaining data of a necessary data symbol group among a plurality of data symbol groups. Therefore, control information demodulator 159 obtains "information of the number of bits of one encoded block and information of a coding rate in error correction coding" of the necessary data symbol group. Control information demodulator 159 outputs estimation signal 1904 of information of the number of bits of one encoded block and the information of the coding rate in error correction coding.

Puncture bit log likelihood ratio producing unit 1905 receives an input of estimation signal 1904 of the information of the number of bits of one encoded block and the information of the coding rate in error correction coding. Puncture bit log likelihood ratio producing unit 1905 determines whether a method used by the transmitter to generate data of a data symbol is "method #A" or "method #B" described with reference to FIGS. 15 and 16, from the information of the number of bits of one encoded block and the information of the coding rate in error correction coding based on FIG. 15 or 16. When it is determined that the method used by the transmitter to generate data of a data symbol is "method #B," puncture bit log likelihood ratio producing unit 1905 generates and outputs a log likelihood ratio 106 of bits corresponding to bits punctured by the transmitter (bits which are not transmitted by the transmitter). Note that the above describes such that "when it is determined that the method used by the transmitter to generate data of a data symbol is "method #B," puncture bit log likelihood ratio producing unit 1905 generates and outputs log likelihood ratio 106 of bits corresponding to bits punctured by the transmitter (bits which are not transmitted by the transmitter)," but puncture bit log likelihood ratio producing unit 1905 generates and outputs log likelihood ratio 106 of bits corresponding to bits punctured for a necessary data symbol group (bits which are not transmitted by the transmitter).

For example, when the transmitter in FIG. 17 performs encoding based on FIG. 15, and transmits a modulated signal of the frame configuration based on FIG. 20, puncture bit log likelihood ratio producing unit 1905 determines as follows for each data symbol group (X is 1, 2 and 3).

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 5/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 6/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 7/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 8/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 9/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 10/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 11/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 12/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=16200 bits, and that the information of the coding rate in error correction coding of data symbol group #X indicates a coding rate 13/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 5/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 6/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 7/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 8/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 9/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 10/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 11/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 12/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates z=64800 bits, and that the information of the coding rate in error correction coding of data symbol group #X indicates a coding rate 13/15, puncture bit log likelihood ratio producing unit 1905 determines that the method used by the transmitter to generate data of data symbol group #X is "method #B."

For example, when the transmitter in FIG. 17 performs encoding based on FIG. 16, and transmits a modulated signal of the frame configuration based on FIG. 20, puncture bit log likelihood ratio producing unit 1905 determines as follows for each data symbol group (X is 1, 2 and 3).

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 5/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 6/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 7/15, puncture bit log likelihood ratio producing unit 1905 determines that the method used by the transmitter to generate data of data symbol group #X is "method #A."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 8/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 9/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 10/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 11/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 12/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 10000 bits or more and 20000 bits or less," and that the information of the coding rate in error correction coding of data symbol group #X indicates a coding rate 13/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 5/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 6/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 7/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 8/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 9/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 10/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 11/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 12/15, puncture bit log likelihood ratio producing unit 1905 determines that the method used by the transmitter to generate data of data symbol group #X is "method #B."

When estimation signal 1904 of the information of the number of bits of one encoded block and the information of the coding rate in error correction coding indicates that the information of number of bits z of one encoded block of an error correction code (LDPC code) of data symbol group #X indicates "z being 50000 bits or more and 70000 bits or less," and that the information of the coding rate in error correction coding of data symbol group #X indicates a coding rate 13/15, puncture bit log likelihood ratio producing unit 1905 determines that the method used by the transmitter to generate data of data symbol group #X is "method #B."

The examples illustrating which one of "method #A" and "method #B" is used for number of bits z of one encoded block and the coding rate are described in exemplary embodiment A and exemplary embodiment B with reference to FIGS. 15 and 16. However, allocation of "method #A" and "method #B" for number of bits z of one encoded block and the coding rate is not limited to those in FIGS. 15 and 16. The features of FIGS. 15 and 16 described in exemplary embodiment A only need to be satisfied. For example, in FIG. 15, "method #B" may be used for z=16800 bits and a coding rate 8/15, and "method #A" may be used for z=16800 bits and a coding rate 9/15.

Moreover, in exemplary embodiment B, the frame configuration of a modulated signal transmitted by the transmitter is described with reference to FIG. 20. However, the frame configuration is not limited thereto, and may be, for example, a frame configuration including one or more data symbol groups or two or more data symbol groups.

The broadcast (or communication) system according to the present disclosure is described in the above-described exemplary embodiments. However, the present disclosure is not limited thereto.

As a matter of course, a plurality of the exemplary embodiments and other contents described herein may be combined and carried out.

Moreover, each exemplary embodiment and the other contents are only examples. For example, although a "modulating method, an error correction coding scheme (an error correction code, a code length and a coding rate to be used), control information and the like" are exemplified, each exemplary embodiment and the other contents can be carried out with the same configuration even when other types of a "modulating method, an error correction coding scheme (an error correction code, a code length and a coding rate to be used), control information and the like" are applied.

As for a modulating method, even when a modulating method other than the modulating methods described herein is used, it is possible to carry out the exemplary embodiments and the other contents described herein. For example, APSK (Amplitude Phase Shift Keying) (such as 16APSK, 64APSK, 128APSK, 256APSK, 1024APSK and 4096APSK), PAM (Pulse Amplitude Modulation) (such as 4PAM, 8PAM, 16PAM, 64PAM, 128PAM, 256PAM, 1024PAM and 4096PAM), PSK (Phase Shift Keying) (such as BPSK, QPSK, 8PSK, 16PSK, 64PSK, 128PSK, 256PSK, 1024PSK and 4096PSK), and QAM (Quadrature Amplitude Modulation) (such as 4QAM, 8QAM, 16QAM, 64QAM, 128QAM, 256QAM, 1024QAM and 4096QAM) may be applied. In each modulating method, uniform mapping or non-uniform mapping may be performed (any mapping may be performed).

Moreover, a method for arranging 16 signal points, 64 signal points or the like on an I-Q plane (a modulating method having 16 signal points, 64 signal points or the like) is not limited to a signal point arrangement method of the modulating methods described herein. Therefore, a function of outputting an in-phase component and a quadrature component based on a plurality of bits is a function in a mapper.

The present disclosure is applicable to a multi-carrier transmission method such as the OFDM method, and is also applicable to a single carrier transmission method. (For example, in a case of a multi-carrier method, symbols are arranged in a frequency axis, but in a case of a single carrier, symbols are arranged only in a time direction.) Moreover, a spread spectrum communication method is also applicable to baseband signals by using spreading codes.

Herein, a receiver of a terminal and an antenna may be configured separately. For example, the receiver includes an interface which receives through a cable an input of a signal received at the antenna or a signal obtained by performing frequency conversion on a signal received at the antenna, and the receiver performs subsequent processing. Moreover, data and information obtained by the receiver are subsequently converted into a video or a sound, and a display (monitor) displays the video or a speaker outputs the sound. Further, the data and the information obtained by the receiver may be subjected to signal processing related to a video or a sound (signal processing may not be performed), and may be output from an RCA terminal (a video terminal or an audio terminal), a USB (Universal Serial Bus), a USB 2, a USB 3, an HDMI (registered trademark) (High-Definition Multimedia Interface), an HDMI 2, a digital terminal or the like of the receiver. Moreover, the data and the information obtained by the receiver are modulated by using a wireless communication method (Wi-Fi (registered trademark) (IEEE 802.11a, IEEE 802.11b, IEEE 802.11g, IEEE 802.11n, IEEE 802.11ac, IEEE 802.1 lad and the like), WiGiG, Bluetooth (registered trademark) and the like) or by using a wired communication method (optical communication and power line communication), and these pieces of information may be transmitted to other apparatuses. In this case, a terminal includes a transmitter for transmitting information (In this case, the terminal may transmit data including the data and the information obtained by the receiver, or may generate modified data from the data and the information obtained by the receiver and transmit the modified data).

Herein, for example, a communication and broadcast apparatus such as a broadcast station, a base station, an access point, a terminal and a mobile phone is considered to include the transmitter. In this case, a communication apparatus such as a television, a radio, a terminal, a personal computer, a mobile phone, an access point and a base station is considered to include the receiver. Moreover, the transmitter and the receiver according to the present disclosure are also each considered to be an apparatus that has a communication function, and that has a form in which the apparatus can be connected via any interface to a device such as a television, a radio, a personal computer and a mobile phone for executing an application.

Moreover, in the present exemplary embodiment, symbols other than data symbols, for example, pilot symbols (preambles, unique words, postambles and reference symbols), and control information symbols may be arranged in frames in any way. Then, these symbols are named a pilot symbol and a control information symbol here, but may be named in any way, and a function itself is important.

Hence, for example, although a symbol is named a control information symbol herein, how to name the symbol is not limited thereto, and the symbol may be named in a different way such as a control channel. This symbol is a symbol for transmitting control information such as information of a transmission method (for example, a transmission method, a modulating method, a coding rate of an error correction code, a code length of an error correction code, a method for configuring a frame and a Fourier transform method (size)).

Moreover, the pilot symbol only needs to be, for example, a known symbol modulated by using PSK modulation in the transmitter and the receiver (or the receiver may be capable of learning a symbol transmitted by a transmitter by establishing synchronization.). The receiver performs frequency synchronization, time synchronization, channel estimation (of each modulated signal) (estimation of CSI (Channel State Information)), signal detection and the like by using this symbol.

Moreover, the control information symbol is a symbol for transmitting information which needs to be transmitted to a communicating party for realizing communication (such as application communication) other than data communication (for example, a modulating method used for communication, an error correction coding scheme, a coding rate of the error correction coding scheme and setting information in an upper layer).

Note that the present disclosure is not limited to each exemplary embodiment, and can be carried out with various modifications. For example, each exemplary embodiment describes the case where the present disclosure is performed as a communication device, but the present disclosure is not limited thereto, and this communication method can also be performed as software.

Transmission antennas of transmission stations and base stations, reception antennas of terminals and one antenna described in the drawings may be configured with a plurality of antennas.

Note that for example, a program for executing the communication method may be stored in a ROM (Read Only Memory) in advance to cause a CPU (Central Processing Unit) to operate this program.

Moreover, the program for executing the communication method may be stored in a computer-readable storage medium, and the program stored in the recording medium may be recorded in a RAM (Random Access Memory) of a computer to cause the computer to operate according to this program.

Then, each configuration of each of the above-described exemplary embodiments and the like may be realized typically as an LSI (Large Scale Integration) which is an integrated circuit. These integrated circuits may be formed separately as one chip, or may be formed as one chip so as to include the entire configuration or part of the configuration according to each exemplary embodiment. The LSI is described here, but the integrated circuit may also be referred to as an IC (Integrated Circuit), a system LSI, a super LSI and an ultra LSI depending on a degree of integration. Moreover, a circuit integration technique is not limited to the LSI, and may be realized by a dedicated circuit or a general purpose processor. After manufacturing of the LSI, a programmable FPGA (Field Programmable Gate Array) or a reconfigurable processor which is reconfigurable in connection or settings of circuit cells inside the LSI may be used.

Further, when development of a semiconductor technology or another derived technology provides a circuit integration technology which replaces the LSI, as a matter of course, functional blocks may be integrated by using this technology. There may be adaption of a biotechnology or the like as a possibility.

The present disclosure is widely applicable to a wireless system which transmits different modulated signals from a plurality of antennas, respectively. Moreover, the present disclosure is also applicable to a case where MIMO transmission is performed in a wired communication system having a plurality of transmission portions (for example, a PLC (Power Line Communication) system, an optical communication system, and a DSL (Digital Subscriber Line) system).

Exemplary Embodiment C

The above-described exemplary embodiments describe the data symbols in FIGS. 11 and 18 and the data symbol group in FIG. 20 that may be of an MISO method and an MIMO method. In the present exemplary embodiment, generation of modulated signals in a case of the MISO method and the MIMO method will be described in detail.

Figure 21:
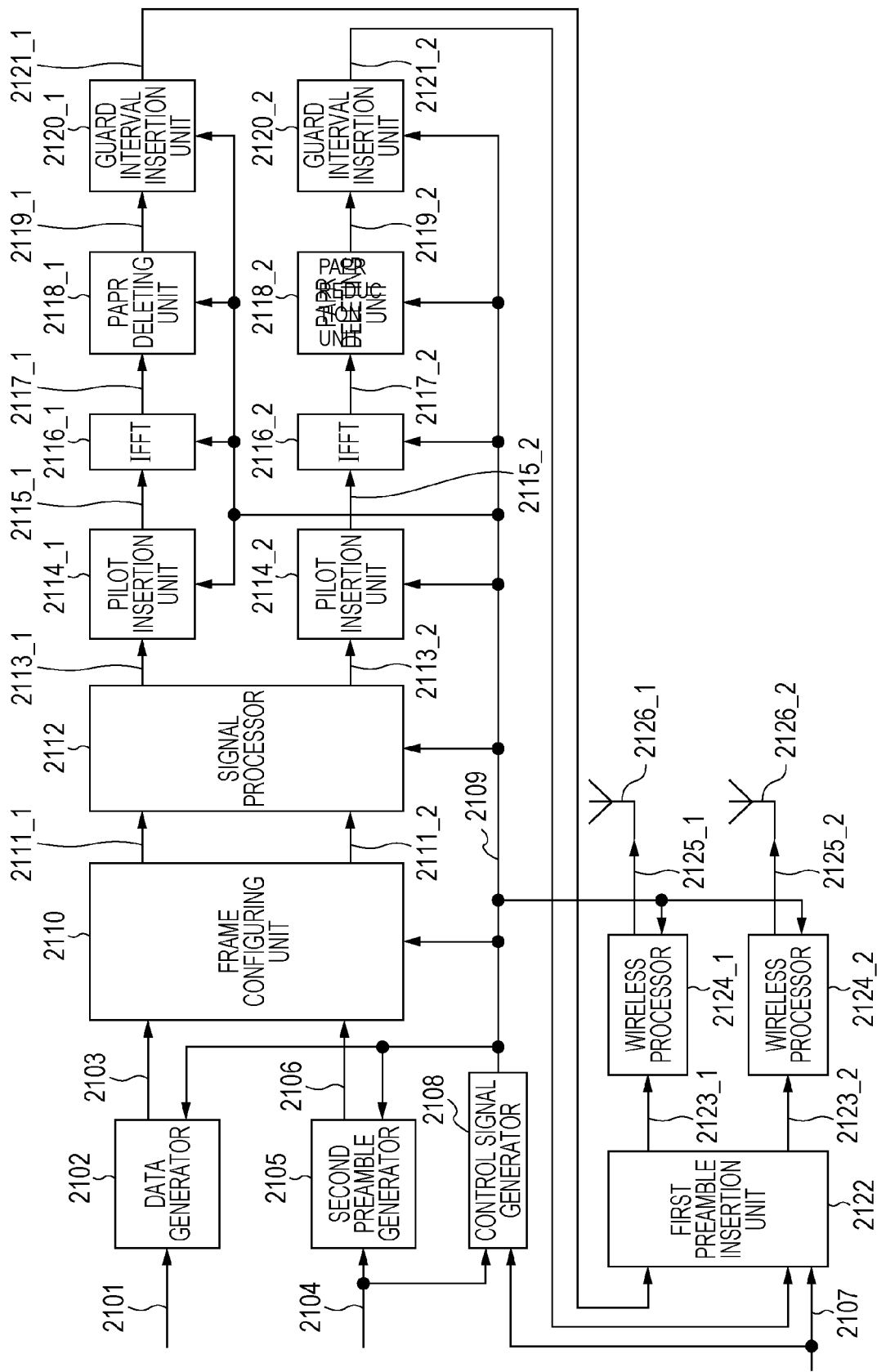
FIG. 21 is a view illustrating an example of a configuration of the transmitter.

FIG. 21 is an example of a configuration of a transmitter (of, for example, a broadcast station) according to the present exemplary embodiment.

Data generator 2102 receives an input of transmission data 2101, and control signal 2109. Data generator 2102 performs error correction coding and mapping which is based on a modulating method, based on information such as information contained in control signal 2109 and related to error correction coding (for example, information related to a number of bits of one encoded block and information of a coding rate) and information of the modulating method contained in control signal 2109. Data generator 2102 outputs data transmission (quadrature) baseband signal 2103.

Second preamble signal generator 2105 receives an input of second preamble transmission data 2104, and control signal 2109. Second preamble signal generator 2105 performs error correction coding and mapping which is based on a modulating method, based on information such as information contained in control signal 2109 and related to error correction of a second preamble and information of the modulating method contained in control signal 2109. Second preamble signal generator 2105 outputs second preamble (quadrature) baseband signal 2106.

Control signal generator 2108 receives an input of first preamble transmission data 2107, and second preamble transmission data 2104. Control signal generator 2108 outputs as control signal 2109 information of a transmission method of each symbol (a selected transmission method including an error correction code, a coding rate of the error correction code, a modulating method, a block length, a frame configuration and a method for regularly switching precoding matrices, a method for inserting a pilot symbol, information of IFFT (Inverse Fast Fourier Transform)/FFT (Fast Fourier Transform), and the like, information of a method for deleting PAPR (Peak to Average Power Ratio) and information of a method for inserting a guard interval).

Frame configuring unit 2110 receives an input of data transmission (quadrature) baseband signal 2103, second preamble (quadrature) baseband signal 2106, and control signal 2109. Frame configuring unit 2110 performs rearrangement in a frequency axis and a time axis based on information of a frame configuration contained in control signal 2109. Frame configuring unit 2110 outputs (quadrature) baseband signal 2111_1 of stream 1 according to the frame configuration (a signal obtained after mapping, that is, a baseband signal based on a modulating method to be used), and (quadrature) baseband signal 2111_2 of stream 2 according to the frame configuration (a signal obtained after mapping, that is, a baseband signal based on a modulating method to be used).

Signal processor 2112 receives an input of baseband signal 2111_1 of stream 1, baseband signal 2111_2 of stream 2, and control signal 2109. Signal processor 2112 outputs modulated signal 1 (2113_1) obtained after signal processing and based on a transmission method contained in control signal 2109 and modulated signal 2 (2113_2) obtained after the signal processing based on a transmission method contained in control signal 2109.

Note that signal processor 2112 uses, for example, precoding, an MIMO transmission method which uses a phase change (which may also be an MIMO transmission method which does not perform a phase change) (referred to as an MIMO method here), an MISO transmission method which uses space time block codes (frequency-space block codes) (referred to as an MISO method here), and an SISO (or SIMO) transmission method for transmitting a modulated signal of one stream from one antenna (however, there is also a case where a modulated signal of one stream is transmitted from a plurality of antennas in the SISO method and the SIMO method). An operation of signal processor 2112 will be described in detail below.

Pilot insertion unit 2114_1 receives an input of modulated signal 1 (2113_1) obtained after signal processing, and control signal 2109. Pilot insertion unit 2114_1 inserts a pilot symbol to modulated signal 1 (2113_1) obtained after the signal processing, based on information contained in control signal 2109 and related to a method for inserting the pilot symbol. Pilot insertion unit 2114_1 outputs modulated signal 2115_1 obtained after the pilot symbol insertion.

Pilot insertion unit 2114_2 receives an input of modulated signal 2 (2113_2) obtained after signal processing, and control signal 2109. Pilot insertion unit 2114_2 inserts a pilot symbol to modulated signal 2 (2113_2) obtained after the signal processing, based on information contained in control signal 2109 and related to a method for inserting the pilot symbol. Pilot insertion unit 2114_2 outputs modulated signal 2115_2 obtained after the pilot symbol insertion.

IFFT (Inverse Fast Fourier Transform) unit 2116_1 receives an input of modulated signal 2115_1 obtained after the pilot symbol insertion, and control signal 2109. IFFT unit 2116_1 performs IFFT based on information of an IFFT method contained in control signal 2109. IFFT unit 2116_1 outputs signal 2117_1 obtained after the IFFT.

IFFT unit 2116_2 receives an input of modulated signal 2115_2 obtained after the pilot symbol insertion, and control signal 2109. IFFT unit 2116_2 performs IFFT based on information of an IFFT method contained in control signal 2109. IFFT unit 2116_2 outputs signal 2117_2 obtained after the IFFT.

PAPR reduction unit 2118_1 receives an input of signal 2117_1 obtained after the IFFT, and control signal 2109. PAPR reduction unit 2118_1 performs processing for deleting PAPR on signal 2117_1 obtained after the IFFT, based on information contained in control signal 2109 and related to PAPR deletion. PAPR reduction unit 2118_1 outputs signal 2119_1 obtained after the PAPR deletion.

PAPR reduction unit 2118_2 receives an input of signal 2117_2 obtained after the IFFT, and control signal 2109. PAPR reduction unit 2118_2 performs processing for deleting PAPR on signal 2117_2 obtained after the IFFT, based on information contained in control signal 2109 and related to PAPR deletion. PAPR reduction unit 2118_2 outputs signal 2119_2 obtained after the PAPR deletion.

Guard interval insertion unit 2120_1 receives an input of signal 2119_1 obtained after the PAPR deletion, and control signal 2109. Guard interval insertion unit 2120_1 inserts a guard interval in signal 2119_1 obtained after the PAPR deletion, based on information contained in control signal 2109 and related to a guard interval insertion method. Guard interval insertion unit 2120_1 outputs signal 2121_1 obtained after the guard interval insertion.

Guard interval insertion unit 2120_2 receives an input of signal 2119_2 obtained after the PAPR deletion, and control signal 2109. Guard interval insertion unit 2120_2 inserts a guard interval in signal 2119_2 obtained after the PAPR deletion, based on information contained in control signal 2109 and related to a guard interval insertion method. Guard interval insertion unit 2120_2 outputs signal 2121_2 obtained after the guard interval insertion.

First preamble insertion unit 2122 receives an input of signal 2121_1 obtained after the guard interval insertion, signal 2121_2 obtained after the guard interval insertion, and first preamble transmission data 107. First preamble insertion unit 2122 generates a first preamble signal from first preamble transmission data 2107. First preamble insertion unit 2122 adds the first preamble to signal 2121_1 obtained after the guard interval insertion. First preamble insertion unit 2122 adds the first preamble to signal 2123_1 obtained after the addition of the first preamble, and to signal 2121_2 obtained after the guard interval insertion. First preamble insertion unit 2122 outputs signal 2123_2 obtained after the addition of a second preamble. Note that the first preamble signal may be added to both or any one of signal 2123_1 obtained after the addition of the first preamble and signal 2123_2 obtained after addition of the first preamble. When the first preamble signal is added to one of signal 2123_1 and signal 2123_2, the signal to which the first preamble is not added includes a zero signal as a baseband signal in a transmission section of the signal to which the first preamble is added.

Wireless processor 2124_1 receives an input of signal 2123_1 obtained after the addition of the first preamble. Wireless processor 2124_1 performs processing such as frequency conversion and amplification on signal 2123_1. Wireless processor 2124_1 outputs transmission signal 2125_1. Then, transmission signal 2125_1 is output as a radio wave from antenna 2126_1.

Signal processor 2124_2 receives an input of signal 2123_2 obtained after the addition of the first preamble. Signal processor 2124_2 performs processing such as frequency conversion and amplification on signal 2123_2. Signal processor 2124_2 outputs transmission signal 2125_2. Then, transmission signal 2125_2 is output as a radio wave from antenna 2126_2.

The error correction coding described above (described in each exemplary embodiment herein) is performed as error correction coding in data generator 2102.

Note that in the present exemplary embodiment, the MIMO transmission method which uses precoding and a phase change, the MISO transmission method which uses space time block codes (or space frequency block codes) and the SISO (or SIMO) transmission method are used as described above. These methods will be described below.

The MISO (transmission) method which uses space time block codes (frequency-space block codes) will be described.

A configuration in a case where signal processor 2112 in FIG. 21 performs a transmission method which uses space time block codes will be described with reference to FIG. 22.

Mapper 2202 receives an input of data signal (data obtained after error correction coding) 2201, and control signal 2206, performs mapping based on information contained in control signal 2206 and related to a modulating method, and outputs signal 2203 obtained after the mapping.

For example, signal 2203 obtained after mapping is arranged in order of s0, s1, s2, s3, s(2i), s(2i+1), (i is an integer equal to or more than 0).

MISO processor 2204 receives an input of signal 2203 obtained after the mapping, and control signal 2206, and outputs signals 2205A and 2205B obtained after MISO processing in a case where control signal 2206 instructs transmission according to the MISO method. For example, signal 2205A obtained after the MISO processing is of s0, s1, s2, s3, s(2i), s(2i+1), . . . , and signal 2205B obtained after the MISO processing is of −s1*, s0*, −s3*, s2* . . . , −s(2i+1)*, s(2i)*, . . . . Note that "*" means a complex conjugate. (For example, s0* is a complex conjugate of s0.) Then, symbols output in the same order in signals 2205A and 2205B obtained after the MISO processing are transmitted at an identical frequency and identical time. For example, s0 of signal 2205A obtained after the MISO processing, and −s1* of signal 2205B obtained after the MISO processing are transmitted at an identical frequency and identical time, and s1 of signal 2205A obtained after the MISO processing, and s0* of signal 2205B obtained after the MISO processing are transmitted at an identical frequency and identical time.

In this case, signals 2205A and 2205B obtained after the MISO processing correspond to modulated signal 1 (2113_1) obtained after signal processing in FIG. 21, and modulated signal 2 (2113_2) obtained after signal processing, respectively. Note that a method of space time block codes is not limited to the above.

Then, modulated signal 1 (2113_1) obtained after the signal processing is subjected to predetermined processing, and is transmitted as a radio wave from antenna 2126_1. Moreover, modulated signal 1 (2113_2) obtained after the signal processing is subjected to predetermined processing, and is transmitted as a radio wave from antenna 2126_2.

Figure 22:
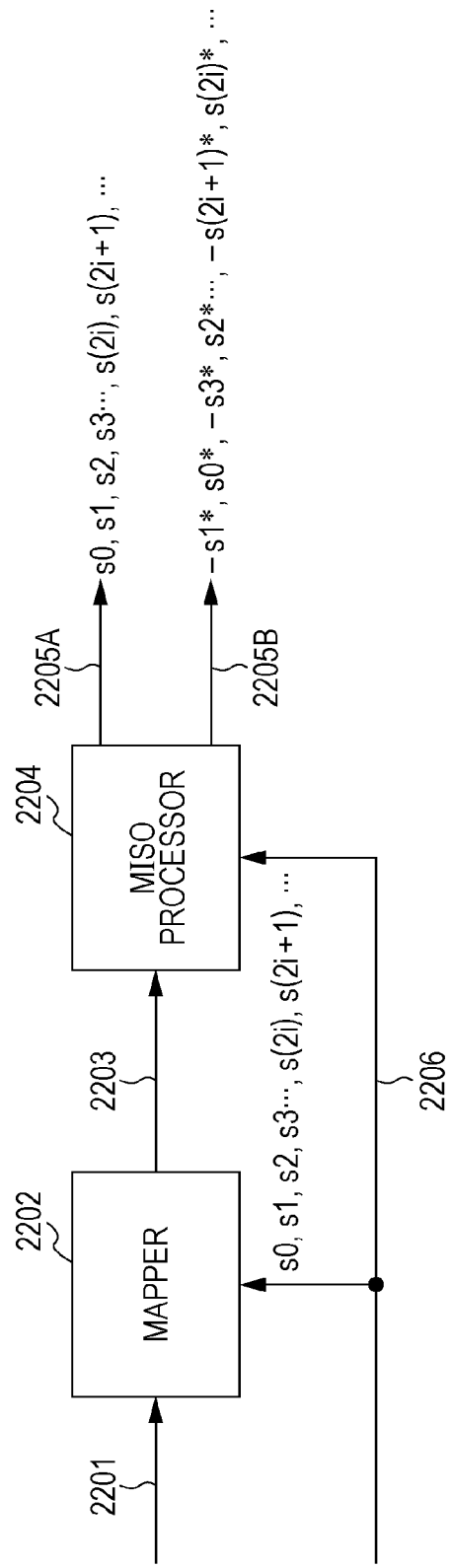
FIG. 22 is a view illustrating an example of a transmission method using space time block codes.
Figure 23:
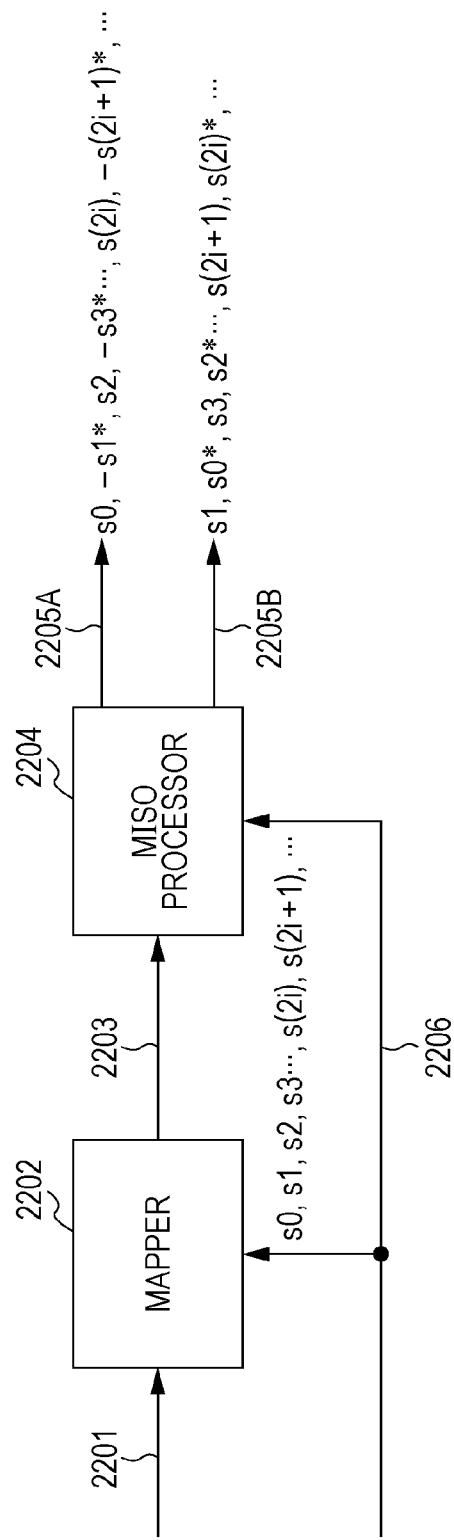
FIG. 23 is a view illustrating an example of the transmission method using space time block codes.

FIG. 23 is a configuration in a case where a transmission method which uses different space time block codes from those in FIG. 22.

Mapper 2202 receives an input of data signal (data obtained after error correction coding) 2201 and control signal 2206, performs mapping based on information contained in control signal 2206 and related to a modulating method, and outputs signal 2203 obtained after mapping. For example, signal 2203 obtained after mapping is arranged in order of s0, s1, s2, s3, s(2i), s(2i+1), (i is an integer equal to or more than 0).

MISO processor 2204 receives an input of signal 2203 obtained after mapping and control signal 2206, and outputs signals 2205A and 2205B obtained after MISO processing in a case where control signal 2206 instructs transmission according to the MISO method. For example, signal 2205A obtained after the MISO processing is of s0, −s1*, s2, −s3*, s(2i), −s(2i+1)*, . . . , and signal 2205B obtained after the MISO processing is of s1, s0*, s3, s2* . . . , s(2i+1), s(2i)*, . . . . Note that "*" means a complex conjugate. (For example, s0* is a complex conjugate of s0.) Then, symbols output in the same order in signals 2205A and 2205B obtained after the MISO processing are transmitted at an identical frequency and identical time. For example, s0 of signal 2205A obtained after the MISO processing, and s1 of signal 2205B obtained after the MISO processing are transmitted at an identical frequency and identical time, and −s1* of signal 2205A obtained after the MISO processing, and s0* of signal 2205B obtained after the MISO processing are transmitted at an identical frequency and identical time.

In this case, signals 2205A and 2205B obtained after the MISO processing correspond to modulated signal 1

(2113_1) obtained after signal processing in FIG. 21, and modulated signal 2 (2113_2) obtained after signal processing, respectively. Note that a method of space time block codes is not limited to the above.

Then, modulated signal 1 (2113_1) obtained after the signal processing is subjected to predetermined processing, and is transmitted as a radio wave from antenna 2126_1. Moreover, modulated signal 1 (2113_2) obtained after the signal processing is subjected to predetermined processing, and is transmitted as a radio wave from antenna 2126_2.

Next, the MIMO method to which precoding, a phase change and a power change are applied will be described as an example of the MIMO method (however, the method for transmitting a plurality of streams from a plurality of antennas is not limited thereto, and the present exemplary embodiment can also be carried out by another method).

A configuration in a case where signal processor 2112 in FIG. 21 performs a transmission method which uses the MIMO method will be described with reference to FIGS. 24 to 32.

Figure 24:
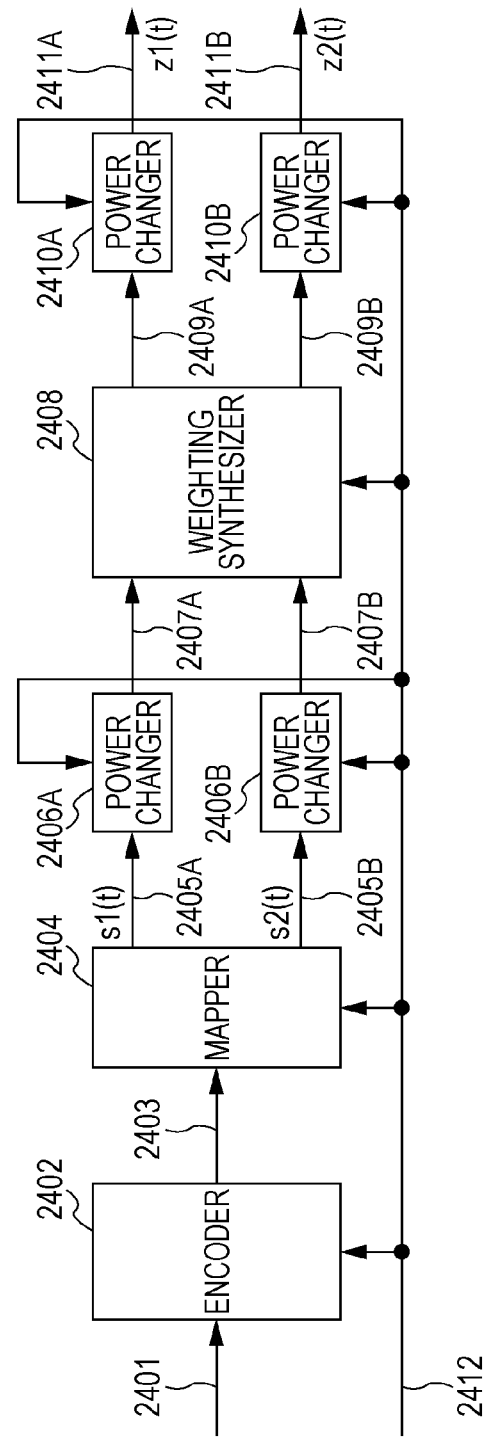
FIG. 24 is a view illustrating an example of a configuration of the transmitter.

Encoder 2402 in FIG. 24 receives an input of information 2401, and control signal 2412. Encoder 2402 performs encoding based on information of a coding rate and a number of bits of one encoded block contained in control signal 2412. Encoder 2402 outputs encoded data 2403.

Mapper 2404 receives an input of encoded data 2403, and control signal 2412. Then, it is assumed that control signal 2412 specifies transmission of two streams as a transmission method. In addition, it is assumed that control signal 2412 specifies modulating method α and modulating method β as the modulating methods of two streams, respectively. Note that modulating method a is a modulating method for modulating x-bit data, and modulating method β is a modulating method for modulating y-bit data. (For example, the modulating method is a modulating method for modulating 4-bit data in a case of 16QAM (16 Quadrature Amplitude Modulation), and a modulating method for modulating 6-bit data in a case of 64QAM (64 Quadrature Amplitude Modulation).) Then, mapper 2404 modulates the x-bit data of x+y-bit data according to modulating method a, and generates and outputs baseband signal s1(t) (2405A). Moreover, mapper 2404 modulates the remaining y-bit data according to modulating method β, and outputs baseband signal s2(t) (2405B) (note that FIG. 24 illustrates one mapper, but according to a configuration different from the configuration in FIG. 24, there may separately be a mapper for generating s1(t) and a mapper for generating s2(t). In this case, encoded data 2403 is sorted to the mapper for generating s1(t) and the mapper for generating s2(t)).

Note that s1(t) and s2(t) are expressed by complex numbers (however, s1(t) and s2(t) may be any of complex numbers and actual numbers), and t represents time. Note that when a transmission method which uses multi-carriers such as OFDM (Orthogonal Frequency Division Multiplexing), s1 and s2 can also be considered as a function of frequency f such as s1(f) and s2(f), or as a function of time t and frequency f such as s1(t,f) and s2(t,f).

A baseband signal, a precoding matrix, a phase change and the like will be described below as functions of time t, but may be considered as functions of frequency f and functions of time t and frequency f.

Therefore, there is also a case where a baseband signal, a precoding matrix, a phase change and the like are described as functions of symbol number i. However, in this case, a baseband signal, a precoding matrix, a phase change and the like may be considered as functions of time t, functions of frequency f and functions of time t and frequency f. That is, a symbol and a baseband signal may be generated and arranged in a time axis direction, or may be generated and arranged in a frequency axis direction. Moreover, a symbol and a baseband signal may be generated and arranged in the time axis direction and the frequency axis direction.

Power changer 2406A (power adjuster 2406A) receives an input of baseband signal s1(t) (2405A), and control signal 2412. Power changer 2406A sets actual number P1 based on control signal 2412. Power changer 2406A outputs P1×s1(t) as signal 2407A obtained after power change (note that P1 is an actual number but may be a complex number).

Similarly, power changer 2406B (power adjuster 2406B) receives an input of baseband signal s2(t) (2405B), and control signal 2412. Power changer 2406B sets actual number P2. Power changer 2406B outputs P2×s2(t) as signal 2407B obtained after power change (note that P2 is an actual number but may be a complex number).

Weighting synthesizer 2408 receives an input of signal 2407A obtained after the power change, signal 2407B obtained after the power change, and control signal 2412. Weighting synthesizer 2408 sets precoding matrix F (or F(i)) based on control signal 2412. Weighting synthesizer 2408 performs the following arithmetic operation, assuming that a slot number (symbol number) is i.

[Equation 1]

$$\begin{pmatrix} u_1(i) \\ u_2(i) \end{pmatrix} = F \begin{pmatrix} P_1 \times s_1(i) \\ P_2 \times s_2(i) \end{pmatrix} \quad (1)$$
$$= \begin{pmatrix} a(i) & b(i) \\ c(i) & d(i) \end{pmatrix} \begin{pmatrix} P_1 \times s_1(i) \\ P_2 \times s_2(i) \end{pmatrix}$$
$$= \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}$$

Here, a(i), b(i), c(i) and d(i) can be expressed by complex numbers (or may be actual numbers), and three or more of a(i), b(i), c(i) and d(i) should not be 0 (zero). Note that a precoding matrix may be a function of i or may not be the function of i. Then, when a precoding matrix is the function of i, precoding matrices are switched according to a slot number (symbol number).

Then, weighting synthesizer 2408 outputs u1(i) in equation (1) as signal 2409A obtained after weighting synthesis. Weighting synthesizer 2408 outputs u2(i) in equation (1) as signal 2409B obtained after the weighting synthesis.

Power changer 2410A receives an input of signal 2409A (u1(i)) obtained after the weighting synthesis, and control signal 2412. Power changer 2410A sets actual number Q1 based on control signal 2412. Power changer 2410A outputs Q1×u1(t) as signal 2411A (z1(i)) obtained after power change (note that Q1 is an actual number, but may be a complex number).

Similarly, power changer 2410B receives an input of signal 2409B (u2(i)) obtained after the weighting synthesis, and control signal 2412. Power changer 2410B sets actual number Q2 based on control signal 2412. Power changer 2410B outputs Q2×u2(t) as signal 2411B (z2(i)) obtained after the power change (note that Q2 is an actual number, but may be a complex number).

Therefore, the following equation holds.

[Equation 2]

$$\begin{pmatrix} z_1(i) \\ z_2(i) \end{pmatrix} = \begin{pmatrix} Q_1 & 0 \\ 0 & Q_2 \end{pmatrix} F \begin{pmatrix} P_1 \times s_1(i) \\ P_2 \times s_2(i) \end{pmatrix} \qquad (2)$$

$$= \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix}$$

$$= \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}$$

Note that z1(i) and z2(i) are transmitted from different antennas by using identical time and an identical frequency (the same applies below).

Next, a method for transmitting two streams different from those streams in FIG. 24 will be described with reference to FIG. 25. Note that elements which operate in the same way as those in FIG. 24 are assigned the same reference numerals in FIG. 25.

Phase changer 2461 receives an input of signal 2409B obtained after weighting synthesis of u2(i) in equation (1), and control signal 2412. Phase changer 2461 changes a phase of signal 2409B obtained after the weighting synthesis of u2(i) in equation (1), based on control signal 2412. Therefore, a signal obtained after the change of the phase of signal 2409B obtained after the weighting synthesis of u2(i) in equation (1) is expressed by $e^{j\theta(i)} \times u2(i)$. Phase changer 2461 outputs $e^{j\theta(i)} \times u2(i)$ as signal 2462 obtained after the phase change (j is a unit of an imaginary number). Note that a value of a phase to be changed is a portion characterized by being the function of i like θ(i).

Figure 25:
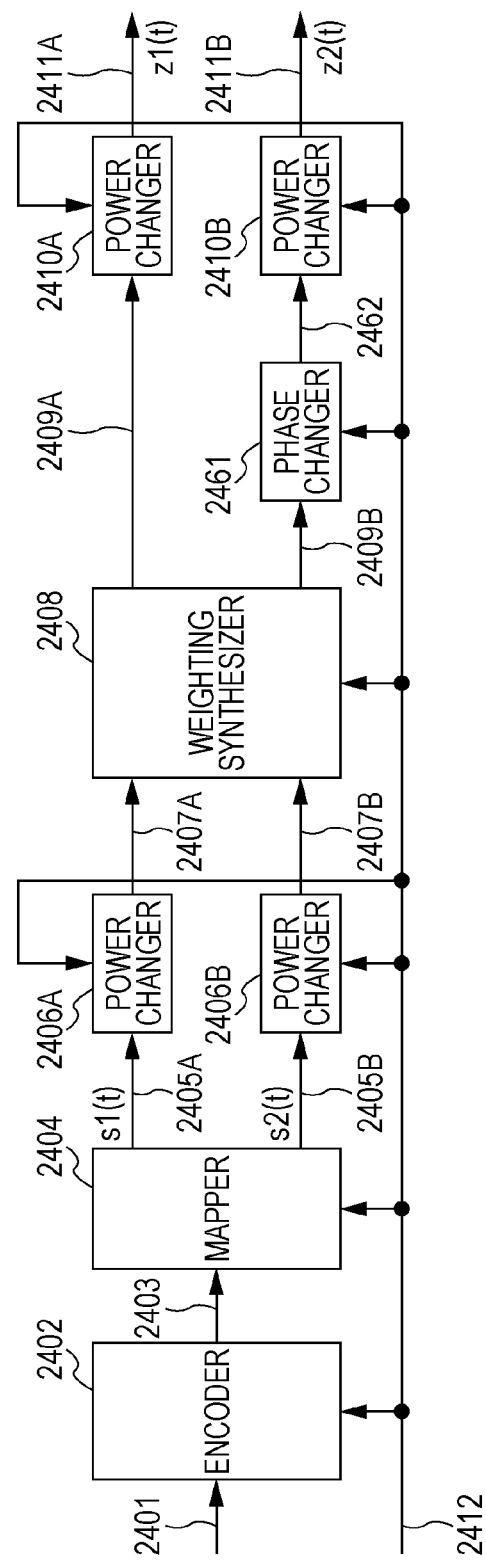
FIG. 25 is a view illustrating an example of a configuration of the transmitter.

Then, power changers 2410A and 2410B in FIG. 25 each change power of an input signal. Therefore, respective outputs z1(i) and z2(i) of power changers 2410A and 2410B in FIG. 25 are expressed by the following equation.

[Equation 3]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} \qquad (3)$$

$$= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix}$$

$$= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}$$

Figure 26:
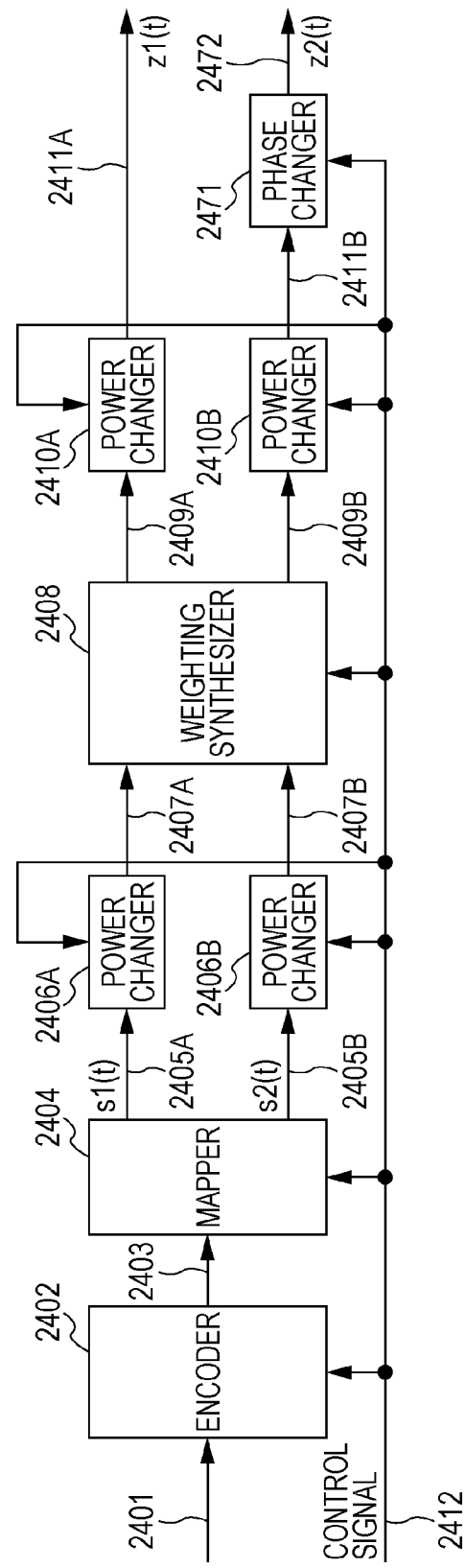
FIG. 26 is a view illustrating an example of a configuration of the transmitter.

Note that as a method for realizing equation (3), there is FIG. 26 as a configuration different from the configuration in FIG. 25. A difference between FIGS. 25 and 26 is that the power changers and the phase changers are switched in order. (Functions themselves of changing power and changing phases are not changed.) In this case, z1(i) and z2(i) are expressed by the following equation.

[Equation 4]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} \qquad (4)$$

$$= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix}$$

$$= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}$$

When value θ(i) of a phase to be changed in equation (3) and equation (4) is set such that, for example, θ(i+1)−θ(i) is a fixed value, the receiver is highly likely to obtain good data reception quality in radio wave propagation environment in which a direct wave is dominant. However, how to give value θ(i) of a phase to be changed is not limited to this example.

The case where there are part of (or all of) the power changers in FIGS. 24 to 26 is described as an example. However, a case where there is no part of the power changers can also be considered.

For example, when there are neither power changer 2406A (power adjuster 2406A) nor power changer 2406B (power adjuster 2406B) in FIG. 24, z1(i) and z2(i) are expressed as follows.

[Equation 5]

$$\begin{pmatrix} z_1(i) \\ z_2(i) \end{pmatrix} = \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \qquad (5)$$

Moreover, when there are neither power changer 2410A (power adjuster 2410A) nor power changer 2410B (power adjuster 2410B) in FIG. 24, z1(i) and z2(i) are expressed as follows.

[Equation 6]

$$\begin{pmatrix} z_1(i) \\ z_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \qquad (6)$$

Moreover, when there are neither power changer 2406A (power adjuster 2406A), nor power changer 2406B (power adjuster 2406B), nor power changer 2410A (power adjuster 2410A) nor power changer 2410B (power adjuster 2410B) in FIG. 24, z1(i) and z2(i) are expressed as follows.

[Equation 7]

$$\begin{pmatrix} z_1(i) \\ z_2(i) \end{pmatrix} = \begin{pmatrix} a(i) & b(i) \\ c(i) & d(i) \end{pmatrix} \begin{pmatrix} s_1(i) \\ s_2(i) \end{pmatrix} \qquad (7)$$

Moreover, when there are neither power changer 2406A (power adjuster 2406A) nor power changer 2406B (power adjuster 24066) in FIG. 25 or 26, z1(i) and z2(i) are expressed as follows.

[Equation 8]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad (8)$$

$$= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix}$$

Moreover, when there are neither power changer 2410A (power adjuster 2410A) nor power changer 2410B (power adjuster 2410B) in FIG. 25 or 26, z1(i) and z2(i) are expressed as follows.

[Equation 9]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad (9)$$

Moreover, when there are neither power changer 2406A (power adjuster 2406A), nor power changer 2406B (power adjuster 2406B), nor power changer 2410A (power adjuster 2410A) nor power changer 24106 (power adjuster 2410B) in FIG. 25 or 26, z1(i) and z2(i) are expressed as follows.

[Equation 10]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad (10)$$

Next, a method for transmitting two streams different from those streams in FIGS. 24 to 26 will be described with reference to FIG. 27. Note that elements which operate in the same way as those in FIGS. 24 to 26 are assigned the same reference numerals in FIG. 27, and will not be described.

Figure 27:
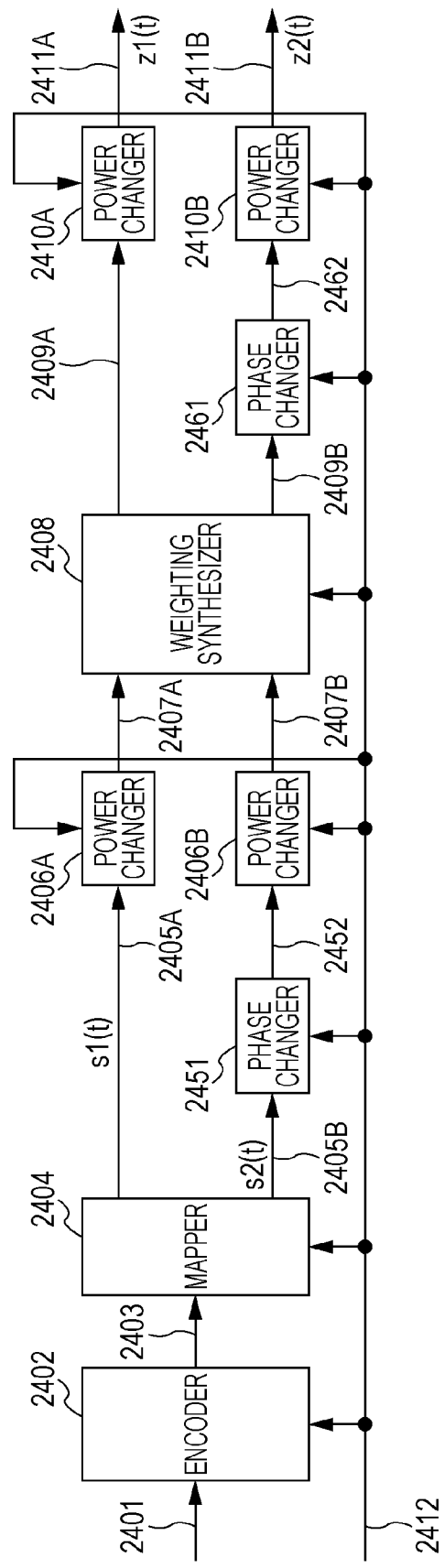
FIG. 27 is a view illustrating an example of a configuration of the transmitter.

A characteristic point in FIG. 27 is that phase changer 2451 is inserted.

Phase changer 2451 receives an input of baseband signal s2(i) (2405B), and control signal 2412. Phase changer 2451 changes a phase of baseband signal s2(i) (2405B) based on control signal 2412. In this case, a phase change value is $e^{j\lambda(i)}$ (j is a unit of an imaginary number). Note that a value of a phase to be changed is a portion characterized by being a function of i like $\lambda(i)$.

Then, as considered in the same way as equation (1) to equation (10), z1(i) and z2(i) which are output signals in FIG. 27 are expressed by the following equation.

[Equation 11]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 & 0 \\ 0 & P_2 \end{pmatrix} \begin{pmatrix} 1 & 0 \\ 0 & e^{j\lambda(i)} \end{pmatrix} \begin{pmatrix} s_1(i) \\ s_2(i) \end{pmatrix} \quad (11)$$

$$= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix}$$

$$\begin{pmatrix} 1 & 0 \\ 0 & e^{j\lambda(i)} \end{pmatrix} \begin{pmatrix} s_1(i) \\ s_2(i) \end{pmatrix}$$

Note that as a method for realizing equation (11), there is a configuration of switching power changer 2406B and phase changer 2451 in order as a configuration different from the configuration in FIG. 27. (Functions themselves of changing power and changing phases are not changed.) In this case, z1(i) and z2(i) are expressed by the following equation.

[Equation 12]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} 1 & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix} \quad (12)$$

$$= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} 1 & 0 \\ 0 & e^{j\lambda(i)} \end{pmatrix}$$

$$\begin{pmatrix} P_1 & 0 \\ 0 & P_2 \end{pmatrix} \begin{pmatrix} s_1(i) \\ s_2(i) \end{pmatrix}$$

As a matter of course, z1(i) of equation (11) and z1(i) of equation (12) are equal, and z2(i) of equation (11) and z2(i) of equation (12) are equal.

Figure 28:
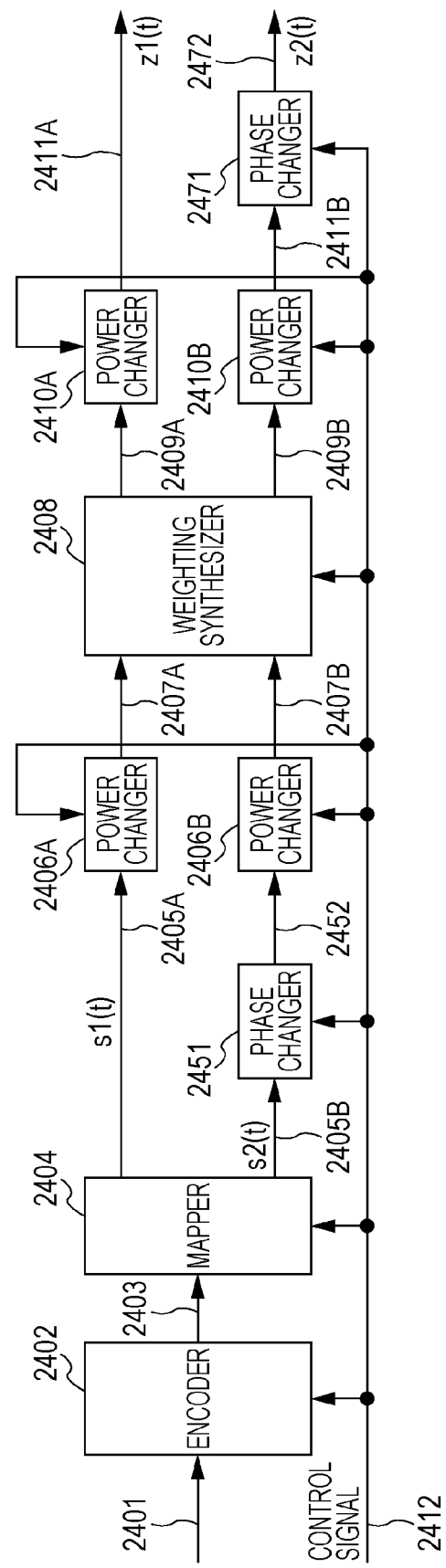
FIG. 28 is a view illustrating an example of a configuration of the transmitter.

FIG. 28 is another configuration which can realize the same processing as the processing in FIG. 27. Note that elements which operate in the same way as those in FIGS. 24 to 27 are assigned the same reference numerals in FIG. 28, and will not be described. Then, a difference between FIGS. 27 and 28 is that order in which power changer 2410B and phase changer 2461 are switched in FIG. 27 is order in FIG. 28. (Functions themselves of changing power and changing phases are not changed.)

Then, as considered in the same way as equation (1) to equation (12), z1(i) and z2(i) which are output signals in FIG. 28 are expressed by the following equation.

[Equation 13]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 & 0 \\ 0 & P_2 \end{pmatrix} \begin{pmatrix} 1 & 0 \\ 0 & e^{j\lambda(i)} \end{pmatrix} \begin{pmatrix} s_1(i) \\ s_2(i) \end{pmatrix} = \quad (13)$$

$$\begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} 1 & 0 \\ 0 & e^{j\lambda(i)} \end{pmatrix} \begin{pmatrix} s_1(i) \\ s_2(i) \end{pmatrix}$$

Note that as a method for realizing equation (13), there is a configuration of switching power changer 2406B and phase changer 2451 in order as a configuration different from the configuration in FIG. 28. (Functions themselves of changing power and changing phases are not changed.) In this case, z1(i) and z2(i) are expressed by the following equation.

[Equation 14]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} 1 & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix} = \quad (14)$$

$$\begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} 1 & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix}$$

As a matter of course, z1(i) of equation (11), z1(i) of equation (12), z1(i) of equation (13) and z1(i) of equation (14) are equal, and z2(i) of equation (11), z2(i) of equation (12), z2(i) of equation (13) and z2(i) of equation (14) are equal.

Next, a method for transmitting two streams different from those streams in FIGS. 24 to 28 will be described with reference to FIG. 29. Note that elements which operate in the same way as those in FIGS. 24 to 28 are assigned the same reference numerals in FIG. 29, and will not be described.

Figure 29:
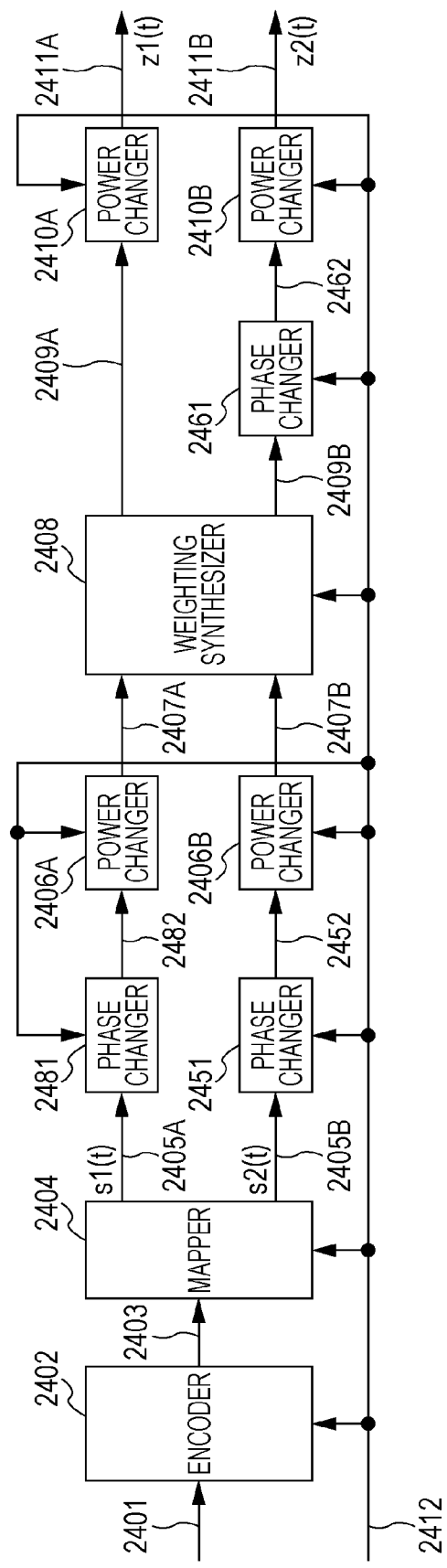
FIG. 29 is a view illustrating an example of a configuration of the transmitter.

A characteristic point in FIG. 29 is that phase changer 2481 and phase changer 2451 are inserted.

Phase changer 2451 receives an input of baseband signal s2(i) (2405B), and control signal 2412. Phase changer 2451 changes a phase of baseband signal s2(i) (2405B) based on control signal 2412. In this case, a phase change value is $e^{j\lambda(i)}$ (j is a unit of an imaginary number). Note that a value of a phase to be changed is a portion characterized by being a function of i like $\lambda(i)$.

Moreover, phase changer 2481 receives an input of baseband signal s1(i) (2405A), and control signal 2412. Phase changer 2481 changes a phase of baseband signal s1(i) (1105A) based on control signal 2412. In this case, a phase change value is $e^{j\delta(i)}$ (j is a unit of an imaginary number). Note that a value of a phase to be changed is a portion characterized by being a function of i like $\delta(i)$.

Then, as considered in the same way as equation (1) to equation (14), z1(i) and z2(i) which are output signals in FIG. 29 are expressed by the following equation.

[Equation 15]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 & 0 \\ 0 & P_2 \end{pmatrix} \begin{pmatrix} e^{j\delta(i)} & 0 \\ 0 & e^{j\lambda(i)} \end{pmatrix} \begin{pmatrix} s_1(i) \\ s_2(i) \end{pmatrix} = \\ \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} e^{j\delta(i)} & 0 \\ 0 & e^{j\lambda(i)} \end{pmatrix} \begin{pmatrix} s_1(i) \\ s_2(i) \end{pmatrix}$$ (15)

Note that as a method for realizing equation (15), there is a configuration of switching power changer 2406B and phase changer 2451 in order and of switching power changer 2406A and phase changer 2481 in order as a configuration different from the configuration in FIG. 29. (Functions themselves of changing power and changing phases are not changed.) In this case, z1(i) and z2(i) are expressed by the following equation.

[Equation 16]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} e^{j\delta(i)} & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix} = \\ \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} e^{j\delta(i)} & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix}$$ (16)

As a matter of course, z1(i) of equation (15) and z1(i) of equation (16) are equal, and z2(i) of equation (15) and z2(i) of equation (16) are equal.

Figure 30:
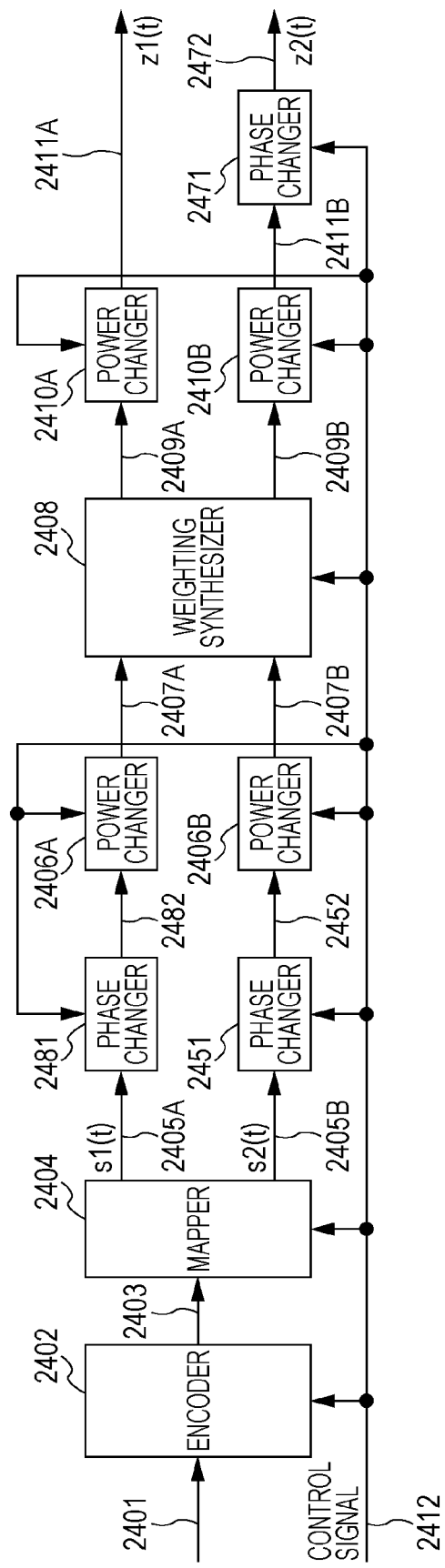
FIG. 30 is a view illustrating an example of a configuration of the transmitter.

FIG. 30 is another configuration which can realize the same processing as the processing in FIG. 29. Note that elements which operate in the same way as those in FIGS. 24 to 29 are assigned the same reference numerals in FIG. 30, and will not be described. Then, a difference between FIGS. 29 and 30 is that order in which power changer 2410B and phase changer 2461 are switched in FIG. 29 is order in FIG. 30. (Functions themselves of changing power and changing phases are not changed.)

Then, as considered in the same way as equation (1) to equation (16), z1(i) and z2(i) which are output signals in FIG. 30 are expressed by the following equation.

[Equation 17]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 & 0 \\ 0 & P_2 \end{pmatrix} \begin{pmatrix} e^{j\delta(i)} & 0 \\ 0 & e^{j\lambda(i)} \end{pmatrix} \begin{pmatrix} s_1(i) \\ s_2(i) \end{pmatrix} = \\ \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} e^{j\delta(i)} & 0 \\ 0 & e^{j\lambda(i)} \end{pmatrix} \begin{pmatrix} s_1(i) \\ s_2(i) \end{pmatrix}$$ (17)

Note that as a method for realizing equation (17), there is a configuration of switching power changer 2406B and phase changer 2451 in order and of switching power changer 2406A and phase changer 2481 in order as a configuration different from the configuration in FIG. 30. (Functions themselves of changing power and changing phases are not changed.) In this case, z1(i) and z2(i) are expressed by the following equation.

[Equation 18]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} e^{j\delta(i)} & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix} = \\ \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} e^{j\delta(i)} & 0 \\ 0 & e^{j\lambda(i)} \end{pmatrix} \begin{pmatrix} P_1 & 0 \\ 0 & P_2 \end{pmatrix} \begin{pmatrix} s_1(i) \\ s_2(i) \end{pmatrix}$$ (18)

As a matter of course, z1(i) of equation (15), z1(i) of equation (16), z1(i) of equation (17) and z1(i) of equation (18) are equal, and z2(i) of equation (15), z2(i) of equation (16), z2(i) of equation (17) and z2(i) of equation (18) are equal.

Next, a method for transmitting two streams different from those streams in FIGS. 24 to 30 will be described with reference to FIG. 31. Note that elements which operate in the same way as those in FIGS. 24 to 30 are assigned the same reference numerals in FIG. 31, and will not be described.

Figure 31:
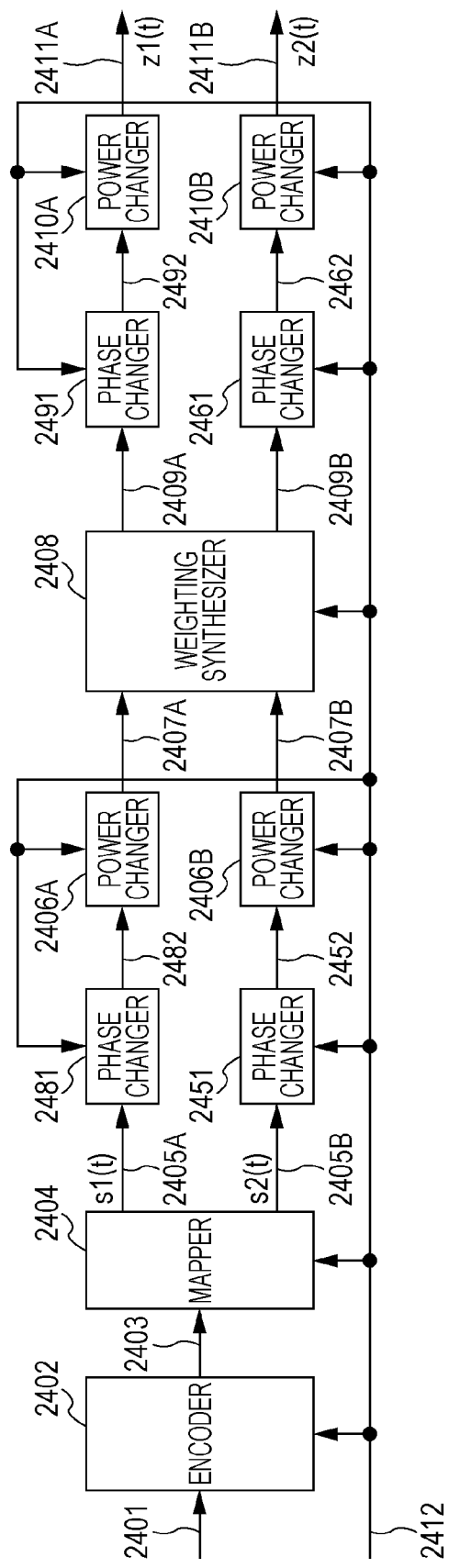
FIG. 31 is a view illustrating an example of a configuration of the transmitter.

A characteristic point in FIG. 31 is that phase changer 2481, phase changer 2451, phase changer 2410A and phase changer 24106 are inserted.

Phase changer 2451 receives an input of baseband signal s2(i) (2405B), and control signal 2412. Phase changer 2451 changes a phase of baseband signal s2(i) (2405B) based on control signal 2412. In this case, a phase change value is $e^{j\lambda(i)}$ (j is a unit of an imaginary number). Note that a value of a phase to be changed is a portion characterized by being a function of i like $\lambda(i)$.

Moreover, phase changer 2481 receives an input of baseband signal s1(i) (2405A), and control signal 2412. Phase changer 2481 changes a phase of baseband signal s1(i) (2405A) based on control signal 2412. In this case, a phase change value is $e^{j\delta(i)}$ (j is a unit of an imaginary number). Note that a value of a phase to be changed is a portion characterized by being a function of i like $\delta(i)$.

Phase changer 2461 changes a phase of an input signal. A phase change value in this case is $\theta(i)$. Similarly, phase changer 2491 changes a phase of an input signal. A phase change value in this case is $\omega(i)$.

Then, as considered in the same way as equation (1) to equation (18), z1(i) and z2(i) which are output signals in FIG. 31 are expressed by the following equation.

[Equation 19]

$$\begin{pmatrix} z_1(i) \\ z_2(i) \end{pmatrix} = \qquad (19)$$

$$\begin{pmatrix} Q_1 & 0 \\ 0 & Q_2 \end{pmatrix}\begin{pmatrix} e^{j\omega(i)} & 0 \\ 0 & e^{j\theta(i)} \end{pmatrix} F \begin{pmatrix} P_1 & 0 \\ 0 & P_2 \end{pmatrix}\begin{pmatrix} e^{j\delta(i)} & 0 \\ 0 & e^{j\lambda(i)} \end{pmatrix}\begin{pmatrix} s_1(i) \\ s_2(i) \end{pmatrix} =$$

$$\begin{pmatrix} Q_1 & 0 \\ 0 & Q_2 \end{pmatrix}\begin{pmatrix} e^{j\omega(i)} & 0 \\ 0 & e^{j\theta(i)} \end{pmatrix}\begin{pmatrix} a(i) & b(i) \\ c(i) & d(i) \end{pmatrix}$$

$$\begin{pmatrix} P_1 & 0 \\ 0 & P_2 \end{pmatrix}\begin{pmatrix} e^{j\delta(i)} & 0 \\ 0 & e^{j\lambda(i)} \end{pmatrix}\begin{pmatrix} s_1(i) \\ s_2(i) \end{pmatrix}$$

Note that as a method for realizing equation (19), there is a configuration of switching power changer 2406B and phase changer 2451 in order and of switching power changer 2406A and phase changer 2481 in order as a configuration different from the configuration in FIG. 31. (Functions themselves of changing power and changing phases are not changed.) In this case, z1(i) and z2(i) are expressed by the following equation.

[Equation 20]

$$\begin{pmatrix} z_1(i) \\ z_2(i) \end{pmatrix} = \qquad (20)$$

$$\begin{pmatrix} Q_1 & 0 \\ 0 & Q_2 \end{pmatrix}\begin{pmatrix} e^{j\omega(i)} & 0 \\ 0 & e^{j\theta(i)} \end{pmatrix} F \begin{pmatrix} e^{j\delta(i)} & 0 \\ 0 & e^{j\lambda(i)} \end{pmatrix}\begin{pmatrix} P_1 & 0 \\ 0 & P_2 \end{pmatrix}\begin{pmatrix} s_1(i) \\ s_2(i) \end{pmatrix} =$$

$$\begin{pmatrix} Q_1 & 0 \\ 0 & Q_2 \end{pmatrix}\begin{pmatrix} e^{j\omega(i)} & 0 \\ 0 & e^{j\theta(i)} \end{pmatrix}\begin{pmatrix} a(i) & b(i) \\ c(i) & d(i) \end{pmatrix}$$

$$\begin{pmatrix} e^{j\delta(i)} & 0 \\ 0 & e^{j\lambda(i)} \end{pmatrix}\begin{pmatrix} P_1 & 0 \\ 0 & P_2 \end{pmatrix}\begin{pmatrix} s_1(i) \\ s_2(i) \end{pmatrix}$$

As a matter of course, z1(i) of equation (19) and z1(i) of equation (20) are equal, and z2(i) of equation (19) and z2(i) of equation (20) are equal.

Figure 32:
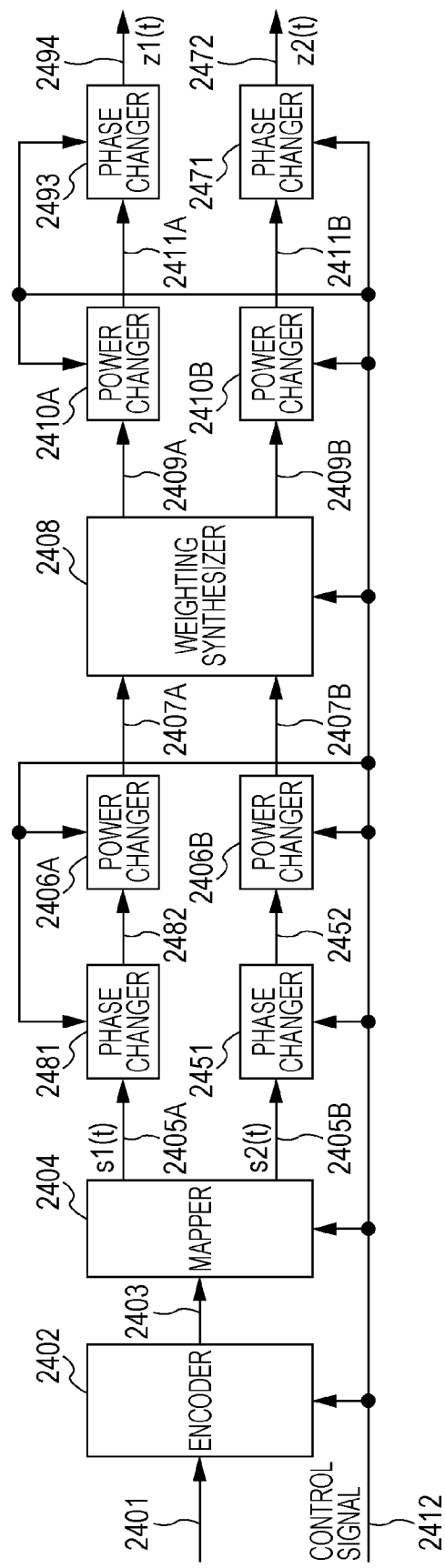
FIG. 32 is a view illustrating an example of a configuration of the transmitter.

FIG. 32 is another configuration which can realize the same processing as the processing in FIG. 31. Note that elements which operate in the same way as those in FIGS. 24 to 31 are assigned the same reference numerals in FIG. 32, and will not be described. Then, a difference between FIGS. 31 and 32 is that order in which power changer 2410B and phase changer 2461 are switched in FIG. 31 and order in which power changer 2410A and phase changer 2491 are switched in FIG. 31 are order in FIG. 32. (Functions themselves of changing power and changing phases are not changed.)

Then, as considered in the same way as equation (1) to equation (20), z1(i) and z2(i) which are output signals in FIG. 32 are expressed by the following equation.

[Equation 21]

$$\begin{pmatrix} z_1(i) \\ z_2(i) \end{pmatrix} = \qquad (21)$$

$$\begin{pmatrix} e^{j\omega(i)} & 0 \\ 0 & e^{j\theta(i)} \end{pmatrix}\begin{pmatrix} Q_1 & 0 \\ 0 & Q_2 \end{pmatrix} F \begin{pmatrix} P_1 & 0 \\ 0 & P_2 \end{pmatrix}\begin{pmatrix} e^{j\delta(i)} & 0 \\ 0 & e^{j\lambda(i)} \end{pmatrix}\begin{pmatrix} s_1(i) \\ s_2(i) \end{pmatrix} =$$

$$\begin{pmatrix} e^{j\omega(i)} & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}$$

$$\begin{pmatrix} P_1 & 0 \\ 0 & P_2 \end{pmatrix}\begin{pmatrix} e^{j\delta(i)} & 0 \\ 0 & e^{j\lambda(i)} \end{pmatrix}\begin{pmatrix} s_1(i) \\ s_2(i) \end{pmatrix}$$

Note that as a method for realizing equation (21), there is a configuration of switching power changer 2406B and phase changer 2451 in order and of switching power changer 2406A and phase changer 2481 in order as a configuration different from the configuration in FIG. 32. (Functions themselves of changing power and changing phases are not changed.) In this case, z1(i) and z2(i) are expressed by the following equation.

[Equation 22]

$$\begin{pmatrix} z_1(i) \\ z_2(i) \end{pmatrix} = \qquad (22)$$

$$\begin{pmatrix} e^{j\omega(i)} & 0 \\ 0 & e^{j\theta(i)} \end{pmatrix}\begin{pmatrix} Q_1 & 0 \\ 0 & Q_2 \end{pmatrix} F \begin{pmatrix} e^{j\delta(i)} & 0 \\ 0 & e^{j\lambda(i)} \end{pmatrix}\begin{pmatrix} P_1 & 0 \\ 0 & P_2 \end{pmatrix}\begin{pmatrix} s_1(i) \\ s_2(i) \end{pmatrix} =$$

$$\begin{pmatrix} e^{j\omega(i)} & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}$$

$$\begin{pmatrix} e^{j\delta(i)} & 0 \\ 0 & e^{j\lambda(i)} \end{pmatrix}\begin{pmatrix} P_1 & 0 \\ 0 & P_2 \end{pmatrix}\begin{pmatrix} s_1(i) \\ s_2(i) \end{pmatrix}$$

As a matter of course, z1(i) of equation (19), z1(i) of equation (20), z1(i) of equation (21) and z1(i) of equation (22) are equal, and z2(i) of equation (19), z2(i) of equation (20), z2(i) of equation (21) and z2(i) of equation (22) are equal.

Matrix F for weighting synthesis (precoding) is described above. However, each exemplary embodiment herein can also be carried out by using precoding matrix F (or F(i)) described below.

[Equation 23]

$$F = \begin{pmatrix} \beta \times e^{j0} & \beta \times \alpha \times e^{j0} \\ \beta \times \alpha \times e^{j0} & \beta \times e^{j\pi} \end{pmatrix} \text{ or} \qquad (23)$$

[Equation 24]

$$F = \frac{1}{\sqrt{\alpha^2 + 1}}\begin{pmatrix} e^{j0} & \alpha \times e^{j0} \\ \alpha \times e^{j0} & e^{j\pi} \end{pmatrix} \text{ or} \qquad (24)$$

[Equation 25]

$$F = \begin{pmatrix} \beta \times e^{j0} & \beta \times \alpha \times e^{j\pi} \\ \beta \times \alpha \times e^{j0} & \beta \times e^{j0} \end{pmatrix} \text{ or} \qquad (25)$$

[Equation 26]
$$F = \frac{1}{\sqrt{\alpha^2+1}}\begin{pmatrix} e^{j0} & \alpha \times e^{j\pi} \\ \alpha \times e^{j0} & e^{j0} \end{pmatrix} \text{ or} \quad (26)$$

[Equation 27]
$$F = \begin{pmatrix} \beta \times \alpha \times e^{j0} & \beta \times e^{j\pi} \\ \beta \times e^{j0} & \beta \times \alpha \times e^{j0} \end{pmatrix} \text{ or} \quad (27)$$

[Equation 28]
$$F = \frac{1}{\sqrt{\alpha^2+1}}\begin{pmatrix} \alpha \times e^{j0} & e^{j\pi} \\ e^{j0} & \alpha \times e^{j0} \end{pmatrix} \text{ or} \quad (28)$$

[Equation 29]
$$F = \begin{pmatrix} \beta \times \alpha \times e^{j0} & \beta \times e^{j0} \\ \beta \times e^{j0} & \beta \times \alpha \times e^{j\pi} \end{pmatrix} \text{ or} \quad (29)$$

[Equation 30]
$$F = \frac{1}{\sqrt{\alpha^2+1}}\begin{pmatrix} \alpha \times e^{j0} & e^{j0} \\ e^{j0} & \alpha \times e^{j\pi} \end{pmatrix} \quad (30)$$

Note that in equation (23), equation (24), equation (25), equation (26), equation (27), equation (28), equation (29), and equation (30), $\alpha$ may be an actual number or may be an imaginary number, and $\beta$ may be an actual number or may be an imaginary number. Here, $\alpha$ is not 0 (zero). Then, $\beta$ is not 0 (zero), either. Alternatively

[Equation 31]
$$F = \begin{pmatrix} \beta \times \cos\theta & \beta \times \sin\theta \\ \beta \times \sin\theta & -\beta \times \cos\theta \end{pmatrix} \text{ or} \quad (31)$$

[Equation 32]
$$F = \begin{pmatrix} \cos\theta & \sin\theta \\ \sin\theta & -\cos\theta \end{pmatrix} \text{ or} \quad (32)$$

[Equation 33]
$$F = \begin{pmatrix} \beta \times \cos\theta & -\beta \times \sin\theta \\ \beta \times \sin\theta & \beta \times \cos\theta \end{pmatrix} \text{ or} \quad (33)$$

[Equation 34]
$$F = \begin{pmatrix} \cos\theta & -\sin\theta \\ \sin\theta & \cos\theta \end{pmatrix} \text{ or} \quad (34)$$

[Equation 35]
$$F = \begin{pmatrix} \beta \times \sin\theta & -\beta \times \cos\theta \\ \beta \times \cos\theta & \beta \times \sin\theta \end{pmatrix} \text{ or} \quad (35)$$

[Equation 36]
$$F = \begin{pmatrix} \sin\theta & -\cos\theta \\ \cos\theta & \sin\theta \end{pmatrix} \text{ or} \quad (36)$$

[Equation 37]
$$F = \begin{pmatrix} \beta \times \sin\theta & \beta \times \cos\theta \\ \beta \times \cos\theta & -\beta \times \sin\theta \end{pmatrix} \text{ or} \quad (37)$$

[Equation 38]
$$F = \begin{pmatrix} \sin\theta & \cos\theta \\ \cos\theta & -\sin\theta \end{pmatrix} \quad (38)$$

Note that in equation (31), equation (33), equation (35) and equation (37), $\beta$ may be an actual number or may be an imaginary number. Here, $\beta$ is not 0 (zero). Alternatively

[Equation 39]
$$F(i) = \begin{pmatrix} \beta \times e^{j\theta_{11}(i)} & \beta \times \alpha \times e^{j(\theta_{11}(i)+\lambda)} \\ \beta \times \alpha \times e^{j\theta_{21}(i)} & \beta \times e^{j(\theta_{21}(i)+\lambda+\pi)} \end{pmatrix} \text{ or} \quad (39)$$

[Equation 40]
$$F(i) = \frac{1}{\sqrt{\alpha^2+1}}\begin{pmatrix} e^{j\theta_{11}(i)} & \beta \times e^{j(\theta_{11}(i)+\lambda)} \\ \alpha \times e^{j\theta_{21}(i)} & e^{j(\theta_{21}(i)+\lambda+\pi)} \end{pmatrix} \text{ or} \quad (40)$$

[Equation 41]
$$F(i) = \begin{pmatrix} \beta \times \alpha \times e^{j\theta_{21}(i)} & \beta \times e^{j(\theta_{21}(i)+\lambda+\pi)} \\ \beta \times e^{j\theta_{11}(i)} & \beta \times \alpha \times e^{j(\theta_{11}(i)+\lambda)} \end{pmatrix} \text{ or} \quad (41)$$

[Equation 42]
$$F(i) = \frac{1}{\sqrt{\alpha^2+1}}\begin{pmatrix} \alpha \times e^{j\theta_{21}(i)} & e^{j(\theta_{21}(i)+\lambda+\pi)} \\ e^{j\theta_{11}(i)} & \alpha \times e^{j(\theta_{11}(i)+\lambda)} \end{pmatrix} \text{ or} \quad (42)$$

[Equation 43]
$$F(i) = \begin{pmatrix} \beta \times e^{j\theta_{11}} & \beta \times \alpha \times e^{j(\theta_{11}+\lambda(i))} \\ \beta \times \alpha \times e^{j\theta_{21}} & \beta \times e^{j(\theta_{21}+\lambda(i)+\pi)} \end{pmatrix} \text{ or} \quad (43)$$

[Equation 44]
$$F(i) = \frac{1}{\sqrt{\alpha^2+1}}\begin{pmatrix} e^{j\theta_{11}} & \alpha \times e^{j(\theta_{11}+\lambda(i))} \\ \alpha \times e^{j\theta_{21}} & e^{j(\theta_{21}+\lambda(i)+\pi)} \end{pmatrix} \text{ or} \quad (44)$$

[Equation 45]
$$F(i) = \begin{pmatrix} \beta \times \alpha \times e^{j\theta_{21}} & \beta \times e^{j(\theta_{21}+\lambda(i)+\pi)} \\ \beta \times e^{j\theta_{11}} & \beta \times \alpha \times e^{j(\theta_{11}+\lambda(i))} \end{pmatrix} \text{ or} \quad (45)$$

[Equation 46]
$$F(i) = \frac{1}{\sqrt{\alpha^2+1}}\begin{pmatrix} \alpha \times e^{j\theta_{21}} & e^{j(\theta_{21}+\lambda(i)+\pi)} \\ e^{j\theta_{11}} & \alpha \times e^{j(\theta_{11}+\lambda(i))} \end{pmatrix} \text{ or} \quad (46)$$

[Equation 47]
$$F = \begin{pmatrix} \beta \times e^{j\theta_{11}} & \beta \times \alpha \times e^{j(\theta_{11}+\lambda)} \\ \beta \times \alpha \times e^{j\theta_{21}} & \beta \times e^{j(\theta_{21}+\lambda+\pi)} \end{pmatrix} \text{ or} \quad (47)$$

[Equation 48]
$$F = \frac{1}{\sqrt{\alpha^2+1}}\begin{pmatrix} e^{j\theta_{11}} & \alpha \times e^{j(\theta_{11}+\lambda)} \\ \alpha \times e^{j\theta_{21}} & e^{j(\theta_{21}+\lambda+\pi)} \end{pmatrix} \text{ or} \quad (48)$$

[Equation 49]
$$F = \begin{pmatrix} \beta \times \alpha \times e^{j\theta_{21}} & \beta \times e^{j(\theta_{21}+\lambda+\pi)} \\ \beta \times e^{j\theta_{11}} & \beta \times \alpha \times e^{j(\theta_{11}+\lambda)} \end{pmatrix} \text{ or} \quad (49)$$

-continued

[Equation 50]

$$F = \frac{1}{\sqrt{\alpha^2+1}} \begin{pmatrix} \alpha \times e^{j\theta_{21}} & e^{j(\theta_{21}+\lambda+\pi)} \\ e^{j\theta_{11}} & \alpha \times e^{j(\theta_{11}+\lambda)} \end{pmatrix} \quad (50)$$

Here, $\theta_{11}(i)$, $\theta_{21}(i)$ and $\lambda(i)$ are functions of i (functions of time, functions of a frequency or functions of time and a frequency), $\lambda$ is a fixed value, $\alpha$ may be an actual number or may be an imaginary number, and $\beta$ may be an actual number or may be an imaginary number. Here, $\alpha$ is not 0 (zero). Then, $\beta$ is not 0 (zero), either. Alternatively

[Equation 51]

$$F = \begin{pmatrix} \beta & 0 \\ 0 & \beta \end{pmatrix} \text{ or} \quad (51)$$

[Equation 52]

$$F = \begin{pmatrix} \beta & 0 \\ 0 & -\beta \end{pmatrix} \text{ or} \quad (52)$$

[Equation 53]

$$F = \begin{pmatrix} \beta & 0 \\ 0 & \beta \times e^{j\theta(i)} \end{pmatrix} \text{ or} \quad (53)$$

[Equation 54]

$$F = \begin{pmatrix} \beta & 0 \\ 0 & -\beta \times e^{j\theta(i)} \end{pmatrix} \text{ or} \quad (54)$$

[Equation 55]

$$F = \begin{pmatrix} -\beta & 0 \\ 0 & \beta \times e^{j\theta(i)} \end{pmatrix} \quad (55)$$

Here, $\theta(i)$ is a function of i (a function of time, a function of a frequency or a function of time and a frequency), and $\beta$ may be an actual number or may be an imaginary number. Here, $\beta$ is not 0 (zero), either.

Moreover, each exemplary embodiment herein can also be carried out by using a precoding matrix other than these matrices.

In addition, a method for performing precoding without performing the above-described phase change, and generating a modulated signal, and transmitting the modulated signal from the transmitter may be used. In this case, an example where z1(i) and z2(i) are expressed by the following equation can be considered.

[Equation 56]

$$\begin{pmatrix} z_1(i) \\ z_2(i) \end{pmatrix} = \begin{pmatrix} Q_1 & 0 \\ 0 & Q_2 \end{pmatrix} F \begin{pmatrix} P_1 & 0 \\ 0 & P_2 \end{pmatrix} \begin{pmatrix} s_1(i) \\ s_2(i) \end{pmatrix} \quad (56)$$

[Equation 57]

$$\begin{pmatrix} z_1(i) \\ z_2(i) \end{pmatrix} = \begin{pmatrix} Q_1 & 0 \\ 0 & Q_2 \end{pmatrix} F \begin{pmatrix} P_1 & 0 \\ 0 & P_2 \end{pmatrix} \begin{pmatrix} s_1(i) \\ s_2(i) \end{pmatrix} \quad (57)$$

[Equation 58]

$$\begin{pmatrix} z_1(i) \\ z_2(i) \end{pmatrix} = F \begin{pmatrix} P_1 & 0 \\ 0 & P_2 \end{pmatrix} \begin{pmatrix} s_1(i) \\ s_2(i) \end{pmatrix} \quad (58)$$

[Equation 59]

$$\begin{pmatrix} z_1(i) \\ z_2(i) \end{pmatrix} = \begin{pmatrix} Q_1 & 0 \\ 0 & Q_2 \end{pmatrix} F \begin{pmatrix} s_1(i) \\ s_2(i) \end{pmatrix} \quad (59)$$

[Equation 60]

$$\begin{pmatrix} z_1(i) \\ z_2(i) \end{pmatrix} = F \begin{pmatrix} s_1(i) \\ s_2(i) \end{pmatrix} \quad (60)$$

Then, z1(i) (or z1(i) of equation (56), z1(i) of equation (57), z1(i) of equation (58), z1(i) of equation (59) or z1(i) of equation (60)) obtained in FIGS. 24 to 32 corresponds to 2113_1 in FIG. 21. z2(i) (or z2(i) of equation (56), z2(i) of equation (57), z2(i) of equation (58), z2(i) of equation (59) or z2(i) of equation (60)) obtained in FIGS. 24 to 32 corresponds to 2113_2 in FIG. 21.

FIGS. 33 to 37 illustrate examples of a method for arranging z1(i) and z2(i) generated in FIGS. 17 to 32 (as described above, z1(a) and z2(a) are transmitted from different antennas by using identical time and an identical frequency).

Figure 33:
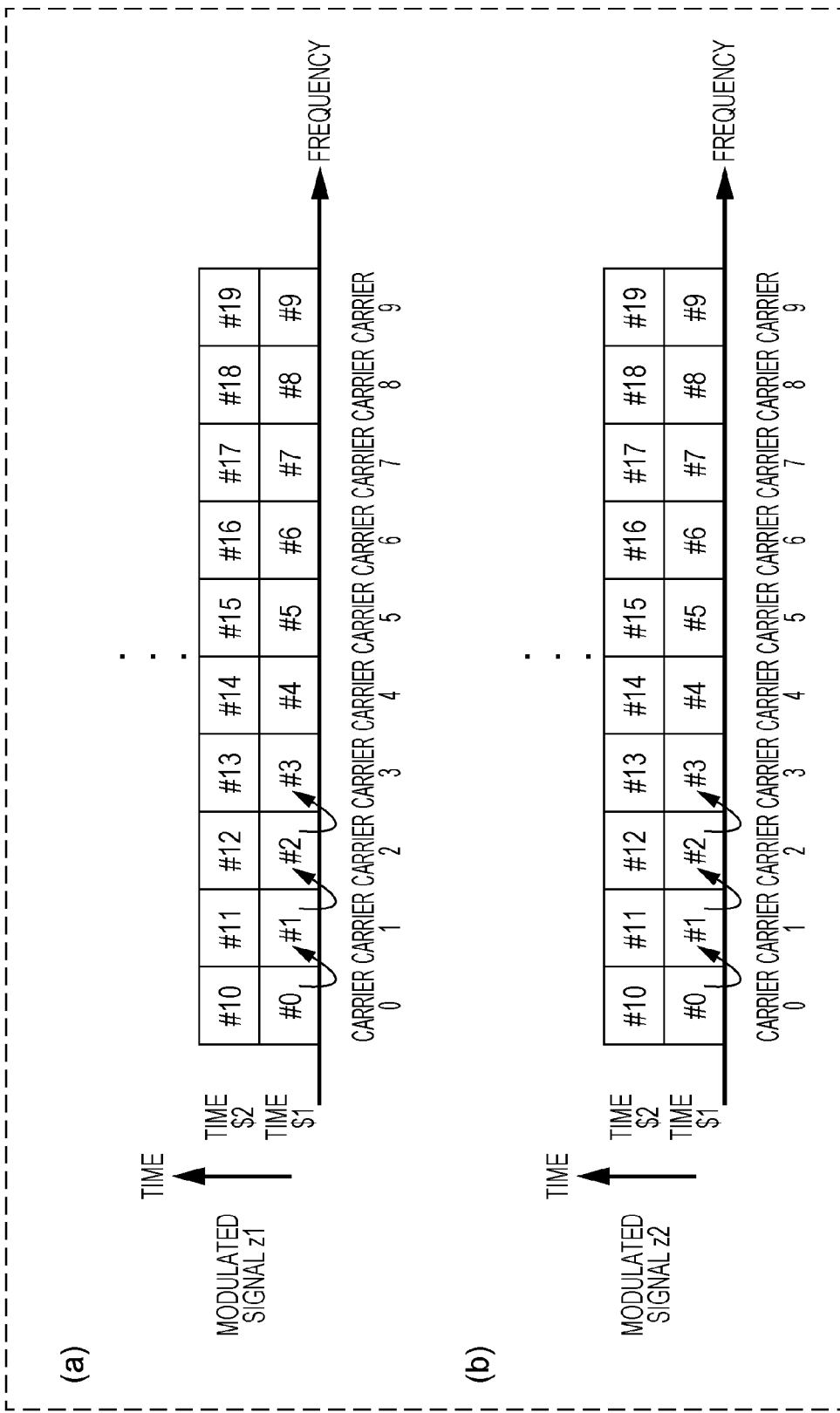
FIG. 33 is a view illustrating an example of a frame configuration.

In FIG. 33, FIG. 33(A) illustrates a method for arranging z1(i), and FIG. 33(B) illustrates a method for arranging z2(i). In FIGS. 33(A) and 33(B), a vertical axis indicates time, and a horizontal axis indicates a frequency.

FIG. 33(A) will be described. First, when z1(0), z1(1), z1(2), z1(3), corresponding to i=0, 1, 2, 3, . . . are generated, z1(0) is arranged at carrier 0 and time 1, z1(1) is arranged at carrier 1 and time 1, z1(2) is arranged at carrier 2 and time 1, . . . , z1(10) is arranged at carrier 0 and time 2, z1(11) is arranged at carrier 1 and time 2, z1(12) is arranged at carrier 2 and time 2, and . . . .

Similarly, when z2(0), z2(1), z2(2), z2(3), . . . corresponding to i=0, 1, 2, 3, . . . are generated in FIG. 33(B), z2(0) is arranged at carrier 0 and time 1, z2(1) is arranged at carrier 1 and time 1, z2(2) is arranged at carrier 2 and time 1, . . . , z2(10) is arranged at carrier 0 and time 2, z2(11) is arranged at carrier 1 and time 2, z2(12) is arranged at carrier 2 and time 2, and . . . .

In this case, z1(a) and z2(a) in a case of i=α are transmitted at an identical frequency and at identical time. Then, FIG. 33 is an example of a case where generated z1(i) and z2(i) are preferentially arranged in the frequency axis direction.

Figure 34:
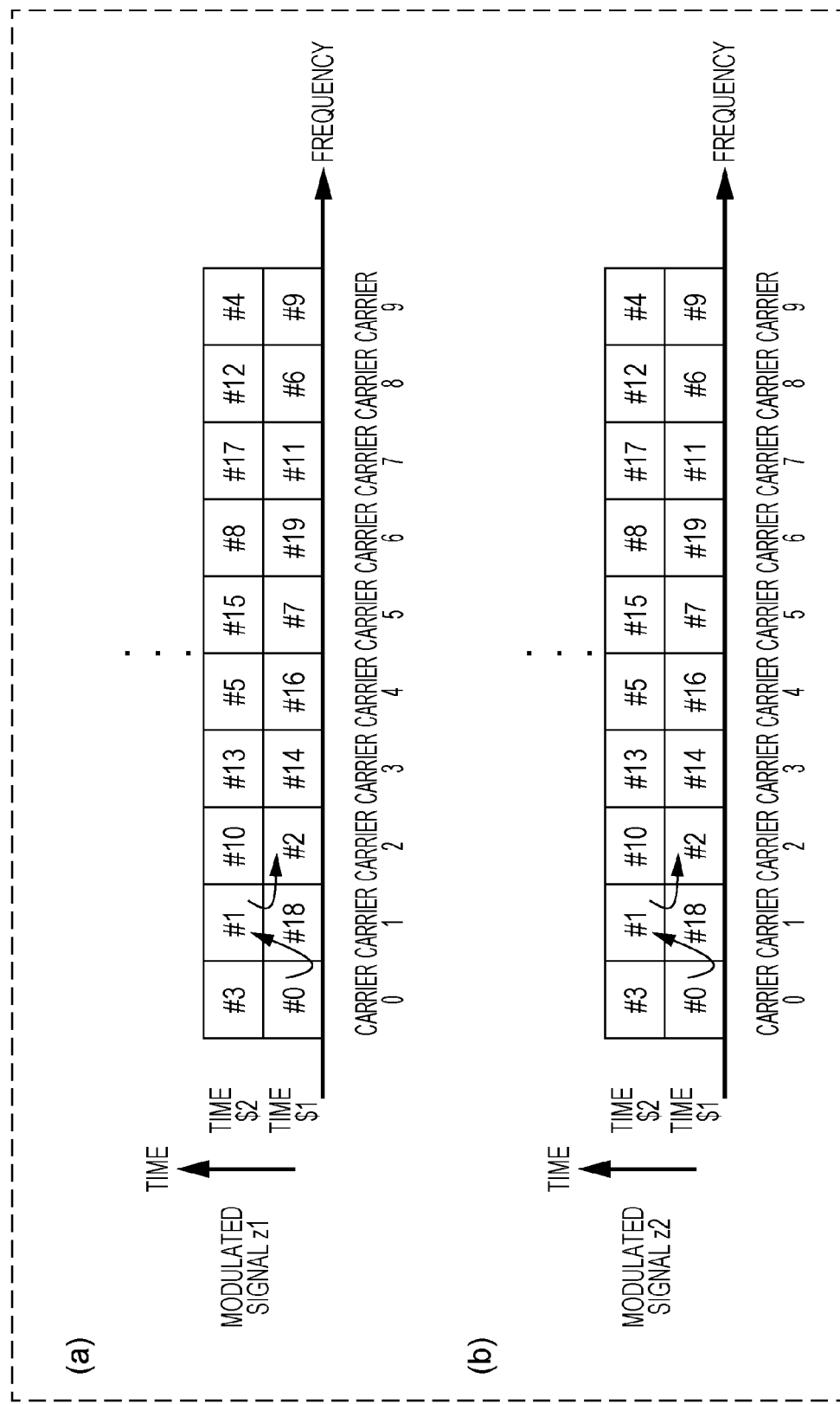
FIG. 34 is a view illustrating an example of a frame configuration.

In FIG. 34, FIG. 34(A) illustrates a method for arranging z1(i), and FIG. 34(B) illustrates a method for arranging z2(i). In FIGS. 34(A) and 34(B), a vertical axis indicates time, and a horizontal axis indicates a frequency.

FIG. 34(A) will be described. First, when z1(0), z1(1), z1(2), z1(3), corresponding to i=0, 1, 2, 3, . . . are generated, z1(0) is arranged at carrier 0 and time 1, z1(1) is arranged at carrier 1 and time 2, z1(2) is arranged at carrier 2 and time 1, . . . , z1(10) is arranged at carrier 2 and time 2, z1(11) is arranged at carrier 7 and time 1, z1(12) is arranged at carrier 8 and time 2, and . . . .

Similarly, when z2(0), z2(1), z2(2), z2(3), . . . corresponding to i=0, 1, 2, 3, . . . are generated in FIG. 34(B), z2(0) is arranged at carrier 0 and time 1, z2(1) is arranged at carrier 1 and time 2, z2(2) is arranged at carrier 2 and time 1, . . . , z2(10) is arranged at carrier 2 and time 2, z2(11) is arranged at carrier 7 and time 1, z2(12) is arranged at carrier 8 and time 2, and . . . .

In this case, z1(a) and z2(a) in a case of i=α are transmitted at an identical frequency and at identical time. Then, FIG. 34 is an example of a case where generated z1(i) and z2(i) are randomly arranged in the frequency axis and time axis directions.

Figure 35:
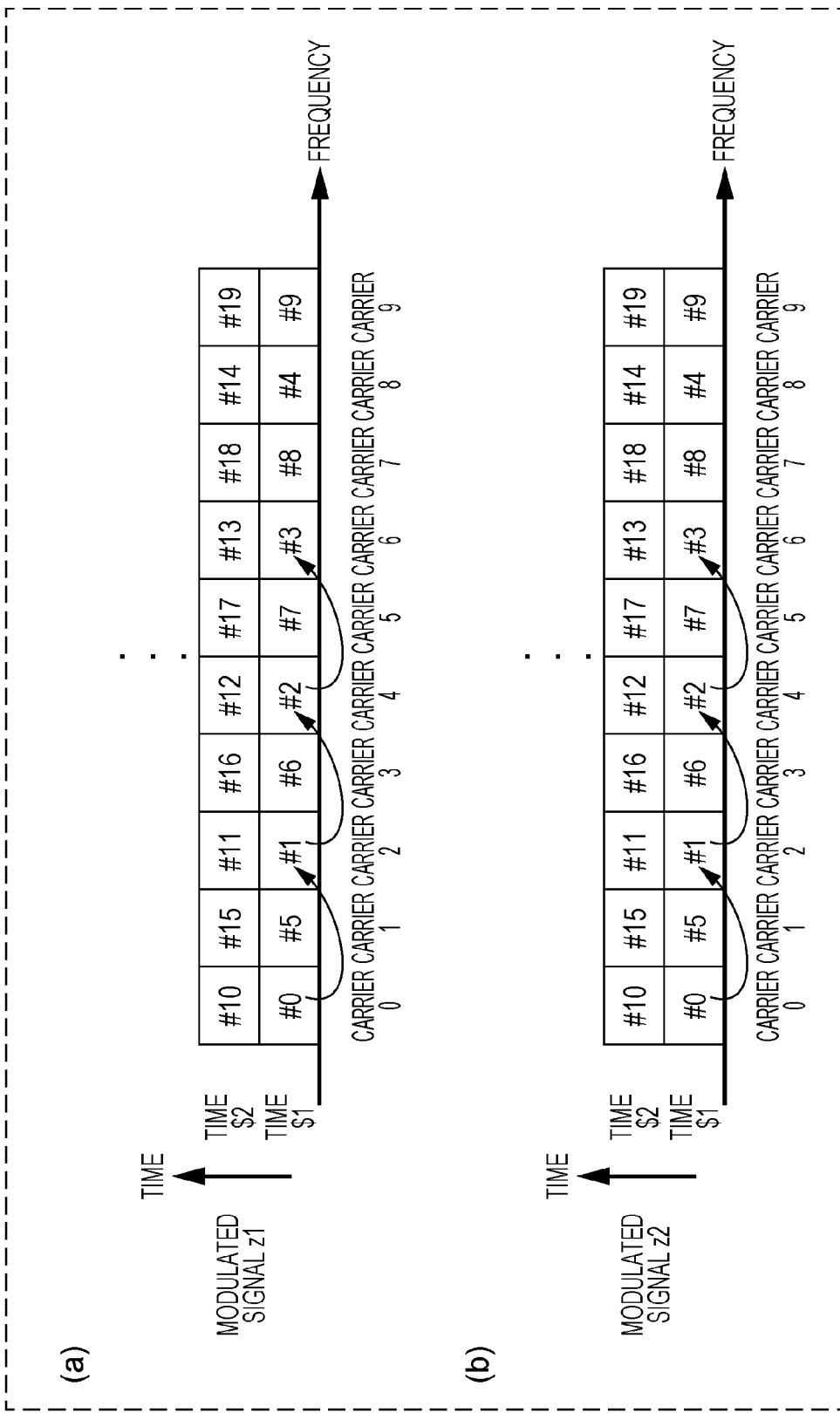
FIG. 35 is a view illustrating an example of a frame configuration.

In FIG. 35, FIG. 35(A) illustrates a method for arranging z1(i), and FIG. 35(B) illustrates a method for arranging z2(i). In FIGS. 35(A) and 35(B), a vertical axis indicates time, and a horizontal axis indicates a frequency.

FIG. 35(A) will be described. First, when z1(0), z1(1), z1(2), z1(3), corresponding to i=0, 1, 2, 3, . . . are generated, z1(0) is arranged at carrier 0 and time 1, z1(1) is arranged at carrier 2 and time 1, z1(2) is arranged at carrier 4 and time 1, . . . , z1(10) is arranged at carrier 0 and time 2, z1(11) is arranged at carrier 2 and time 2, z1(12) is arranged at carrier 4 and time 2, and . . . .

Similarly, when z2(0), z2(1), z2(2), z2(3), . . . corresponding to i=0, 1, 2, 3, . . . are generated in FIG. 35(B), z2(0) is arranged at carrier 0 and time 1, z2(1) is arranged at carrier 2 and time 1, z2(2) is arranged at carrier 4 and time 1, . . . , z2(10) is arranged at carrier 0 and time 2, z2(11) is arranged at carrier 2 and time 2, z2(12) is arranged at carrier 4 and time 2, and . . . .

In this case, z1(a) and z2(a) in a case of i=α are transmitted at an identical frequency and at identical time. Then, FIG. 35 is an example of a case where generated z1(i) and z2(i) are preferentially arranged in the frequency axis direction.

Figure 36:
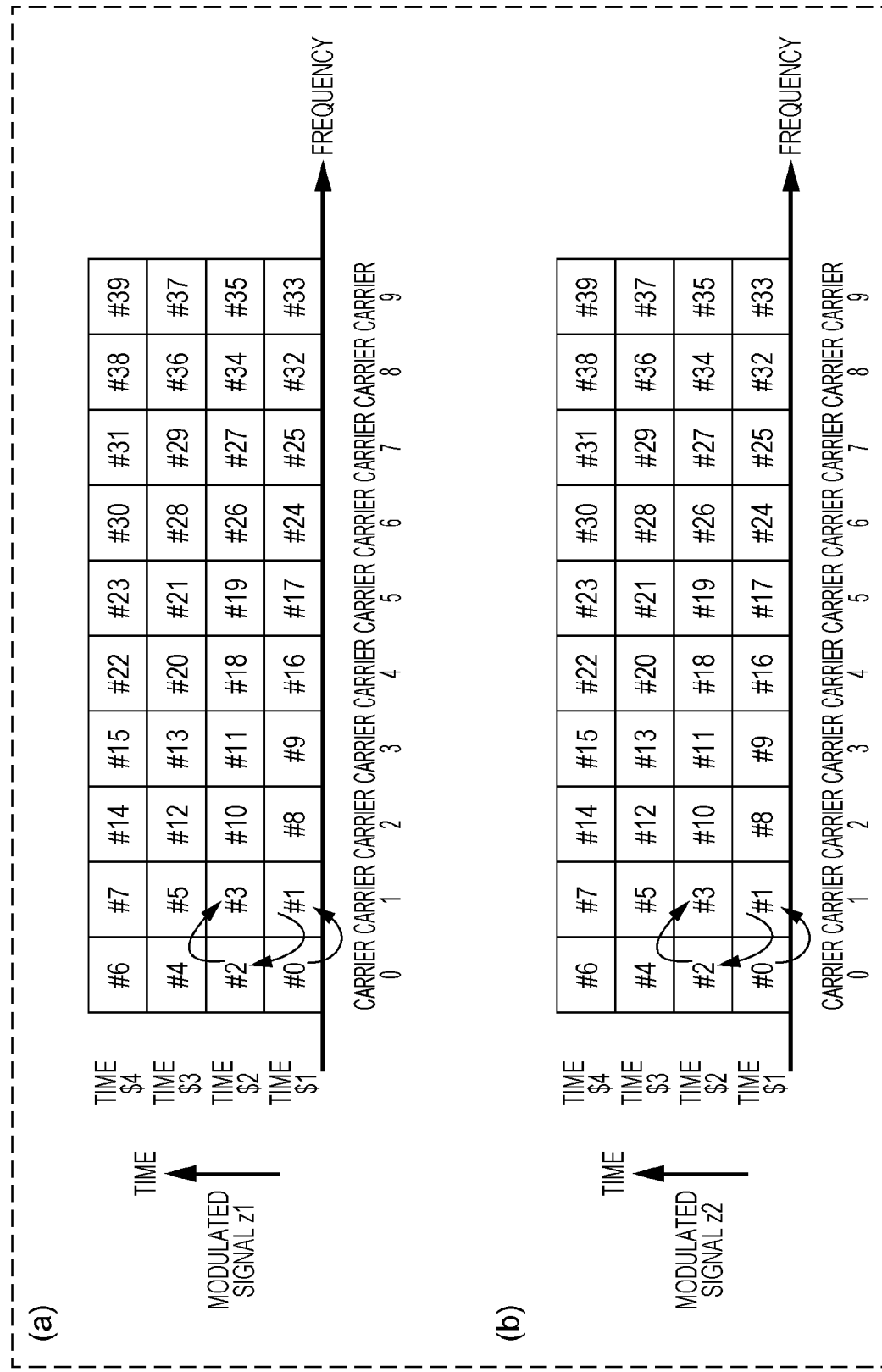
FIG. 36 is a view illustrating an example of a frame configuration.

In FIG. 36, FIG. 36(A) illustrates a method for arranging z1(i), and FIG. 36(B) illustrates a method for arranging z2(i). In FIGS. 36(A) and 36(B), a vertical axis indicates time, and a horizontal axis indicates a frequency.

FIG. 36(A) will be described. First, when z1(0), z1(1), z1(2), z1(3), corresponding to i=0, 1, 2, 3, . . . are generated, z1(0) is arranged at carrier 0 and time 1, z1(1) is arranged at carrier 1 and time 1, z1(2) is arranged at carrier 0 and time 2, . . . , z1(10) is arranged at carrier 2 and time 2, z1(11) is arranged at carrier 3 and time 2, z1(12) is arranged at carrier 2 and time 3, and . . . .

Similarly, when z2(0), z2(1), z2(2), z2(3), . . . corresponding to i=0, 1, 2, 3, . . . are generated in FIG. 36(B), z2(0) is arranged at carrier 0 and time 1, z2(1) is arranged at carrier 1 and time 1, z2(2) is arranged at carrier 0 and time 2, . . . , z2(10) is arranged at carrier 2 and time 2, z2(11) is arranged at carrier 3 and time 2, z2(12) is arranged at carrier 2 and time 3, and . . . .

In this case, z1(a) and z2(a) in a case of i=α are transmitted at an identical frequency and at identical time. Then, FIG. 36 is an example of a case where generated z1(i) and z2(i) are arranged in the time and frequency axis directions.

Figure 37:
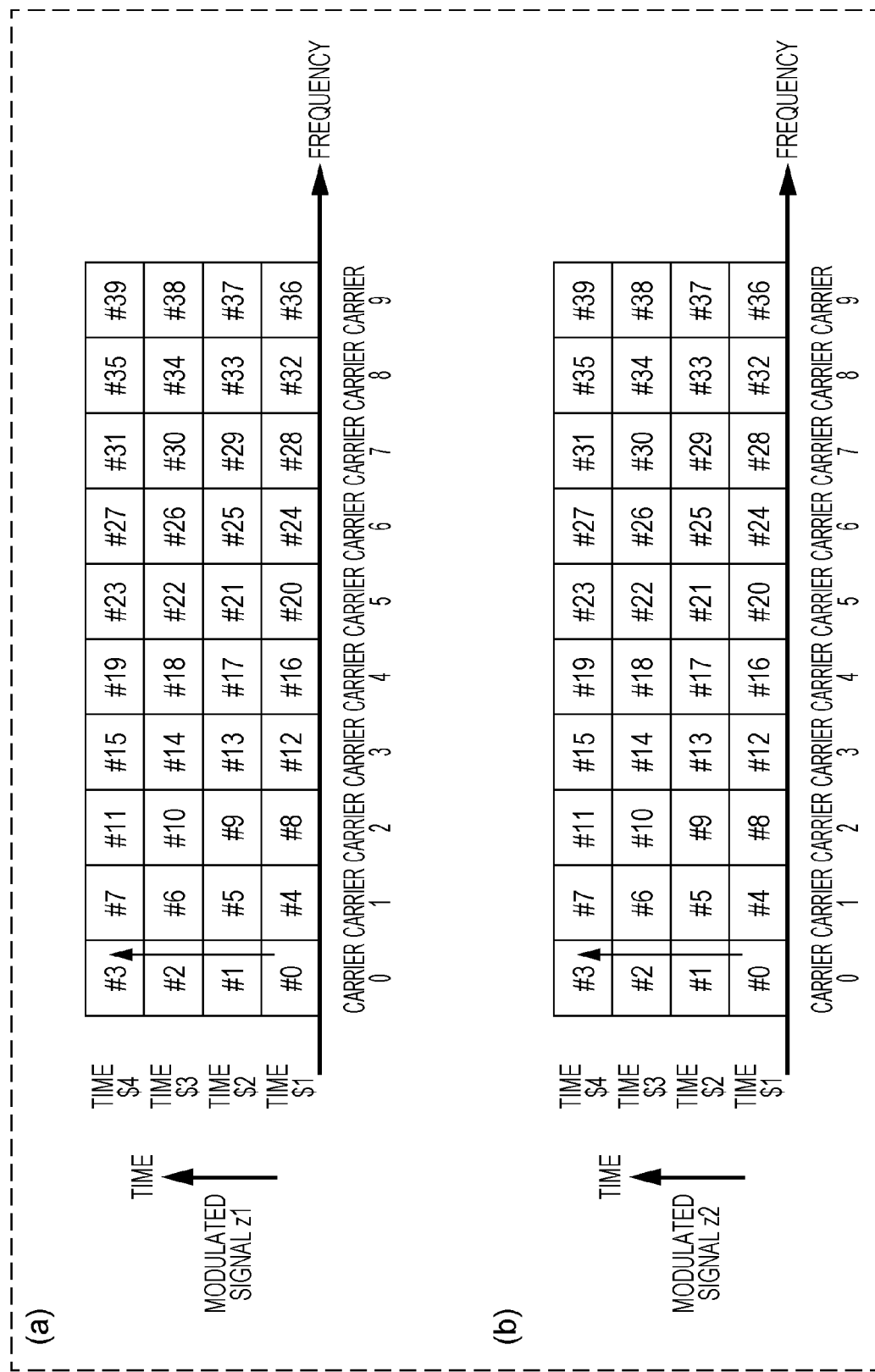
FIG. 37 is a view illustrating an example of a frame configuration.

In FIG. 37, FIG. 37(A) illustrates a method for arranging z1(i), and FIG. 37(B) illustrates a method for arranging z2(i). In FIGS. 37(A) and 37(B), a vertical axis indicates time, and a horizontal axis indicates a frequency.

FIG. 37(A) will be described. First, when z1(0), z1(1), z1(2), z1(3), corresponding to i=0, 1, 2, 3, . . . are generated, z1(0) is arranged at carrier 0 and time 1, z1(1) is arranged at carrier 0 and time 2, z1(2) is arranged at carrier 0 and time 3, . . . , z1(10) is arranged at carrier 2 and time 3, z1(11) is arranged at carrier 2 and time 4, z1(12) is arranged at carrier 3 and time 1, and . . . .

Similarly, when z2(0), z2(1), z2(2), z2(3), . . . corresponding to i=0, 1, 2, 3, . . . are generated in FIG. 37(B), z2(0) is arranged at carrier 0 and time 1, z2(1) is arranged at carrier 0 and time 2, z2(2) is arranged at carrier 0 and time 3, . . . , z2(10) is arranged at carrier 2 and time 3, z2(11) is arranged at carrier 2 and time 4, z2(12) is arranged at carrier 3 and time 1, and . . . .

In this case, z1(a) and z2(a) in a case of i=α are transmitted at an identical frequency and at identical time. Then, FIG. 37 is an example of a case where generated z1(i) and z2(i) are preferentially arranged in the time axis direction.

Figure 38:
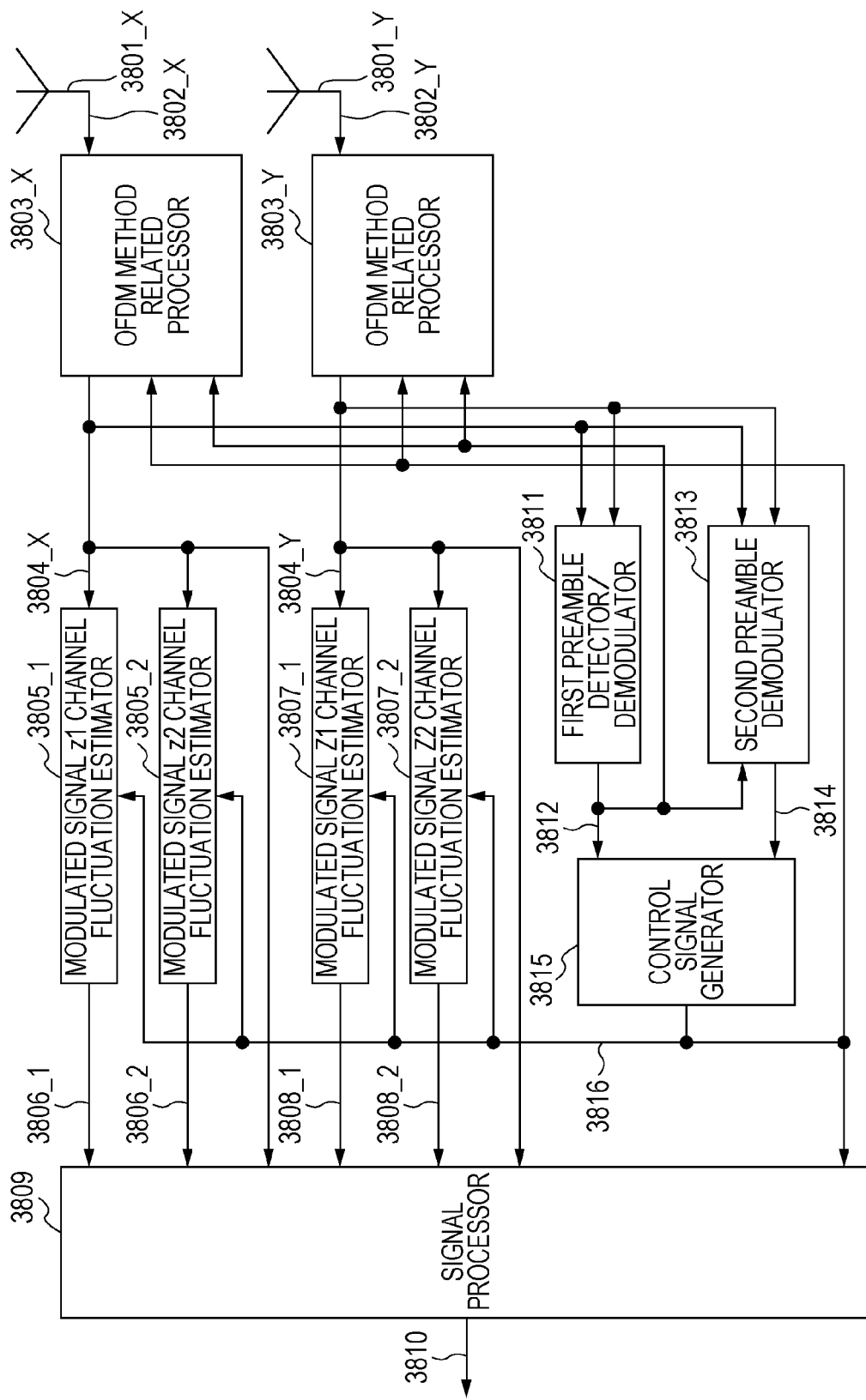
FIG. 38 is a view illustrating an example of a configuration of the receiver.

FIG. 38 is a configuration example of a receiver (terminal) which receives a modulated signal transmitted by the transmitter in FIG. 21.

In FIG. 38, OFDM method related processor 3803_X receives an input of received signal 3802_X received at antenna 3801_X. OFDM method related processor 3803_X performs reception side signal processing for the OFDM method. OFDM method related processor 3803_X outputs signal 3804_X obtained after the signal processing. Similarly, OFDM method related processor 3803_Y receives an input of received signal 3802_Y received at antenna 3801_Y. OFDM method related processor 3803_Y performs reception side signal processing for the OFDM method. OFDM method related processor 3803_Y outputs signal 3804_Y obtained after the signal processing.

The transmitter may arrange symbols according to any method of the methods in FIGS. 33 to 37 and symbol arranging methods other than the methods in FIGS. 33 to 37 (FIGS. 33 to 37 are only examples of symbol arrangement).

First preamble detector/demodulator 3811 receives an input of signals 3804_X and 3804_Y obtained after the signal processing. First preamble detector/demodulator 3811 performs signal detection and time-frequency synchronization by detecting a first preamble, and at the same time obtains control information contained in the first preamble (by performing demodulation and error correction decoding), and outputs first preamble control information 3812.

Second preamble demodulator 3813 receives an input of signals 3804_X and 3804_Y obtained after the signal processing, and first preamble control information 3812. Second preamble demodulator 3813 performs signal processing based on first preamble control information 3812. Second preamble demodulator 3813 performs demodulation (error correction decoding). Second preamble demodulator 3813 outputs second preamble control information 3814.

Control information generator 3815 receives an input of first preamble control information 3812, and second preamble control information 3814. Control information generator 3815 bundles control information (related to a receiving operation) and outputs the control information as control signal 3816. Then, control signal 2316 is input to each unit as illustrated in FIG. 23.

Modulated signal z1 channel fluctuation estimator 3805_1 receives an input of signal 3804_X obtained after the signal processing, and control signal 3816. Modulated signal z1 channel fluctuation estimator 3805_1 estimates a channel fluctuation between an antenna from which the transmitter has transmitted modulated signal z1 and reception antenna 3801_X by using a pilot symbol and the like contained in signal 3804_X obtained after the signal processing, and outputs channel estimation signal 3806_1.

Modulated signal z2 channel fluctuation estimator 3805_2 receives an input of signal 3804_X obtained after the signal processing, and control signal 3816. Modulated signal z2 channel fluctuation estimator 3805_2 estimates a channel fluctuation between an antenna from which the transmitter has transmitted modulated signal z2 and reception antenna 3801_X by using a pilot symbol and the like contained in signal 3804_X obtained after the signal processing, and outputs channel estimation signal 3806_2.

Modulated signal z1 channel fluctuation estimator 3807_1 receives an input of signal 3804_Y obtained after the signal processing, and control signal 3816. Modulated signal z1 channel fluctuation estimator 3807_1 estimates a channel fluctuation between an antenna from which the transmitter has transmitted modulated signal z1 and reception antenna 3801_Y by using a pilot symbol and the like contained in signal 3804_Y obtained after the signal processing, and outputs channel estimation signal 3808_1.

Modulated signal z2 channel fluctuation estimator 3807_2 receives an input of signal 3804_Y obtained after the signal processing, and control signal 3816. Modulated signal z2 channel fluctuation estimator 3807_2 estimates a channel fluctuation between an antenna from which the transmitter has transmitted modulated signal z2 and reception antenna 3801_Y by using a pilot symbol and the like contained in signal 3804_Y obtained after the signal processing, and outputs channel estimation signal 3808_2.

Signal processor 3809 receives an input of signals 3806_1, 3806_2, 3808_1, 3808_2, 3804_X and 3804_Y, and control signal 3816. Signal processor 3809 performs demodulation and decoding processing based on information such as a transmission method, a modulating method, an error correction coding scheme, a coding rate of error correction coding and a block size of an error correction code contained in control signal 3816. Signal processor 3809 outputs received data 3810. In this case, other wave detection (demodulation)/decoding is performed based on the above-described transmission method.

In a case of the present exemplary embodiment, signal processor 3809 switches decoding according to "method #A" and decoding according to "method #B" illustrated, for example, in FIGS. 5, 6, 7, 8, 9, 10, 12, 13, 14, 15 and 16, based on information of a number of bits of one encoded block contained in control signal 3816 and based on information of a coding rate contained in control signal 3816, and performs error correction decoding.

Note that the receiver extracts and demodulates (including signal demultiplexing and signal wave detection) a necessary symbol from control signal 3816, and performs error correction decoding. Moreover, a configuration of the receiver is not limited thereto.

Exemplary Embodiment D

The above-described exemplary embodiments describe the data symbols in FIGS. 11 and 18 and the data symbol group in FIG. 20 that may be of an SISO method and an SIMO method. In the present exemplary embodiment, an example different from the above-described example of generation of a modulated signal in a case of the SISO method and the SIMO method will be described.

Figure 39:
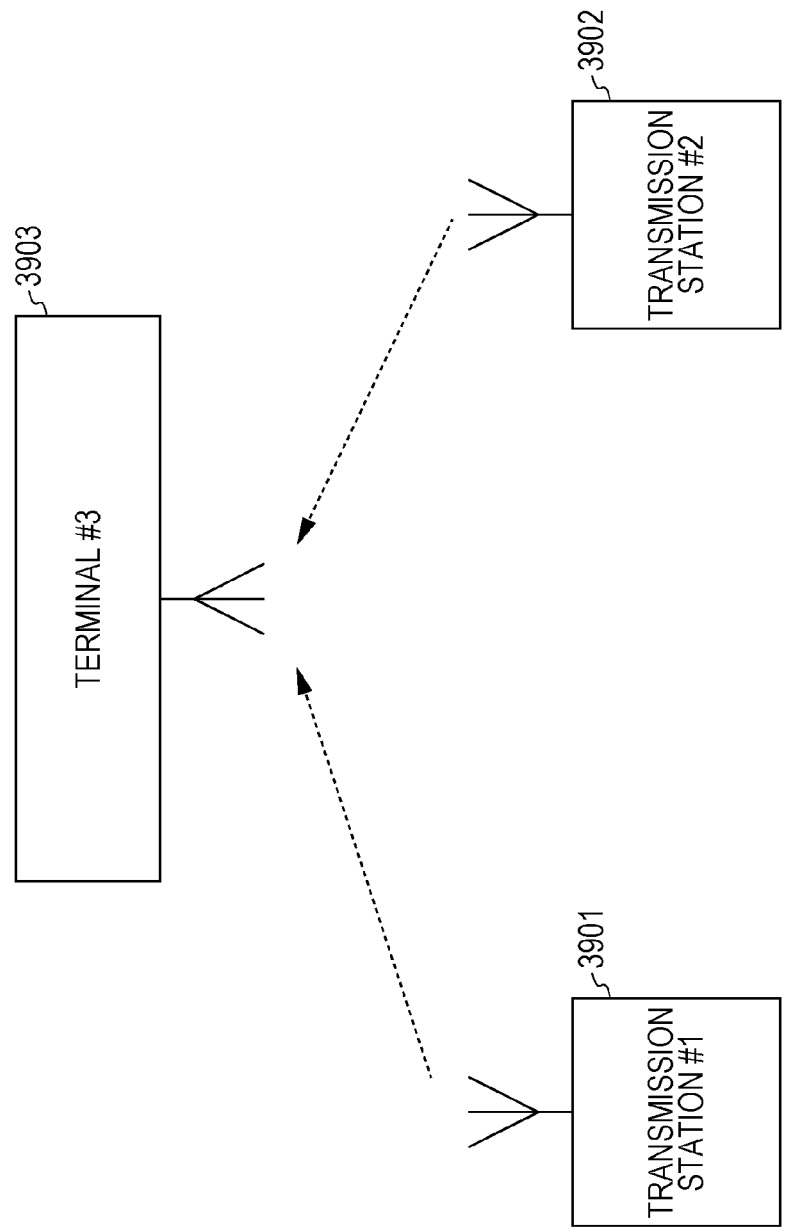
FIG. 39 is a view illustrating an example of a relationship between the transmitter and the receiver.

FIG. 39 illustrates a relationship between a transmission station and a terminal according to the present exemplary embodiment. Terminal #3 (3903) can receive modulated signal #1 transmitted by transmission station #1 (3901), and modulated signal #2 transmitted by transmission station #2 (3902). For example, identical data is transmitted in modulated signal #1 and modulated signal #2 in frequency band A. That is, when a baseband signal mapped on a data sequence according to a certain modulating method is s1(t,f) (where t represents time and f represents a frequency.), transmission station #1 and transmission station #2 both transmit modulated signals based on s1(t,f).

Therefore, terminal #3 (3903) receives both of the modulated signal transmitted by transmission station #1 and the modulated signal transmitted by transmission station #2 in frequency band A, and demodulates and decodes data.

Figure 40:
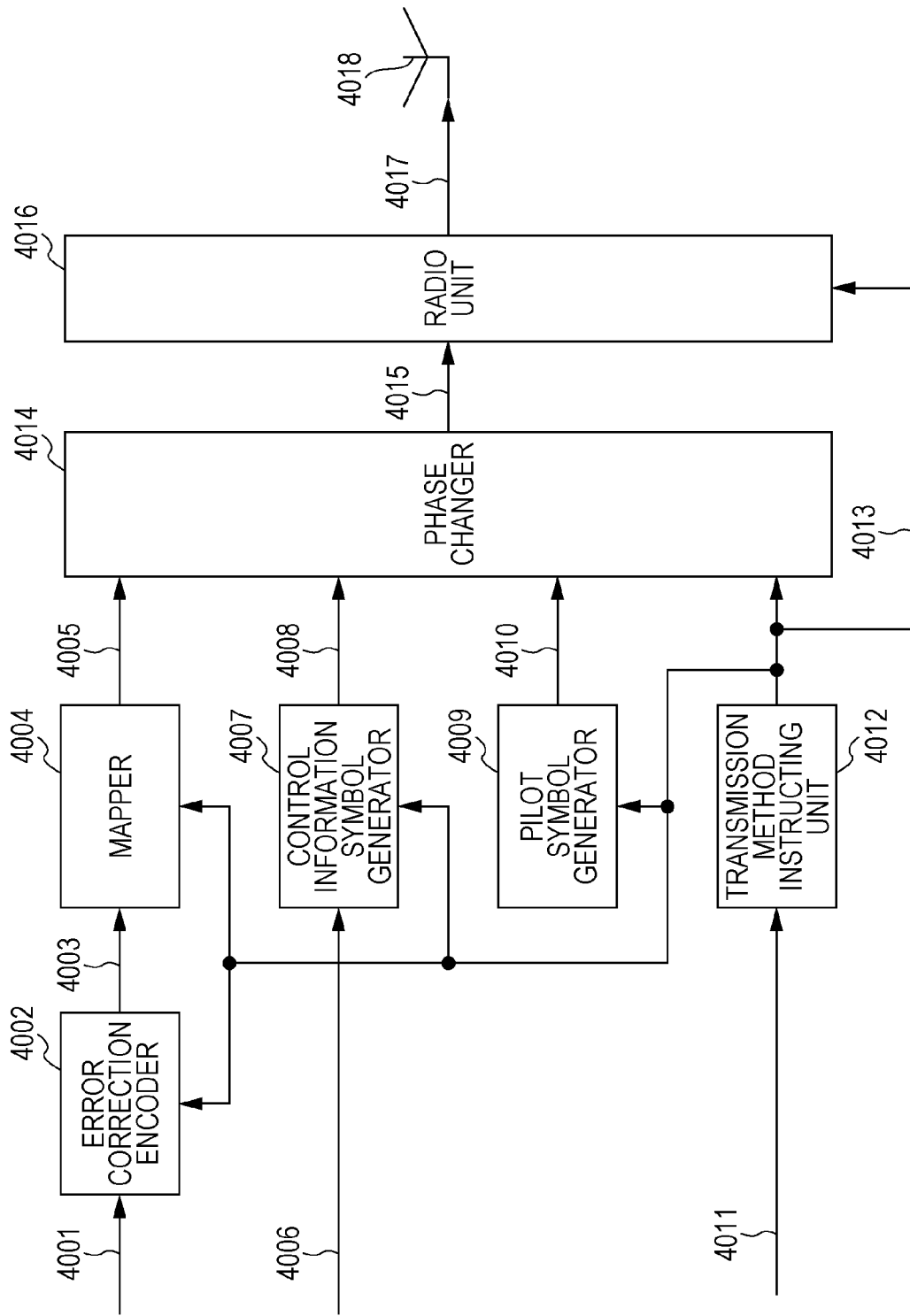
FIG. 40 is a view illustrating an example of a configuration of the transmitter.

FIG. 40 is an example of a configuration of transmission station #1 and transmission station #2. A case where transmission station #1 and transmission station #2 both transmit modulated signals based on s1(t,f) as in frequency band A as described above will be discussed.

Error correction encoder 4002 receives an input of information 4001 and signal 4013 related to a transmission method. Error correction encoder 4002 performs error correction coding based on information of a number of bits of one encoded block contained in signal 4013 related to the transmission method, and based on information related to a coding rate of an error correction code and contained in signal 4013 related to the transmission method. Error correction encoder 4002 outputs data 4003 (for example, error correction encoder 4002 switches coding processing according to "method #A" and coding processing according to "method #B" illustrated, for example, in FIGS. 5, 6, 7, 8, 9, 10, 12, 13, 14, 15 and 16).

Mapper 4004 receives an input of data 4003 and signal 4013 related to the transmission method. Mapper 4004 performs mapping based on information related to the modulating method and contained in signal 4013 related to the transmission method. Mapper 4004 outputs baseband signal 4005 (s1(t,f)) (note that mapper 4004 may perform data interleaving (data order rearrangement) between error correction encoder 4002 and mapper 4004).

Control information symbol generator 4007 receives an input of control information 4006, and information 4013 related to the transmission method. Control information symbol generator 4007 generates a control information symbol based on information related to the transmission method and contained in signal 4013 related to the transmission method. Control information symbol generator 4707 outputs baseband signal 4008 of the control information symbol (note that the control information symbol includes information of the number of bits of one encoded block and information related to a coding rate of an error correction code).

Pilot symbol generator 4009 receives an input of signal 4013 related to the transmission method. Pilot symbol generator 4009 generates a pilot symbol based on signal 4013. Pilot symbol generator 4009 outputs baseband signal 4010 of the pilot symbol.

Transmission method instructing unit 4012 receives an input of transmission method instruction information 4011. Transmission method instructing unit 4012 generates and outputs signal 4013 related to the transmission method.

Phase changer 4014 receives an input of baseband signal 4005 (s1(t, f)), baseband signal 4008 of the control information symbol, baseband signal 4010 of the pilot symbol, and signal 4013 related to the transmission method. Phase changer 4014 performs a phase change based on information of a frame configuration contained in signal 4013 related to the transmission method, and based on information related to a phase change. Phase changer 4014 outputs baseband signal 4015 based on a frame configuration. Note that depending on information related to a phase change, phase changer 4014 may output baseband signal 4015 based on a frame configuration, without performing a phase change.

Radio unit 4016 receives an input of baseband signal 4015 based on the frame configuration, and signal 4013 related to the transmission method. Radio unit 4016 performs processing such as interleaving, inverse Fourier transform and frequency conversion based on signal 4013 related to the transmission method. Radio unit 4016 generates and outputs transmission signal 4017. Transmission signal 4017 is output as a radio wave from antenna 4018.

Then, terminal 3903 in FIG. 39 receives modulated signals transmitted by transmission station #1 (3901) and transmission station #2 (3902). Terminal 3903 switches decoding according to "method #A" and decoding according to "method #B" illustrated, for example, in FIGS. 5, 6, 7, 8, 9, 10, 12, 13, 14, 15 and 16, based on information of a number of bits of one encoded block contained in a control information symbol contained in a received signal, and based on information of a coding rate contained in a control information symbol contained in a received signal, and performs error correction decoding.

Note that the configurations of transmission stations #1 and #2 in FIG. 39 are not limited to the configurations in FIG. 40. Another configuration example will be described with reference to FIG. 41.

Figure 41:
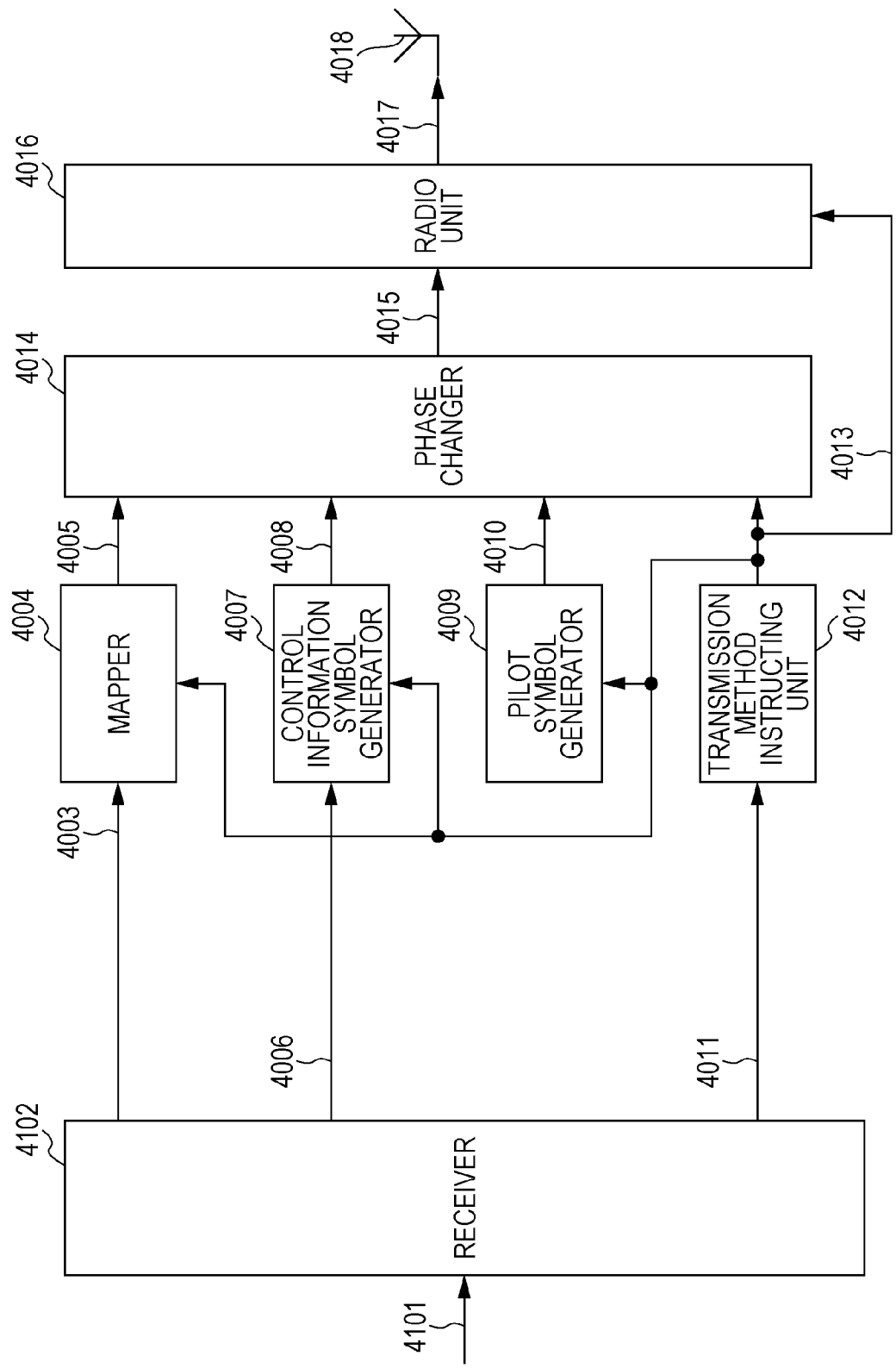
FIG. 41 is a view illustrating an example of a configuration of the transmitter.

Elements which operate in the same way as those in FIG. 40 are assigned the same reference numerals in FIG. 41, and will not be described. Features of FIG. 41 are such that another device transmits data 4003, control information 4006 and transmission method instruction information 4011, and receiver 4102 in FIG. 41 performs demodulation and decoding to obtain data 4003, control information 4006 and transmission method instruction information 4011.

Therefore, receiver 4102 receives a modulated signal transmitted by another device, receives an input of received signal 4101, and performs demodulation and decoding to output data 4003, control information 4006, and transmission method instruction information 4011.

Hence, another device is, for example, the transmitter as illustrated in FIG. 17 which performs the operation described in exemplary embodiment A.

Exemplary Embodiment E

Application examples of the coding scheme, the decoding scheme, the transmission method and the reception method described above, and a configuration example of a system which uses the application examples will be described.

Application examples of the coding scheme, the decoding scheme, the transmission method and the reception method described above, and a configuration example of a system which uses the application examples will be described.

Figure 42:
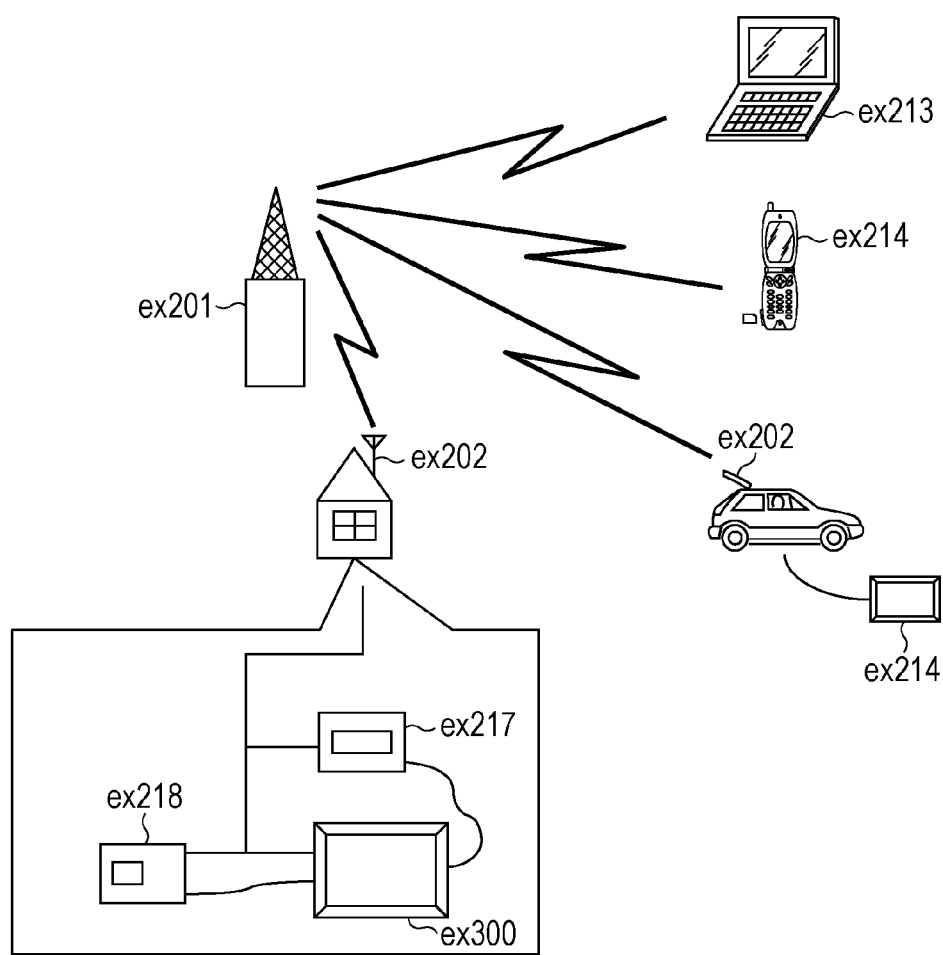
FIG. 42 is a view illustrating an example of a configuration of a digital broadcast system.

The transmission method and the reception method described in each of the above-described exemplary embodiments are carried out by digital broadcast system ex200 including various types of receivers such as a broadcast station illustrated in FIG. 42, a TV (television), a DVD recorder, a Blu-ray recorder, an STB (Set Top Box), a computer, an in-vehicle television and a mobile phone. Specifically, broadcast station ex201 transmits multiplexed data obtained by multiplexing video data, audio data and the like, in a predetermined transmission band by using the transmission method described in each of the above-described exemplary embodiments.

A signal transmitted from a broadcast station is received at an antenna which is built in each receiver or which is installed outside and connected with the receiver. Each receiver demodulates a signal received at an antenna by using the reception method described in each of the above-described exemplary embodiments, and acquires multiplexed data. (Therefore, the transmitter (broadcast station) switches coding processing according to "method #A" and coding processing according to "method #B" illustrated, for example, in FIGS. 5, 6, 7, 8, 9, 10, 12, 13, 14, 15 and 16. Each terminal switches decoding according to "method #A" and decoding according to "method #B" illustrated, for example, in FIGS. 5, 6, 7, 8, 9, 10, 12, 13, 14, 15 and 16, and performs error correction decoding. Moreover, the transmitter (broadcast station) transmits control information described herein, and each terminal obtains this control information and switches error correction decoding schemes.) Consequently, the digital broadcast system can provide the effect according to the present disclosure described in each of the above-described exemplary embodiments.

Here, video data contained in multiplexed data is encoded by using a moving image coding scheme which complies with a standard such as MPEG2, MPEG4-AVC, VC-1, H.265 and HEVC (High Efficiency Video Coding). Moreover, audio data contained in multiplexed data is encoded by an audio coding scheme such as Dolby AC-3, Dolby Digital Plus, MLP, DTS, DTS-HD and linear PCM.

Figure 43:
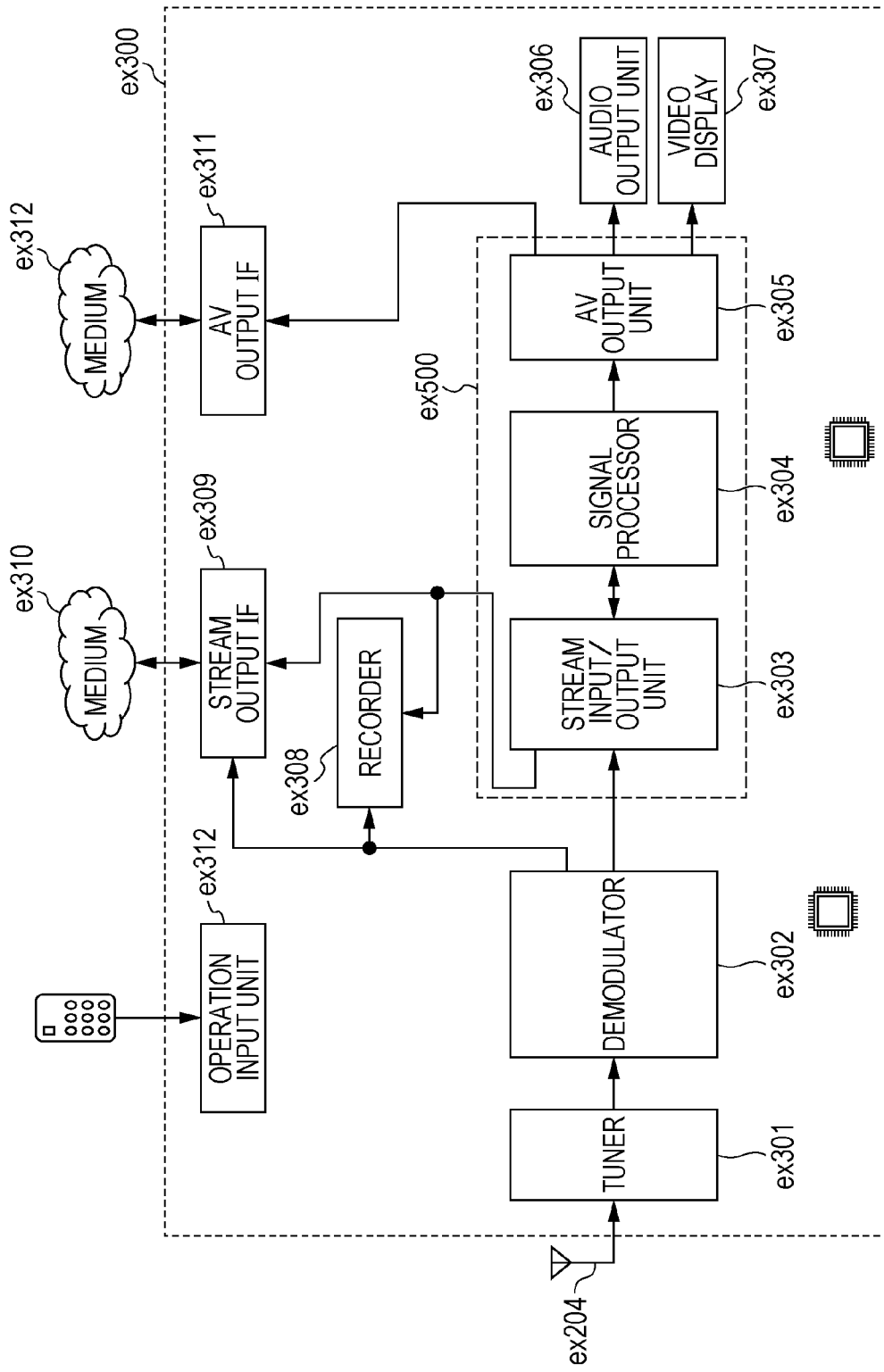
FIG. 43 is a view illustrating an example of a configuration of the receiver.

FIG. 43 is a view illustrating an example of a configuration of receiver ex300 which carries out the reception method described in each of the above-described exemplary embodiments. Receiver ex300 includes tuner ex301 which converts a high frequency signal received at antenna ex204 into a baseband signal, and demodulator ex302 which demodulates the baseband signal obtained after the frequency conversion, and which acquires multiplexed data. Demodulator ex302 carries out the decoding scheme described in each of the above-described exemplary embodiments (switches decoding according to "method #A" and decoding according to "method #B" illustrated in FIGS. 5, 6, 7, 8, 9, 10, 12, 13, 14, 15 16 and the like, and performs error correction decoding). Consequently, it is possible to obtain the effect according to the present disclosure described in each of the above-described exemplary embodiments.

Moreover, receiver ex300 includes stream input/output unit ex303 which demultiplexes video data and audio data from multiplexed data obtained by the demodulator, signal processor ex304 which decodes the video data to a video signal by using a moving image decoding scheme corresponding to the demultiplexed video data, and which decodes the audio data to an audio signal by using an audio decoding scheme corresponding to the demultiplexed audio data, audio output unit ex306 for outputting the decoded audio signal to a speaker, an audio amplifier or the like, and video output unit ex308 for outputting the decoded video signal to a display or the like.

For example, a user transmits information of a selected channel (a selected (TV) program or a selected audio broadcast) by using operation input unit (remote controller) ex312. Then, receiver ex300 performs processing such as demodulation and error correction decoding on a received signal received at antenna ex204 and corresponding to the selected channel, and obtains received data. In this case, receiver ex300 obtains information of a control symbol including information (for example, information related to a number of bits of one encoded block and information of a coding rate) of a transmission method (a transmission method, a modulating method, an error correction method and the like) contained in the signal corresponding to the selected channel. Consequently, a receiving operation, a demodulating method and a method for error correction decoding or the like are correctly set. Consequently, it is possible to obtain data contained in a data symbol transmitted by a broadcast station (base station). The example where the user selects a channel by using the remote controller is described above. However, an operation in a case of selecting a channel by using a channel selection key mounted on the receiver is the same as the above-described operation.

According to the above-described configuration, the user can view a program received by the receiver according to the decoding scheme and the reception method described herein.

Moreover, receiver ex300 according to the present exemplary embodiment includes a recorder (drive) which records data contained in multiplexed data demodulated and subjected to error correction decoding by the demodulator (the multiplexed data may not be subjected to error correction decoding depending on cases. Moreover, the multiplexed data may be subjected to error correction decoding and then other signal processing. The same applies to a portion expressed in a similar way below.) or data corresponding to this data, that is, data obtained by compressing this data or data obtained by processing a moving image and audio, in a recording medium such as a magnetic disk, an optical disk, and a non-volatile semiconductor memory. Here, the optical disk means a recording medium such as a DVD (Digital Versatile Disc) and a BD (Blu-ray (registered trademark) Disc) in and from which information is stored and read by using laser light. The magnetic disk means a recording medium such as a FD (Floppy Disk) and a hard disk in which information is stored by magnetizing a magnetic body by using a magnetic flux. The non-volatile semiconductor memory means a recording medium including a semiconductor element such as a flash memory and a ferroelectric random access memory, and examples of the non-volatile semiconductor memory include an SD card using a flash memory, and a Flash SSD (Solid State Drive). Note that the types of the recording media described herein are only examples thereof, and as a matter of course, recording may be performed by using recording media other than the above-described recording media.

According to the above-described configuration, the user can record and store a program received by the receiver according to the reception method described in each of the above-described exemplary embodiments, and read and view recorded data at any time after program broadcast time.

Note that the receiver including the recorder which records multiplexed data demodulated and subjected to error correction decoding by the demodulator is described above, but the recorder may extract and record some piece of data of data contained in multiplexed data. For example, when multiplexed data demodulated and subjected to error correction decoding by the demodulator includes data broadcast service content or the like other than video data and audio data, the recorder may record new multiplexed data obtained by extracting video data and audio data from multiplexed data demodulated by the demodulator and demultiplexing the video data and the audio data. Moreover, the recorder may record new multiplexed data obtained by multiplexing only one of video data and audio data contained in multiplexed data demodulated and subjected to error correction decoding by the demodulator. Then, the recorder may record the data broadcast service content contained in the above-described multiplexed data.

Further, when the receiver described in the present disclosure is mounted on a television, a recording device (for example, a DVD recorder and a Blu-ray recorder) and a mobile phone, multiplexed data demodulated and subjected to error correction decoding by the demodulator includes data for correcting a defect (bug) of software used for operating the television or the recording device, or data for correcting a defect (bug) of software for preventing leakage of personal information or recorded data. In this case, the software defect of the television or the recording device may be corrected by installing these pieces of data. Then, when multiplexed data includes data for correcting a defect (bug) of software of the receiver itself, the defect of the receiver itself can also be corrected by this data. Consequently, it is possible to operate more stably the television, the recording device or the mobile phone on which the receiver is mounted.

Here, for example, a stream processor performs processing of extracting some piece of data from a plurality of pieces of data contained in multiplexed data demodulated and subjected to error correction decoding by the demodulator, and multiplexing the some piece of data. Specifically, according to an instruction from a controller such as a CPU which is not illustrated, the stream processor demultiplexes multiplexed data demodulated by the demodulator, to a plurality of pieces of data such as video data, audio data and data broadcast service content, and extracts only specified data from the demultiplexed data and multiplexes the data to generate new multiplexed data. Note that data to be extracted from demultiplexed data may be determined by, for example, the user or may be determined in advance per recording medium type.

According to the above-described configuration, since the receiver can extract and record only necessary data in viewing of a recorded program, it is possible to reduce a data size of data to be recorded.

Moreover, the recorder which records multiplexed data demodulated and subjected to error correction decoding by the demodulator is described above. However, the recorder may convert video data contained in multiplexed data demodulated and subjected to error correction decoding by the demodulator, into video data which is encoded according to a moving image coding scheme different from a moving image coding scheme performed on the video data so as to have a data size or a bit rate lower than a data size or a bit rate of the video data. The recorder may record new multiplexed data obtained by multiplexing the converted video data. In this case, the moving image coding scheme performed on original video data and the moving image coding scheme performed on converted video data may comply with different standards from each other, or only parameters which comply with the same standard and which are used in coding may be different. Similarly, the recorder may convert audio data contained in multiplexed data demodulated and subjected to error correction decoding by the demodulator, into audio data which is encoded according to an audio coding scheme different from an audio coding scheme performed on the audio data so as to have a data size or a bit rate lower than a data size or a bit rate of the audio data. The recorder may record new multiplexed data obtained by multiplexing the converted audio data.

Here, for example, the stream processor and the signal processor perform processing of converting video data or audio data contained in multiplexed data demodulated and subjected to error correction decoding by the demodulator, into video data or audio data having a different data size or bit rate. Specifically, according to an instruction from the controller such as the CPU, the stream processor demultiplexes multiplexed data demodulated and subjected to error correction decoding by the demodulator, to a plurality of pieces of data such as video data, audio data and data broadcast service content. According to an instruction from the controller, the signal processor performs processing of converting the demultiplexed video data into video data encoded according to a moving image coding scheme different from a moving image coding scheme performed on the video data, and processing of converting the demultiplexed audio data into audio data encoded according to an audio coding scheme different from an audio coding scheme performed on the audio data. The stream processor multiplexes the converted video data and the converted audio data, and generates new multiplexed data according to the instruction from the controller. Note that according to the instruction from the controller, the signal processor may perform processing of converting one of video data and audio data or may perform processing of converting both of video data and audio data. Moreover, data sizes or bit rates of converted video data and audio data may be determined by the user or may be determined in advance per recording medium type.

According to the above-described configuration, the receiver can change a data size or a bit rate of video data or audio data according to a data size recordable in a recording medium or according to a data recording or reading speed of the recorder, and record the video data or the audio data. Consequently, even when a data size recordable in a recording medium is smaller than a data size of multiplexed data demodulated and subjected to error correction decoding by the demodulator, or even when a data recording or reading speed of the recorder is lower than a bit rate of multiplexed data demodulated by the demodulator, the recorder can record programs. For this reason, the user can read and view recorded data at any time after program broadcast time.

Moreover, the receiver includes a stream output IF (Interface) which transmits multiplexed data demodulated by the demodulator, to an external apparatus via a communication medium. An example of the stream output IF includes a wireless communication device which transmits, to an external apparatus via a wireless medium, multiplexed data modulated by using a wireless communication method which complies with a wireless communication standard such as Wi-Fi (IEEE802.11a, IEEE802.11b, IEEE802.11g, IEEE802.11n, IEEE802.11ac and IEEE802.11ad), WiGig, UltraGig, WirelessHD, Bluetooth and Zigbee (registered trademark). Moreover, the stream output IF may be a wired communication device which transmits, to an external apparatus via a wired transmission channel connected to the stream output IF, multiplexed data modulated by using a communication method which complies with a wired communication standard such as the Ethernet (registered trademark, the same applies below), a USB (Universal Serial Bus), a USB2, a USB3, PLC (Power Line Communication), an HDMI (High-Definition Multimedia Interface) and an HDMI2.

According to the above-described configuration, the user can use multiplexed data received by the receiver according to the decoding scheme and the reception method described herein by using an external apparatus. The use of multiplexed data described here includes, for example, a case where the user views multiplexed data in real time by using an external apparatus, a case where the user records multiplexed data by using a recorder of the external apparatus, and a case where the user transmits multiplexed data from the external apparatus to further another external apparatus.

Note that the receiver including the stream output IF which outputs multiplexed data demodulated and subjected to error correction decoding by the demodulator is described above, but the stream output IF may extract and output some piece of data of data contained in multiplexed data may be recorded. For example, when multiplexed data demodulated and subjected to error correction decoding by the demodulator includes data broadcast service content or the like other than video data and audio data, the stream output IF may output new multiplexed data obtained by extracting video data and audio data from multiplexed data demodulated and subjected to error correction decoding by the demodulator, and multiplexing the video data and the audio data. Moreover, the stream output IF may output new multiplexed data obtained by multiplexing only one of video data and audio data contained in multiplexed data demodulated by the demodulator.

Here, for example, a stream processor performs processing of extracting some piece of data from a plurality of pieces of data contained in multiplexed data demodulated and subjected to error correction decoding by the demodulator, and multiplexing the some piece of data. Specifically, according to an instruction from the controller such as the CPU (Central Processing Unit) which is not illustrated, the stream processor demultiplexes multiplexed data demodulated by the demodulator, to a plurality of pieces of data such as video data, audio data and data broadcast service content, and extracts only specified data from the demultiplexed data and multiplexes the data to generate new multiplexed data. Note that data to be extracted from demultiplexed data may be determined by, for example, the user or may be determined in advance per stream output IF type.

According to the above-described configuration, since the receiver can extract and output only data which is necessary for an external apparatus, it is possible to reduce a communication band to be consumed by an output of multiplexed data.

Moreover, the stream output IF which records multiplexed data demodulated and subjected to error correction decoding by the demodulator is described above. However, the stream output IF may convert video data contained in multiplexed data demodulated and subjected to error correction decoding by the demodulator, into video data which is encoded according to a moving image coding scheme different from a moving image coding scheme performed on the video data so as to have a data size or a bit rate lower than a data size or a bit rate of the video data. The stream output IF may output new multiplexed data obtained by multiplexing the converted video data. In this case, the moving image coding scheme performed on original video data and the moving image coding scheme performed on converted video data may comply with different standards from each other, or only parameters which comply with the same standard and which are used in coding may be different. Similarly, the stream output IF may convert audio data contained in multiplexed data demodulated and subjected to error correction decoding by the demodulator, into audio data which is encoded according to an audio coding scheme different from an audio coding scheme performed on the audio data so as to have a data size or a bit rate lower than a data size or a bit rate of the audio data. The stream output IF may output new multiplexed data obtained by multiplexing the converted audio data.

Here, for example, the stream processor and the signal processor perform processing of converting video data or audio data contained in multiplexed data demodulated and subjected to error correction decoding by the demodulator, into video data or audio data having a different data size or bit rate. Specifically, according to an instruction from the controller, the stream processor demultiplexes multiplexed data demodulated and subjected to error correction decoding by the demodulator, to a plurality of pieces of data such as video data, audio data and data broadcast service content. According to an instruction from the controller, the signal processor performs processing of converting demultiplexed video data into video data encoded according to a moving image coding scheme different from a moving image coding scheme performed on the video data, and processing of converting the demultiplexed audio data into audio data encoded according to an audio coding scheme different from an audio coding scheme performed on the audio data. The stream processor multiplexes the converted video data and the converted audio data, and generates new multiplexed data according to the instruction from the controller. Note that according to the instruction from the controller, the signal processor may perform processing of converting one of video data and audio data or may perform processing of converting both of video data and audio data. Moreover, data sizes or bit rates of converted video data and audio data may be determined by the user or may be determined in advance per stream output IF type.

According to the above-described configuration, the receiver can change a bit rate of video data or audio data according to a communication speed between the receiver and an external apparatus, and output the video data or the audio data. Consequently, even when the communication speed between the receiver and an external apparatus is lower than a bit rate of multiplexed data demodulated and subjected to error correction decoding by the demodulator, the stream output IF can output new multiplexed data to the external apparatus. For this reason, the user can use new multiplexed data in another communication device.

Moreover, the receiver includes an AV (Audio and Visual) output IF (Interface) which outputs a video signal and an audio signal decoded by the signal processor, to an external apparatus via a communication medium. An example of the AV output IF includes a wireless communication device which transmits, to an external apparatus via a wireless medium, a video signal and an audio signal modulated by using a wireless communication method which complies with a wireless communication standard such as Wi-Fi (IEEE802.11a, IEEE802.11b, IEEE802.11g, IEEE802.11n, IEEE802.11ac and IEEE802.11ad), WiGig, UltraGig, WirelessHD, Bluetooth and Zigbee. Moreover, the AV output IF may be a wired communication device which transmits, to an external apparatus via a wired transmission channel connected to the AV output IF, a video signal and an audio signal modulated by using a communication method which complies with a wired communication standard such as the Ethernet, a USB, a USB2, a USB3, a PLC, an HDMI and an HDMI2. Moreover, the AV output IF may be a terminal for connection of a cable which outputs video signals and audio signals directly as analog signals.

According to the above-described configuration, in an external device, the user can use video signals and audio signals decoded by the signal processor.

Further, television ex300 includes operation input unit ex312 which receives an input of a user's operation. Based on a control signal input to the operation input unit in response to a user's operation, the receiver switches ON/OFF of a power supply, switches channels to be received, switches whether or not to display a caption or switches display languages, switches various operations such as changing sound volume output from an audio output unit, or changes settings such as a setting of receivable channels.

Moreover, the receiver may include a function of displaying an antenna level indicating reception quality of a signal which is being received by the receiver. Here, the antenna level is an index indicating reception quality calculated based on, for example, an RSSI (Received Signal Strength Indication, Received Signal Strength Indicator, or received signal strength), received field strength, a C/N (Carrier-to-noise power ratio), a BER (Bit Error Rate), a packet error rate, a frame error rate, channel state information and the like of a signal received by the receiver. The antenna level is a signal indicating a signal level and signal superiority and inferiority. In this case, the demodulator includes a reception quality measuring unit which measures an RSSI, received field strength, a C/N, a BER, a packet error rate, a frame error rate, channel state information and the like of a received signal. The receiver causes the video output unit to display an antenna level (a signal indicating a signal level or signal superiority and inferiority) in a format which can be identified by the user, according to a user's operation. The antenna level (a signal indicating a signal level and signal superiority and inferiority) display format may be a format of displaying a numerical value corresponding to an RSSI, received field strength, a C/N, a BER, a packet error rate, a frame error rate, channel state information and the like, or may be a format of displaying different images according to an RSSI, received field strength, a C/N, a BER, a packet error rate, a frame error rate, channel state information and the like. Moreover, the receiver may display a plurality of antenna levels (signals each indicating a signal level and signal superiority and inferiority) determined for each of a plurality of streams s1, s2, . . . received and demultiplexed by using the reception method described in each of the above-described exemplary embodiments. Alternatively, the receiver may display one antenna level (a signal indicating a signal level and signal superiority and inferiority) determined from a plurality of streams s1, s2, . . . . Moreover, when video data or audio data configuring a program is transmitted by using a hierarchical transmission method, it is also possible to indicate a signal level (a signal indicating signal superiority and inferiority) per layer.

According to the above-described configuration, the user can numerically or visually and effectively learn an antenna level (a signal indicating a signal level or signal superiority and inferiority) in reception using the decoding scheme and the reception method described herein.

Note that the case where the receiver includes the audio output unit, the video output unit, the recorder, the stream output IF and the AV output IF is described above as an example, but the receiver does not need to include all of these configurations. As long as the receiver includes at least one of the above-described configurations, the user can use multiplexed data demodulated and subjected to error correction decoding by the demodulator. For this reason, each receiver only needs to include any combination of the above-described configurations according to application of each receiver.

(Multiplexed Data)

Next, an example of a multiplexed data structure will be described in detail. A data structure used for broadcasting is generally an MPEG2-transport stream (TS), and the MPEG2-TS will be described as an example. However, a data structure transmitted by the transmission method and the reception method described in each of the above-described exemplary embodiments is not limited to the MPEG2-TS. As a matter of course, the effect described in each of the above-described exemplary embodiments can also be obtained by using any other data structure.

FIG. 44 is a view illustrating an example of a configuration of multiplexed data. The multiplexed data illustrated in FIG. 44 is obtained by multiplexing one or more of elementary streams such as a video stream, an audio stream, a presentation graphics stream (PG), and an interactive graphics stream (IG) which are elements configuring a program (a program or an event that is part of the program) which is currently provided by each service. When a program provided by multiplexed data is a movie, a video stream indicates a main video and a sub video of the movie, an audio stream indicates a main audio part of the movie and sub audio mixed with the main audio, and a presentation graphics stream indicates a caption of the movie. Here, the main video indicates a normal video displayed on a screen, and the sub video indicates a video displayed on a small screen in the main video. Moreover, the interactive graphics stream indicates a conversation screen created by arranging GUI parts on the screen.

Each stream contained in multiplexed data is identified by a PID (Process ID) which is an identifier allocated to each stream. For example, 0x1011 is allocated to a video stream used for a video of a movie, 0x1100 to 0x111F are allocated to audio streams, 0x1200 to 0x121F are allocated to presentation graphics stream, 0x1400 to 0x141 F are allocated to interactive graphics streams, 0x1 B00 to 0x1 B1 F are allocated to video streams used for sub videos of a movie, and 0x1A00 to 0x1A1F are allocated to audio streams used for sub audio mixed with main audio.

Figure 45:
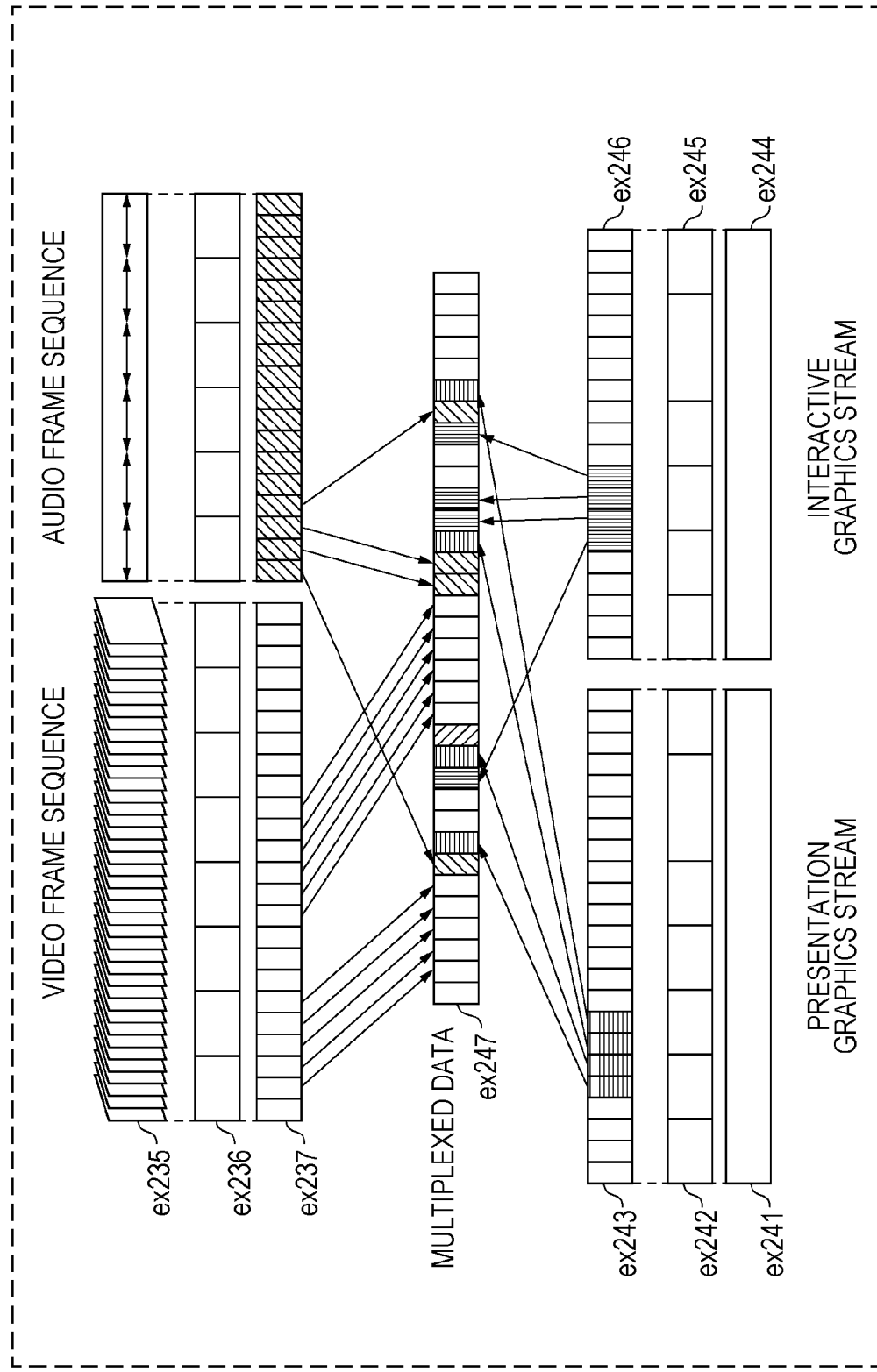
FIG. 45 is a view illustrating an example of how to multiplex multiplexed data.

FIG. 45 is a view schematically illustrating an example of how to multiplex multiplexed data. First, video stream ex235 including a plurality of video frames and audio stream ex238 including a plurality of audio frames are converted into PES packet trains ex236 and ex239, and are converted into TS packets ex237 and ex240, respectively. Similarly, data of presentation graphics stream ex241 and data of interactive graphics ex244 are converted into PES packet trains ex242 and ex245, and are further converted into TS packets ex243 and ex246, respectively. Multiplexed data ex247 is configured by multiplexing these TS packets into one stream.

Figure 46:
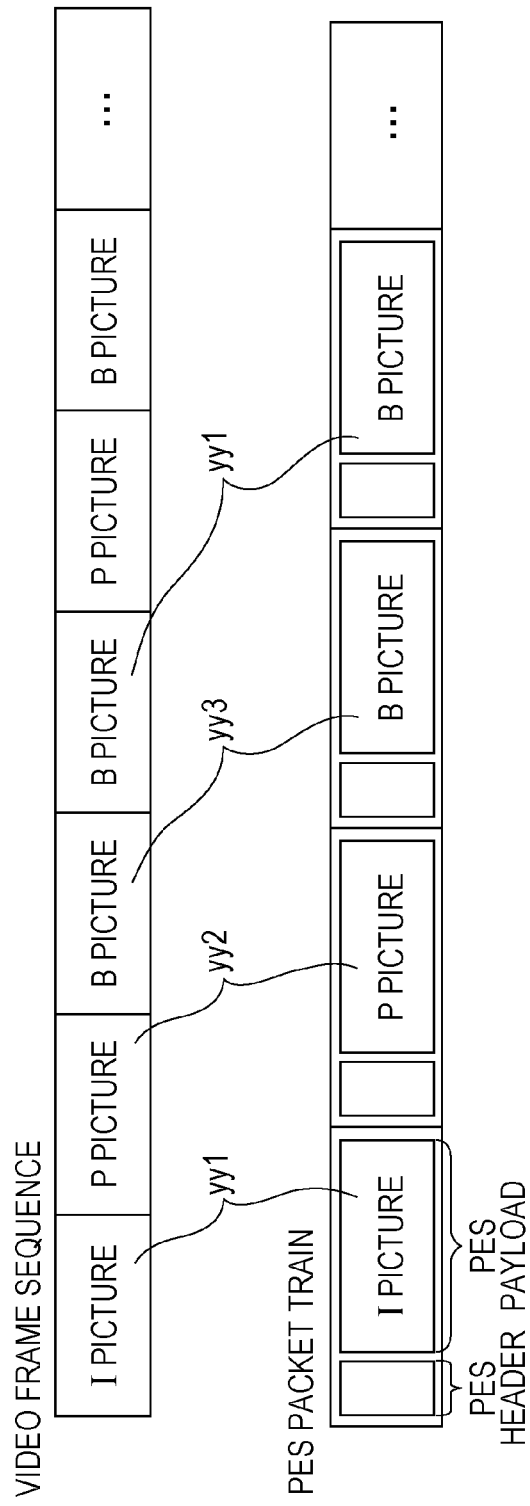
FIG. 46 is a view illustrating an example of how to store a video stream in a PES packet train.

FIG. 46 is a view illustrating in more detail how to store a video stream in a PES packet train. A first stage in FIG. 46 indicates a video frame train of a video stream. A second stage indicates a PES packet train. As indicated by arrows yy1, yy2, yy3 and yy4 in FIG. 46, an I picture, B pictures and P pictures which are a plurality of video presentation units in a video stream are divided per picture, and are stored in payloads of PES packets. Each PES packet has a PES header, and, a PTS (Presentation Time-Stamp) which is picture display time, and a DTS (Decoding Time-Stamp) which is picture decoding time are stored in the PES packet.

Figure 47:
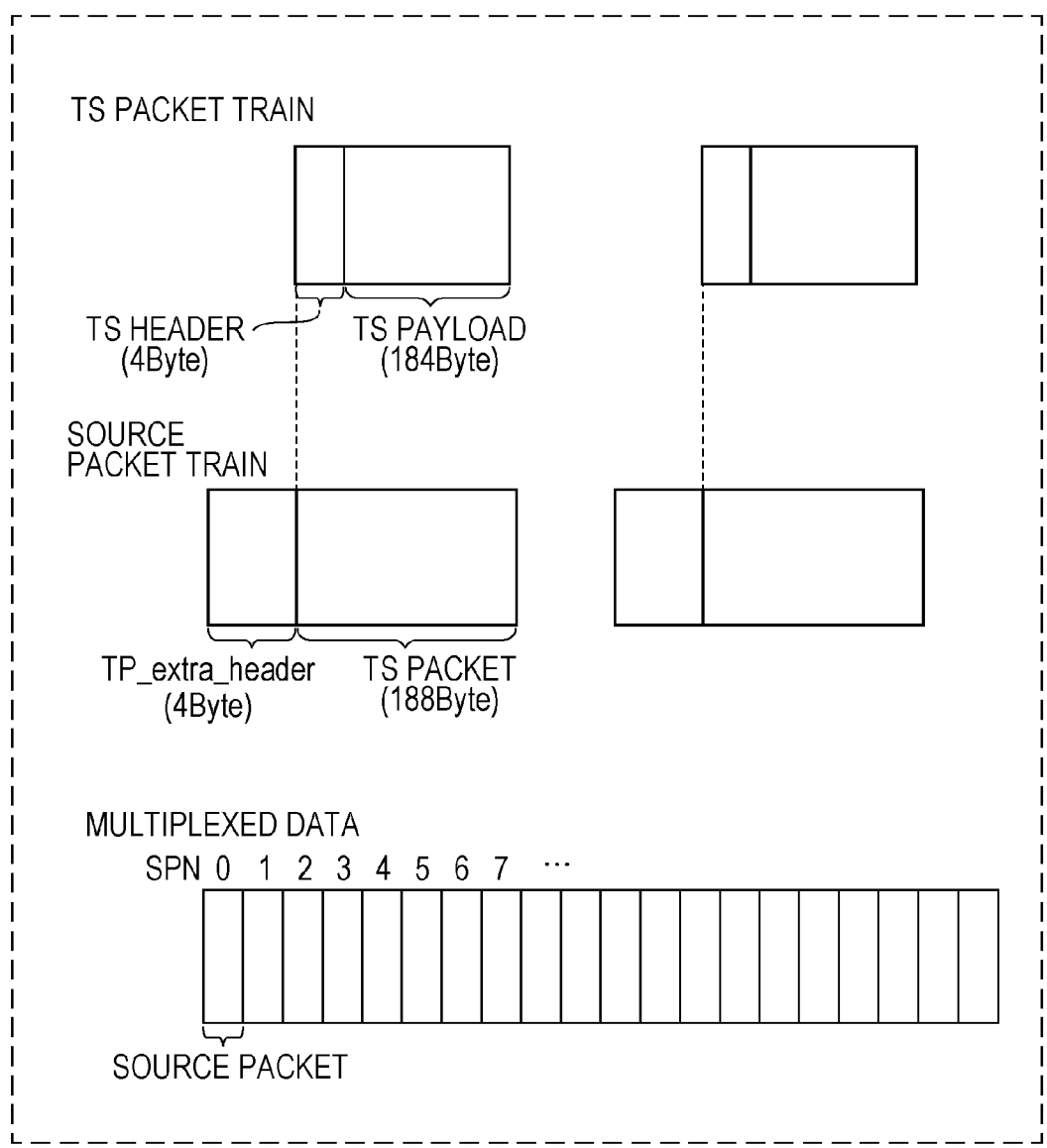
FIG. 47 is a view illustrating an example of a TS packet format finally written in multiplexed data.

FIG. 47 is a view illustrating a TS packet format finally written in multiplexed data. A TS packet is a packet of a fixed length of 188 bytes which includes a TS header of 4 bytes having information such as a PID for identifying a stream, and which includes a TS payload of 184 bytes storing data. The PES packet is divided and stored in a TS payload. In a case of a BD-ROM, TP_Extra_Header of 4 bytes is given to the TS packet, and configures a source packet of 192 bytes, and is written in multiplexed data. Information such as ATS (Arrival_Time_Stamp) is described in TP_Extra_Header. The ATS indicates transfer start time of the TS packet to a PID filter of a decoder. Source packets are aligned in multiplexed data as indicated at a lower stage in FIG. 47, and incremental numbers from a head of the multiplexed data are referred to as SPNs (Source Packet Numbers).

Moreover, a TS packet contained in multiplexed data includes a PAT (Program Association Table), a PMT (Program Map Table) and a PCR (Program Clock Reference), in addition to each stream such as a video stream, an audio stream, a presentation graphics stream, and the like. The PAT indicates what a PID of the PMT used in multiplexed data is, and the PID of the PAT itself is registered as 0. The PMT has a PID of each stream such as a video/audio/caption contained in multiplexed data, and attribute information of a stream corresponding to each PID, and also has various descriptors related to the multiplexed data. Each descriptor includes, for example, copy control information for instructing whether or not to permit copy of multiplexed data. The PCR has information of STC (System Time Clock) time corresponding to the ATS (Arrival Time Clock) at which a PCR packet is transferred to the decoder in order to synchronize an ATC which is an ATS time axis, and an STC which is a PTS and DTS time axis.

Figure 48:
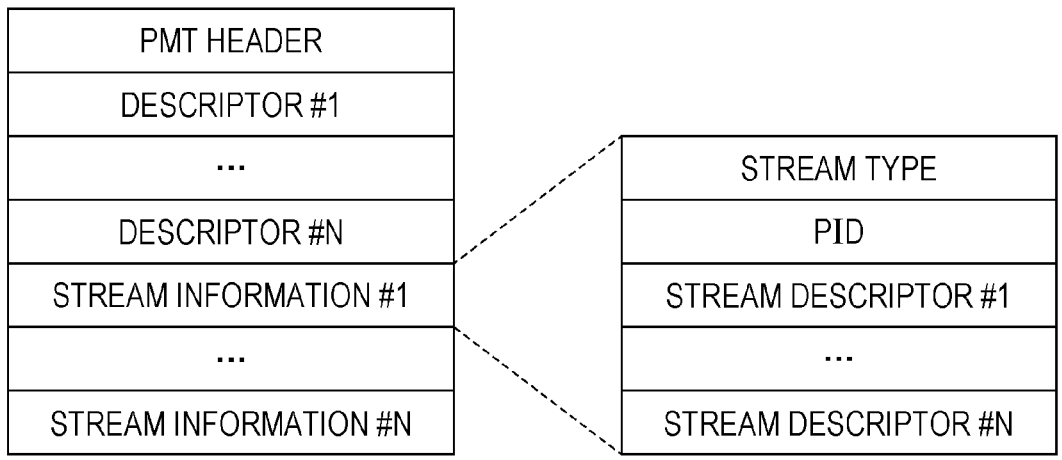
FIG. 48 is a view illustrating an example of a PMT data structure.

FIG. 48 is a view illustrating a PMT data structure in more detail. A PMT header which describes a length and the like of data contained in the PMT is arranged at a head of the PMT. A plurality of descriptors related to the multiplexed data is arranged after the PMT header. The copy control information and the like are described as the descriptors. A plurality of pieces of stream information contained in multiplexed data and related to each stream is arranged after the descriptors. Stream information includes a stream type for identifying a stream compression codec, a stream PID and a stream descriptor in which stream attribute information (for example, a frame rate and an aspect ratio) is described. A number of existing stream descriptors corresponds to a number of streams existing in multiplexed data.

When multiplexed data is recorded in a recording medium, the multiplexed data is recorded together with a multiplexed data information file.

The multiplexed data information file is multiplexed data management information as illustrated in FIG. 48, corresponds to multiplexed data on a one-to-one basis and includes multiplexed data information, stream attribute information and an entry map.

Figure 49:
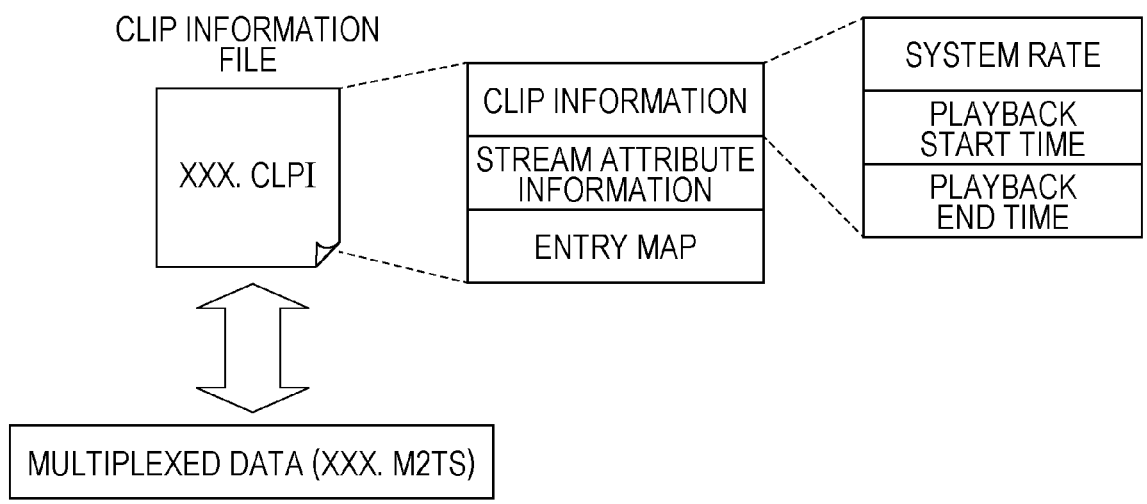
FIG. 49 is a view illustrating an example of a configuration of multiplexed data.

Multiplexed data information includes a system rate, playback start time and playback end time as illustrated in FIG. 49. A system rate indicates a maximum transfer rate of multiplexed data to a PID filter of a system target decoder described below. An ATS interval contained in multiplexed data is set so as to be a system rate or less. Playback start time is a PTS of a video frame at a head of multiplexed data, and is set to time obtained by adding a playback interval of one frame to a PTS of a video frame at an end of the multiplexed data.

Figure 50:
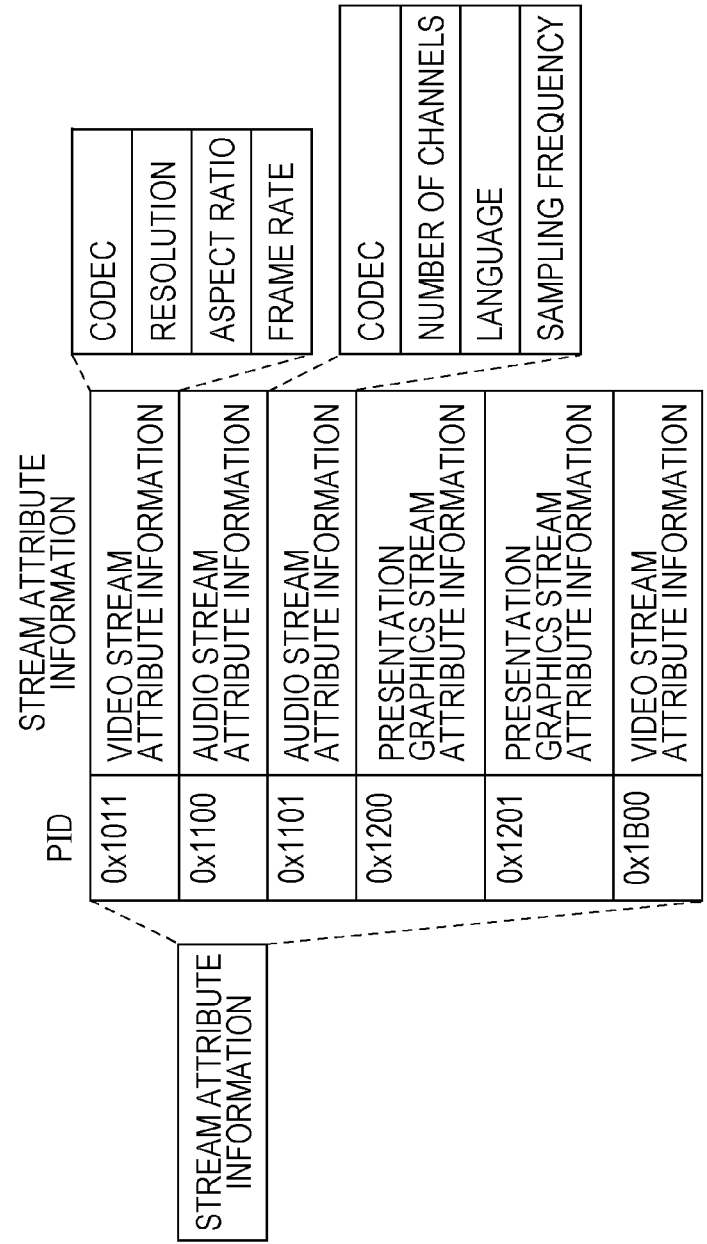
FIG. 50 is a view illustrating an example of stream attribute information.

As illustrated in FIG. 50, attribute information on each stream contained in multiplexed data is registered in stream attribute information per PID. Each piece of attribute information has different information per video stream, audio stream, presentation graphics stream, and interactive graphics stream. Video stream attribute information has information such as a compression codec used to compress a video stream thereof, a value of resolution of each piece of picture data configuring the video stream, a value of an aspect ratio and a value of a frame rate. Audio stream attribute information has information such as a compression codec used to compress an audio stream thereof, a number of channels contained in the audio stream, a corresponding language, and a value of a sampling frequency. These pieces of information are used, for example, for initializing the decoder before a player performs playback.

A stream type contained in a PMT of the multiplexed data is used. Moreover, when multiplexed data is recorded in a recording medium, video stream attribute information contained in multiplexed data information is used. Specifically, the moving image coding scheme or device described in each of the above-described exemplary embodiments is provided with a step or means for setting unique information indicating that video data is generated by the moving image coding scheme or device described in each of the above-described exemplary embodiments, to a stream type contained in the PMT or video stream attribute information. According to this configuration, it is possible to identify video data generated by the moving image coding scheme or device described in each of the above-described exemplary embodiments, and video data which complies with another standard.

Figure 51:
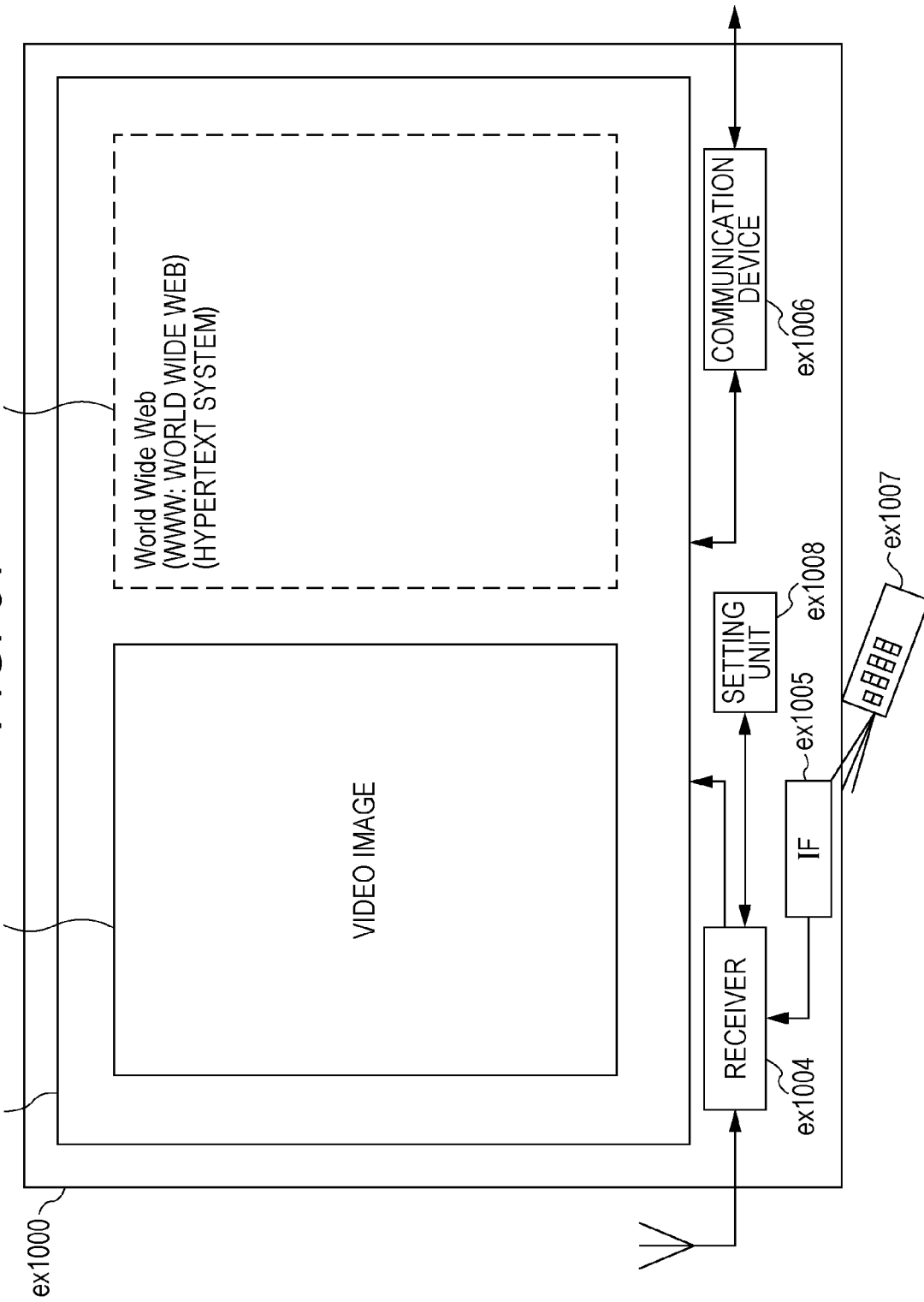
FIG. 51 is a view illustrating an example of a configuration of a device which performs video display and audio output.

FIG. 51 illustrates an example of a configuration of video display and audio output device ex1000 which includes receiver ex1004 which receives a modulated signal including video and audio data or data for data broadcast transmitted from a broadcast station (base station). Note that a configuration of receiver ex1004 corresponds to the configuration of receiver ex300 in FIG. 43. In video display and audio output device ex1000, for example, an OS (Operating System) is mounted, and communication device ex1006 for connection to the Internet (for example, a wireless LAN (Local Area Network) and a communication device for the Ethernet) is mounted. Consequently, video display portion ex1001 can simultaneously display video ex1002 in video and audio data or in data for data broadcast, and hypertext (World Wide Web (WWW)) ex1003 provided on the Internet. Then, remote controller (which may be a mobile phone or a keyboard) ex1007 is operated to select any of video ex1002 in data for data broadcast and hypertext ex1003 provided on the Internet and to change an operation. For example, when hypertext ex1003 provided on the Internet is selected, the remote controller is operated to change a displayed WWW site. Moreover, when video ex1002 in video and audio data or in data for data broadcast is selected, the remote controller is operated to transmit information of a selected channel (a selected (TV) program or a selected audio broadcast).

Then, IF (ex1005) acquires the information transmitted with the remote controller, and receiver ex1004 performs processing such as demodulation and error correction decoding on a signal corresponding to the selected channel, and obtains received data. In this case, receiver ex1004 obtains information of a control symbol including information of a transmission method (a transmission method, a modulating method, an error correction method and the like) contained in the signal corresponding to the selected channel. Consequently, a receiving operation, a demodulating method and a method for error correction decoding or the like are correctly set. Consequently, it is possible to obtain data contained in a data symbol transmitted by a broadcast station (base station). (For example, receiver ex1004 switches decoding according to "method #A" and decoding according to "method #B" illustrated in FIGS. 5, 6, 7, 8, 9, 10, 12, 13, 14, 15, 16 and the like, based on a number of bits of one encoded block contained in a control symbol and based on a coding rate contained in a control symbol, and performs error correction decoding.) The example where the user selects a channel with the remote controller is described above. However, an operation of using a channel selection key mounted on a receiver to select a channel is also the same as the described-above operation.

Moreover, video display and audio output device ex1000 may be operated by using the Internet. For example, video recording (storing) reservation is performed on video display and audio output device ex1000 by another terminal connected to the Internet. (Hence, video display and audio output device ex1000 has a storage as illustrated in FIG. 43.) Then, before video recording starts, a channel is selected. Receiver ex1004 performs processing such as demodulation and error correction decoding on a signal corresponding to the selected channel, and obtains received data. In this case, receiver ex1004 obtains information of a control symbol including information of a transmission method (a transmission method, a modulating method, an error correction method and the like) contained in the signal corresponding to the selected channel. Consequently, a receiving operation, a demodulating method and a method for error correction decoding or the like are correctly set. Consequently, it is possible to obtain data contained in a data symbol transmitted by a broadcast station (base station). (For example, receiver ex1004 switches decoding according to "method #A" and decoding according to "method #B" illustrated in FIGS. 5, 6, 7, 8, 9, 10, 12, 13, 14, 15, 16 and the like, based on a number of bits of one encoded block contained in a control symbol and based on a coding rate contained in a control symbol, and performs error correction decoding.)

Moreover, in a case of moving image decoding described in, for example, NPL 15 and NPL 16, decoding corresponding to HDR (High Dynamic Range) video compression may be performed. For example, remote controller (which may be a mobile phone or a keyboard) ex1007 or setting unit ex1008 can set whether or not to perform "decoding corresponding to HDR video compression." Note that in a case of "ON," decoding corresponding to HDR video compression is performed, and in a case of "OFF," decoding corresponding to HDR video compression is not performed.

Receiver ex1004 receives an input of a received signal. Moreover, receiver ex1004 receives via IF (ex1005) an input of an ON/OFF signal of decoding corresponding to HDR video compression set with remote controller ex1007, and/or receives an input of an ON/OFF signal of decoding corresponding to HDR video compression set by setting unit ex1008.

When the ON/OFF signal of decoding corresponding to HDR video compression indicates "ON," receiver ex1004 performs decoding corresponding to at least HDR video compression on data obtained by demodulation and decoding processing, and outputs a video signal. Then, display ex1002 displays a video based on the video signal (the video signal may be output to an outside).

Moreover, when the ON/OFF signal of decoding corresponding to HDR video compression indicates "OFF," receiver ex1004 generates and outputs a video signal without performing decoding corresponding to HDR video compression on data obtained by demodulation and decoding processing. Then, display ex1002 displays a video based on the video signal (the video signal may be output to an outside).

Note that there are two methods of "decoding processing corresponding to HDR video compression."

Method 1) Signal processing unique to device ex1000 is performed, and decoding processing corresponding to HDR video compression is performed (in this case, device ex1000 does not perform decoding processing corresponding to HDR video compression by using "data for performing decoding processing corresponding to HDR video compression" transmitted by the transmitter (a broadcast station, a base station or the like). Instead, device ex1000 performs signal processing unique to device ex1000, and performs decoding processing corresponding to HDR video compression).

Method 2) Device ex1000 performs decoding processing corresponding to HDR video compression by using "data for performing decoding processing corresponding to HDR video compression" transmitted by the transmitter (a broadcast station, a base station or the like) (hence, it is presumed that the transmitter (a broadcast station, a base station or the like) transmits "data for performing decoding processing corresponding to HDR video compression").

Device ex1000 may realize decoding processing corresponding to HDR video compression by any one of method 1) and method 2). Moreover, device ex1000 may be able to select processing according to method 1) and processing according to method 2) with remote controller ex1007 and/or setting unit ex1008.

Moreover, in receiver ex1004, parameters such as a chroma, a tone curve, a luminance, a highlight, a shadow, a gamma curve and a contrast may be settable through remote controller ex1007 or setting unit ex1008 in decoding processing corresponding to HDR video compression.

Note that receiver ex1004 switches decoding according to "method #A" and decoding according to "method #B" illustrated in FIGS. 5, 6, 7, 8, 9, 10, 12, 13, 14, 15, 16 and the like, for example, based on a number of bits of one encoded block contained in a control symbol and based on a coding rate contained in a control symbol, and performs error correction decoding.

Exemplary Embodiment F

An LDPC code will be described supplementarily below. In these years, as one of error correction codes which exhibit high error correction performance in a practicable circuit scale, a low-density parity-check (LDPC) code is gaining attention. Since the LDPC code has high error correction performance and is easy to implement, the LDPC code is adopted for an error correction coding scheme such as a wireless LAN system and terrestrial digital broadcasting.

The LDPC code is an error correction code defined by low-density parity check matrix H, and an example of the LDPC code includes a block code (LDPC block code) which has a block length (code length) equal to number of columns N (N is a natural number.) of parity check matrix H. Examples of the LDPC block code include a random LDPC code, a QC-LDPC code (QC: Quasi-Cyclic) and an LDPC code having an accumulate structure (see NPL 3, NPL 4, NPL 5, NPL 6, NPL 7 and NPL 8).

For example, sum-product decoding described in NPL 4 and NPL 9, and min-sum decoding of simplified sum-product decoding, normalized BP (belief propagation) decoding, offset-BP decoding, shuffled BP decoding of a devised belief updating method and layered BP decoding described in NPL 10 to NPL 13 are used as decoding of an LDPC code.

Moreover, as a decoding scheme different from BP decoding, decoding of an LDPC code is performed by using a decoding scheme based on Bit-Flipping, for example, as described in NPL 14.

In decoding in the receiver described herein, a parity check matrix is used to perform, for example, decoding based on the BP decoding and decoding based on the Bit-Flipping described above. However, when puncturing is performed, as described with reference to FIG. 4, the receiver inserts a log likelihood ratio (for example, a value of zero) of each bit which is not transmitted by the transmitter, to a log likelihood ratio obtained from a received signal, and performs decoding by using these log likelihood ratio and parity check matrix Moreover, "$Hs^T=0$" is described with reference to FIG. 2, and this point will be described. The number of columns of parity check matrix H is M+N, and a number of rows of parity check matrix H is N. (M and N are natural numbers.) In this case, an encoded sequence obtained by encoding is $s=(z_1, z_2, \ldots, z_{M+N})$ (s is a vector of M+N columns in one row.). In this case, $Hs^T=0$ holds, and "0 (zero) of $Hs^T=0$ (zero)" means that all elements are vectors of 0.

Exemplary Embodiment G

The case where a transmitter switches a coding scheme of "method #A" and a coding scheme of "method #B" illustrated in FIGS. 5, 6, 7, 8, 9, 10, 12, 13, 14, 15, 16 and the like, based on a number of bits of one encoded block and a coding rate, and accordingly a receiver switches a decoding scheme of "method #A" and a decoding scheme of "method #B" illustrated in FIGS. 5, 6, 7, 8, 9, 10, 12, 13, 14, 15, 16 and the like, based on a number of bits of one encoded block and a coding rate is described above.

In the present exemplary embodiment, particularly, a method for transmitting data in a case of an LDPC coding scheme using puncturing according to "method #A" will be described in detail.

Figure 52:
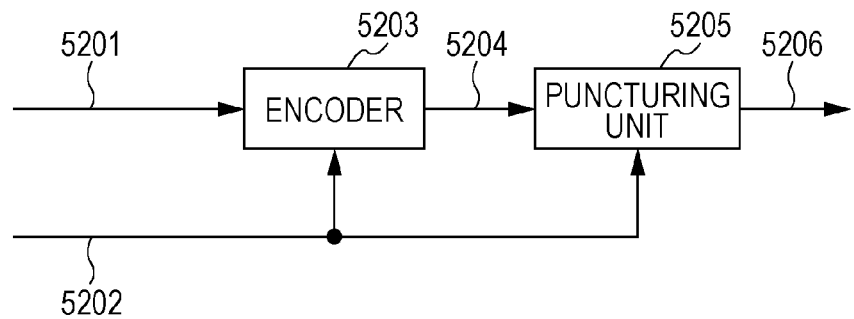
FIG. 52 is a view illustrating an example of a configuration related to an encoder and a puncturer.

A case in FIG. 15 where a coding rate is 6/15 and the number of bits of one encoded block is z=16200 bits will be discussed as an example. FIG. 52 illustrates an example of a configuration related to an encoder and a puncturer in this case.

Encoder 5203 receives an input of information 5201, and control signal 5202. Encoder 5203 performs, for example, error correction coding of an LDPC code on information 5201 based on control signal 5202. Encoder 5203 outputs data 5204 obtained after the error correction coding.

Puncturer 5205 receives an input of control signal 5202, and data 5204 obtained after the error correction coding. Puncturer 5205 performs puncturing (selects bits not to be transmitted) based on control signal 5202. Puncturer 5205 outputs data obtained after the puncturing (data from which bits not to be transmitted are removed) 5206.

A case where data of a coding rate of 6/15, the number of bits of one encoded block of 16200 bits and "method #A" is generated will be discussed. In this case, encoder 5203 performs encoding of an LDPC code (LDPC block) of a coding rate of 18/48=3/8 and a code length of 17280 bits. Then, information of the ith block is expressed by X(i, j) (i is, for example, a natural number, and j is an integer of 1 or more and 6480 or less.). A parity of the ith block is expressed by P(i, k) (i is, for example, a natural number, and k is a natural number of 1 or more and 10800 or less.). Then, encoder 5203 receives an input of 6480 bits of information X(i, 1) to X(i, 6480) of the ith block when encoder 5203 encodes the ith block. Encoder 5203 performs encoding of an LDPC code (LDPC block) of a coding rate of 18/48=3/8 and a code length of 17280 bits. Encoder 5203 outputs the 6480 bits of information X(i, 1) to X(i, 6480), and the 10800 bits of parity P(i, 1) to P(i, 10800), as data obtained after error correction coding of the ith block.

Then, puncturer 5205 determines bits not to be transmitted of 1080 bits from among a total of 17280 bits of the data obtained after the error correction coding of the ith block, the 6480 bits of information X(i, 1) to X(i, 6480) and the 10800 bits of parity P(i, 1) to P(i, 10800). Puncturer 5205 outputs 16200 bits from which the bits not to be transmitted of 1080 bits are removed, as data obtained after puncturing of the ith block (consequently, the number of bits of one encoded block of z=16200 bits and a coding rate of 6/15 are realized).

Figure 53:
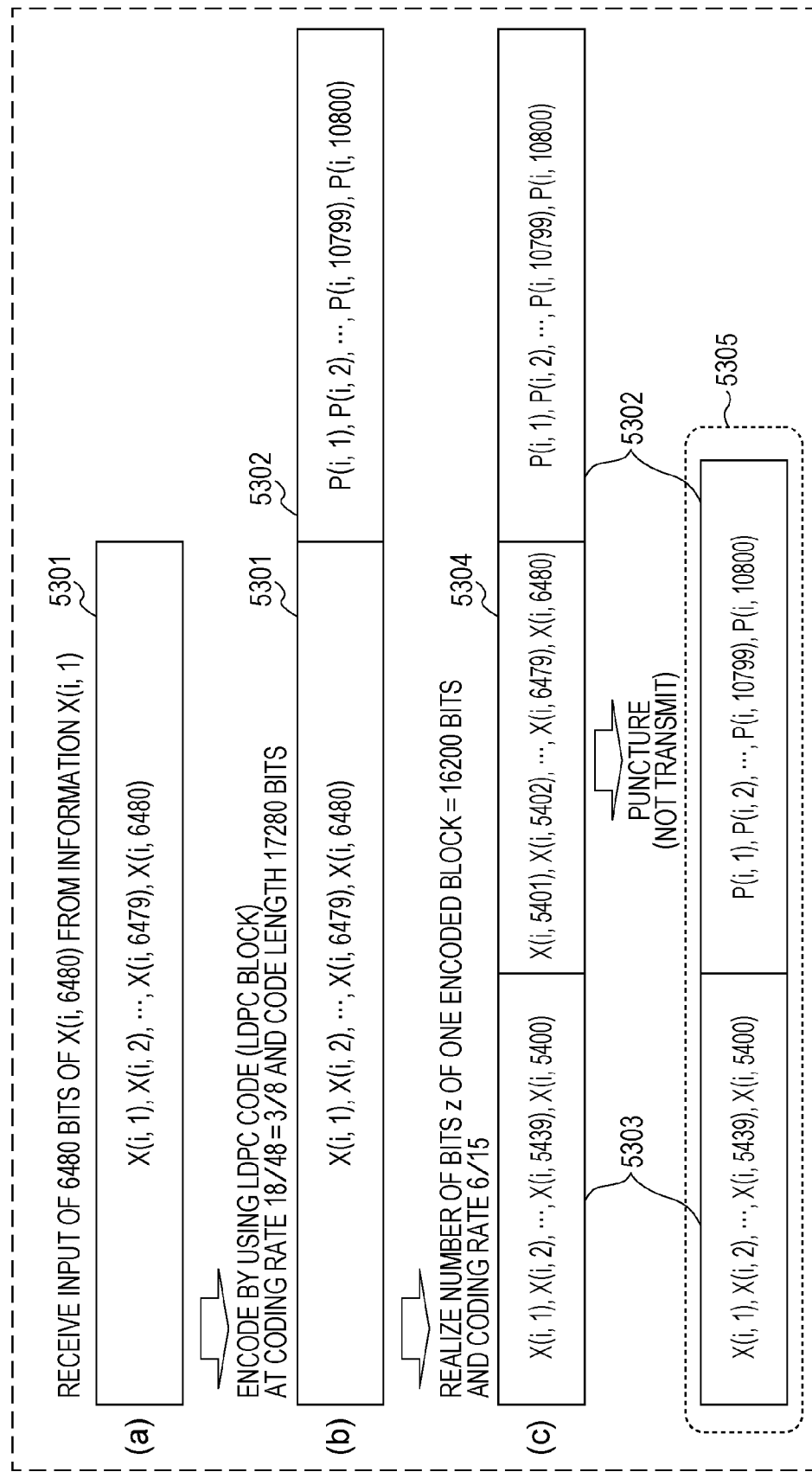
FIG. 53 is a view illustrating an example of coding processing and puncturing processing.

FIG. 53 illustrates an example of this point.

FIG. 53(*a*) illustrates a configuration of information of an ith block. Information (5301) of 6480 bits of the ith block is configured with the 6480 bits of "X(i, 1), X(i, 2), . . . , X(i, 6479), X(i, 6480)" (that is, the information of the ith block has 6480 bits, assuming X(i, j) where j is an integer of 1 or more and 6480 or less).

FIG. 53(b) illustrates a configuration of data of the ith block obtained by performing LDPC coding of a coding rate of 18/48=3/8 and a code length of 17280 bits. The 17280 bits of the ith block are configured with information (5301) of 6480 bits of "X(i, 1), X(i, 2), . . . , X(i, 6479), X(i, 6480)" and parity (5302) of 10800 bits of "P(i, 1), P(i, 2), . . . , P(i, 10799), P(i, 10800)." Then, when a parity check matrix of an LDPC code of a coding rate of 18/48=3/8 and a code length of 17280 bits is H, and codeword si of the ith block is si=(X(i, 1), X(i, 2), . . . , X(i, 6479), X(i, 6480), P(i, 1), P(i, 2), . . . , P(i, 10799), P(i, 10800)), $Hsi^T=0$ holds (note that $A^T$ means transposition of A).

FIG. 53(c) illustrates a method for generating data of an ith block to be transmitted in a case where the number of bits of one encoded block is z=16200 bits and a coding rate is 6/15. As one of features here, bits to be punctured (that is, bits not to be transmitted among 17280 bits of the ith block obtained by performing LDPC coding of a coding rate of 18/48=3/8 and a code length of 17280 bits) of 1080 bits are selected from information of 6480 bits of "X(i, 1), X(i, 2), . . . , X(i, 6479), X(i, 6480)."

For example, as illustrated in FIG. 53(c), in each block, information of 5400 bits (5303) of "X(i, 1), X(i, 2), . . . , X(i, 5439), X(i, 5400)" (the 5400 bits, assuming X(i, j) where j is an integer of 1 or more and 5400 or less) is of information bits to be transmitted (5303) of 5400 bits of the ith block, and information of 1080 bits (5304) of "X(i, 5401), X(i, 5402), . . . , X(i, 6479), X(i, 6480)" (the 1080 bits, assuming X(i, j) where j is an integer of 5401 or more and 6480 or less) is of information bits to be punctured (information bits not to be transmitted) (5304) of 1080 bits of the ith block.

Therefore, the transmitter transmits data of 16200 bits (5305) including information of 5400 bits (5303) of "X(i, 1), X(i, 2), . . . , X(i, 5439), X(i, 5400)" (the 5400 bits, assuming X(i, j) where j is an integer of 1 or more and 5400 or less), and parity of 10800 bits of P(i, 1), P(i, 2), . . . , P(i, 10799), P(i, 10800) (assuming P(i, k) where k is an integer of 1 or more and 10800 or less) (5302).

Note that the case where data to be punctured in each block is information of 1080 bits (5304) of "X(i, 5401), X(i, 5402), . . . , X(i, 6479), X(i, 6480)" (the 1080 bits, assuming X(i, j) where j is an integer of 5401 or more and 6480 or less) is described above, but this is only an example, and a method for selecting 1080 bits as data to be punctured (data not to be transmitted), from 6480 bits of "X(i, 1), X(i, 2), . . . , X(i, 6479), X(i, 6480)" (that is, information of the ith block has 6480 bits, assuming X(i, j) where j is an integer of 1 or more and 6480 or less) is not limited thereto (however, in each block, a method for selecting data to be punctured (data not to be transmitted) is the same. That is, for example, in a case where X(i, 5400) is set as data to be punctured (data not to be transmitted) in a certain block, X(i, 5400) is also set as data to be punctured (data not to be transmitted) in another block).

A case where information of 1080 bits (5304) of "X(i, 5401), X(i, 5402), . . . , X(i, 6479), X(i, 6480)" (the 1080 bits, assuming X(i, j) where j is an integer of 5401 or more and 6480 or less) is set as information bits to be punctured (information bits not to be transmitted) (5304) of 1080 bits of the ith block will be described below as an example.

The case where data of a coding rate of 6/15, the number of bits of one encoded block of 16200 bits and "method #A" is generated is discussed above. Generation of one encoded block in this case is as described above. In this case, information of 6480 bits is necessary in order to form one encoded block.

Here, in consideration of a system, an amount of information to be transmitted is not necessarily a number of bits of a multiple of 6480 (6480×N bits (N is a natural number)). In this case, special processing is necessary. This processing method will be described below.

A number of bits of information to be transmitted by the transmitter can be generalized by setting the number of bits of information to be transmitted by the transmitter to "6480× n+α bits" (where n is an integer equal to or more than 0, and α is an integer of 0 or more and 6479 or less).

In this case, when n is an integer equal to or more than 1 and α is 0, the transmitter performs the processing illustrated in FIG. 53 to generate n blocks of a "coding rate of 6/15, the number of bits of one encoded block of 16200 bits and "method #A"" and generates and transmits these n blocks.

When n is an integer equal to or more than 0 and α is an integer of 1 or more and 6479 or less, the transmitter performs the processing illustrated in FIG. 53 to generate n blocks of a "coding rate of 6/15, the number of bits of one encoded block of 16200 bits and "method #A"" and generates and transmits these n blocks. Further, processing for transmitting the information of the α bits is necessary (this corresponds to performing the above-described "special processing").

The "processing for transmitting the information of the α bits" will be described in detail below.

A case where the "number of bits of information to be transmitted by the transmitter is "6480×n+α bits," n is an integer equal to or more than 0 and α is an integer of 1 or more and 6479 or less" will be discussed here. As also described above, in this case, the processing illustrated in FIG. 53 is performed on information of "6480×n bits" to generate n blocks of a "coding rate of 6/15, the number of bits of one encoded block of 16200 bits and "method #A"" and these n blocks are generated and transmitted. Further, the transmitter transmits the information of α bits. A coding scheme in this case will be described.

A characteristic point in this case is to "preferentially allocate the information of the α bits to a portion of information bits to be punctured 5304 of 1080 bits of the ith block in FIG. 53(c), and to perform LDPC coding of a coding rate of 18/48=3/8 and a code length of 17280 bits." An example of this point will be described with reference to FIG. 53.

First, a block for transmitting the information of the α bits is an n+1th block. Therefore, information bits (information sequence) of 6480 bits in FIG. 53 can be expressed by "X(n+1, 1), X(n+1, 2), . . . , X(n+1, 6479), X(n+1, 6480)" (that is, information of the n+1th block has 6480 bits, assuming X(n+1, j) where j is an integer of 1 or more and 6480 or less.). Parity bits (parity sequence) of 10800 bits in FIG. 53 can be expressed by "P(n+1, 1), P(n+1, 2), . . . , P(n+1, 10799), P(n+1, 10800)" (that is, the 10800 bits, assuming P(n+1, k) where k is an integer of 1 or more and 10800 or less.).

<1> A Case where α in the Information of the α Bits is an Integer of 1 or More and 1080 or Less:

In this case, bits known in the transmitter and the receiver of (1080−α) bits are prepared. For example, "zeroes" of the (1080−α) bits are prepared (a sequence formed with (1080−a) zeroes is prepared.). Then, a sequence of 1080 bits formed with information of the information of the α bits and "zeroes" of the (1080−α) bits is expressed by "Y(n+1, 1), "Y(n+1, 2), . . . , Y(n+1, 1079), Y(n+1, 1080)" (that is, the 1080 bits, assuming Y(n+1, j) where j is an integer of 1 or more and 1080 or less.).

Further, information of 5400 bits is further necessary in order to perform LDPC coding. (As is clear from FIGS. 53(a), (b) and (c), information of 6480 bits is necessary in order to perform LDPC coding. Since the 1080 bits are prepared as Y(n+1, j), information of 6480−1080=5400 bits is further necessary.) Then, a known sequence of 5400 bits is prepared as information of these 5400 bits. For example, the known sequence is of "zeroes" of the 5400 bits (a sequence formed with 5400 zeros), and is expressed by "Z(n+1, 1), Z(n+1, 2), . . . , Z(n+1, 5399), Z(n+1, 5400)" (that is, the 5400 bits, assuming Z(n+1, j) where j is an integer of 1 or more and 5400 or less.).

In this case, LDPC coding and data transmission are performed as follows.

"Y(n+1, 1), Y(n+1, 2), . . . , Y(n+1, 1079), Y(n+1, 1080)" (that is, the 1080 bits, assuming Y(n+1, j) where j is an integer of 1 or more and 1080 or less.) is applied to "information to be punctured (information bits not to be transmitted) 5304 of 1080 bits of the ith block in FIG. 53. Therefore, the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is obtained by "Y(n+1, 1), Y(n+1, 2), . . . , Y(n+1, 1799), Y(n+1, 1080)" (that is, the 1080 bits, assuming Y(n+1, j) where j is an integer of 1 or more and 1080 or less.).

"Z(n+1, 1), Z(n+1, 2), . . . , Z(n+1, 5399), Z(n+1, 5400)" (that is, the 5400 bits, assuming Z(n+1, j) where j is an integer of 1 or more and 5400 or less.) is applied to information of 5400 bits (5303) of "X(i, 1), X(i, 2), . . . , X(i, 5439), X(i, 5400)" (the 5400 bits, assuming X(i, j) where j is an integer of 1 or more and 5400 or less). Therefore, the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) is obtained by "Z(n+1, 1), Z(n+1, 2), . . . , Z(n+1, 5399), Z(n+1, 5400)" (that is, the 5400 bits, assuming Z(n+1, j) where j is an integer of 1 or more and 5400 or less.).

As described above, the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less), and the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) are obtained. Consequently, LDPC coding of a coding rate of 18/48=3/8 and a code length of 17280 bits is performed to obtain a parity of 10800 bits of "P(n+1, 1), P(n+1, 2), . . . , P(n+1, 10799), P(n+1, 10800)" (assuming P(n+1, k) where k is an integer of 1 or more and 10800 or less).

Then, since the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is data to be punctured in FIG. 53(c), the transmitter does not transmit this information.

Since the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) is a known sequence, the transmitter does not transmit this information.

Therefore, the transmitter transmits as data of the n+1th block the parity of 10800 bits of "P(n+1, 1), P(n+1, 2), . . . , P(n+1, 10799), P(n+1, 10800)" (assuming P(n+1, k) where k is an integer of 1 or more and 10800 or less).

The following processing is performed in decoding of the n+1th block of the decoder of the receiver.

For example, a log likelihood ratio corresponding to each bit of the parity of the 10800 bits of "P(n+1, 1), P(n+1, 2), . . . , P(n+1, 10799), P(n+1, 10800)" (assuming P(n+1, k) where k is an integer of 1 or more and 10800 or less) transmitted by the transmitter is obtained.

Since the transmitter does not transmit the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less), the receiver does not determine from a received signal a log likelihood ratio corresponding to each bit of the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less). Instead, since the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) is a known sequence, the receiver creates a log likelihood ratio corresponding to each bit of this known sequence.

The information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) includes a portion of a known sequence and a portion of an information sequence to be transmitted to the receiver. However, since these 1080 bits are puncture bits (puncture sequence), the transmitter does not transmit these 1080 bits. Hence, the receiver does not determine from a received signal a log likelihood ratio corresponding to each bit of the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less). Instead, the receiver gives a log likelihood ratio of each bit corresponding to the portion of the known sequence of the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less). Moreover, the receiver gives a log likelihood ratio of each bit corresponding to the portion of the information sequence to be transmitted to the receiver of the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) (for example, the receiver gives a zero as a log likelihood ratio).

A log likelihood ratio of each bit of the 17280 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

<2> A Case where α in the Information of the α Bits is an Integer of 1081 or More and 6480 or Less:

In this case, 1080 bits are extracted from the information of the α bits. Then, a sequence formed with the extracted 1080 bits is expressed by "y(n+1, 1), y(n+1, 2), . . . , y(n+1, 1079), y(n+1, 1080)" (that is, the 1080 bits, assuming y(n+1, j) where j is an integer of 1 or more and 1080 or less.).

Next, bits known in the transmitter and the receiver of (6480−α) bits are prepared. For example, "zeroes" of the (6480−α) bits are prepared ((6480−α) zeroes are prepared.). Then, "zeros" of the (6480−α) bits and "information of the (α−1080) bits other than the "1080 bits extracted from the information of the α bits" of the information of the α bits," that is, a data sequence of (6480−α)+(α−1080)=5400 bits is expressed by "z(n+1, 1), z(n+1, 2), . . . , z(n+1, 5399), z(n+1, 5400)" (that is, the 5400 bits, assuming z(n+1, j) where j is an integer of 1 or more and 5400 or less.).

In this case, LDPC coding and data transmission are performed as follows.

"y(n+1, 1), y(n+1, 2), . . . , y(n+1, 1079), y(n+1, 1080)" (that is, the 1080 bits, assuming y(n+1, j) where j is an integer of 1 or more and 1080 or less.) is applied to "information to be punctured (information bits not to be transmitted) 5304 of 1080 bits of the ith block in FIG. 53. Therefore, the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is obtained by "y(n+1, 1), y(n+1, 2), . . . , y(n+1, 1079), y(n+1, 1080)" (that is, the 1080 bits, assuming y(n+1, j) where j is an integer of 1 or more and 1080 or less.).

"z(n+1, 1), z(n+1, 2), . . . , z(n+1, 5399), z(n+1, 5400)" (that is, the 5400 bits, assuming z(n+1, j) where j is an integer of 1 or more and 5400 or less.) is applied to information of 5400 bits (5303) of "X(i, 1), X(i, 2), . . . , X(i, 5439), X(i, 5400)" (the 5400 bits, assuming X(i, j) where j is an integer of 1 or more and 5400 or less). Therefore, the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) is obtained by "z(n+1, 1), z(n+1, 2), . . . , z(n+1, 5399), z(n+1, 5400)" (that is, the 5400 bits, assuming z(n+1, j) where j is an integer of 1 or more and 5400 or less.).

As described above, the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less), and the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) are obtained. Consequently, LDPC coding of a coding rate of 18/48=3/8 and a code length of 17280 bits is performed to obtain a parity of 10800 bits of "P(n+1, 1), P(n+1, 2), . . . , P(n+1, 10799), P(n+1, 10800)" (assuming P(n+1, k) where k is an integer of 1 or more and 10800 or less).

Then, since the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is data to be punctured in FIG. 53(*c*), the transmitter does not transmit this information.

Since a sequence corresponding to "zeroes" of (6480−α) bits in the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) is a sequence known in the transmitter and the receiver, the transmitter does not transmit this sequence. Then, the transmitter transmits the "information of the (α−1080) bits other than the "1080 bits extracted from the information of the α bits" of the information of the α bits" in the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less).

The transmitter transmits a parity of 10800 bits of "P(n+1, 1), P(n+1, 2), . . . , P(n+1, 10799), P(n+1, 10800)" (assuming P(n+1, k) where k is an integer of 1 or more and 10800 or less).

Therefore, the transmitter transmits, as data of the n+1 th block, the "information of the (α−1080) bits other than the "1080 bits extracted from the information of the α bits" of the information of the α bits" in the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less), and the parity of 10800 bits of "P(n+1, 1), P(n+1, 2), . . . , P(n+1, 10799), P(n+1, 10800)" (assuming P(n+1, k) where k is an integer of 1 or more and 10800 or less).

The following processing is performed in decoding of the n+1th block of the decoder of the receiver.

For example, a log likelihood ratio corresponding to each bit of the parity of the 10800 bits of "P(n+1, 1), P(n+1, 2), . . . , P(n+1, 10799), P(n+1, 10800)" (assuming P(n+1, k) where k is an integer of 1 or more and 10800 or less) transmitted by the transmitter is obtained.

The information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is configured with an information sequence to be transmitted to the receiver. Then, since the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) is of puncture bits (puncture sequence), the transmitter does not transmit the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less). Hence, the receiver does not determine from a received signal a log likelihood ratio corresponding to each bit of the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less). Instead, the receiver gives a log likelihood ratio corresponding to the information sequence to be transmitted, to each bit of the information of 1080 bits of "X(n+1, 5401), X(n+1, 5402), . . . , X(n+1, 6479), X(n+1, 6480)" (the 1080 bits, assuming X(n+1, j) where j is an integer of 5401 or more and 6480 or less) (for example, the receiver gives a zero as a log likelihood ratio).

The information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less) includes a portion of a known sequence and a portion of an information sequence to be transmitted to the receiver.

In this case, the transmitter transmits the information sequence to be transmitted to the receiver in the information of 5400 bits of "X(n+1, 1), X(n+1, 2), . . . , X(n+1, 5439), X(n+1, 5400)" (the 5400 bits, assuming X(n+1, j) where j is an integer of 1 or more and 5400 or less). For this reason, the receiver obtains from a received signal, for example, a log likelihood ratio corresponding to each bit of the information sequence to be transmitted in the information of 5400 bits of "X(n+1, 1), X(n+1, 2), ..., X(n+1, 5439), X(n+1, 5400)" (the 5400 bits, assuming X(n+1, j) where j is an integer of 1 or more and 5400 or less).

The transmitter does not transmit the known sequence in the information of 5400 bits of "X(n+1, 1), X(n+1, 2), ..., X(n+1, 5439), X(n+1, 5400)" (the 5400 bits, assuming X(n+1, j) where j is an integer of 1 or more and 5400 or less). For this reason, the receiver does not determine from a received signal a log likelihood ratio corresponding to each bit of the known sequence in the information of 5400 bits of "X(n+1, 1), X(n+1, 2), ..., X(n+1, 5439), X(n+1, 5400)" (the 5400 bits, assuming X(n+1, j) where j is an integer of 1 or more and 5400 or less). Instead, the receiver gives a log likelihood ratio corresponding to the known sequence to each bit of the known sequence in the information of 5400 bits of "X(n+1, 1), X(n+1, 2), ..., X(n+1, 5439), X(n+1, 5400)" (the 5400 bits, assuming X(n+1, j) where j is an integer of 1 or more and 5400 or less).

A log likelihood ratio of each bit of the 17280 bits of the n+1th block can be obtained by obtaining the log likelihood ratio as described above. Belief propagation decoding (BP (Belief Propagation) decoding) is performed by using these log likelihood ratios to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

As described above, a characteristic point according to the present disclosure is to "preferentially allocate the information of the α bits to a portion of information bits to be punctured 5304 of 1080 bits of the ith block in FIG. 53(c), and to perform LDPC coding of a coding rate of 18/48=3/8 and a code length of 17280 bits." In this case, it is possible to obtain an effect of improvement in data transmission efficiency of the n+1th block and improvement in data reception quality. This point will be described.

The transmitter does not transmit information bits to be punctured 5304 of 1080 bits of the ith block in FIG. 53. In the receiver, information bits to be punctured 5304 of 1080 bits of the ith block are estimated by using a log likelihood ratio of each bit except the "information bits to be punctured of 1080 bits" of the ith block. That is, when belief of the log likelihood ratio of each bit except the "information bits to be punctured of 1080 bits" of the ith block is high, estimation precision in the receiver of the information bits to be punctured of 1080 bits of the ith block improves.

In consideration of this point, when a sequence known in the transmitter and the receiver is preferentially allocated to information bits except information bits to be punctured 5304 of 1080 bits of the ith block, that is, information bits to be transmitted 5303 of 5400 bits of the ith block in FIG. 53, estimation precision of the information bits to be punctured of 1080 bits of the ith block improves.

Moreover, in terms of information transmission efficiency, a sequence known in the transmitter and the receiver is not transmitted by the transmitter. In addition, bits to be punctured are not transmitted by the transmitter. According to this rule, when the "information of the α bits is preferentially allocated to a portion of information bits to be punctured 5304 of 1080 bits of the ith block in FIG. 53(c), and LDPC coding of a coding rate of 18/48=3/8 and a code length of 17280 bits is performed," transmission efficiency of n+1th data is good.

The case where the number of bits of one encoded block is z=16200 bits, a coding rate is 6/15 (a coding rate obtained after puncturing), a code length (block length) of an LDPC code used in this case is 17280 bits, and a coding rate of an LDPC code is 18/48=3/8 is described as an example in the present exemplary embodiment.

However, the present disclosure is not limited thereto. Even in a case where number of bits z of one encoded block, a coding rate (a coding rate obtained after puncturing), a code length (block length) of an LDPC and a coding rate of the LDPC code are different from these values, the same effect can be obtained by carrying out the present disclosure in the same way.

Note that case <1> and case <2> described above each describe the example where the "parity of 10800 bits of "P(n+1, 1), P(n+1, 2), ..., P(n+1, 10799), P(n+1, 10800)" (assuming P(n+1, k) where k is an integer of 1 or more and 10800 or less) is transmitted," that is, all parity bits are transmitted, but (part of) parity bits (parity sequence) may be punctured (the transmitter may not transmit (part of) the parity bits (parity sequence)).

Case <1> according to the present exemplary embodiment describes the "case where α in the information of the α bits is an integer of 1 or more and 1080 or less." However, case <1> may hold with every a in the information of the α bits which satisfies an integer of 1 or more and 1080 or less.

Moreover, there may be integer a satisfying 1 or more and 1080 or less in order that case <1> holds.

Similarly, case <2> according to the present exemplary embodiment describes the "case where α in the information of the α bits is an integer of 1081 or more and 6480 or less." However, case <2> may hold with every a in the information of the α bits which satisfies an integer of 1081 or more and 6480 or less.

Moreover, there may be integer a satisfying 1081 or more and 6480 or less in order that case <2> holds.

A summary of the above can also be described as follows.

Encoding of an LDPC code of coding rate u/(u+v) where a code length (block length) is u+v, and where a block is configured with number of bits u of information and number of bits v of a parity is performed (u is an integer equal to or more than 1, and v is an integer equal to or more than 1). Information of u bits and a parity of v bits are obtained by this encoding.

Subsequently, a processor including a configuration of extracting information of β bits to be punctured of the information of the u bits (β is an integer of 1 or more and v or less (β is equal to or less than v in consideration of erasure correction performance.)) (a configuration of extracting information of β bits not to be transmitted) sets to the α bits (α is an integer of 1 or more and u−1 or less) a number of bits of information to be transmitted to the receiver of the information of the u bits used for the LDPC coding (in this case, u−α bits of the information of the u bits used for the LDPC coding is a sequence known in the transmitter and the receiver).

In this case, the information of the α bits to be transmitted to the receiver is allocated as much as possible to "(information corresponding to) the sequence of the β bits to be punctured" (the LDPC coding is performed based on the allocation).

In other words, this is as follows.

Encoding of an LDPC code of coding rate u/(u+v) where a code length (block length) is u+v, and where a block is configured with number of bits u of information and number of bits v of a parity is performed (u is an integer equal to or more than 1, and v is an integer equal to or more than 1). Information of u bits and a parity of v bits are obtained by this encoding.

Subsequently, a processor including a configuration of extracting information of β bits to be punctured of the information of the u bits (β is an integer of 1 or more and v or less ((3 is equal to or less than v in consideration of erasure correction performance.)) (a configuration of extracting information of β bits not to be transmitted) sets to the α bits (a is an integer of 1 or more and u−1 or less) a number of bits of information to be transmitted to the receiver of the information of the u bits used for the LDPC coding (in this case, u−α bits of the information of the u bits used for the LDPC coding is a sequence known in the transmitter and the receiver).

In this case, in a case of α≥β (α is equal to or more than β), information of the β bits of the information of the α bits to be transmitted to the receiver is allocated to "(information corresponding to) the sequence of the β bits to be punctured" (the LDPC coding is performed based on the allocation).

Then, in a case of α<β (α is smaller than β), the information of the α bits to be transmitted to the receiver is allocated to "(information corresponding to) the sequence of the β bits to be punctured (the LDPC coding is performed based on the allocation).

Note that known bits (known sequence) and a parity can be handled in the same way as in case <1> and case <2>. Note that as described above, (part of) parity bits (parity sequence) may be punctured (the transmitter may not transmit (part of) the parity bits (parity sequence)).

Exemplary Embodiment H

The case where a transmitter switches a coding scheme of "method #A" and a coding scheme of "method #B" illustrated in FIGS. 5, 6, 7, 8, 9, 10, 12, 13, 14, 15, 16 and the like, based on a number of bits of one encoded block and a coding rate, and accordingly a receiver switches a decoding scheme of "method #A" and a decoding scheme of "method #B" illustrated in FIGS. 5, 6, 7, 8, 9, 10, 12, 13, 14, 15, 16 and the like, based on a number of bits of one encoded block and a coding rate is described above.

In the present exemplary embodiment, particularly, a method for transmitting data in a case of an LDPC coding scheme using puncturing according to "method #A" will be described in detail.

A case in FIG. 15 where a coding rate is 5/15 and the number of bits of one encoded block is z=16200 bits will be discussed as an example. An example of a configuration related to an encoder and a puncturer is as illustrated in FIG. 52, and will not be described.

A case where data of a coding rate of 5/15, the number of bits of one encoded block of 16200 bits and "method #A" is generated will be discussed. In this case, encoder 5203 performs encoding of an LDPC code (LDPC block) of a coding rate of 15/49 and a code length of 17640 bits. Then, information of the ith block is expressed by X(i, j) (i is, for example, a natural number, and j is an integer of 1 or more and 5400 or less.). A parity of the ith block is expressed by P(i, k) (i is, for example, a natural number, and k is a natural number of 1 or more and 12240 or less.). Then, encoder 5203 receives an input of 5400 bits of information X(i, 1) to X(i, 5400) of the ith block when encoder 5203 encodes the ith block. Encoder 5203 performs encoding of an LDPC code (LDPC block) of a coding rate of 15/49 and a code length of 17640 bits. Encoder 5203 outputs the 5400 bits of information X(i, 1) to X(i, 5400), and the 12240 bits of parity P(i, 1) to P(i, 12240), as data obtained after error correction coding of the ith block.

Then, puncturer 5205 determines bits not to be transmitted of 1440 bits from among a total of 17640 bits of the data obtained after the error correction coding of the ith block, the 5400 bits of information X(i, 1) to X(i, 5400) and the 12240 bits of parity P(i, 1) to P(i, 12240). Puncturer 5205 outputs 16200 bits from which the 1440 bits not to be transmitted are removed, as data obtained after the puncturing of the ith block (consequently, the number of bits of one encoded block of z=16200 bits and a coding rate of 5/15 are realized).

Figure 54:
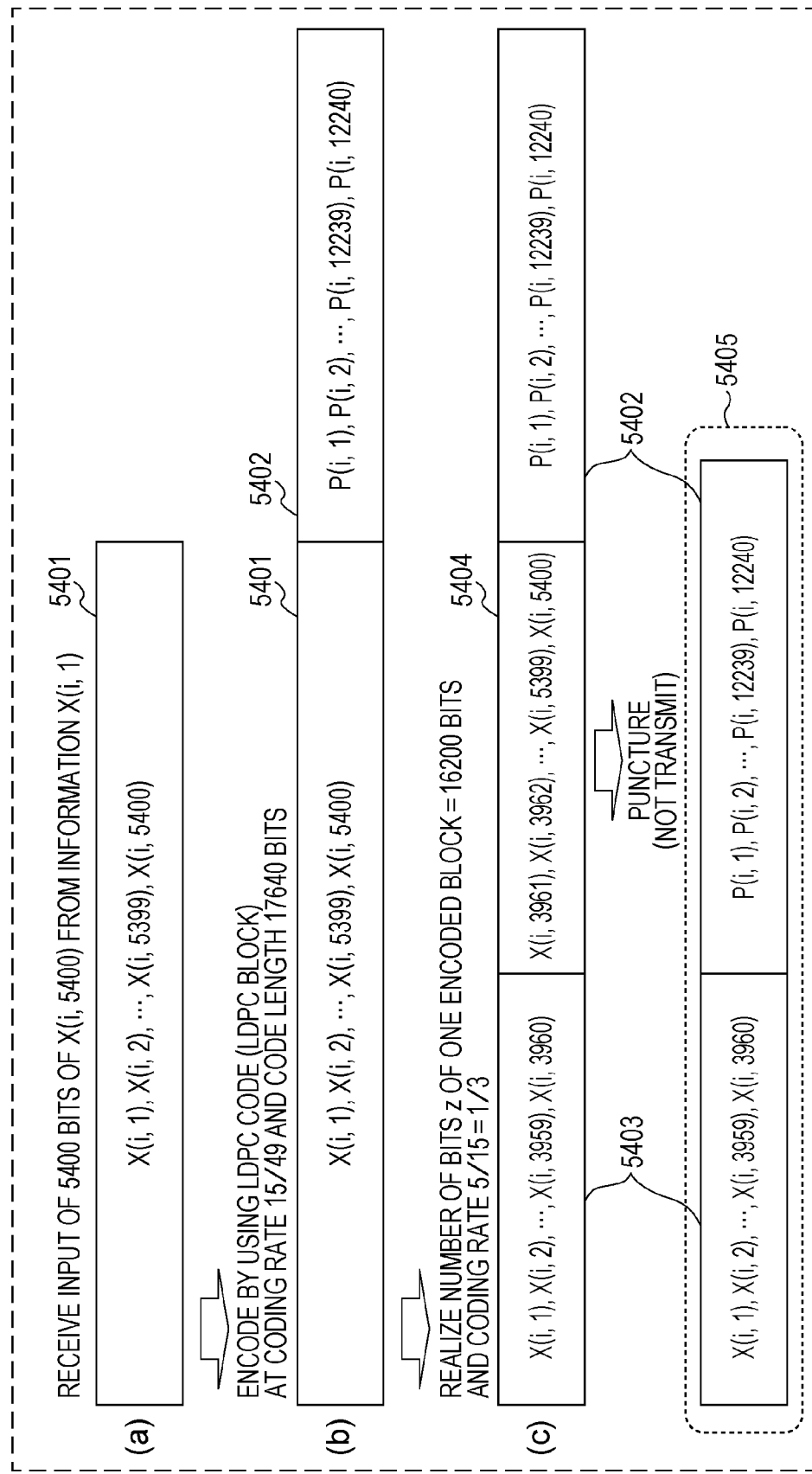
FIG. 54 is a view illustrating an example of coding processing and puncturing processing.

FIG. 54 illustrates an example of this point.

FIG. 54(a) illustrates a configuration of information of the ith block, and information (5401) of 5400 bits of the ith block is configured with the 5400 bits of "X(i, 1), X(i, 2), . . . , X(i, 5399), X(i, 5400)" (that is, the information of the ith block has 5400 bits, assuming X(i, j) where j is an integer of 1 or more and 5400 or less).

FIG. 54(b) illustrates a configuration of data of the ith block obtained by performing LDPC coding of a coding rate of 15/49 and a code length of 17640 bits. The 17640 bits of the ith block are configured with information (5401) of 5400 bits of "X(i, 1), X(i, 2), . . . , X(i, 5399), X(i, 5400)" and parity (5402) of 12240 bits of "P(i, 1), P(i, 2), . . . , P(i, 12239), P(i, 12240)." Then, when a parity check matrix of an LDPC code of a coding rate of 15/49 and a code length of 17640 bits is H, and codeword si of the ith block is si=(X(i, 1), X(i, 2), . . . , X(i, 5399), X(i, 5400), P(i, 1), P(i, 2), . . . , P(i, 12239), P(i, 12240)), $Hsi^T=0$ holds (note that $A^T$ means transposition of A).

FIG. 54(c) illustrates a method for generating data of the ith block to be transmitted in a case where the number of bits of one encoded block is z=16200 bits and a coding rate is 5/15=1/3. As one of features here, bits to be punctured (that is, bits not to be transmitted among 17640 bits of the ith block obtained by performing LDPC coding of a coding rate of 15/49 and a code length of 17640 bits) of 1440 bits are selected from information of 5400 bits of "X(i, 1), X(i, 2), . . . , X(i, 5399), X(i, 5400)."

For example, as illustrated in FIG. 54(c), in each block, information of 3960 bits (5403) of "X(i, 1), X(i, 2), . . . , X(i, 3959), X(i, 3960)" (the 3960 bits, assuming X(i, j) where j is an integer of 1 or more and 3960 or less) is of information bits (5403) to be transmitted of 3960 bits of the ith block, and information of 1440 bits (5404) of "X(i, 3961), X(i, 3962), . . . , X(i, 5399), X(i, 5400)" (the 1440 bits, assuming X(i, j) where j is an integer of 3961 or more and 5400 or less) is of information bits to be punctured (information bits not to be transmitted) (5404) of 1440 bits of the ith block.

Therefore, the transmitter transmits data of 16200 bits (5405) including information of 3960 bits (5403) of "X(i, 1), X(i, 2), . . . , X(i, 3959), X(i, 3960)" (the 3960 bits, assuming X(i, j) where j is an integer of 1 or more and 3960 or less), and parity of 12240 bits of P(i, 1), P(i, 2), . . . , P(i, 12239), P(i, 12240) (assuming P(i, k) where k is an integer of 1 or more and 12240 or less) (5402).

Note that the case where data to be punctured in each block is information of 1440 bits (5404) of "X(i, 3961), X(i, 3962), ..., X(i, 5399), X(i, 5400)" (the 1440 bits, assuming X(i, j) where j is an integer of 3961 or more and 5400 or less) is described above, but this is only an example, and a method for selecting 1440 bits as data to be punctured (data not to be transmitted), from 5400 bits of "X(i, 1), X(i, 2), ..., X(i, 5399), X(i, 5400)" (that is, information of the ith block has 5400 bits, assuming X(i, j) where j is an integer of 1 or more and 5400 or less) is not limited thereto (however, in each block, a method for selecting data to be punctured (data not to be transmitted) is the same. That is, for example, in a case where X(i, 5400) is set as data to be punctured (data not to be transmitted) in a certain block, X(i, 5400) is also set as data to be punctured (data not to be transmitted) in another block).

A case where information of 1440 bits (5404) of "X(i, 3961), X(i, 3962), ..., X(i, 5399), X(i, 5400)" (the 1440 bits, assuming X(i, j) where j is an integer of 3961 or more and 5400 or less) is set as information bits to be punctured (information bits not to be transmitted) (5404) of 1440 bits of the ith block will be described below as an example.

The case where data of a coding rate of 5/15=1/3, the number of bits of one encoded block of 16200 bits and "method #A" is generated is discussed above. Generation of one encoded block in this case is as described above. In this case, information of 5400 bits is necessary in order to form one encoded block.

Here, in consideration of a system, an amount of information to be transmitted is not necessarily a number of bits of a multiple of 5400 (5400×N bits (N is a natural number)). In this case, special processing is necessary. This processing method will be described below.

A number of bits of information to be transmitted by the transmitter can be generalized by setting the number of bits of information to be transmitted by the transmitter to "5400×n+α bits" (where n is an integer equal to or more than 0, and α is an integer of 0 or more and 5399 or less).

In this case, when n is an integer equal to or more than 1 and α is 0, the transmitter performs the processing illustrated in FIG. 54 to generate n blocks of a "coding rate of 5/15=1/3, the number of bits of one encoded block of 16200 bits and "method #A"" and generates and transmits these n blocks.

When n is an integer equal to or more than 0 and α is an integer of 1 or more and 5399 or less, the transmitter performs the processing illustrated in FIG. 54 to generate n blocks of a "coding rate of 5/15=1/3, the number of bits of one encoded block of 16200 bits and "method #A"" and generates and transmits these n blocks. Further, processing for transmitting the information of the α bits is necessary (this corresponds to performing the above-described "special processing").

The "processing for transmitting the information of the α bits" will be described in detail below.

A case where the "number of bits of information to be transmitted by the transmitter is "5400×n+α bits," n is an integer equal to or more than 0 and α is an integer of 1 or more and 5399 or less" will be discussed here. As also described above, in this case, the processing illustrated in FIG. 54 is performed on information of "5400×n bits" to generate n blocks of a "coding rate of 5/15=1/3, the number of bits of one encoded block of 16200 bits and "method #A"" and these n blocks are generated and transmitted. Further, the transmitter transmits the information of α bits. A coding scheme in this case will be described.

A characteristic point in this case is to "preferentially allocate the information of the α bits to a portion of information bits to be punctured 5404 of 1440 bits of the ith block in FIG. 54(c), and to perform LDPC coding of a coding rate of 15/49 and a code length of 17640 bits." An example of this point will be described with reference to FIG. 54.

First, a block for transmitting the information of the α bits is an n+1th block. Therefore, information bits (information sequence) of 5400 bits in FIG. 54 can be expressed by "X(n+1, 1), X(n+1, 2), ..., X(n+1, 5399), X(n+1, 5400)" (that is, information of the n+1th block has 5400 bits, assuming X(n+1, j) where j is an integer of 1 or more and 5400 or less.). Parity bits (parity sequence) of 12240 bits in FIG. 54 can be expressed by "P(n+1, 1), P(n+1, 2), ..., P(n+1, 12239), P(n+1, 12240)" (that is, the 12240 bits, assuming P(n+1, k) where k is an integer of 1 or more and 12240 or less.).

<1> A Case where α in the Information of the α Bits is an Integer of 1 or More and 1440 or Less:

In this case, bits known in the transmitter and the receiver of (1440−α) bits are prepared. For example, "zeroes" of the (1440−α) bits are prepared (a sequence formed with (1440−α) zeroes is prepared.). Then, a sequence of 1440 bits formed with information of the information of the α bits and "zeroes" of the (1440−α) bits is expressed by "Y(n+1, 1), Y(n+1, 2), ..., Y(n+1, 1439), Y(n+1, 1440)" (that is, the 1440 bits, assuming Y(n+1, j) where j is an integer of 1 or more and 1440 or less.).

Further, information of 3960 bits is further necessary in order to perform LDPC coding. (As is clear from FIGS. 54(a), (b) and (c), information of 5400 bits is necessary in order to perform LDPC coding. Since the 1440 bits are prepared as Y(n+1, j), information of 5400−1440=3960 bits is further necessary.) Then, a known sequence of 3960 bits is prepared as information of these 3960 bits. For example, the known sequence is of "zeroes" of the 3960 bits (a sequence formed with 3960 zeros), and is expressed by "Z(n+1, 1), Z(n+1, 2), ..., Z(n+1, 3959), Z(n+1, 3960)" (that is, the 3960 bits, assuming Z(n+1, j) where j is an integer of 1 or more and 3960 or less.).

In this case, LDPC coding and data transmission are performed as follows.

"Y(n+1, 1), Y(n+1, 2), ..., Y(n+1, 1439), Y(n+1, 1440)" (that is, the 1440 bits, assuming Y(n+1, j) where j is an integer of 1 or more and 1440 or less.) is applied to "information to be punctured (information bits not to be transmitted) 5404 of 1440 bits of the ith block in FIG. 54. Therefore, the information of 1440 bits of "X(n+1, 3961), X(n+1, 3962), ..., X(n+1, 5399), X(n+1, 5400)" (the 1440 bits, assuming X(n+1, j) where j is an integer of 3961 or more and 5400 or less) is obtained by "Y(n+1, 1), Y(n+1, 2), ..., Y(n+1, 1439), Y(n+1, 1440)" (that is, the 1440 bits, assuming Y(n+1, j) where j is an integer of 1 or more and 1440 or less.).

"Z(n+1, 1), Z(n+1, 2), ..., Z(n+1, 3959), Z(n+1, 3960)" (that is, the 3960 bits, assuming Z(n+1, j) where j is an integer of 1 or more and 3960 or less.) is applied to information of 3960 bits (5403) of "X(i, 1), X(i, 2), ..., X(i, 3959), X(i, 3960)" (the 3960 bits, assuming X(i, j) where j is an integer of 1 or more and 3960 or less). Therefore, the information of 3960 bits of "X(n+1, 1), X(n+1, 2), ..., X(n+1, 3959), X(n+1, 3960)" (the 3960 bits, assuming X(n+1, j) where j is an integer of 1 or more and 3960 or less) is obtained by "Z(n+1, 1), Z(n+1, 2), ..., Z(n+1, 3959), Z(n+1, 3960)" (that is, the 3960 bits, assuming Z(n+1, j) where j is an integer of 1 or more and 3960 or less.).

As described above, the information of 1440 bits of "X(n+1, 3961), X(n+1, 3962), ..., X(n+1, 5399), X(n+1, 5400)" (the 1440 bits, assuming X(n+1, j) where j is an integer of 3961 or more and 5400 or less), and the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) are obtained. Consequently, LDPC coding of a coding rate of 15/49 and a code length of 17640 bits is performed to obtain a parity of 12240 bits of "P(n+1, 1), P(n+1, 2), . . . , P(n+1, 12239), P(n+1, 12240)" (assuming P(n+1, k) where k is an integer of 1 or more and 12240 or less).

Then, since the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) is data to be punctured in FIG. 54(c), the transmitter does not transmit this information.

Since the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) is a known sequence, the transmitter does not transmit this information.

Therefore, the transmitter transmits as data of the n+1th block the parity of 12240 bits of "P(n+1, 1), P(n+1, 2), . . . , P(n+1, 12239), P(n+1, 12240)" (assuming P(n+1, k) where k is an integer of 1 or more and 12240 or less).

The following processing is performed in decoding of the n+1th block of the decoder of the receiver.

For example, a log likelihood ratio corresponding to each bit of the parity of 12240 bits of "P(n+1, 1), P(n+1, 2), . . . , P(n+1, 12239), P(n+1, 12240)" (assuming P(n+1, k) where k is an integer of 1 or more and 12240 or less) transmitted by the transmitter is obtained.

Since the transmitter does not transmit the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less), the receiver does not determine from a received signal a log likelihood ratio corresponding to each bit of the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less). Instead, since the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) is a known sequence, the receiver creates a log likelihood ratio corresponding to each bit of this known sequence.

The information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) includes a portion of a known sequence and a portion of an information sequence to be transmitted to the receiver. However, since these 1440 bits are puncture bits (puncture sequence), the transmitter does not transmit these 1440 bits. Hence, the receiver does not determine from a received signal a log likelihood ratio corresponding to each bit of the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less). Instead, the receiver gives a log likelihood ratio of each bit corresponding to the portion of the known sequence of the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less). Moreover, the receiver gives a log likelihood ratio of each bit corresponding to the portion of the information sequence to be transmitted to the receiver of the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) (for example, the receiver gives a zero as a log likelihood ratio).

A log likelihood ratio of each bit of the 17640 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

<2> A Case where α in the Information of the α Bits is an Integer of 1441 or More and 5400 or Less:

In this case, 1440 bits are extracted from the information of the α bits. Then, a sequence formed with the extracted 1440 bits is expressed by "y(n+1, 1), y(n+1, 2), . . . , y(n+1, 1439), y(n+1, 1440)" (that is, the 1440 bits, assuming y(n+1, j) where j is an integer of 1 or more and 1440 or less.).

Next, bits known in the transmitter and the receiver of (5400−α) bits are prepared. For example, "zeroes" of the (5400−α) bits are prepared ((5400−α) zeroes are prepared.). Then, "zeros" of the (5400−α) bits and "information of the (α−1440) bits other than the "1440 bits extracted from the information of the α bits" of the information of the α bits," that is, a data sequence of (5400−α)+(α−1440)=3960 bits is expressed by "z(n+1, 1), z(n+1, 2), . . . , z(n+1, 3959), z(n+1, 3960)" (that is, the 3960 bits, assuming z(n+1, j) where j is an integer of 1 or more and 3960 or less.).

In this case, LDPC coding and data transmission are performed as follows.

"y(n+1, 1), y(n+1, 2), . . . , y(n+1, 1439), y(n+1, 1440)" (that is, the 1440 bits, assuming y(n+1, j) where j is an integer of 1 or more and 1440 or less.) is applied to "information to be punctured (information bits not to be transmitted) 5404 of 1440 bits of the ith block in FIG. 54. Therefore, the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) is obtained by "y(n+1, 1), y(n+1, 2), . . . , y(n+1, 1439), y(n+1, 1440)" (that is, the 1440 bits, assuming y(n+1, j) where j is an integer of 1 or more and 1440 or less.).

"z(n+1, 1), z(n+1, 2), . . . , z(n+1, 3959), z(n+1, 3960)" (that is, the 3960 bits, assuming z(n+1, j) where j is an integer of 1 or more and 3960 or less.) is applied to information of 3960 bits (5403) of "X(i, 1), X(i, 2), . . . , X(i, 3959), X(i, 3960)" (the 3960 bits, assuming X(i, j) where j is an integer of 1 or more and 3960 or less). Therefore, the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) is obtained by "z(n+1, 1), z(n+1, 2), . . . , z(n+1, 3959), z(n+1, 3960)" (that is, the 3960 bits, assuming z(n+1, j) where j is an integer of 1 or more and 3960 or less.).

As described above, the information of 1440 bits of X(n+1, 3961), X(n+1, 3962), . . . , X(n+1, 5399), X(n+1, 5400)" (the 1440 bits, assuming X(n+1, j) where j is an integer of 3961 or more and 5400 or less), and the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) are obtained. Consequently, LDPC coding of a coding rate of 15/49 and a code length of 17640 bits is performed to obtain a parity of 12240 bits of "P(n+1, 1), P(n+1, 2), . . . , P(n+1, 12239), P(n+1, 12240)" (assuming P(n+1, k) where k is an integer of 1 or more and 12240 or less).

Then, since the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) is data to be punctured in FIG. 54(c), the transmitter does not transmit this information.

Since a sequence corresponding to "zeroes" of (5400−α) bits in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) is a sequence known in the transmitter and the receiver, the transmitter does not transmit this sequence. Then, the transmitter transmits "information of (α−1440) bits other than the "1440 bits extracted from the information of the α bits" of the information of the α bits" in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less).

The transmitter transmits a parity of 12240 bits of "P(n+1, 1), P(n+1, 2), . . . , P(n+1, 12239), P(n+1, 12240)" (assuming P(n+1, k) where k is an integer of 1 or more and 12240 or less).

Therefore, the transmitter transmits, as data of the n+1th block, the "information of the (α−1440) bits other than the "1440 bits extracted from the information of the α bits" of the information of the α bits" in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less), and the parity of 12240 bits of "P(n+1, 1), P(n+1, 2), . . . , P(n+1, 12239), P(n+1, 12240)" (assuming P(n+1, k) where k is an integer of 1 or more and 12240 or less).

The following processing is performed in decoding of the n+1th block of the decoder of the receiver.

For example, a log likelihood ratio corresponding to each bit of the parity of 12240 bits of "P(n+1, 1), P(n+1, 2), . . . , P(n+1, 12239), P(n+1, 12240)" (assuming P(n+1, k) where k is an integer of 1 or more and 12240 or less) transmitted by the transmitter is obtained.

The information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) is configured with an information sequence to be transmitted to the receiver. Then, since the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) is of puncture bits (puncture sequence), the transmitter does not transmit the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less). Hence, the receiver does not determine from a received signal a log likelihood ratio corresponding to each bit of the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less). Instead, the receiver gives a log likelihood ratio corresponding to the information sequence to be transmitted, to each bit of the information of 1440 bits of "X(n+1, 3961), X(n+1, 3962), . . . , X(n+1, 5399), X(n+1, 5400)" (the 1440 bits, assuming X(n+1, j) where j is an integer of 3961 or more and 5400 or less) (for example, the receiver gives a zero as a log likelihood ratio).

The information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less) includes a portion of a known sequence and a portion of an information sequence to be transmitted to the receiver.

In this case, the transmitter transmits an information sequence to be transmitted to the receiver in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less). For this reason, the receiver obtains from a received signal, for example, a log likelihood ratio corresponding to each bit of the information sequence to be transmitted in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less).

The transmitter does not transmit a known sequence in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less). For this reason, the receiver does not determine from a received signal a log likelihood ratio corresponding to each bit of the known sequence in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less). Instead, the receiver gives a log likelihood ratio corresponding to the known sequence to each bit of the known sequence in the information of 3960 bits of "X(n+1, 1), X(n+1, 2), . . . , X(n+1, 3959), X(n+1, 3960)" (the 3960 bits, assuming X(n+1, j) where j is an integer of 1 or more and 3960 or less).

A log likelihood ratio of each bit of the 17640 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

As described above, a characteristic point according to the present disclosure is to "preferentially allocate the information of the α bits to a portion of information bits to be punctured 5404 of 1440 bits of the ith block in FIG. 54(c), and to perform LDPC coding of a coding rate of 15/49 and a code length of 17640 bits." In this case, it is possible to obtain an effect of improvement in data transmission efficiency of the n+1th block and improvement in data reception quality. This point will be described.

The transmitter does not transmit information bits to be punctured 5404 of 1440 bits of the ith block in FIG. 54. In the receiver, information bits to be punctured 5404 of 1440 bits of the ith block are estimated by using a log likelihood ratio of each bit except the "information bits to be punctured of 1440 bits" of the ith block. That is, when belief of the log likelihood ratio of each bit except the "information bits to be punctured of 1440 bits" of the ith block is high, estimation precision in the receiver of the information bits to be punctured of 1440 bits of the ith block improves.

In consideration of this point, when a sequence known in the transmitter and the receiver is preferentially allocated to information bits except information bits to be punctured 5404 of 1440 bits of the ith block, that is, information bits to be transmitted 5403 of 3960 bits of the ith block in FIG. 54, estimation precision of the information bits to be punctured of 1440 bits of the ith block improves.

Moreover, in terms of information transmission efficiency, a sequence known in the transmitter and the receiver is not transmitted by the transmitter. In addition, bits to be punctured are not transmitted by the transmitter. According to this rule, when the "information of the α bits is preferentially allocated to the portion of information bits to be punctured 5404 of 1440 bits of the ith block in FIG. 54(c), and LDPC coding of a coding rate of 15/49 and a code length of 17640 bits is performed," transmission efficiency of n+1th data is good.

The case where the number of bits of one encoded block is z=16200 bits, a coding rate is 5/15 (a coding rate obtained after puncturing), a code length (block length) of an LDPC code used in this case is 17640 bits, and a coding rate of an LDPC code is 15/49 is described as an example in the present exemplary embodiment. However, the present disclosure is not limited thereto. Even in a case where number of bits z of one encoded block, a coding rate (a coding rate obtained after puncturing), a code length (block length) of an LDPC and a coding rate of the LDPC code are different from these values, the same effect can be obtained by carrying out the present disclosure in the same way.

Note that case <1> and case <2> described above each describe the example where the "parity of 12240 bits of "P(n+1, 1), P(n+1, 2), . . . , P(n+1, 12239), P(n+1, 12240)" (assuming P(n+1, k) where k is an integer of 1 or more and 12240 or less) is transmitted," that is, all parity bits are transmitted, but (part of) parity bits (parity sequence) may be punctured (the transmitter may not transmit (part of) the parity bits (parity sequence).).

Case <1> according to the present exemplary embodiment describes the "case where α in the information of the α bits is an integer of 1 or more and 1440 or less." However, case <1> may hold with every a in the information of the α bits which satisfies an integer of 1 or more and 1440 or less.

Moreover, there may be integer a satisfying 1 or more and 1440 or less in order that case <1> holds.

Similarly, case <2> according to the present exemplary embodiment describes the "case where α in the information of the α bits is an integer of 1441 or more and 5400 or less." However, case <2> may hold with every a in the information of the α bits which satisfies an integer of 1441 or more and 5400 or less.

Moreover, there may be integer a satisfying 1441 or more and 5400 or less in order that case <2> holds.

Exemplary Embodiment I

The case where a transmitter switches a coding scheme of "method #A" and a coding scheme of "method #B" illustrated in FIGS. 5, 6, 7, 8, 9, 10, 12, 13, 14, 15, 16 and the like, based on a number of bits of one encoded block and a coding rate, and accordingly a receiver switches a decoding scheme of "method #A" and a decoding scheme of "method #B" illustrated in FIGS. 5, 6, 7, 8, 9, 10, 12, 13, 14, 15, 16 and the like based on a number of bits of one encoded block and a coding rate is described above.

In the present exemplary embodiment, particularly, a method for transmitting data in a case of an LDPC coding scheme using puncturing according to "method #A" will be described in detail.

A case in FIG. 15 where a coding rate is 7/15 and the number of bits of one encoded block is z=16200 bits will be discussed as an example. An example of a configuration related to an encoder and a puncturer is as illustrated in FIG. 52, and will not be described.

A case where data of a coding rate of 7/15, the number of bits of one encoded block of 16200 bits and "method #A" is generated will be discussed. In this case, encoder 5203 performs encoding of an LDPC code (LDPC block) of a coding rate of 21/49 and a code length of 17640 bits. Then, information of the ith block is expressed by $X(i, j)$ (i is, for example, a natural number, and j is an integer of 1 or more and 7560 or less.). A parity of the ith block is expressed by $P(i, k)$ (i is, for example, a natural number, and k is a natural number of 1 or more and 10080 or less.). Then, encoder 5203 receives an input of 7560 bits of information $X(i, 1)$ to $X(i, 7560)$ of the ith block when encoder 5203 encodes the ith block. Encoder 5203 performs encoding of an LDPC code (LDPC block) of a coding rate of 21/49 and a code length of 17640 bits. Encoder 5203 outputs the 7560 bits of information $X(i, 1)$ to $X(i, 7560)$, and the 10080 bits of parity $P(i, 1)$ to $P(i, 10080)$, as data obtained after error correction coding of the ith block.

Then, puncturer 5205 determines 1440 bits not to be transmitted from among a total of 17640 bits of the data obtained after the error correction coding of the ith block, the 7560 bits of information $X(i, 1)$ to $X(i, 7560)$ and the 10080 bits of parity $P(i, 1)$ to $P(i, 10080)$. Puncturer 5205 outputs 16200 bits from which the 1440 bits not to be transmitted are removed, as data obtained after the puncturing of the ith block (consequently, the number of bits of one encoded block of z=16200 bits and a coding rate of 7/15 are realized).

Figure 55:
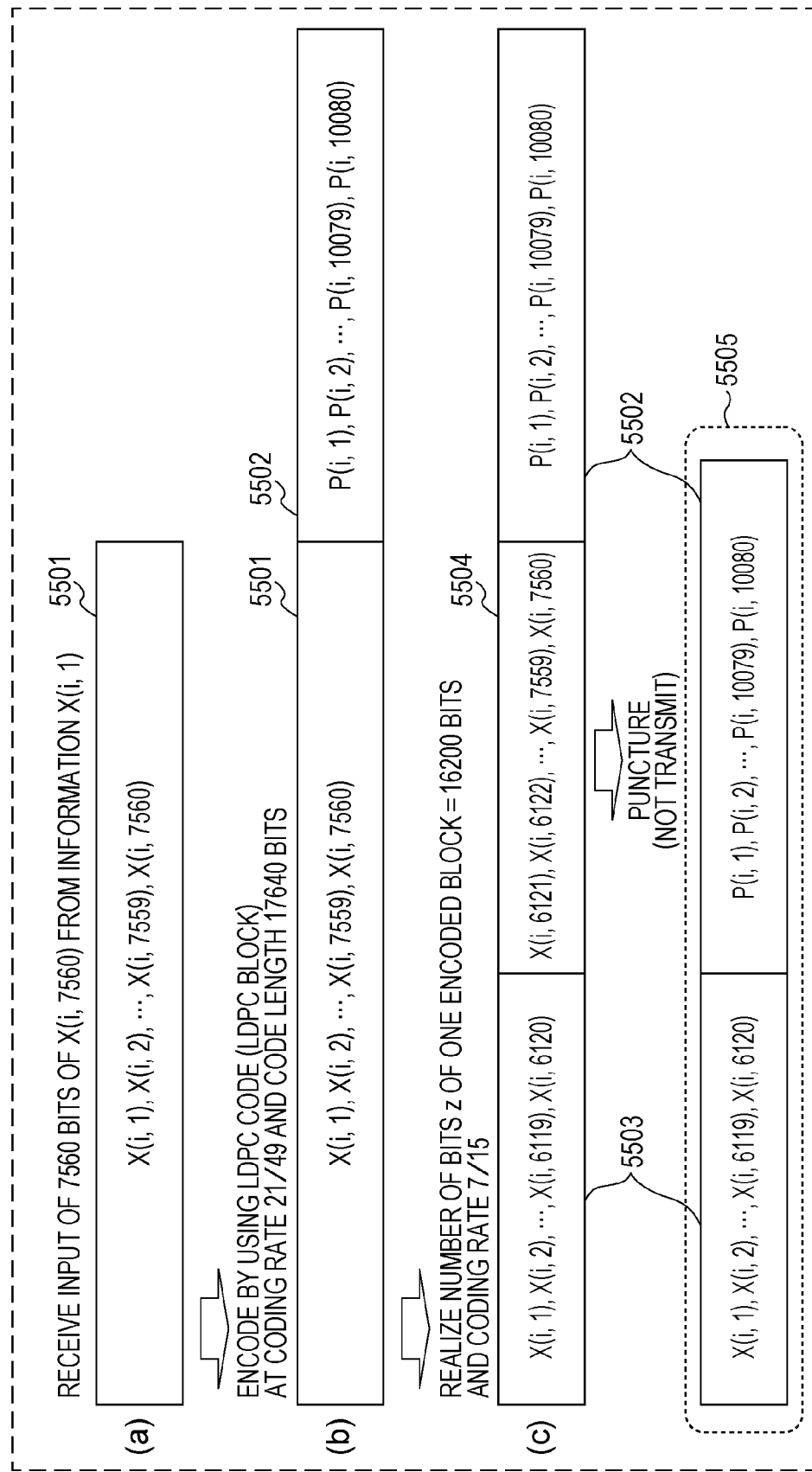
FIG. 55 is a view illustrating an example of coding processing and puncturing processing.

FIG. 55 illustrates an example of this point.

FIG. 55(a) illustrates a configuration of information of the ith block. Information (5501) of 7560 bits of the ith block is configured with the 7560 bits of "$X(i, 1), X(i, 2), \ldots, X(i, 7559), X(i, 7560)$" (that is, the information of the ith block has 7560 bits, assuming $X(i, j)$ where j is an integer of 1 or more and 7560 or less).

FIG. 55(b) illustrates a configuration of data of the ith block obtained by performing LDPC coding of a coding rate of 21/49 and a code length of 17640 bits. The 17640 bits of the ith block are configured with information (5501) of 7560 bits of "$X(i, 1), X(i, 2), \ldots, X(i, 7559), X(i, 7560)$" and parity (5502) of 10080 bits of "$P(i, 1), P(i, 2), \ldots, P(i, 10079), P(i, 10080)$." Then, when a parity check matrix of an LDPC code of a coding rate of 21/49 and a code length of 17640 bits is H, and codeword si of the ith block is $si=(X(i, 1), X(i, 2), \ldots, X(i, 7559), X(i, 7560), P(i, 1), P(i, 2), \ldots, P(i, 10079), P(i, 10080))$, $Hsi^T=0$ holds (note that $A^T$ means transposition of A).

FIG. 55(c) illustrates a method for generating data of the ith block to be transmitted in a case where the number of bits of one encoded block is z=16200 bits and a coding rate is 7/15. As one of features here, bits to be punctured (that is, bits not to be transmitted among 17640 bits of the ith block obtained by performing LDPC coding of a coding rate of 21/49 and a code length of 17640 bits) of 1440 bits are selected from information of 7560 bits of "X(i, 1), X(i, 2), . . . , X(i, 7559), X(i, 7560)."

For example, as illustrated in FIG. 55(c), in each block, information of 6120 bits (5503) of "X(i, 1), X(i, 2), . . . , X(i, 6119), X(i, 6120)" (the 6120 bits, assuming X(i, j) where j is an integer of 1 or more and 6120 or less) is of information bits to be transmitted (5503) of 6120 bits of the ith block, and information of 1440 bits (5504) of "X(i, 6121), X(i, 6122), . . . , X(i, 7559), X(i, 7560)" (the 1440 bits, assuming X(i, j) where j is an integer of 6121 or more and 7560 or less) is of information bits to be punctured (information bits not to be transmitted) (5504) of 1440 bits of the ith block.

Therefore, the transmitter transmits data of 16200 bits (5505) including information of 6120 bits (5503) of "X(i, 1), X(i, 2), . . . , X(i, 6119), X(i, 6120)" (the 6120 bits, assuming X(i, j) where j is an integer of 1 or more and 6120 or less), and parity of 10080 bits of P(i, 1), P(i, 2), . . . , P(i, 10079), P(i, 10080) (assuming P(i, k) where k is an integer of 1 or more and 10080 or less) (5502).

Note that the case where data to be punctured in each block is information of 1440 bits (5504) of "X(i, 6121), X(i, 6122), . . . , X(i, 7559), X(i, 7560)" (the 1440 bits, assuming X(i, j) where j is an integer of 6121 or more and 7560 or less) is described above, but this is only an example, and a method for selecting 1440 bits as data to be punctured (data not to be transmitted), from 7560 bits of "X(i, 1), X(i, 2), . . . , X(i, 7559), X(i, 7560)" (that is, information of the ith block has 7560 bits, assuming X(i, j) where j is an integer of 1 or more and 7560 or less) is not limited thereto (however, in each block, a method for selecting data to be punctured (data not to be transmitted) is the same. That is, for example, in a case where X(i, 5400) is set as data to be punctured (data not to be transmitted) in a certain block, X(i, 5400) is also set as data to be punctured (data not to be transmitted) in another block).

A case where information of 1440 bits (5504) of "X(i, 6121), X(i, 6122), . . . , X(i, 7559), X(i, 7560)" (the 1440 bits, assuming X(i, j) where j is an integer of 6121 or more and 7560 or less) is set as information bits to be punctured (information bits not to be transmitted) (5504) of 1440 bits of the ith block will be described below as an example.

The case where data of a coding rate of 7/15, the number of bits of one encoded block of 16200 bits and "method #A"" is generated is discussed above. Generation of one encoded block in this case is as described above. In this case, information of 7560 bits is necessary in order to form one encoded block.

Here, in consideration of a system, an amount of information to be transmitted is not necessarily a number of bits of a multiple of 7560 (7560×N bits (N is a natural number)). In this case, special processing is necessary. This processing method will be described below.

A number of bits of information to be transmitted by the transmitter can be generalized by setting the number of bits of information to be transmitted by the transmitter to "7560× n+α bits" (where n is an integer equal to or more than 0, and α is an integer of 0 or more and 7559 or less).

In this case, when n is an integer equal to or more than 1 and α is 0, the transmitter performs the processing illustrated in FIG. 55 to generate n blocks of a "coding rate of 7/15, the number of bits of one encoded block of 16200 bits and "method #A"" and generates and transmits these n blocks.

When n is an integer equal to or more than 0 and α is an integer of 1 or more and 7559 or less, the transmitter performs the processing illustrated in FIG. 55 to generate n blocks of a "coding rate of 7/15, the number of bits of one encoded block of 16200 bits and "method #A"" and generates and transmits these n blocks. Further, processing for transmitting the information of the α bits is necessary (this corresponds to performing the above-described "special processing").

The "processing for transmitting the information of the α bits" will be described in detail below.

A case where the "number of bits of information to be transmitted by the transmitter is "7560×n+α bits," n is an integer equal to or more than 0 and α is an integer of 1 or more and 7559 or less" will be discussed here. As also described above, in this case, the processing illustrated in FIG. 55 is performed on information of "7560×n bits" to generate n blocks of a "coding rate of 7/15, the number of bits of one encoded block of 16200 bits and "method #A"" and these n blocks are generated and transmitted. Further, the transmitter transmits the information of α bits. A coding scheme in this case will be described.

A characteristic point in this case is to "preferentially allocate the information of the α bits to a portion of information bits to be punctured 5504 of 1440 bits of the ith block in FIG. 55(c), and to perform LDPC coding of a coding rate of 21/49 and a code length of 17640 bits." An example of this point will be described with reference to FIG. 55.

First, a block for transmitting the information of the α bits is an n+1th block. Therefore, information bits (information sequence) of 7560 bits in FIG. 55 can be expressed by "X(n+1, 1), X(n+1, 2), . . . , X(n+1, 7559), X(n+1, 7560)" (that is, information of the n+1th block has 7560 bits, assuming X(n+1, j) where j is an integer of 1 or more and 7560 or less.). Parity bits (parity sequence) of 10080 bits in FIG. 55 can be expressed by "P(n+1, 1), P(n+1, 2), . . . , P(n+1, 10079), P(n+1, 10080)" (that is, the 10080 bits, assuming P(n+1, k) where k is an integer of 1 or more and 10080 or less.).

<1> A Case where α in the Information of the α Bits is an Integer of 1 or More and 1440 or Less:

In this case, bits known in the transmitter and the receiver of (1440−α) bits are prepared. For example, "zeroes" of the (1440−α) bits are prepared (a sequence formed with (1440−α) zeroes is prepared.). Then, a sequence of 1440 bits formed with the information of the α bits and "zeroes" of the (1440−α) bits is expressed by "Y(n+1, 1), Y(n+1, 2), . . . , Y(n+1, 1439), Y(n+1, 1440)" (that is, the 1440 bits, assuming Y(n+1, j) where j is an integer of 1 or more and 1440 or less.).

Further, information of 6120 bits is further necessary in order to perform LDPC coding. (As is clear from FIGS. 55(a), (b) and (c), information of 7560 bits is necessary in order to perform LDPC coding. Since the 1440 bits are prepared as Y(n+1, j), information of 7560-1440=6120 bits is further necessary.) Then, a known sequence of 6120 bits is prepared as information of these 6120 bits. For example, the known sequence is of "zeroes" of the 6120 bits (a sequence formed with 6120 zeros), and is expressed by "Z(n+1, 1), Z(n+1, 2), . . . , Z(n+1, 6119), Z(n+1, 6120)" (that is, the 6120 bits, assuming Z(n+1, j) where j is an integer of 1 or more and 6120 or less.).

In this case, LDPC coding and data transmission are performed as follows.

"Y(n+1, 1), Y(n+1, 2), . . . , Y(n+1, 1439), Y(n+1, 1440)" (that is, the 1440 bits, assuming Y(n+1, j) where j is an integer of 1 or more and 1440 or less.) is applied to "information bits to be punctured (information bits not to be transmitted) 5504 of 1440 bits of the ith block in FIG. 55. Therefore, the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less) is obtained by "Y(n+1, 1), Y(n+1, 2), . . . , Y(n+1, 1439), Y(n+1, 1440)" (that is, the 1440 bits, assuming Y(n+1, j) where j is an integer of 1 or more and 1440 or less.).

"Z(n+1, 1), Z(n+1, 2), . . . , Z(n+1, 6119), Z(n+1, 6120)" (that is, the 6120 bits, assuming Z(n+1, j) where j is an integer of 1 or more and 6120 or less.) is applied to information of 6120 bits (5503) of "X(i, 1), X(i, 2), . . . , X(i, 6119), X(i, 6120)" (the 6120 bits, assuming X(i, j) where j is an integer of 1 or more and 6120 or less). Therefore, the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less) is obtained by "Z(n+1, 1), Z(n+1, 2), . . . , Z(n+1, 6119), Z(n+1, 6120)" (that is, the 6120 bits, assuming Z(n+1, j) where j is an integer of 1 or more and 6120 or less.).

As described above, the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less), and the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less) are obtained. Consequently, LDPC coding of a coding rate of 21/49 and a code length of 17640 bits is performed to obtain a parity of 10080 bits of "P(n+1, 1), P(n+1, 2), . . . , P(n+1, 10079), P(n+1, 10080)" (assuming P(n+1, k) where k is an integer of 1 or more and 10080 or less).

Then, since the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less) is data to be punctured in FIG. 55(c), the transmitter does not transmit this information.

Since the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less) is a known sequence, the transmitter does not transmit this information.

Therefore, the transmitter transmits as data of the n+1th block the parity of 10080 bits of "P(n+1, 1), P(n+1, 2), . . . , P(n+1, 10079), P(n+1, 10080)" (assuming P(n+1, k) where k is an integer of 1 or more and 10080 or less).

The following processing is performed in decoding of the n+1th block of the decoder of the receiver.

For example, a log likelihood ratio corresponding to each bit of the parity of 10080 bits of "P(n+1, 1), P(n+1, 2), . . . , P(n+1, 10079), P(n+1, 10080)" (assuming P(n+1, k) where k is an integer of 1 or more and 10080 or less) transmitted by the transmitter is obtained.

Since the transmitter does not transmit the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less), the receiver does not determine from a received signal a log likelihood ratio corresponding to each bit of the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less). Instead, since the information of 6120 bits of "X(n+1, 1), X(n+1, 2), . . . , X(n+1, 6119), X(n+1, 6120)" (the 6120 bits, assuming X(n+1, j) where j is an integer of 1 or more and 6120 or less) is a known sequence, the receiver creates a log likelihood ratio corresponding to each bit of this known sequence.

The information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less) includes a portion of a known sequence and a portion of an information sequence to be transmitted to the receiver. However, since these 1440 bits are puncture bits (puncture sequence), the transmitter does not transmit these 1440 bits. Hence, the receiver does not determine from a received signal a log likelihood ratio corresponding to each bit of the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less). Instead, the receiver gives a log likelihood ratio of each bit corresponding to the portion of the known sequence of the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less). Moreover, the receiver gives a log likelihood ratio of each bit corresponding to the portion of the information sequence to be transmitted to the receiver of the information of 1440 bits of "X(n+1, 6121), X(n+1, 6122), . . . , X(n+1, 7559), X(n+1, 7560)" (the 1440 bits, assuming X(n+1, j) where j is an integer of 6121 or more and 7560 or less) (for example, the receiver gives a zero as a log likelihood ratio).

A log likelihood ratio of each bit of the 17640 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

<2> A Case where α in the Information of the α Bits is an Integer of 1441 or More and 7560 or Less:

In this case, 1440 bits are extracted from the information of the α bits. Then, a sequence formed with the extracted 1440 bits is expressed by "y(n+1, 1), y(n+1, 2), . . . , y(n+1, 1439), y(n+1, 1440)" (that is, the 1440 bits, assuming y(n+1, j) where j is an integer of 1 or more and 1440 or less.).

Next, bits known in the transmitter and the receiver of (7560−α) bits are prepared. For example, "zeroes" of the (7560−α) bits are prepared ((7560−α) zeroes are prepared.). Then, "zeros" of the (7560−α) bits and "information of the (α−1440) bits other than the "1440 bits extracted from the information of the α bits" of the information of the α bits," that is, a data sequence of (7560−α)+(α−1440)=6120 bits is expressed by "z(n+1, 1), z(n+1, 2), . . . , z(n+1, 6119), z(n+1, 6120)" (that is, the 6120 bits, assuming z(n+1, j) where j is an integer of 1 or more and 6120 or less.).

In this case, LDPC coding and data transmission are performed as follows.

"y(n+1, 1), y(n+1, 2), . . . , y(n+1, 1439), y(n+1, 1440)" (that is, the 1440 bits, assuming y(n+1, j) where j is an integer of 1 or more and 1440 or less.) is applied to "information bits to be punctured (information bits not to be transmitted) 5504 of 1440 bits of the ith block in FIG. 55. Therefore, the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less) is obtained by "y(n+1, 1), y(n+1, 2), ..., y(n+1, 1439), y(n+1, 1440)" (that is, the 1440 bits, assuming y(n+1, j) where j is an integer of 1 or more and 1440 or less.).

"z(n+1, 1), z(n+1, 2), ..., z(n+1, 6119), z(n+1, 6120)" (that is, the 6120 bits, assuming z(n+1, j) where j is an integer of 1 or more and 6120 or less.) is applied to information of 6120 bits (5503) of "X(i, 1), X(i, 2), ..., X(i, 6119), X(i, 6120)" (the 6120 bits, assuming X(i, j) where j is an integer of 1 or more and 6120 or less). Therefore, the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less) is obtained by "z(n+1, 1), z(n+1, 2), ..., z(n+1, 6119), z(n+1, 6120)" (that is, the 6120 bits, assuming z(n+1, j) where j is an integer of 1 or more and 6120 or less.).

As described above, the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less), and the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less) are obtained. Consequently, LDPC coding of a coding rate of 21/49 and a code length of 17640 bits is performed to obtain a parity of 10080 bits of "P(n+1, 1), P(n+1, 2), ..., P(n+1, 10079), P(n+1, 10080)" (assuming P(n+1, k) where k is an integer of 1 or more and 10080 or less).

Then, since the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less) is data to be punctured in FIG. 55(*c*), the transmitter does not transmit this information.

Since a sequence corresponding to "zeroes" of (7560−α) bits in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less) is a sequence known in the transmitter and the receiver, the transmitter does not transmit this sequence. Then, the transmitter transmits "information of (α−1440) bits other than the "1440 bits extracted from the information of the α bits" of the information of the α bits" in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less).

The transmitter transmits a parity of 10080 bits of "P(n+1, 1), P(n+1, 2), ..., P(n+1, 10079), P(n+1, 10080)" (assuming P(n+1, k) where k is an integer of 1 or more and 10080 or less).

Therefore, the transmitter transmits, as data of the n+1 th block, the "information of (α−1440) bits other than the "1440 bits extracted from the information of the α bits" of the information of the α bits" in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less), and the parity of 10080 bits of "P(n+1, 1), P(n+1, 2), ..., P(n+1, 10079), P(n+1, 10080)" (assuming P(n+1, k) where k is an integer of 1 or more and 10080 or less).

The following processing is performed in decoding of the n+1th block of the decoder of the receiver.

For example, a log likelihood ratio corresponding to each bit of the parity of 10080 bits of "P(n+1, 1), P(n+1, 2), ..., P(n+1, 10079), P(n+1, 10080)" (assuming P(n+1, k) where k is an integer of 1 or more and 10080 or less) transmitted by the transmitter is obtained.

The information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less) is configured with an information sequence to be transmitted to the receiver. Then, since the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less) is of puncture bits (puncture sequence), the transmitter does not transmit the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less). Hence, the receiver does not determine from a received signal a log likelihood ratio corresponding to each bit of the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less). Instead, the receiver gives a log likelihood ratio corresponding to the information sequence to be transmitted to the receiver, to each bit of the information of 1440 bits of "X(n+1, 6121), X(n+1, 6122), ..., X(n+1, 7559), X(n+1, 7560)" (the 1440 bits, assuming X(n+1, j) where j is an integer of 6121 or more and 7560 or less) (for example, the receiver gives a zero as a log likelihood ratio).

The information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less) includes a portion of a known sequence and a portion of an information sequence to be transmitted to the receiver.

In this case, the transmitter transmits an information sequence to be transmitted to the receiver in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less). For this reason, the receiver obtains from a received signal, for example, a log likelihood ratio corresponding to each bit of the information sequence to be transmitted in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less).

The transmitter does not transmit the known sequence in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less). For this reason, the receiver does not determine from a received signal a log likelihood ratio corresponding to each bit of the known sequence in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less). Instead, the receiver gives a log likelihood ratio corresponding to the known sequence to each bit of the known sequence in the information of 6120 bits of "X(n+1, 1), X(n+1, 2), ..., X(n+1, 6119), X(n+1, 6120)" (the 6120 bits, assuming X(n+1, j) where j is an integer of 1 or more and 6120 or less).

A log likelihood ratio of each bit of the 17640 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity.) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

As described above, a characteristic point according to the present disclosure is to "preferentially allocate the information of the α bits to a portion of information bits to be punctured 5504 of 1440 bits of the ith block in FIG. 55(*c*), and to perform LDPC coding of a coding rate of 21/49 and a code length of 17640 bits." In this case, it is possible to obtain an effect of improvement in data transmission efficiency of the n+1th block and improvement in data reception quality. This point will be described.

The transmitter does not transmit information bits to be punctured 5504 of 1440 bits of the ith block in FIG. 55. In the receiver, information bits to be punctured 5504 of 1440 bits of the ith block are estimated by using a log likelihood ratio of each bit except the "information bits to be punctured of 1440 bits" of the ith block. That is, when belief of the log likelihood ratio of each bit except the "information bits to be punctured of 1440 bits" of the ith block is high, estimation precision in the receiver of the information bits to be punctured of 1440 bits of the ith block improves.

In consideration of this point, when a sequence known in the transmitter and the receiver is preferentially allocated to information bits except information bits to be punctured 5504 of 1440 bits of the ith block, that is, information bits to be transmitted 5503 of 6120 bits of the ith block in FIG. 55, estimation precision of the information bits to be punctured of 1440 bits of the ith block improves.

Moreover, in terms of information transmission efficiency, a sequence known in the transmitter and the receiver is not transmitted by the transmitter. In addition, bits to be punctured are not transmitted by the transmitter. According to this rule, when the "information of the α bits is preferentially allocated to a portion of information bits to be punctured 5504 of 1440 bits of the ith block in FIG. 55(*c*), and LDPC coding of a coding rate of 21/49 and a code length of 17640 bits is performed," transmission efficiency of n+1th data is good.

The case where the number of bits of one encoded block is z=16200 bits, a coding rate is 7/15 (a coding rate obtained after puncturing), a code length (block length) of an LDPC code used in this case is 17640 bits, and a coding rate of an LDPC code is 21/49 is described as an example in the present exemplary embodiment. However, the present disclosure is not limited thereto. Even in a case where number of bits z of one encoded block, a coding rate (a coding rate obtained after puncturing), a code length (block length) of an LDPC and a coding rate of the LDPC code are different from these values, the same effect can be obtained by carrying out the present disclosure in the same way.

Note that case <1> and case <2> described above each describe the example where the "parity of 10080 bits of "P(n+1, 1), P(n+1, 2), . . . , P(n+1, 10079), P(n+1, 10080)" (assuming P(n+1, k) where k is an integer of 1 or more and 10080 or less) is transmitted," that is, all parity bits are transmitted, but (part of) parity bits (parity sequence) may be punctured (the transmitter may not transmit (part of) the parity bits (parity sequence)).

Case <1> according to the present exemplary embodiment describes the "case where α in the information of the α bits is an integer of 1 or more and 1440 or less." However, case <1> may hold with every a in the information of the α bits which satisfies an integer of 1 or more and 1440 or less.

Moreover, there may be integer a satisfying 1 or more and 1440 or less in order that case <1> holds.

Similarly, case <2> according to the present exemplary embodiment describes the "case where α in the information of the α bits is an integer of 1441 or more and 7560 or less." However, case <2> may hold with every a in the information of the α bits which satisfies an integer of 1441 or more and 7560 or less.

Moreover, there may be integer a satisfying 1441 or more and 7560 or less in order that case <2> holds.

Exemplary Embodiment J

The case where a transmitter switches a coding scheme of "method #A" and a coding scheme of "method #B" illustrated in FIGS. 5, 6, 7, 8, 9, 10, 12, 13, 14, 15, 16 and the like, based on a number of bits of one encoded block and a coding rate, and accordingly a receiver switches a decoding scheme of "method #A" and a decoding scheme of "method #B" illustrated in FIGS. 5, 6, 7, 8, 9, 10, 12, 13, 14, 15, 16 and the like based on a number of bits of one encoded block and a coding rate is described above.

In the present exemplary embodiment, particularly, a method for transmitting data in a case of an LDPC coding scheme using puncturing according to "method #A" will be described in detail.

A case in FIG. 15 where a coding rate is 9/15 and the number of bits of one encoded block is z=16200 bits will be discussed as an example. An example of a configuration related to an encoder and a puncturer is as illustrated in FIG. 52, and will not be described.

A case where data of a coding rate of 9/15, the number of bits of one encoded block of 16200 bits and "method #A" is generated will be discussed. In this case, encoder 5203 performs encoding of an LDPC code (LDPC block) of a coding rate of 27/46 and a code length of 16560 bits. Then, information of the ith block is expressed by X(i, j) (i is, for example, a natural number, and j is an integer of 1 or more and 9720 or less.). A parity of the ith block is expressed by P(i, k) (i is, for example, a natural number, and k is a natural number of 1 or more and 6840 or less.). Then, encoder 5203 receives an input of 9720 bits of information X(i, 1) to X(i, 9720) of the ith block when encoder 5203 encodes the ith block. Encoder 5203 performs encoding of an LDPC code (LDPC block) of a coding rate of 27/46 and a code length of 16560 bits. Encoder 5203 outputs the 9720 bits of information X(i, 1) to X(i, 9720), and the 6840 bits of parity P(i, 1) to P(i, 6840), as data obtained after error correction coding of the ith block.

Then, puncturer 5205 determines bits not to be transmitted of 360 bits from among a total of 16560 bits of the data obtained after the error correction coding of the ith block, the 9720 bits of information X(i, 1) to X(i, 9720) and the 6840 bits of parity P(i, 1) to P(i, 6840). Puncturer 5205 outputs 16200 bits from which the 360 bits not to be transmitted are removed, as data obtained after the puncturing of the ith block (consequently, the number of bits of one encoded block of z=16200 bits and a coding rate of 9/15 are realized).

Figure 56:
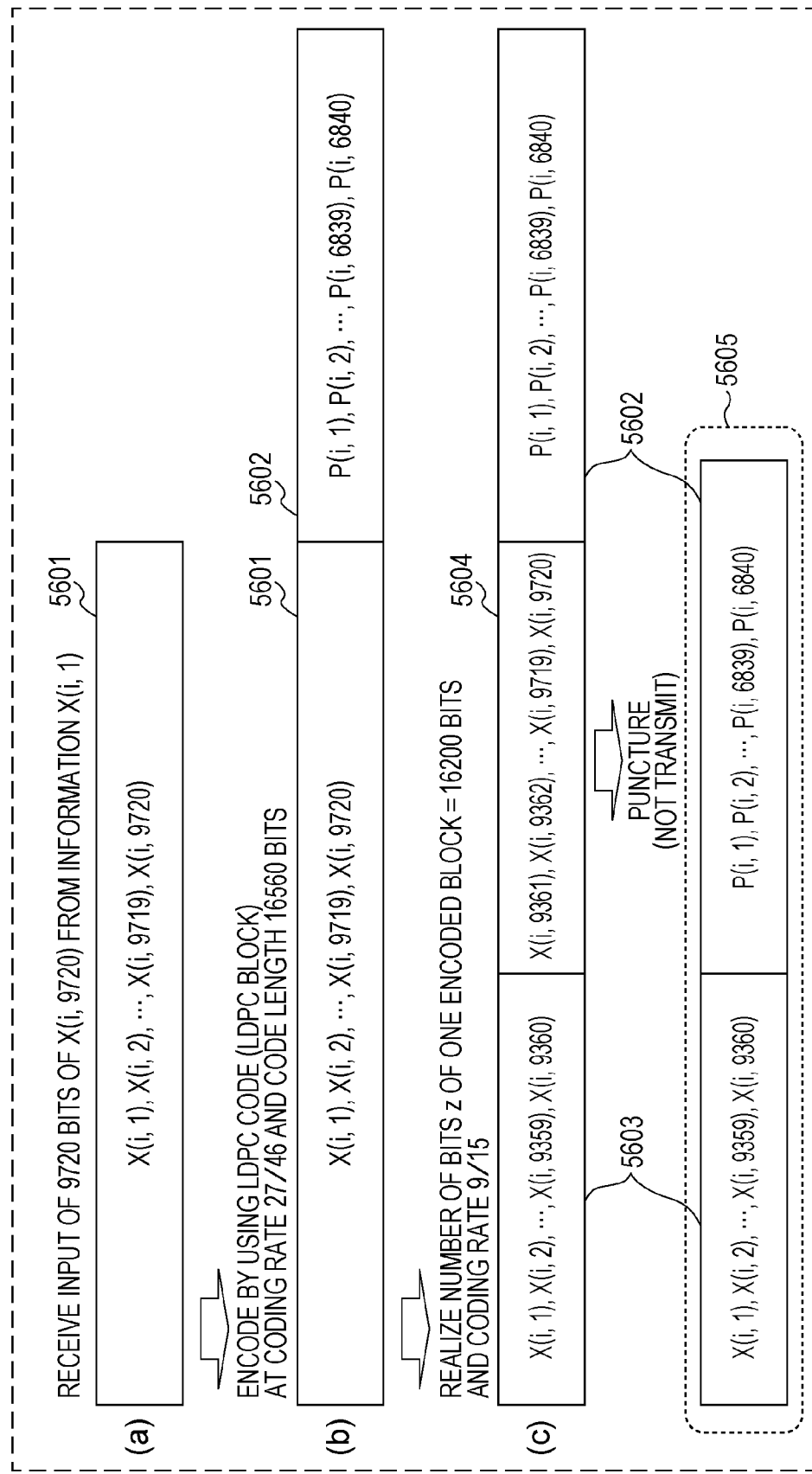
FIG. 56 is a view illustrating an example of coding processing and puncturing processing.

FIG. 56 illustrates an example of this point.

FIG. 56(*a*) illustrates a configuration of information of the ith block, and information (5601) of 9720 bits of the ith block is configured with the 9720 bits of "X(i, 1), X(i, 2), . . . , X(i, 9719), X(i, 9720)" (that is, the information of the ith block has 9720 bits, assuming X(i, j) where j is an integer of 1 or more and 9720 or less).

FIG. 56(b) illustrates a configuration of data of the ith block obtained by performing LDPC coding of a coding rate of 27/46 and a code length of 16560 bits. The 16560 bits of the ith block are configured with information (5601) of 9720 bits of "X(i, 1), X(i, 2), . . . , X(i, 9719), X(i, 9720)" and parity (5602) of 6840 bits of "P(i, 1), P(i, 2), . . . , P(i, 6839), P(i, 6840)." Then, when a parity check matrix of an LDPC code of a coding rate of 27/46 and a code length of 16560 bits is H, and codeword si of the ith block is si=(X(i, 1), X(i, 2), . . . , X(i, 9719), X(i, 9720), P(i, 1), P(i, 2), . . . , P(i, 6839), P(i, 6840)), $Hsi^T=0$ holds (note that $A^T$ means transposition of A).

FIG. 56(c) illustrates a method for generating data of the ith block to be transmitted in a case where the number of bits of one encoded block is z=16200 bits and a coding rate is 9/15. As one of features here, bits to be punctured (that is, bits not to be transmitted among 16560 bits of the ith block obtained by performing LDPC coding of a coding rate of 27/46 and a code length of 16560 bits) of 360 bits are selected from information of 9720 bits of "X(i, 1), X(i, 2), . . . , X(i, 9719), X(i, 9720)."

For example, as illustrated in FIG. 56(c), in each block, information of 9360 bits (5603) of "X(i, 1), X(i, 2), . . . , X(i, 9359), X(i, 9360)" (the 9360 bits, assuming X(i, j) where j is an integer of 1 or more and 9360 or less) is of information bits to be transmitted (5603) of 9360 bits of the ith block, and information of 360 bits (5604) of "X(i, 9361), X(i, 9362), . . . , X(i, 9719), X(i, 9720)" (the 360 bits, assuming X(i, j) where j is an integer of 9361 or more and 9720 or less) is of information bits to be punctured (information bits not to be transmitted) (5604) of 360 bits of the ith block.

Therefore, the transmitter transmits data of 16200 bits (5605) including information of 9360 bits (5603) of "X(i, 1), X(i, 2), . . . , X(i, 9359), X(i, 9360)" (the 9360 bits, assuming X(i, j) where j is an integer of 1 or more and 9360 or less), and parity of 6840 bits of P(i, 1), P(i, 2), . . . , P(i, 6839), P(i, 6840) (assuming P(i, k) where k is an integer of 1 or more and 6840 or less) (5602).

Note that the case where data to be punctured in each block is information of 360 bits (5604) of "X(i, 9361), X(i, 9362), . . . , X(i, 9719), X(i, 9720)" (the 360 bits, assuming X(i, j) where j is an integer of 9361 or more and 9720 or less) is described above, but this is only an example, and a method for selecting 360 bits as data to be punctured (data not to be transmitted), from 9720 bits of "X(i, 1), X(i, 2), . . . , X(i, 9719), X(i, 9720)" (that is, information of the ith block has 9720 bits, assuming X(i, j) where j is an integer of 1 or more and 9720 or less) is not limited thereto (however, in each block, a method for selecting data to be punctured (data not to be transmitted) is the same. That is, for example, in a case where X(i, 5400) is set as data to be punctured (data not to be transmitted) in a certain block, X(i, 5400) is also set as data to be punctured (data not to be transmitted) in another block).

A case where information of 360 bits (5604) of "X(i, 9361), X(i, 9362), . . . , X(i, 9719), X(i, 9720)" (the 360 bits, assuming X(i, j) where j is an integer of 9361 or more and 9720 or less) is set as information bits to be punctured (information bits not to be transmitted) (5604) of 360 bits of the ith block will be described below as an example.

The case where data of a coding rate of 9/15, the number of bits of one encoded block of 16200 bits and "method #A" is generated is discussed above. Generation of one encoded block in this case is as described above. In this case, information of 9720 bits is necessary in order to form one encoded block.

Here, in consideration of a system, an amount of information to be transmitted is not necessarily a number of bits of a multiple of 9720 (9720×N bits (N is a natural number)). In this case, special processing is necessary. This processing method will be described below.

A number of bits of information to be transmitted by the transmitter can be generalized by setting the number of bits of information to be transmitted by the transmitter to "9720× n+α bits" (where n is an integer equal to or more than 0, and α is an integer of 0 or more and 9719 or less).

In this case, when n is an integer equal to or more than 1 and α is 0, the transmitter performs the processing illustrated in FIG. 56 to generate n blocks of a "coding rate of 9/15, the number of bits of one encoded block of 16200 bits and "method #A"" and generates and transmits these n blocks.

When n is an integer equal to or more than 0 and α is an integer of 1 or more and 9719 or less, the transmitter performs the processing illustrated in FIG. 56 to generate n blocks of a "coding rate of 9/15, the number of bits of one encoded block of 16200 bits and "method #A"" and generates and transmits these n blocks. Further, processing for transmitting the information of the α bits is necessary (this corresponds to performing the above-described "special processing").

The "processing for transmitting the information of the α bits" will be described in detail below.

A case where the "number of bits of information to be transmitted by the transmitter is "9720×n+α bits," n is an integer equal to or more than 0 and α is an integer of 1 or more and 9719 or less" will be discussed here. As also described above, in this case, the processing illustrated in FIG. 56 is performed on information of "9720×n bits" to generate n blocks of a "coding rate of 9/15, the number of bits of one encoded block of 16200 bits and "method #A"" and these n blocks are generated and transmitted. Further, the transmitter transmits the information of α bits. A coding scheme in this case will be described.

A characteristic point in this case is to "preferentially allocate the information of the α bits to a portion of information bits to be punctured 5604 of 360 bits of the ith block in FIG. 56(c), and to perform LDPC coding of a coding rate of 27/46 and a code length of 16560 bits." An example of this point will be described with reference to FIG. 56.

First, a block for transmitting the information of the α bits is an n+1th block. Therefore, information bits (information sequence) of 9720 bits in FIG. 56 can be expressed by "X(n+1, 1), X(n+1, 2), . . . , X(n+1, 9719), X(n+1, 9720)" (that is, information of the n+1th block has 9720 bits, assuming X(n+1, j) where j is an integer of 1 or more and 9720 or less.). Parity bits (parity sequence) of 6840 bits in FIG. 56 can be expressed by "P(n+1, 1), P(n+1, 2), . . . , P(n+1, 6839), P(n+1, 6840)" (that is, the 6840 bits, assuming P(n+1, k) where k is an integer of 1 or more and 6840 or less.).

<1> A Case where α in the Information of the α Bits is an Integer of 1 or More and 360 or Less:

In this case, bits known in the transmitter and the receiver of (360−α) bits are prepared. For example, "zeroes" of the (360−α) bits are prepared (a sequence formed with (360−α) zeroes is prepared.). Then, a sequence of 360 bits formed with information of the information of the α bits and "zeroes" of the (360−α) bits is expressed by "Y(n+1, 1), "Y(n+1, 2), . . . , Y(n+1, 359), Y(n+1, 360)" (that is, the 360 bits, assuming Y(n+1, j) where j is an integer of 1 or more and 360 or less).

Further, information of 9720 bits is further necessary in order to perform LDPC coding. (As is clear from FIGS. 56(a), (b) and (c), information of 9720 bits is necessary in order to perform LDPC coding. Since the 360 bits are prepared as Y(n+1, j), information of 9720−360=9360 bits is further necessary.) Then, a known sequence of 9360 bits is prepared as information of these 9360 bits. For example, the known sequence is of "zeroes" of the 9360 bits (a sequence formed with 9360 zeros), and is expressed by "Z(n+1, 1), Z(n+1, 2), . . . , Z(n+1, 9359), Z(n+1, 9360)" (that is, the 9360 bits, assuming Z(n+1, j) where j is an integer of 1 or more and 9360 or less.).

In this case, LDPC coding and data transmission are performed as follows.

"Y(n+1, 1), Y(n+1, 2), . . . , Y(n+1, 359), Y(n+1, 360)" (that is, the 360 bits, assuming Y(n+1, j) where j is an integer of 1 or more and 360 or less.) is applied to "information to be punctured (information bits not to be transmitted) 5604 of 360 bits of the ith block in FIG. 56. Therefore, the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is obtained by "Y(n+1, 1), Y(n+1, 2), . . . , Y(n+1, 359), Y(n+1, 360)" (that is, the 360 bits, assuming Y(n+1, j) where j is an integer of 1 or more and 360 or less.).

"Z(n+1, 1), Z(n+1, 2), . . . , Z(n+1, 9359), Z(n+1, 9360)" (that is, the 9360 bits, assuming Z(n+1, j) where j is an integer of 1 or more and 9360 or less.) is applied to information of 9360 bits (5603) of "X(i, 1), X(i, 2), . . . , X(i, 9359), X(i, 9360)" (the 9360 bits, assuming X(i, j) where j is an integer of 1 or more and 9360 or less). Therefore, the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) is obtained by "Z(n+1, 1), Z(n+1, 2), . . . , Z(n+1, 9359), Z(n+1, 9360)" (that is, the 9360 bits, assuming Z(n+1, j) where j is an integer of 1 or more and 9360 or less.).

As described above, the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less), and the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) are obtained. Consequently, LDPC coding of a coding rate of 27/46 and a code length of 16560 bits is performed to obtain a parity of 6840 bits of "P(n+1, 1), P(n+1, 2), . . . , P(n+1, 6839), P(n+1, 6840)" (assuming P(n+1, k) where k is an integer of 1 or more and 6840 or less).

Then, since the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is data to be punctured in FIG. 56(c), the transmitter does not transmit this information.

Since the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) is a known sequence, the transmitter does not transmit this information.

Therefore, the transmitter transmits as data of the n+1th block the parity of 6840 bits of "P(n+1, 1), P(n+1, 2), . . . , P(n+1, 6839), P(n+1, 6840)" (assuming P(n+1, k) where k is an integer of 1 or more and 6840 or less).

The following processing is performed in decoding of the n+1th block of the decoder of the receiver.

For example, a log likelihood ratio corresponding to each bit of the parity of 6840 bits of "P(n+1, 1), P(n+1, 2), . . . , P(n+1, 6839), P(n+1, 6840)" (assuming P(n+1, k) where k is an integer of 1 or more and 6840 or less) transmitted by the transmitter is obtained.

Since the transmitter does not transmit the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less), the receiver does not determine from a received signal a log likelihood ratio corresponding to each bit of the information of 9360 bits of "X(n+1, 1), X(n+1, 2), . . . , X(n+1, 6359), X(n+1, 9360)" (the 9360 bits, assuming X(n+1, j) where j is an integer of 1 or more and 9360 or less). Instead, since the information of 9360 bits of "X(n+1, 1), X(n+1, 2), . . . , X(n+1, 6359), X(n+1, 9360)" (the 9360 bits, assuming X(n+1, j) where j is an integer of 1 or more and 9360 or less) is a known sequence, the receiver creates a log likelihood ratio corresponding to each bit of this known sequence.

The information of 360 bits of "X(n+1, 9361), X(n+1, 9362), . . . , X(n+1, 9719), X(n+1, 9720)" (the 360 bits, assuming (n+1, j) where j is an integer of 9361 or more and 9720 or less) includes a portion of a known sequence and a portion of an information sequence to be transmitted to the receiver. However, since these 360 bits are puncture bits (puncture sequence), the transmitter does not transmit these 360 bits. Hence, the receiver does not determine from a received signal a log likelihood ratio corresponding to each bit of the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less). Instead, the receiver gives a log likelihood ratio of each bit corresponding to the portion of the known sequence of the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less). Moreover, the receiver gives a log likelihood ratio of each bit corresponding to the portion of the information sequence to be transmitted to the receiver of the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) (for example, the receiver gives a zero as a log likelihood ratio).

A log likelihood ratio of each bit of the 16560 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

<2> A Case where α in the Information of the α Bits is an Integer of 361 or More and 9720 or Less:

In this case, 360 bits are extracted from the information of the α bits. Then, a sequence formed with the extracted 360 bits is expressed by "y(n+1, 1), y(n+1, 2), . . . , y(n+1, 359), y(n+1, 360)" (that is, the 360 bits, assuming y(n+1, j) where j is an integer of 1 or more and 360 or less.).

Next, bits known in the transmitter and the receiver of (9720−α) bits are prepared. For example, "zeroes" of the (9720−α) bits are prepared ((9720−α) zeroes are prepared.). Then, "zeros" of the (9720−α) bits and "information of the (α−360) bits other than the "360 bits extracted from the information of the α bits" of the information of the α bits," that is, a data sequence of (9720−α)+(α−360)=9360 bits is expressed by "z(n+1, 1), z(n+1, 2), . . . , z(n+1, 9359), z(n+1, 9360)" (that is, the 9360 bits, assuming z(n+1, j) where j is an integer of 1 or more and 9360 or less.).

In this case, LDPC coding and data transmission are performed as follows.

"y(n+1, 1), y(n+1, 2), . . . , y(n+1, 359), y(n+1, 360)" (that is, the 360 bits, assuming y(n+1, j) where j is an integer of 1 or more and 360 or less.) is applied to "information to be punctured (information bits not to be transmitted) 5604 of 360 bits of the ith block in FIG. 56. Therefore, the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is obtained by "y(n+1, 1), y(n+1, 2), . . . , y(n+1, 359), y(n+1, 360)" (that is, the 360 bits, assuming y(n+1, j) where j is an integer of 1 or more and 360 or less.).

"z(n+1, 1), z(n+1, 2), . . . , z(n+1, 9359), z(n+1, 9360)" (that is, the 9360 bits, assuming z(n+1, j) where j is an integer of 1 or more and 9360 or less.) is applied to information of 9360 bits (5603) of "X(i, 1), X(i, 2), . . . , X(i, 9359), X(i, 9360)" (the 9360 bits, assuming X(i, j) where j is an integer of 1 or more and 9360 or less). Therefore, the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) is obtained by "z(n+1, 1), z(n+1, 2), . . . , z(n+1, 9359), z(n+1, 9360)" (that is, the 9360 bits, assuming z(n+1, j) where j is an integer of 1 or more and 9360 or less.).

As described above, the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less), and the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) are obtained. Consequently, LDPC coding of a coding rate of 27/46 and a code length of 16560 bits is performed to obtain a parity of 6840 bits of "P(n+1, 1), P(n+1, 2), . . . , P(n+1, 6839), P(n+1, 6840)" (assuming P(n+1, k) where k is an integer of 1 or more and 6840 or less).

Then, since the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is data to be punctured in FIG. 56(*c*), the transmitter does not transmit this information.

Since a sequence corresponding to "zeroes" of (9720−α) bits in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) is a sequence known in the transmitter and the receiver, the transmitter does not transmit this sequence. Then, the transmitter transmits the "information of (α−360) bits other than the "360 bits extracted from the information of the α bits" of the information of the α bits" in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less).

The transmitter transmits a parity of 6840 bits of "P(n+1, 1), P(n+1, 2), . . . , P(n+1, 6839), P(n+1, 6840)" (assuming P(n+1, k) where k is an integer of 1 or more and 6840 or less).

Therefore, the transmitter transmits, as data of the n+1 th block, the "information of (α−360) bits other than the "360 bits extracted from the information of the α bits" of the information of the α bits" in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less), and the parity of 6840 bits of "P(n+1, 1), P(n+1, 2), . . . , P(n+1, 6839), P(n+1, 6840)" (assuming P(n+1, k) where k is an integer of 1 or more and 6840 or less).

The following processing is performed in decoding of the n+1th block of the decoder of the receiver.

For example, a log likelihood ratio corresponding to each bit of the parity of 6840 bits of "P(n+1, 1), P(n+1, 2), . . . , P(n+1, 6839), P(n+1, 6840)" (assuming P(n+1, k) where k is an integer of 1 or more and 6840 or less) transmitted by the transmitter is obtained.

The information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is configured with an information sequence to be transmitted to the receiver. Then, since the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) is of puncture bits (puncture sequence), the transmitter does not transmit the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less). Hence, the receiver does not determine from a received signal a log likelihood ratio corresponding to each bit of the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less). Instead, the receiver gives a log likelihood ratio corresponding to the information sequence to be transmitted, to each bit of the information of 360 bits of "X(n+1, 9361), X(n+1, 9362), . . . , X(n+1, 9719), X(n+1, 9720)" (the 360 bits, assuming X(n+1, j) where j is an integer of 9361 or more and 9720 or less) (for example, the receiver gives a zero as a log likelihood ratio).

The information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less) includes a portion of a known sequence and a portion of an information sequence to be transmitted to the receiver.

In this case, the transmitter transmits an information sequence to be transmitted to the receiver in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less). For this reason, the receiver obtains from a received signal, for example, a log likelihood ratio corresponding to each bit of the information sequence to be transmitted in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less).

The transmitter does not transmit a known sequence in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less). For this reason, the receiver does not determine from a received signal a log likelihood ratio corresponding to each bit of the known sequence in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less). Instead, the receiver gives a log likelihood ratio corresponding to the known sequence to each bit of the known sequence in the information of 9360 bits of "X(n+1, 1), X(n+1, 2), . . . , X(n+1, 9359), X(n+1, 9360)" (the 9360 bits, assuming X(n+1, j) where j is an integer of 1 or more and 9360 or less).

A log likelihood ratio of each bit of the 16560 bits of the n+1th block can be obtained by obtaining the log likelihood ratio as described above. Belief propagation decoding (BP (Belief Propagation) decoding) is performed by using these log likelihood ratios, to obtain an estimated value of information contained in the n+1th block.

There can be considered a method for the transmitter to transmit a control information symbol including information of a number of bits of data to be transmitted by the transmitter (the number of bits of data may be a number of bits of information or a number of bits of information and a parity) in order to transmit the number of bits of information contained in the n+1th block. The receiver obtains the information contained in the control information symbol of the number of bits of the data to be transmitted by the transmitter. Consequently, the receiver can learn a configuration of the n+1th block transmitted by the transmitter and performs the above-described decoding, based on the configuration.

As described above, a characteristic point according to the present disclosure is to "preferentially allocate the information of the α bits to a portion of information bits to be punctured 5604 of 360 bits of the ith block in FIG. 56(c), and to perform LDPC coding of a coding rate of 27/46 and a code length of 16560 bits." In this case, it is possible to obtain an effect of improvement in data transmission efficiency of the n+1th block and improvement in data reception quality. This point will be described.

The transmitter does not transmit information bits to be punctured 5604 of 360 bits of the ith block in FIG. 56. In the receiver, information bits to be punctured 5604 of 360 bits of the ith block are estimated by using a log likelihood ratio of each bit except the "information bits to be punctured of 360 bits" of the ith block. That is, when belief of the log likelihood ratio of each bit except the "information bits to be punctured of 360 bits of the ith block is high, estimation precision in the receiver of the information bits to be punctured of 360 bits of the ith block improves.

In consideration of this point, when a sequence known in the transmitter and the receiver is preferentially allocated to information bits except information bits to be punctured 5604 of 360 bits of the ith block, that is, information bits to be transmitted 5603 of 9360 bits of the ith block in FIG. 56, estimation precision of the information bits to be punctured of 360 bits of the ith block improves.

Moreover, in terms of information transmission efficiency, a sequence known in the transmitter and the receiver is not transmitted by the transmitter. In addition, bits to be punctured are not transmitted by the transmitter. According to this rule, when the "information of the α bits is preferentially allocated to a portion of information bits to be punctured 5604 of 360 bits of the ith block in FIG. 56(c), and LDPC coding of a coding rate of 27/46 and a code length of 16560 bits is performed," transmission efficiency of n+1th data is good.

The case where the number of bits of one encoded block is z=16200 bits, a coding rate is 9/15 (a coding rate obtained after puncturing), a code length (block length) of an LDPC code used in this case is 16560 bits, and a coding rate of an LDPC code is 27/46 is described as an example in the present exemplary embodiment. However, the present disclosure is not limited thereto. Even in a case where number of bits z of one encoded block, a coding rate (a coding rate obtained after puncturing), a code length (block length) of an LDPC and a coding rate of the LDPC code are different from these values, the same effect can be obtained by carrying out the present disclosure in the same way.

Note that case <1> and case <2> described above each describe the example where the "parity of 6840 bits of "P(n+1, 1), P(n+1, 2), . . . , P(n+1, 6839), P(n+1, 6840)" (assuming P(n+1, k) where k is an integer of 1 or more and 6840 or less) is transmitted," that is, all parity bits are transmitted, but (part of) parity bits (parity sequence) may be punctured (the transmitter may not transmit (part of) the parity bits (parity sequence)).

Case <1> according to the present exemplary embodiment describes the "case where α in the information of the α bits is an integer of 1 or more and 360 or less." However, case <1> may hold with every a in the information of the α bits which satisfies an integer of 1 or more and 360 or less.

Moreover, there may be integer a satisfying 1 or more and 360 or less in order that case <1> holds.

Similarly, case <2> according to the present exemplary embodiment describes the "case where α in the information of the α bits is an integer of 361 or more and 9720 or less." However, case <2> may hold with every a in the information of the α bits which satisfies an integer of 361 or more and 9720 or less.

Moreover, there may be integer a satisfying 361 or more and 9720 or less in order that case <2> holds.

The transmission method, the reception method, the transmitter and the receiver according to the present disclosure can ensure high data reception quality because of high error correction performance.

What is claimed is:

1. A transmission method, performed by a transmitter, for transmitting contents to a receiver, the transmission method comprising:

determining, based on control information, whether a first encoding scheme to generate a first codeword or a second encoding scheme to generate a second codeword is used for encoding, a first parity check matrix of the first encoding scheme being different from a second parity check matrix of the second encoding scheme, a first length of the first codeword being smaller than a second length of the second codeword;

encoding an information data sequence according to the determined encoding scheme to generate an encoded sequence including the first codeword or the second codeword;

removing a part of the first codeword if the first encoding scheme is determined to be used;

modulating the encoded sequence to generate modulated symbols; and transmitting the modulated symbols and the control information through an antenna, wherein the information data sequence includes multiplexed data in which at least two contents are multiplexed, the at least two contents including a compressed video content, and the information data sequence includes a High Dynamic Range (HDR) indicator indicating that the compressed video content is to be decompressed in the receiver according to HDR video compression.

2. The transmission method according to claim 1, wherein the information data sequence further includes HDR decompression data that are provided to generate a HDR video content from the compressed video content in the receiver.

3. A reception method, performed by a receiver, for receiving contents from a transmitter, the reception method comprising:

receiving modulated symbols and control information through an antenna;

demodulating the modulated symbols to generate an encoded sequence including a first codeword or a second codeword;

performing depuncturing process on the first codeword if the control information indicates that puncturing process is performed in the transmitter;

decoding the first codeword according to a first encoding scheme to generate an information data sequence if the control information indicates that the puncturing process is performed in the transmitter; and decoding the second codeword according to a second encoding scheme to generate an information data sequence if the control information does not indicate that the puncturing process is performed in the transmitter, a first parity check matrix of the first encoding scheme being different from a second parity check matrix of the second encoding scheme, a first length of the first codeword being smaller than a second length of the second codeword, wherein the information data sequence includes multiplexed data in which at least two contents are multiplexed, the at least two contents including a compressed video content, and the information data sequence includes a High Dynamic Range (HDR) indicator indicating that the compressed video content is to be decompressed in the receiver according to HDR video compression.

4. The reception method according to claim 3, wherein the information data sequence further includes HDR decompression data that are provided to generate a HDR video content from the compressed video content in the receiver.

* * * * *